United States Patent [19]
Guruswamy et al.

[11] Patent Number: 5,984,510
[45] Date of Patent: Nov. 16, 1999

[54] AUTOMATIC SYNTHESIS OF STANDARD CELL LAYOUTS

[75] Inventors: Mohan Guruswamy, Austin, Tex.; Daniel Wesley Dulitz, Port Madilda, Pa.; Robert L. Maziasz, Austin, Tex.; Srilata Raman, Austin, Tex.; Venkata K. R. Chiluvuri, Austin, Tex.; Andrea Berens, Austin, Tex.

[73] Assignee: Motorola Inc., Austin, Tex.

[21] Appl. No.: 08/740,720

[22] Filed: Nov. 1, 1996

[51] Int. Cl.⁶ ................................................. G06F 17/50
[52] U.S. Cl. ............................................ 364/491; 364/488
[58] Field of Search .................................. 364/488, 489, 364/490, 491, 578

[56] References Cited

U.S. PATENT DOCUMENTS

| | | | |
|---|---|---|---|
| 4,630,219 | 12/1986 | DiGiacomo et al. | 364/488 |
| 5,097,422 | 3/1992 | Corbin, II et al. | 364/491 |
| 5,463,563 | 10/1995 | Bair et al. | 364/490 |
| 5,625,568 | 4/1997 | Edwards et al. | 364/491 |
| 5,633,807 | 5/1997 | Fishburn et al. | 364/491 |
| 5,666,288 | 9/1997 | Jones et al. | 364/490 |
| 5,701,255 | 12/1997 | Fukui | 364/491 |
| 5,726,902 | 3/1998 | Mahmood et al. | 364/489 |
| 5,737,236 | 4/1998 | Maziasz et al. | 364/490 |
| 5,764,533 | 6/1998 | DeDood | 364/491 |

OTHER PUBLICATIONS

Chao C.Chen and Shau–Lim Chow,"The Layout Synthesizer:An Automatic Netlist–to–Layout System," in Proc. 26th ACM/IEEE Design Automation Conf., Jun. 1989, pp. 232–238.

Chong–Leong Ong, Jeong–Tyng Li and Chi–Yuan Lo, "GENAC An Automatic Cell Synthesis Tool," in Proc. 26th ACM/IEEE Design Automation Conf., Jun. 1989, pp. 239–244.

C.W.Kapral, J.J–Y, Chen, J. Chen,J. Do, and C.R.Fawcett, "Layout Synthesis:An Automatic Cell Generator", Silicon Compiler Systems. no date, no pg #s.

Virtuoso Layout Synthesizer (LAS) User Guide Version 4.2–Cadence Design Systems, Oct. 1991.

M.Lefebvre and D.F.Skoll,"Picasso II:A CMOS leafe cell synthesis system," in Proc .of International Workshop on Layout Synthesis, pp. 207–219, 1992.

Primary Examiner—Kevin J. Teska
Assistant Examiner—Leigh Marie Garbowski
Attorney, Agent, or Firm—Bruce E. Hayden

[57] ABSTRACT

A method for automatically synthesizing standard cell layouts(170) given a circuit netlist, a template describing the layout style and a set of process design rules (136) starts by numerating an ordered sequence of physical netlists from the logical netlist(138). Next, a netlist is selected from the ordered sequence of physical netlists (140). Components are placed according to the selected physical netlist (144). The components are routed to implement interconnections specified by the netlist (154). The components are compacted (156). A next netlist is selected from the ordered sequence of physical netlists. The steps of placing, routing and compacting the components are repeated. The layout with the smallest width is selected(166). Finally, ies, contacts and vias are added and notches filled (170) to improve yield and performance of the circuit.

38 Claims, 73 Drawing Sheets

| VERTEX | WEIGHT | GRID |
|--------|--------|------|
| $V_A$ | 0 | NO |
| $V_B$ | 0 | NO |
| $V_C$ | POSITIVE | NO |
| $V_D$ | NEGATIVE | YES |
| $V_E$ | 0 | NO |

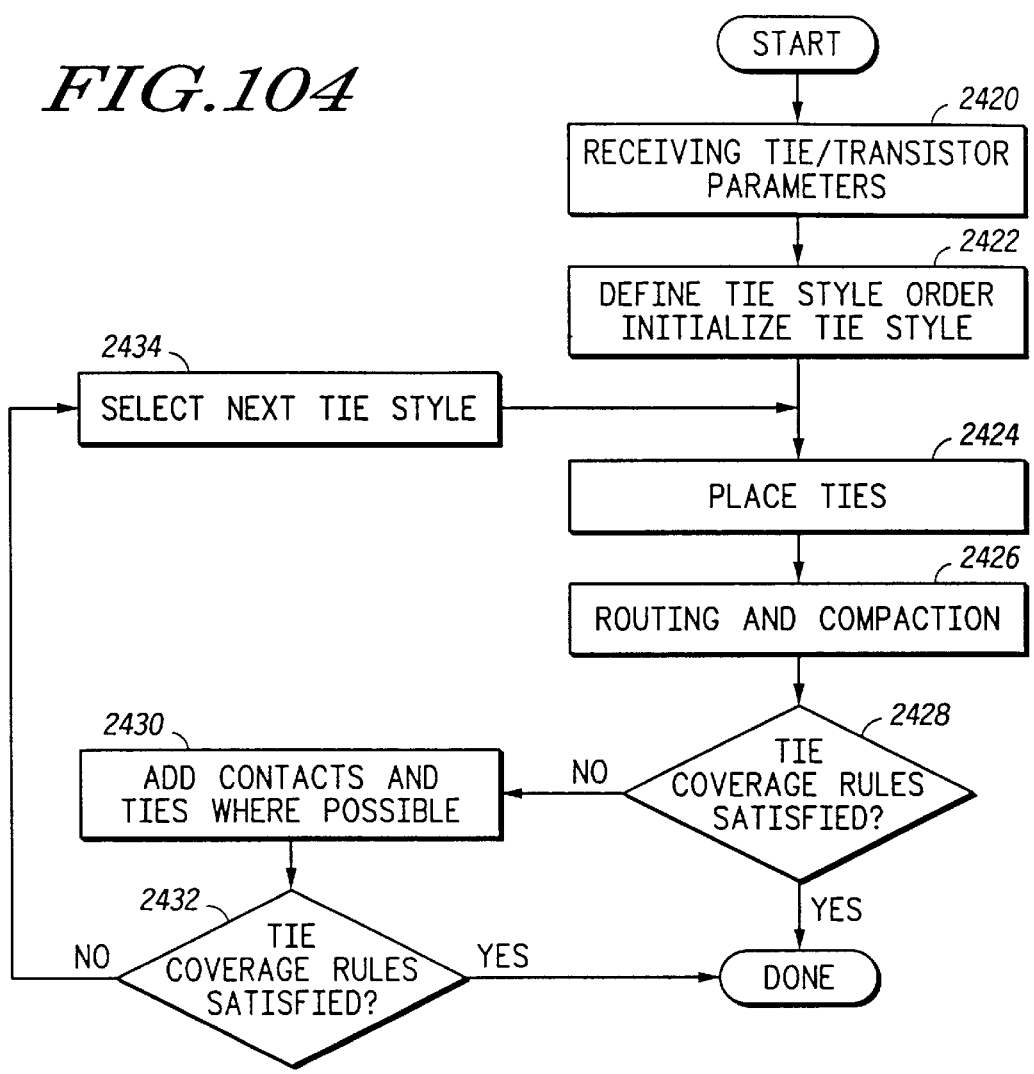

AUTOMATIC SYNTHESIS OF STANDARD CELL LAYOUTS

CROSS REFERENCE TO RELATED APPLICATIONS

This application is related to our commonly assigned copending United States patent applications entitled:

"METHOD AND APPARATUS FOR FORMING REDUNDANT VIAS BETWEEN CONDUCTIVE LAYERS OF AN INTEGRATED CIRCUIT" by Gabriel Bracha et. al., U.S. patent application Ser. No. 08/535,427 Aug. 25, 1998; filed Sep. 28, 1995, now U.S. Pat. No. 5,798,937.

"METHOD AND APPARATUS FOR DESIGNING AN INTEGRATED CIRCUIT" by Larry G. Jones et al., and U.S. Pat. No. 5,666,288 Sep. 9, 1997;

"APPARATUS AND METHOD FOR AUTOMATED TRANSISTOR AND COMPONENT FOLDING TO PRODUCE OPTIMIZED CELL STRUCTURE" by Robert Maziasz et al., and U.S. patent application Ser. No. 08/597,788 filed Feb. 7, 1996;

"APPARATUS AND METHOD FOR AUTOMATICALLY PLACING TIES AND CONNECTION ELEMENTS WITHIN AN INTEGRATED CIRCUIT" by Mohan Guruswamy et al., U.S. patent application Ser. No. 08/597,768 filed Feb. 7, 1996;

"APPARATUS AND METHOD FOR THE AUTOMATIC DETERMINATION OF A STANDARD LIBRARY HEIGHT WITHIN AN INTEGRATED CIRCUIT DESIGN" by Robert Maziasz et al., and U.S. Pat. No. 5,737,236 Apr. 7, 1998;

"AUTOMATIC LAYOUT SUBSTRATE AND WELL TIE STYLE SELECTION" by Mohan Guruswamy et. al., U.S. patent application Ser. No. 08/740,768 filed Nov. 1, 1996;

"AUTOMATIC LAYOUT TRANSISTOR PLACEMENT" by Robert Maziasz et. al., U.S. patent application Ser. No. 08/740,772 filed Nov. 1, 1996;

"AUTOMATIC ROUTING SPACE AND DIRECTION DETERMINATION" by Srilata Raman et. al., U.S. patent application Ser. No. 08/740,724 filed Nov. 1, 1996;

"AUTOMATIC LAYOUT WIRE MINIMIZATION FOR GRIDDED PORTS" by Venkata Chiluvuri et. al., U.S. patent application Ser. No. 08/740,724 filed Nov. 1, 1996;

"AUTOMATIC LAYOUT TRANSISTOR STACKING" by Robert Maziasz et. al., U.S. patent application Ser. No. 08/740,772 filed Nov. 1, 1996;

"AUTOMATIC LAYOUT STANDARD CELL ROUTING" by Srilata Raman et. al., U.S. patent application Ser. No. 08/740,721 filed Nov. 1, 1996;

"AUTOMATIC LAYOUT TIE FILLING" by Daniel Dulitz, U.S. patent application Ser. No. 08,740,771 filed Nov. 1, 1996;

"AUTOMATIC LAYOUT CONTACT AND VIA FILLING" by Daniel Dulitz, U.S. patent application Ser. No. 08/740,770 filed Nov. 1, 1996;

"AUTOMATIC LAYOUT NOTCH FILLING" by Daniel Dulitz, U.S. patent application Ser. No. 08/740,769 filed Nov. 1, 1996;

"AUTOMATIC LAYOUT I/O PORT PLACEMENT" by Srilata Raman et. al., U.S. patent application Ser. No. 08/740,723 filed Nov. 1, 1996;

"SEMICONDUCTOR DEVICE USING DIODE PLACE-HOLDERS AND METHOD OF MANUFACTURE THEREOF" by Daniel R. Cronin, et. al., U.S. patent application Ser. No. 08/740,766 filed Nov. 1, 1996.

TECHNICAL FIELD OF THE INVENTION

This invention relates generally to the design and manufacture of integrated circuitry and more particularly to an apparatus and method for producing optimized cell structures.

BACKGROUND OF THE INVENTION

A common method of designing an integrated circuit (IC) in a semiconductor design requires that an integrated circuit designer first provide a library of computer stored circuit cells and a behavioral circuit model describing the functionality of the integrated circuit. The circuit cells typically include fundamental logic gates such as OR, NAND, NOR, AND, XOR, inverter, and like logical cells with an array of logic gate sizes. These cells also include sequential circuit elements such as latches and flip-flops for memory requirements. Generally, the library of computer stored circuit cells are generated by a layout designer manually. Because this process is time consuming and error prone, prior art methods and apparatus have been developed to automate this procedure.

FIG. 1 illustrates a methodology and apparatus implemented in these prior art systems. Typical prior art implementations include the Virtuoso Layout Synthesizer (LAS) tool from Cadence, the Auto Layout tool from Mentor Graphics, the Custom Cell Synthesizer (CCS) tool from MCC, and a Cadabra tool. The methodology implemented by prior art implementations will now be discussed in greater detail and with reference to FIG. 1.

A prior art implementation 10 includes step 12 whereby an external user provides a netlist and template. The netlist comprises a set of circuit primitives such as transistors and diodes, their sizes, and interconnections. The template describes the physical form of a standard circuit cell. The template may contain cell height, supply rail size, etc.

Next, in step 14, components of the netlist are placed in an appropriate location. Each of the components is then connected to one another in channel routing step 16. A resulting layout is subsequently compacted in step 18. Lastly, a layout designer is required to determine whether a resulting layout meets the template specified in initial step 12. Thus, in step 19, a layout designer must determine whether or not a cell height is met, whether there is proper density among the elements of the layout, and whether well height (abutment) constraints are met. Furthermore, if the layout designer determines that these constraints are not met, the layout designer must determine which parameters of the template specified in step 12 must be modified in order to generate a compliant layout. This often requires that the layout must be hand edited to meet these constraints. Each of the steps of the prior art implementation will now be discussed in greater detail.

In the first step 12, in which an external user provides a netlist and template, prior art implementation required that a physical netlist, and not a logical netlist, be provided. A physical netlist is one in which there is a one-to-one correspondence between devices specified in the netlist and the transistors implemented in a final layout. A physical netlist is different than a logical netlist which only specifies a function to be performed and is not optimized to meet the template requirements. Stated another way, a physical netlist requires user optimization before being provided to a next step in the prior art component placement step (step 14).

Because user optimization, or hand drafted optimization, is required, prior art implementations require a significant amount of time to simply generate one physical layout. In a slight improvement over the previously described prior art techniques, some prior art implementations provide semi-automatic means for translating logical netlists into physical netlists. However, even these slight improvements require user direction to specify a maximum transistor size. This user direction requirement again adds additional time to the layout process and introduces an increased likelihood in layout errors. As well, these prior art techniques have the undesired side effect of creating unnecessary interconnects between nodes guaranteed to be at a same electrical potential because of a manner in which a physical netlist is generated by such techniques.

In step 14 of the prior art implementation, the netlist components are placed in a two dimensional array to minimize certain cost metrics, where the cost metric is a quality indicator for the placement. Generally, a two-dimensional array is comprised of one row of N-type transistors and one row of P-type transistors. Typical cost metrics include wire length and cell height and width estimates. While a two-dimensional array is generally used, the two-dimensional array does not always give optimal results for each type of netlist. For example, because of a linear flow implemented within most prior art implementations, a cell placement selected during execution of step 14 is never modified automatically regardless of its effectiveness in satisfying a template requirement. Also, the prior art does not perform vertical alignment of transistors of the same type (P or N) in order to minimize wire length. Furthermore, prior art implementations tend to emphasize the minimization of interconnection lengths between the transistors forming the cell, but not the Channel Density (defined below). It should be noted that Channel Density should be minimized to minimize cell height. By minimizing interconnection length, prior art techniques fail to minimize a height of the cell.

In addition to the disadvantages delineated above, the method by which prior art implements step 14, component placement, also has several drawbacks. Included in these drawbacks is a method by which prior art places ties in the layout to satisfy latch-up rules. It should be noted that after transistors are placed, prior art implementations must place "merged ties" to connect a source or drain of the transistor to a power or ground source supply. Prior art implementations are only able to place ties at the certain specified locations and are not able to implement ties at optimal locations. Furthermore, it should be noted that even the requirement that the ties be placed at certain locations and provide certain connections between a transistor and a supply source utilizes only an ad hoc process which provides no optimization.

In addition to placing ties, prior art implementations also place ports during step 14. During the port placement step, an area in a cell is reserved to allow the cell to communicate with other cells by providing via sites or another form of interface. As with the tie placement operations, prior art implementations do not optimize placements of ports to provide maximum area utilization. Such port placement step is critical because if the port placement step is performed in an inefficient manner, block area routing will be adversely affected.

Additionally, in recent years, antenna diodes are being implemented by manual layout insertion to provide a contact from a metal layer to a Diffusion layer of a device for manufacturing purposes. This contact provides a path for charge generated in long metal lines during manufacturing to be dissipated without damaging a transistor gate or other circuit implemented on a semiconductor substrate. No prior art techniques currently available provide a method for automatically placing antenna diodes using computer software tools to create a cell layout.

In next step 16, interconnects between components are routed by the prior art implementations. Most prior art techniques implement a channel routing methodology which reflects an attempted solution to a classic layout optimization problem which has been studied extensively. Channel routing is a methodology implemented by prior art systems in which the channel is defined to be a region between a row of N-type transistors and P-type transistors. In performing routing between the two types of transistors, the channel routing implemented by prior art implementations fails to effectively utilize the region lying outside the channel between the two transistors. For example, the region on top of transistors could be used to route metal wires, and the region below the metal supply rails could be used for polysilicon connections. This is not done in the prior art. Additionally, in prior art implementations, the routing direction for each layer is predetermined and may not be modified during channel routing step 16. This fixed routing direction leads to one of the main disadvantages of using a channel router because it results in an increased number of contacts and vias that have adverse effects on area, electrical performance, and yield. Note that some prior art implementations augment channel routing with various ad hoc heuristic methods. However, these fail to overcome the fundamental disadvantage noted above.

In additional to channel routing, some prior art implementations implement an area routing technique. Area routing involves using an entire area of the layout to connect the components and does not limit it to a transistor channel. While the second prior art technique may provide more optimal results, prior art implementations have failed to provide a good solution for selectively increasing an area in which the routing may fail. Additionally, in prior art implementations of area routing, a routing direction is fixed for each layer. As with the channel routing implementations, this fixed directionality adversely affects the optimal nature of the routing operation.

After components are placed and interconnects are routed, layout compaction step 18 is implemented. While most prior art implementations include a layout compaction step, this step is not provided to optimize a well height and a cell height requirement. Some prior art implementations simply ignore the well height requirement problem, while other prior art implementations have attempted to provide well height support by implementing a fixed rectangular well region during a layout compaction step. However, this second technique is not optimal because it limits a height of each of the N-type and P-type transistors. If height requirements are not exceeded, a resulting circuit will not be optimal and will require a greater amount of area to implement. In addition to not adequately providing support for well height requirements, prior art implementations also fail to make efforts to compact a cell layout differently to obtain a narrower cell within a standard cell height.

In other prior art implementations, a two-dimensional compaction operation is implemented. In this process, both the height and the width of the cell are compacted simultaneously. While this methodology may provide a more optimal result, it is computationally intensive and therefore, is unable to optimize larger standard cells. Furthermore, an external user is unable to explore additional options because of the longer run time resulting from the computationally intensive procedure. Therefore, the user is often unable to explore additional placement and routing options which may prove to be optimal. Another drawback of the second implementation of a layout compaction step is that it requires a layout to be sub-divided into columns prior to the compaction step. While this procedure works for current placements of transistors, it is infeasible to use where the transistor placement is modified in a certain manner. For example, when the placement consists of both horizontal and vertical alignments of transistors, the two-dimensional compaction process will result in an erroneous compaction operation. Stated another way, the second two dimensional compaction methodology is not a general purpose compaction procedure.

Finally, after prior art implementations have been used to place components, route connections between the components, and compact that layout, a layout designer is required to inspect the layout and determine in an ad hoc manner whether the layout satisfies the template specified in step 12 and whether the layout is of good quality. For example, in step 19, the layout designer must determine whether or not cell and well height requirements are met, whether port placement is optimized, whether there is good density among the components, and whether or not an abutment requirement is met. Furthermore, the layout designer must determine whether or not the resulting layout satisfies all design rules. If any of these requirements are not satisfied, the layout designer must determine which input to the template must be modified to achieve certain goals. For example, such goals may include a smaller cell height or a cell which has different port placements. Furthermore, layout designers are unable to change routing direction or Tie Style unless they chose to do so manually using a layout editor. Lastly, it should be noted that in some prior art implementations, even steps 14, 16, and 18 are not automatic and the layout designer must come in at each point and make changes to control each tool. This hand editing step requires layout expertise and increases a latency related to a layout development time.

Therefore, it is desirable to have a methodology that may produce standard cell layouts in a fully automatic manner where the resulting layout complies with design rules and the required template, and has a good density.

BRIEF DESCRIPTION OF THE DRAWINGS

Prior art

Prior art

Prior art

FIG. 104 is a flowchart that illustrates Substrate and Well Tie Style Selection in accordance with the method of FIG. 4;

FIG. 105 illustrates the tie style selection matrix in the preferred embodiment.

DETAILED DESCRIPTION OF PREFERRED EMBODIMENT

The present invention provides an apparatus and method for synthesizing mask geometry for standard cells and macro cells from a logical circuit netlist given a standard-cell style and technology parameters (design rules). By using the automatic synthesis of layout for standard cells from a logical netlist, generation of specialized libraries tailored to the requirements of individual design projects and specific standard-cell blocks may be rapidly implemented. Additionally, the use of libraries with gate sizes that closely match circuit needs results in more efficient area, power, and speed optimizations. Furthermore, this automatic synthesis allows for the generation of designs using new process technologies more rapidly. Such rapid turnaround is increasingly important in the semiconductor industry where the timing of market introductions is often critical.

Figure 2:
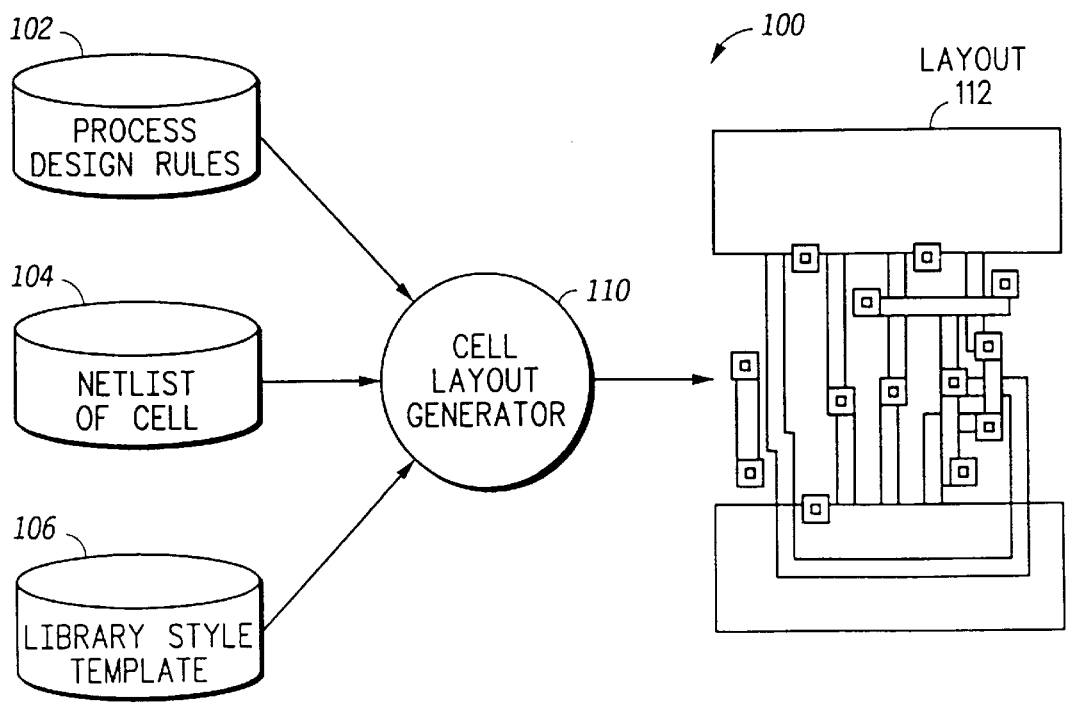
FIG. 2 is a block diagram that illustrates the cell layout generation system in accordance with one embodiment of the present invention.

In a following description of the present invention, a system environment in which the invention will be implemented will first be discussed. This discussion will be followed by a general description of the cell layout generator of the present invention. Subsequently, selected topics which further clarify portions of the cell layout generator will be described in greater detail. The topics are organized as follows:

I. Cell Layout Generation System Environment
II. Overview of Cell Layout Generator
III. Selected Topics
   A. High Density Transistor Placement
   B. Transistor Stacking
   C. Input/Output Port Placement
   D. Diode Placement
   E. Performance Driven Routing Flow
   F. Routing Space and Direction Determination
   G. Wire Minimization for Gridded Ports
   H. Notch, Tie, and Contact Filling Flow
   I. Notch Filling
   J. Tie Filling
   K. Contact and Via Filling
   L. Automatic Tie Placement
   M. Substrate and Well Tie Style Selection
IV. Conclusion I. Cell Layout Generation System Environment FIG. 2 is a block diagram that illustrates a layout generation system 100 in accordance with one embodiment of the present invention. As illustrated in FIG. 2, process design rules, stored in a disk file 102, are provided to a cell layout generator 110. Additionally, a netlist of cells stored in disk file 104, and a library style template stored in disk file 106 are also provided to cell layout generator 110. Cell layout generator 110 processes each of the parameters and values to generate layout 112. To provide a basic background for the present invention, each of the input process design rules, netlist of cells, and library style template will be described in further detail.

Process design rules in disk file 102 include a minimum width of the different layers used in a layout of a cell as well as spacing requirements associated with those layers. The process design rules also specify electrical characteristics such as resistance and capacitance for each layer. The netlist of cells stored in data file 104 includes a list of transistor and signals connected to each of those transistors. Furthermore, the netlist of cells stored in disk file 104 specifies the size of transistors implemented in the layout and the input/output (I/O) signal ports. It should be noted that the list of transistors specified in the netlist of cells represents a logical, and not a physical, netlist. Thus, the present invention only requires that the connections which should be made be specified, and does not require an actual physical netlist. The library style template stored in disk file 106 includes required cell height, required well height, and the dimensions and locations of the supply sources, or rails, of the cell layout. Additionally, there are other styles specified in the template; however, these are not specified herein for brevity's sake and it should be realized that additional styles may be implemented even though they are not discussed in detail herein.

Before describing the functionality of cell layout generator 110 in greater detail, a system in which cell layout generator 110 is implemented will be described. This system is illustrated in greater detail in FIG. 3. The content of a generic cell library stored in a disk file 134 and a register transfer level (RTL) description, also known as a behavioral description, stored in disk file 132 are provided to a logic synthesis tool 114. The generic cell library 134 provides descriptions of the basic building blocks of any design. Logic synthesis tool 114 generates a gate level description of the circuit indicated in the RTL description. Together with the RTL description, logic synthesis tool 114 generates a gate level block netlist 115. Block netlist 115 uses the cells provided by the generic cell library stored in disk file 134 to implement the behavior of the circuit to be designed. Block netlist 115 is provided to a library definition tool 116. In library definition tool 116, portions of block netlist 115 are combined to form a new hybrid set of cells. The new set of cells is represented by a hybrid netlist referred to as an optimized block netlist 117. Optimized block netlist 117 is provided to a place and route, parasitic extraction, and timing verification tool 128. From library definition tool 116, the optimized block netlist 117 is provided to a global size optimization tool 118. In global size optimization tool 118, the size of the individual transistors in the optimized block netlist is altered to satisfy the performance requirements specified in the RTL description provided by disk file 132. Global size optimization tool 118 subsequently provides a size netlist 119 to a power rail optimization tool 120. Power rail optimization tool 120 decides the dimension of the supply rail for each of the cells to be generated based on the current requirements for the optimized block netlist 117. The power calculated by power rail optimization tool 120 together with a sized netlist generated by global size optimization tool 118 are both provided to cell pitch optimization tool 122 to determine an optimal cell height. Once the optimal cell height is known together with the sized netlist, cell layout generation may begin.

The cell layout generation tool 110 is illustrated further in FIG. 4 and will subsequently be described in greater detail. After a layout is generated by cell layout generator 110, resistance and capacitance of all electrical nodes within that layout are extracted by extraction tool 124. This extracted information is provided to characterization tool 126 where the power consumption and performance of each circuit in the block netlist 117 is determined and provided as an optimized block library 127. The optimized block library 127 is provided to Place and Route, Parasitic Extraction, and Timing Verification tools 128. Place and Route, Parasitic Extraction, and Timing Verification tools 128 generate a physical implementation of a desired circuit. The physical design is stored in disk file 130. From tools 128, net parasitics are extracted and provided to a global size optimization tool 118. Global size optimization tool 118 uses the net parasitics to resize a netlist to further optimize performance of the physical design 130.

Figures 4, 7:
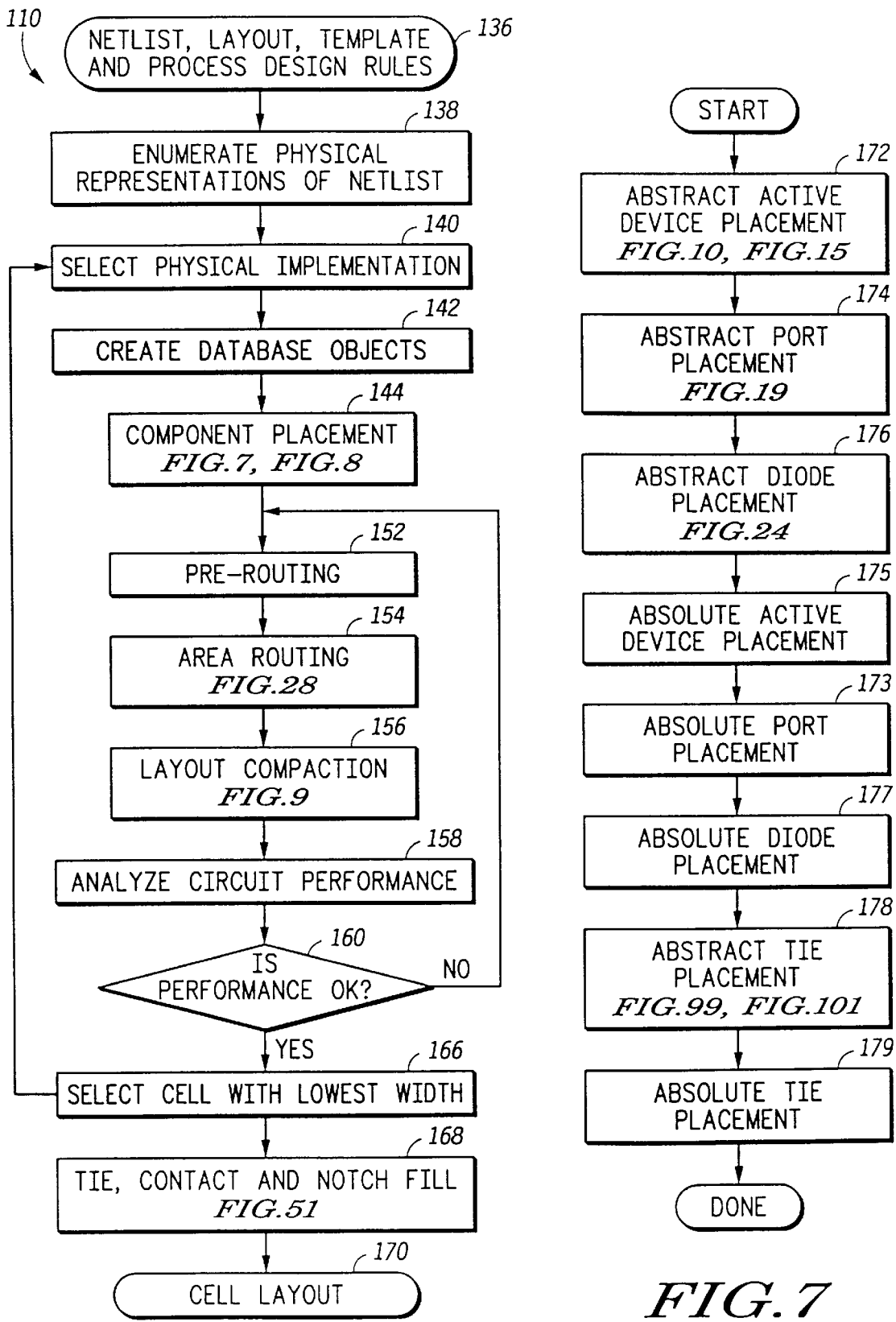
FIG. 4 is a flowchart that illustrates a methodology for generating and laying out standard cells in accordance with the cell generation system of FIG. 2.
FIG. 7 is a flowchart that illustrates component placement in accordance with a preferred embodiment of the present invention.
Figure 5:
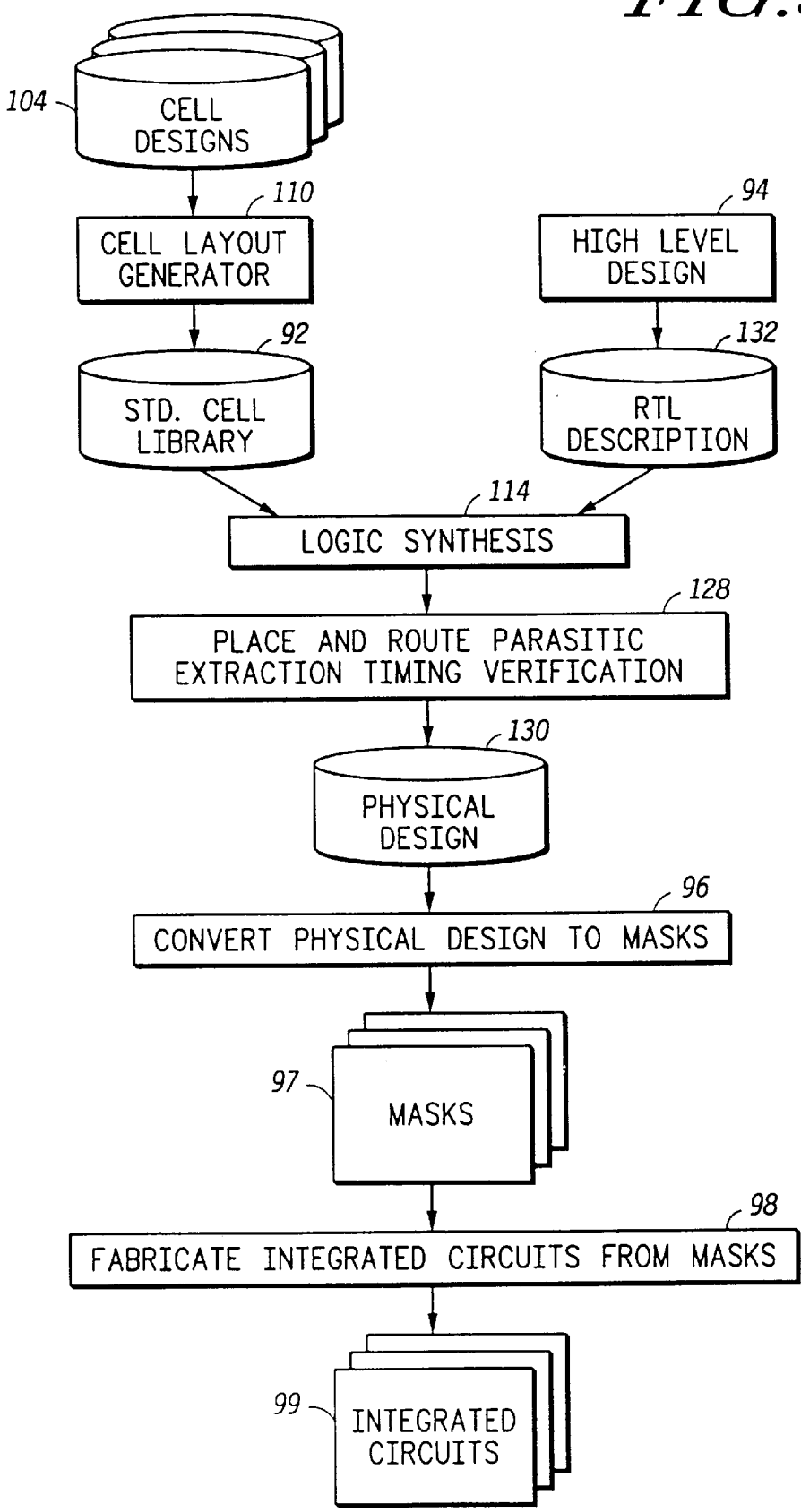
FIG. 5 is a block diagram that illustrates integrated circuit fabrication in accordance with one embodiment of the present invention.

FIG. 5 is a block diagram that illustrates integrated circuit fabrication utilizing the cell layout generation tool 110 further illustrated in FIG. 4. The cell layout generator 110 uses cell netlists 104 to generate a standard cell library 92. Each standard cell library 92 member was generated from one of the cell netlists 104. A high level design tool 94 is used to generate a RTL circuit description 132. A logic synthesis tool 114 combined with a Place and Route, Parasitic Extraction, and Timing Verification tools 128 generates a physical design 130 from the standard cell library 92 and the RTL description 132.

Figure 3:
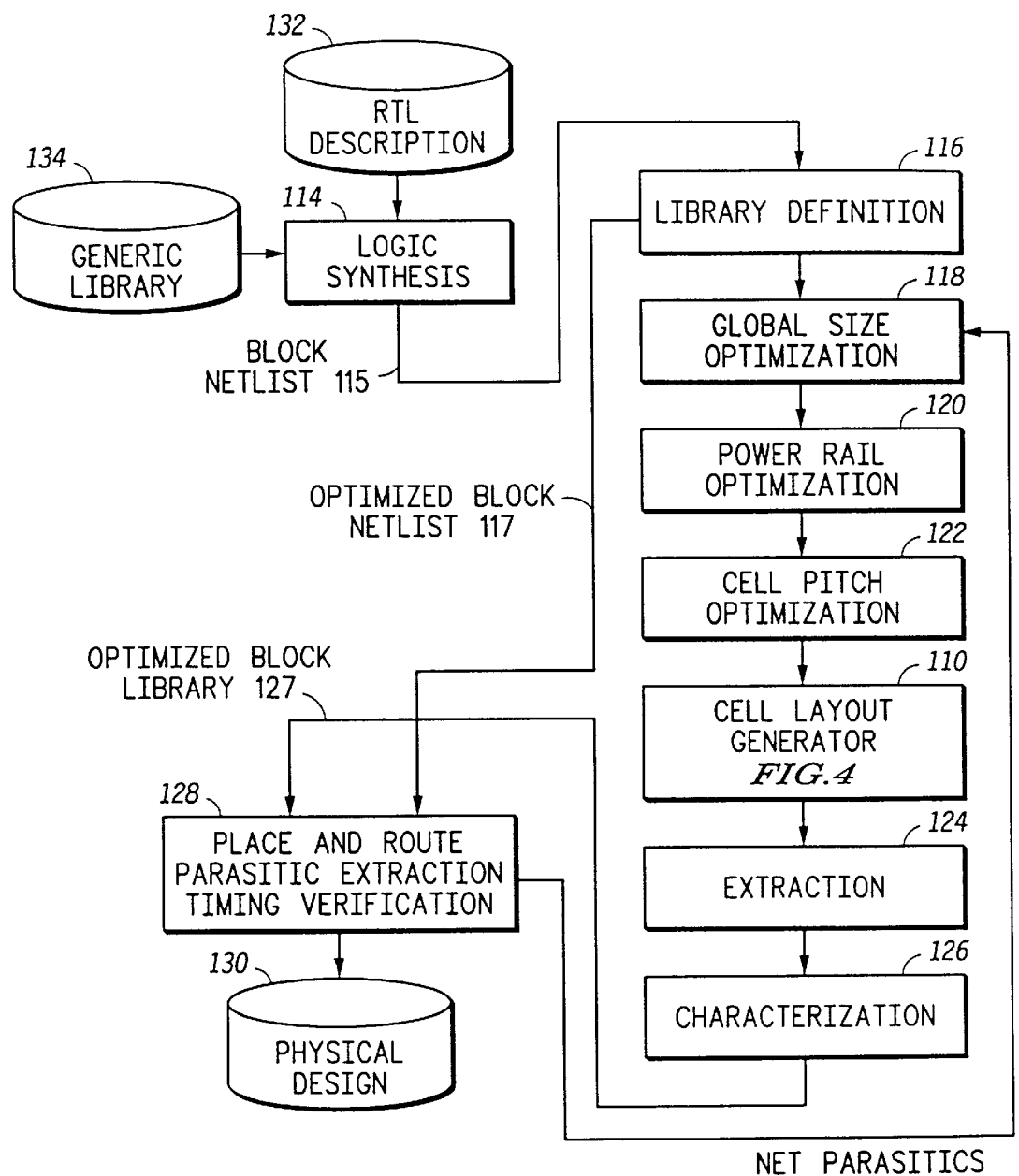
FIG. 3 is a block diagram that illustrates a design flow in accordance with one embodiment of the present invention.

The physical design file 130 includes integrated circuit dimensions, element dimensions, and element locations within the integrated circuit. The physical design file 130 locates elements and connections within a two-dimensional substrate area of an integrated circuit die. Preferably, the physical design file 130 includes physical structure for performing the functions of an integrated circuit design from which the physical design file was derived. The physical design 130 is converted 96 into a set of masks 97 corresponding to the layers in the physical design file 130. The masks 97 are used to fabricate 98 integrated circuits 99. Note that the elimination of steps 116 through 126 between Logic Synthesis 114 and Place and Route, etc. tools 128 from FIG. 3 is an alternate embodiment that does not provide the benefits disclosed in commonly assigned copending patent U.S. patent application Ser. No. 08/426,211 entitled: "METHOD AND APPARATUS FOR DESIGNING AN INTEGRATED CIRCUIT" by Larry G. Jones et al.

The methods taught herein are used to generate CAD (computer aided design) data files which contain information regarding the integrated circuit and placement of gates, transistors, and the like in the integrated circuit. These files are then used to form lithographic masks which are then used to form a plurality of integrated circuits on a plurality of wafers using an integrated circuit fabrication facility. The design phase is taught in "*Principles of CMOS VLSI Design: A Systems Perspective*", by N. H. E. Weste and K. Eshragian in the the VLSI Series by Addison-Wesley, 1985. The mathematical basis for many of the techniques are taught in "*Combinatorial Algorithms for Integrated Circuit Layout*" by Thomas Lengauer, copyright 1990, published by John Wiley and Sons. Fabrication techniques are outlined in "*Silicon Processing for the VLSI Era, Volume* 1: *Process Technology*", by Wolf and Tauber, copyright 1986, published by Lattice Press. Process integration is taught by the second book in the series: "*Silicon Processing for the VLSI Era, Volume* 2: *Process Integration*", by Wolf, copyright 1990, published by Lattice Press.

Figure 6:
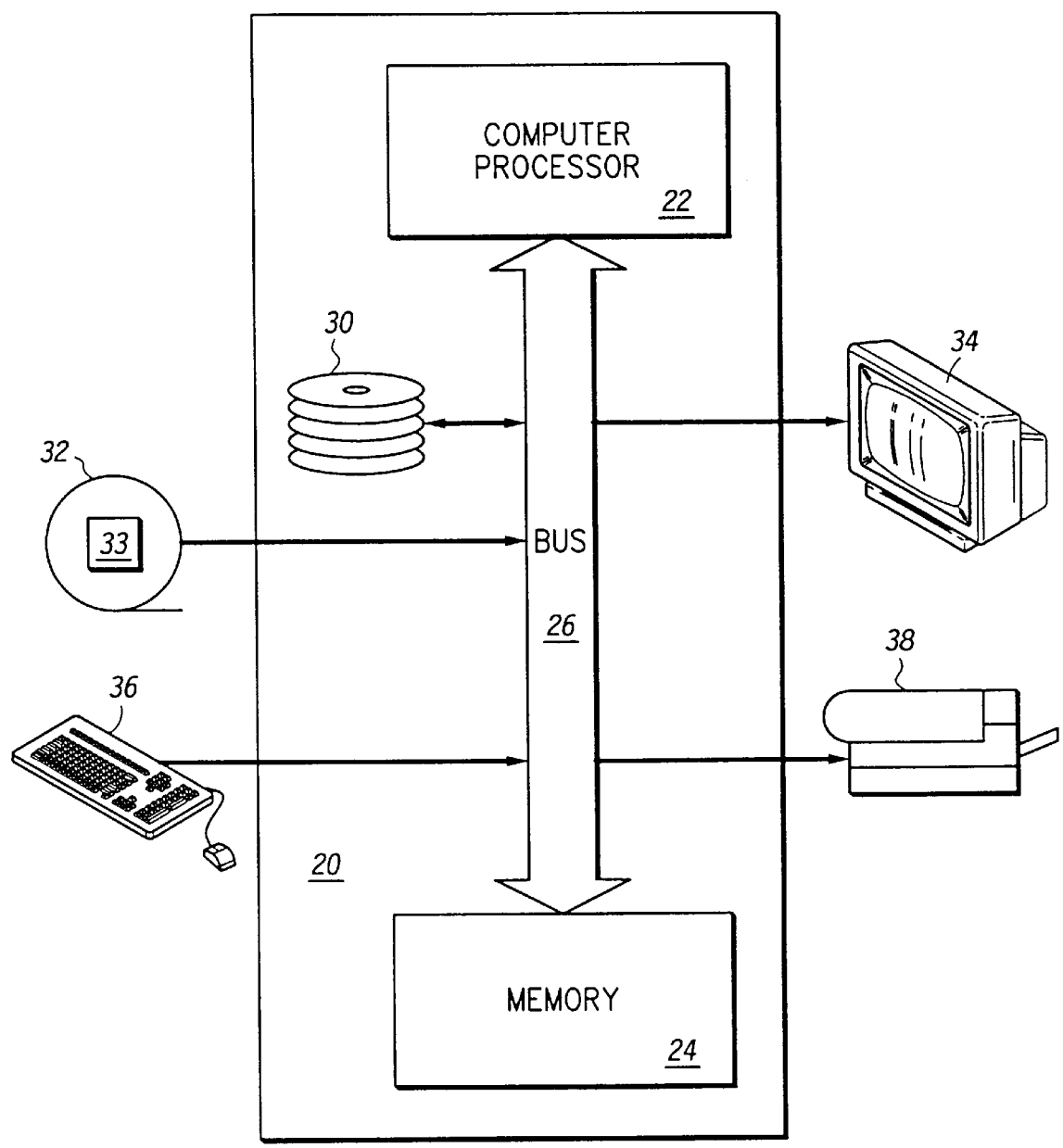
FIG. 6 is a block diagram that illustrates a General Purpose Computer.

FIG. 6 is a block diagram illustrating a General Purpose Computer 20 used to execute cell layout generator 110. The General Purpose Computer 20 has a Computer Processor 22, and Memory 24, connected by a Bus 26. Memory 24 includes relatively high speed machine readable media such as DRAM, SRAM, ROM, FLASH, EEPROM, and bubble memory. Also connected to the Bus are Secondary Storage 30, External Storage 32, output devices such as a monitor 34, input devices such as a keyboard (with mouse) 36, and printers 38. Secondary Storage 30 includes machine readable media such as hard disk drives, magnetic drum, and bubble memory. External Storage 32 includes machine readable media such as floppy disks, removable hard drives, magnetic tape, CD-ROM, and even other computers, possibly connected via a communications line. The distinction drawn here between Secondary Storage 30 and External Storage 32 is primarily for convenience in describing the invention. As such, it should be appreciated that there is substantial functional overlap between these elements. Executable versions of computer software 33, such as the cell layout generator 110 can be written to, and later read from External Storage 32 and loaded for execution directly into Memory 24, or stored on Secondary Storage 30 prior to loading into Memory 24 and execution. Also preferably stored on either Secondary Storage 30 or External Storage 32 are Process Design Rules 102, Cell Netlists 104, Library Style Templates 106, Optimized Block Library 127, Physical Design file 130, Generic Library 134, RTL Description file 132, and Standard Cell Library 92.

II. Overview of Cell Layout Generator

FIG. 4 illustrates cell layout generator 110 of the present invention in greater detail. In first step 136, a netlist, a layout template and process design rules are provided from an external memory source (not illustrated herein). The netlist, layout template and process design rules are the same as those previously described as described in FIGS. 2 and 3. Furthermore, it should be noted that cell layout generator 110 of the present invention includes additional template constraints which are not supported by prior art implementations. These new template constraints include port location designation, substrate and well tie styles, and diode styles.

Next, in step 138, a physical representation of the netlist is enumerated. In step 138, the logical input netlist provided in step 136 is transformed into several physical netlists which are functionally similar, but structurally distinct. For example, the physical netlist may include a different number of transistors or connections. The logical input netlist may be transformed into the physical netlist by a process commonly known as transistor folding, or by unfolding, or by other processes known in the art. Each of these folded netlists will produce a different cell layout structure. These folded netlists are then ordered based on increasing estimated cell widths and processed by succeeding stages in cell layout generator 110.

Furthermore, when physical representations of the netlist are enumerated, the present invention uniquely allows for vertical stacking of the same type of transistor. For example, two N-type transistors may be stacked upon each other and then be followed by a P-type transistor. Additionally, both N-type and P-type transistors may be vertically stacked. Therefore, it should be noted that two N-type transistors may be stacked with two P-type transistors. Furthermore, it should be noted that two N-type transistors may be stacked between P-type transistors, or vice versa. This ability to vertically stack transistors of the same type increases the flexibility of the present invention in laying out cell structures. The greater flexibility translates to greater density and more narrow cells which are often sought in cell layout designs.

In subsequent step 140, a physical implementation is selected by cell layout generator 110. Once each of the folded netlists are ordered, cell layout generator 110 selects a cell structure which is most likely to comply with a specified cell height as determined by the template input in step 136. Cell layout generator 110 moves from a first one of the folded netlist to a next in the order established in step 138 until the best compliant layout is determined.

In a next step 142, database objects are created by generating an actual physical layout of the transistors specified by the folded netlist. It should be noted that there are many different types of objects which may be created. For example, there are active devices such as transistors, and there are also ports, diodes, and ties. Additionally, other objects not specifically discussed herein may also be created by this invention.

After the database objects are created, transistor placement is performed in step 144. Transistors are ordered in a two-dimensional array to minimize an inner connection length and cell area required in the layout. Also in step 144, a simulated annealing based approach for cell layouts, which have cell architectures not previously explored by automatic layout synthesis tools, may be used. The methodology used in step 144 supports a variety of layout styles such as multiple rows of transistor regions and transistor regions with vertically stacked devices (as previously discussed). Furthermore, in addition to minimizing a length of interconnects used in this transistor placement step, the present invention also minimizes channel density such that routing density is also reduced.

Component placement step 144 will now be described in greater detail. Basically, component placement step 144 includes steps necessary for placement of active devices such as transistors, and other devices such as ports, diodes, and ties. In general, component placement step 144 is implemented to minimize an interconnection density and length between each of the aforementioned components. Component placements step 144 is illustrated in greater detail in both FIG. 7 and FIG. 8.

FIG. 7 illustrates a first embodiment of component placement step 144. In first step 172 of FIG. 7, steps for abstract active device placement are executed. During abstract active device placement, active devices such as transistors are placed in a two-dimensional array to minimize the interconnection length and cell area. Another important factor which is considered during this step is the minimization of Channel Density. During this abstract step 172, the order of the transistors is primarily determined, but the actual physical coordinates of those transistors are not determined. Subsequently, in step 174, an abstract port placement step is executed. In this step, ports for both input and output signals are placed in locations which minimize the length of their interconnection to gates, sources, and/or drains of transistors. It should be noted that ports are placed after the active devices are placed because ports must be connected to active devices and that connection won't be known before the active devices themselves are placed.

Abstract diode placement is implemented in step 176. During this step, it should be noted that diodes are usually placed near input ports. Therefore, after the input port is placed, a diode may then be placed as close as possible to the input port. Subsequently in steps 175 and 173, active devices and the ports are absolutely placed. During this absolute placement step, both active devices and ports are given actual geometric locations. With respect to active devices, a geometric location is determined on the basis of a location of contacts in the cell layout. If a contact is located between two active devices, a greater distance is required between the two active devices. Similarly, if no contact is located between the two active devices, a shorter distance may be used. As previously mentioned, once the geometric location of the active device is determined, the placement of the port can be calculated because it must be as close as possible to the active device to which it connects to. Furthermore, in this step, a vertical spacing between active devices, such as transistors, is decided on the basis of Channel Density determined during the steps executed during abstract active device placement in step 172.

Subsequently, absolute diode placement is executed in step 177. This step is executed at this point because the absolute location of the input ports has been determined. Next, abstract tie placement is performed at step 178. Once transistors or active elements are placed, the locations of power and ground connection to the source and drains of transistors are known, and these locations are helpful in abstract placement of substrate and well ties. In absolute tie placement step 179, the actual geometric co-ordinates are assigned to ties based on the geometric locations of transistors and their source/drain connections. Furthermore, to ensure sufficient room for ties at appropriate locations, tie placement is performed before a general routing stage. If necessary, a subsequent router step may be used to solve a problem of interconnecting well or substrate ties to power or ground supply rails.

A primary objective of tie placement step 178 is to determine a set of substrate and well tie locations that will produce design rule compliant layouts at the end of a cell layout synthesis. A secondary objective is to minimize an impact of routing, power and ground signals to well and substrate ties on a layout area.

Figure 8:
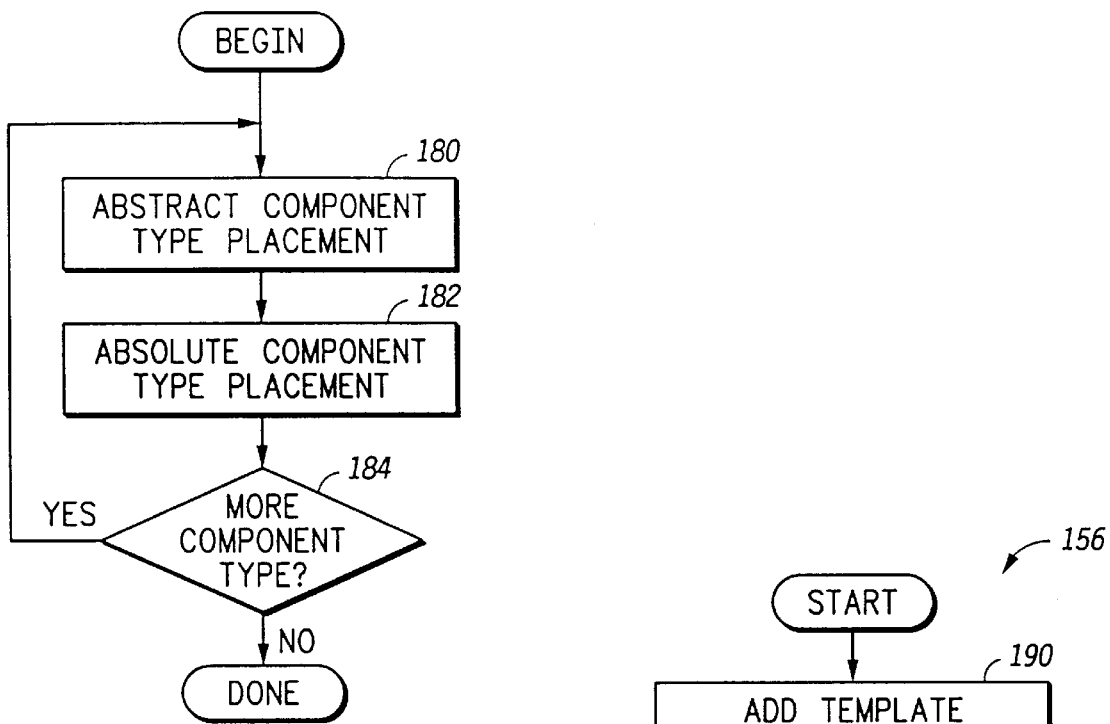
FIG. 8 is a flowchart that illustrates component placement in accordance with a second embodiment of the present invention.

FIG. 8 illustrates an alternate embodiment of component placement step 144. It should be noted that each of the components utilized in cell layout synthesis has a different priority level when determining their respective placement locations. In one embodiment of the implementation of the invention described herein, active devices such as transistors have the highest priority. Therefore, components such as transistors should be placed before any other components. Secondary components include ports, and therefore, ports should be placed after transistors are placed but before any other type of component is placed in the layout. Lastly, components such as diodes and ties are placed. These elements are placed only after active elements and ports have been placed in a cell layout. This priority scheme is inherent in the methodology illustrated in FIG. 8. For example, abstract placement of component types is performed first in step 180. Within step 180, active elements will be placed first, ports will be placed second, and each will be followed by other components such as diodes and ties. Components are then absolutely placed in step 182. At this point, each of the components is given its exact geometric location within the cell layout. Again, the priority scheme described above is implemented. Therefore, active elements are placed first, followed by ports, and then, diodes and ties. At that point, in step 184, the methodology implemented in FIG. 8 determines whether or not more component types should be placed. If no more components should be placed, the placement step is done. If more components should be placed, the placement methodology repeats, performing steps 180–184 for the additional components needing placement.

After the components are placed, pre-routing is performed as step 152. In pre-routing step 152, sources and drains of adjacent transistors which receive the same signal are connected with Diffusion wiring. Diffusion contacts are also added to the source and drain connections if other connections to non-adjacent gates, sources, or drains are required.

Subsequently, area routing is performed as step 154. In area routing step 154, all of the signals connecting the active devices, ports, diodes, and ties are routed in accordance with the layers specified in a template provided in step 136. Each routing layer is given preference in wiring direction and cost parameters to control wiring length and a number of vias. In the area routing technique implemented by the present invention, routing is accomplished by a combination of maze search, layer assignment, and rip-up-and-reroute heuristics.

Figure 9:
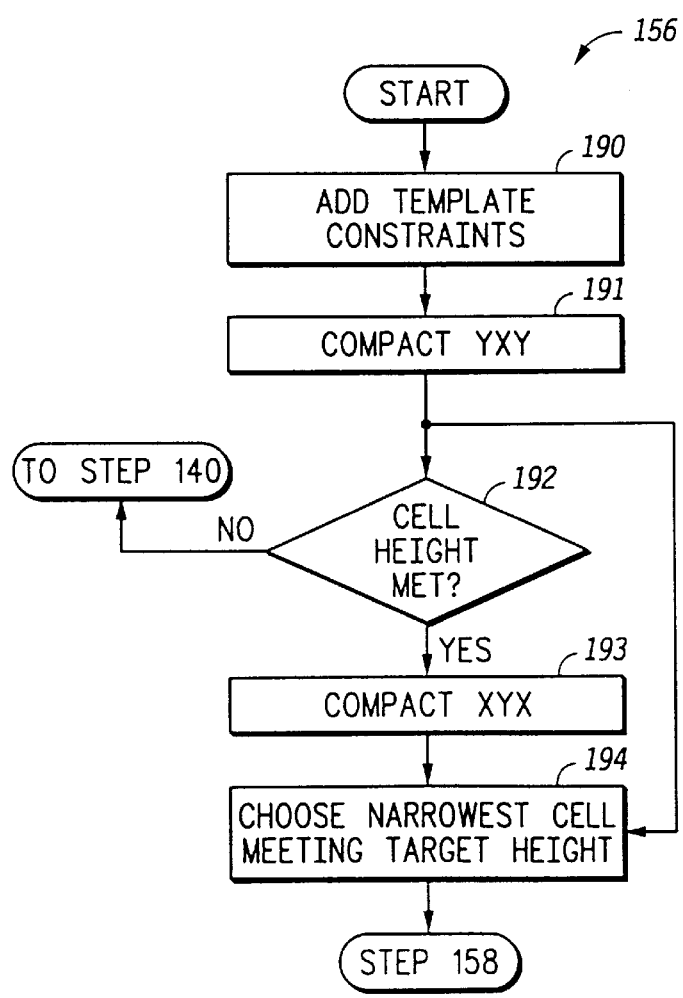
FIG. 9 is a block diagram that illustrates layout compaction in accordance with one embodiment of the present invention.

After connections between the transistors, ports, diodes, and ties are completed, a resulting layout must be compacted to provide for the most efficient area utilization possible. Compaction is accomplished in step 156. FIG. 9 illustrates layout compaction step 156 in greater detail. The layout compactor implemented in FIG. 9 is a one-dimensional constraint-graph based algorithm. It compacts a layout first in one dimension (say X) and then in a second dimension (say Y). One of the characteristics of the graph based approach implemented in FIG. 9 is that results in the first compaction direction are usually better than results in the second direction.

Template constraints are then added as step 190 of FIG. 9. These constraints include cell height, well height, an X and Y grid for a bounding box, an X and Y grid for input and output ports, and the distance of power and/or ground rails from a cell boundary. After the template constraints are added in step 190, compaction is performed as step 191.

After the first compaction step 191 is executed, the resulting layout is tested to determine whether or not the required cell height is met. If the cell height is not met, the program flow reverts to step 140. If the cell height is met, a second compaction step is performed as step 193. This compaction step 193 is in an opposite direction from the first compaction direction executed in step 191. For example, if in step 191, compaction was attempted in a YXY sequence, then compaction is executed in an XYX sequence in step 193. It should be noted that it is important to compact in a Y direction first because if a layout resulting from a compaction in the Y direction does not meet a required cell height, a layout resulting from a first compaction in the X direction will not be within a required cell height specification. Assuming that cell height is met in both the compaction steps 191 and 193, the narrowest cell generated in steps 191 and 193 is selected in step 194. After the narrowest cell is chosen in step 194, program flow reverts to step 158 in FIG. 4. In step 158, the layout area of critical interconnects are analyzed for performance. In general, larger area of certain layout elements, such as Diffusion or polysilicon, indicates slower circuit performance which may be unacceptable. If this is the case with the layout chosen in step 194, the layout is reverted back to step 152, with the same component placement as before. Modified steps of pre-routing step 152, area routing step 154 and layout compaction step 156 are attempted until a satisfactory layout is obtained in step 160.

The cell with a lowest width is then determined in step 166. This cell is determined from all physical implementations generated from steps 144 through step 160. After the cell with the lowest width is determined, a step of tie, contact, and notch filling is executed.

Tie, contact, and notch filling is then performed as step 168. Tie filling step 168 may be required to be executed as compaction step 156 does not guarantee satisfaction of tie-coverage design rules. Step 168 is designed to add substrate and well tie Diffusion wherever possible without violating design rules. This step enhances tie coverage and performance of the final layout without increasing cell area. Finally, notch and contact filing are performed. Notch filling adds geometry to prevent internal and external notch errors. Contact filling identifies Diffusion areas that can accommodate metal contacts in order to minimize resistance and increase circuit performance.

As a result of executing each of steps 136 through 168, a cell layout is generated in step 170. It should be noted that the methodology disclosed herein is a fully automated process and does not require external user intervention or manual manipulation of the layout design. As such, both latency associated with layout development and overhead costs are also significantly decreased.

III. Selected Topics

A. High Density Transistor Placement

Figure 1:
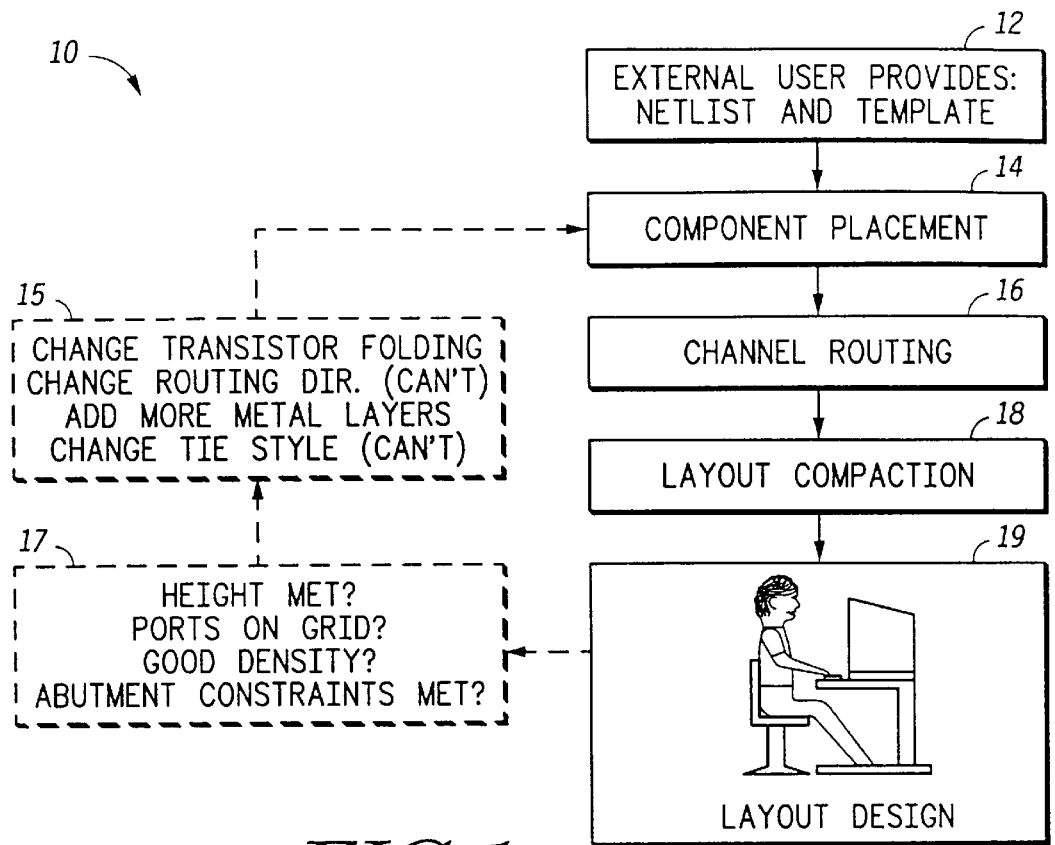
FIG. 1 is a block diagram that illustrates a cell layout generation system in accordance with a prior art implementation.

The process of transistor-level layout synthesis includes a step of placing transistors. This step is included in component placement step 14 of prior art FIG. 1. During the step of placing transistors, a horizontal and vertical location, as well as an orientation, of each transistor must be determined. The transistors are subsequently interconnected by the routing of wires which may be implemented as metal, polysilicon, or another conductive substance. A very substantial fraction of the area consumed by a cell layout consists of area occupied only by these conductive wires. Therefore, the size of a cell with a given transistor placement may be accurately estimated before routing only by accurately estimating the overall routing area of the cell. Additionally, local routing is important to measure because it also affects the size and performance of the cell which is laid out. The measurements used to estimate local routing area include the vertical alignment of transistor terminals that are electrically connected, as well as the measurements of the number of drain-source connections which are connected by Diffusion abutment. The latter measurements are especially important in two-terminal connections.

Many prior art solutions have attempted to find transistor placement that results in minimum cell area. Traditionally, the best estimator of layout width is the number of Diffusion breaks in a transistor placement; similarly, the best estimator of layout height includes the channel routing density of the placement. Therefore, the transistor placement minimization problem is to minimize a cost function that includes the number of Diffusion breaks and channel routing density. However, prior art solutions have recognized that this process of minimizing such a cost function is computationally intractable when a deterministic algorithm is used, even for series-parallel circuits. For more information see the article entitled, "*Minimum Area Layout of Series-Parallel Transistor Networks is NP/Hard*" by Chakravarty et al. published in IEEE Transactions on Computer-Aided Design, Vol. CAD-10, pgs. 943–949, July 1991. Prior art solutions have basically taken three different approaches to solve problems associated with generating transistor placements which result in minimum area cells. In a first prior art solution, a restricted version of the problem is solved with a deterministic algorithm. Such algorithms can find minimum width layouts. Additionally, such algorithms can find a minimum height in restricted cases. For example, a transistor placement algorithm described in "*Layout Minimization of CMOS Cells*" by applicant Robert L. Maziasz and John P. Hayes allows for the minimum height for a multi-gate series-parallel circuit for a given placement of the gates to be found. In addition, for up to 5 gates, this method by Maziasz and Hayes may be extended to find a gate placement that yields an optimal height for the cell by trying all permutations of the gates. However, this prior art implementation is too computationally expensive beyond this number of gates and heuristic methods must be employed.

A second prior art approach uses optimization techniques such as iterative improvement with multiple starts or simulated annealing. These prior art methods employ transistor moves that generate only legal or feasible placements. These optimization methods inherently have the potential to find globally optimal solutions; however, when the search space is highly restricted, the final solution may not be globally optimal, because some placements are not reachable or are only reachable with great difficulty from a given initial placement. Restricting the search space reduces the number of candidate placements whose cost needs to be evaluated; therefore, this restriction allows such methods to use the traditionally inefficient method of calculating channel routing density, called the left edge algorithm (LEA). This prior art placement approach cannot find a globally optimal solution because all solutions are not reachable. An example of this prior art method is reported in "*A multiple row-based layout generator for CMOS cells*" by G. Lakhani and S. Rao, published in the Proceedings of the International Symposium on Circuits and Systems, pgs. 1697–1700, 1990, which uses iterative improvement with multiple starts for multiple rows of transistors. Another example is described in "*Efficient area minimization for dynamic CMOS circuits*" by B. Basaran and R. Rutenbar, published in the Physical Design Workshop, pgs. 150–153, 1996, which uses simulated annealing for a single row of transistors. A third example is described in "*CMOS leaf-cell design using simulated annealing*" by Q. Wu and T. Sloane and is published in the Proceedings of the Midwest Symposium on Circuits and Systems, pgs. 1516–1519, 1992, which uses simulated annealing for multiple rows of cells, not transistors.

A third prior art approach also uses iterative improvement with multiple starts or simulated annealing, but relaxes the constraint that only legal placements be generated. Such relaxation techniques typically assign a high cost to such illegal placements so that none are present in the final solution. The result is that all placements are more easily reachable from a given initial placement, so that a globally optimal solution can be found. However, the search space is greatly increased, so that the prior art solution did not deem it computationally feasible to estimate routing area by using channel routing density, since the traditional LEA method is computationally expensive. Therefore, an inferior but computationally more efficient routing estimator was used, namely total wire length. This prior art approach finds a globally optimal solution to an inaccurate cost function. An example of this approach is provided in an article entitled, "*Optimal CMOS Cell Transistor Placement: A Relaxation Approach*" by A. Stauffer and R. Nair, published in the Proceedings of the International Conference On Computer-Aided Design, pgs. 364–367, November, 1988, which uses either iterative improvement with multiple starts, or simulated annealing, for multiple rows of transistors.

In summary, none of the methods disclosed in the prior art implementations efficiently find minimum width and minimum height layouts for general circuits of arbitrary size. Therefore, layouts produced by prior art methods are usually significantly larger than necessary.

The present invention provides a method for placing transistors which employs a relaxation version of the optimization method previously referred to as simulated annealing. This simulated annealing optimization method using relaxation techniques allows very near optimal solutions to comparatively complex problems to be determined. Unlike other prior art implementations which used such a technique, the present invention uses accurate and computationally efficient routing estimation methods to find optimal or very near optimal width and height solutions to the transistor placement problem. The transistor placement technique of the present invention will now be described in greater detail.

The present invention may be used to implement abstract active device placement step 172 of FIG. 7. It should be noted that the present invention which will be subsequently described provides a method for transistor placement in a traditional two-row layout style. While a two-row layout is a primary context for implementation of the method for transistor placement described herein, other layout styles may also be used. During a following discussion, the term two-row layout style will be used to describe a layout style in which two Diffusion regions, one a P-type and one an N-type, are placed with routing in-between each of the two Diffusion regions to form interconnects between transistors. Routing can also occur over the active devices as well as in the regions above and below them. Other layout styles, which will subsequently be described in greater detail, include a stacked layout style. In the stacked layout style, a plurality of rows of N-type Diffusion regions and/or a plurality of rows of P-type Diffusion regions are provided. There are local interconnects between the plurality of rows of N-type Diffusions and there are local connects between the plurality of rows of P-type Diffusion regions. Furthermore, in the stacked layout style, there are global connections between the plurality of rows of N-Diffusion regions and the plurality of rows of P-Diffusion regions. With the environment in which the present invention will be implemented, provided above, a description of methodology of the present invention will subsequently be described. The preferred embodiment uses two rows of P-Diffusion regions and two rows of N-Diffusion regions.

During execution of the methodology of the present invention, a folded transistor-level net list is provided to step 172. Subsequently, in step 802, the present invention performs random initial transistor placement. During this random initial transistor placement in step 802, transistors are placed without regard for an optimal placement solution. Subsequently, in step 804, the present invention incrementally modifies the initial placement by moving a set of contiguous transistors. Prior to performing the move operation, a move type is selected as well as a size of the move window. A move type which may be selected in the present embodiment of the invention disclosed herein is one of an H1 or an H2 move, although it is not limited to these move types. An H1 move swaps a transistor in a left-most position with a transistor in a right-most position. Similarly, an H1 move swaps a transistor in a left-most minus 1 position with a transistor in a right-most minus 1 position. This swapping process may also be referred to as reflection. A second type of move operation implemented by the present invention is referred to as an H2 move. During execution of an H2 move, two rows of transistors are reflected about a vertical axis which is located at a mid-point of the move window. The type of move operation which is executed is randomly selected. Additionally, the width of the move window is also arbitrarily selected between a maximum and a minimum move window size. The maximum and minimum window side are experimentally determined.

A legal placement is one in which horizontally adjacent source/drain terminals of horizontally adjacent transistors are electrically connected in the circuit. Legal moves always generate legal placements. Illegal moves relax this constraint and generate illegal placements, in which horizontally adjacent source/drain terminals of horizontally adjacent transistors are not electrically connected in the circuit. A explicit Diffusion break is required to be inserted in between such pairs of transistors to prevent their neighboring terminals from electrically shorting together. The present invention allows illegal moves to be selected. Since a given transistor placement typically contains both transistors and explicit Diffusion breaks, these breaks are moved in between such illegal placements during the transistor placement process, as a consequence of the move process. Once moved into such a position, explicit breaks will typically remain in between illegal placements, since such illegal placements are assigned a very high cost.

After the move type and the move window size are determined, the present invention executes a function to evaluate cost of the move step 806. The Evaluate Cost of Move function, step 806, is illustrated in greater detail in FIG. 11. Note that the cost of the move can be determined before making the actual move.

Figure 13:
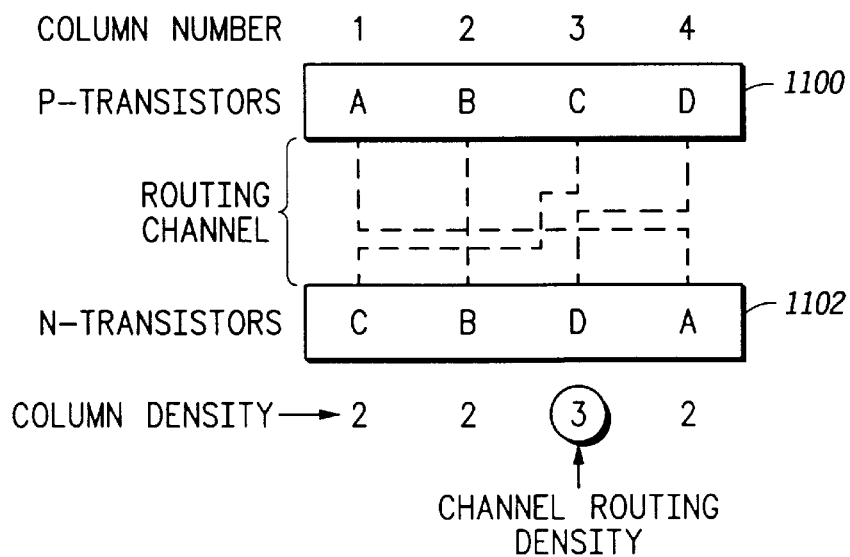
FIGS. 13 and 14 are block diagrams that illustrate channel routing and Channel Routing Density in accordance with one embodiment of the invention.

Before beginning a more detailed description of step 806, a description of the methodology used to calculate Column Density and Channel Routing Density will be described in greater detail. For use and understanding the concepts of Column Density and Channel Routing Density, refer to FIG. 13. As illustrated in FIG. 13, a P-type Diffusion region 1100 implements P-transistors A, B, C, and D. Also, N-type Diffusion region 1102 implements N-transistors C, B, D, and A. To calculate a Column Density, corresponding transistors in each of the P-type region 1100 and the N-type region 1102 are theoretically connected via dotted lines. If columns are then viewed, a number of horizontal lines crossing each column determines a Column Density. For example, the column which includes P-type transistor A and N-type transistor C, includes two horizontal lines. Therefore, a corresponding Column Density is 2. Similarly, the column including P-type transistor C and N-type transistor D, includes 3 horizontal lines. Therefore, the corresponding Column Density is equal to 3. A Channel Routing Density corresponding to the circuit illustrated in FIG. 13 is the maximum of all the Column Density values. The terms, Column Density and Channel Routing Density will subsequently be used during a discussion of the methodology of the present invention.

Referring again to FIG. 11, in step 900, a new Column Density is calculated for the transistors included in the Move Window determined in step 804. The Column Density count for the Move Window is subsequently calculated in step 902. The Column Density count value indicates the number of columns which have a certain column density. For example, if a Move Window includes four columns and two of those columns have a Column Density of two (2), one column has a Column Density of three (3), and the fourth column has a Column Density of one (1), the Column Density count value would indicate that there are two columns having a count density of 2, one column having a count density of 3, and one column having a column density of 1. Additionally, in step 902, the maximum Column Density before the move operation is executed is saved in step 902, and maximum Column Density after the move operation is executed are saved. In step 904, the maximum Column Density value after the move is compared with the Channel Routing Density of the whole layout, and not merely to the Channel Routing Density of the transistors within the Move Window. If the maximum Column Density after the move is greater than the channel routing density, a new channel routing density is set to the maximum Column Density after the move in step 906. It should be noted that the maximum Column Density after the move operation and the maximum Column Density before the move operation apply only to the columns included within the Move Window.

If the maximum Column Density after the move operation is not greater than the channel routing density, step 908 is executed. In step 908, it is determined whether or not the maximum Column Density before the move operation is executed is equal to the channel routing density. If the maximum Column Density before the move is equal to the channel routing density, a new channel routing density value is set to a largest non-zero Column Density in a step 912. The largest non-zero Column Density value corresponds to a largest Column Density value of the largest Column Density in the entire layout and not merely the move window. However, if the maximum Column Density before the move is not equal to the channel routing density, the new channel routing density is set to the old channel routing density in step 910.

Figure 14:
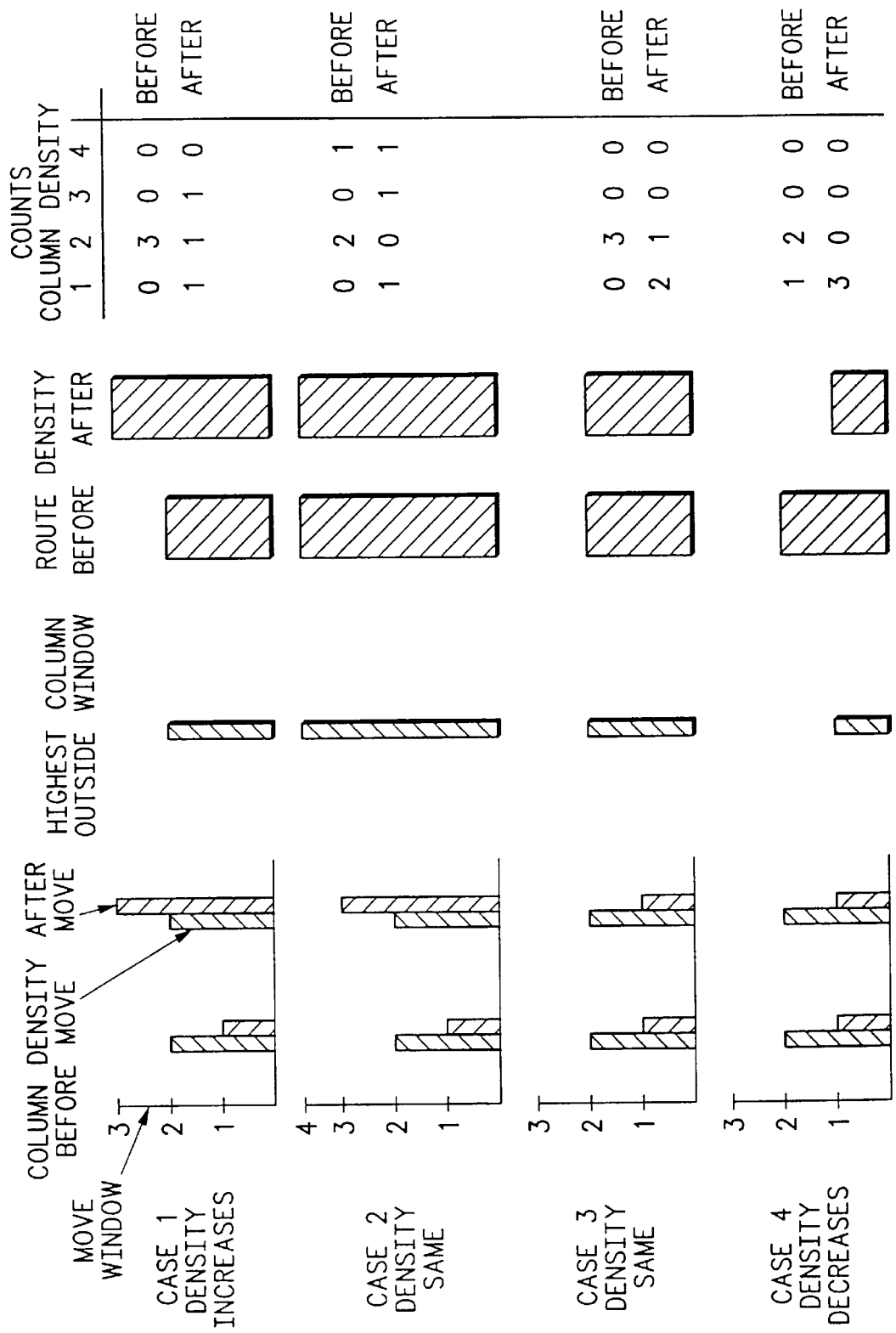

When determining a value of the new channel routing density, it should be noted that the present invention includes a method for efficiently calculating the largest Column Density without exclusively considering a Column Density of all columns of the layout. An example of execution of evaluate cost of moves step 806 is illustrated in FIG. 14. Referring to Case 1 of FIG. 14, Column Densities for the Move Window are calculated before and after a move operation. In Case 1, an overall Channel Routing Density increases. In the first column, the Column Density before the move was equal to 2 and the Column Density after the move was equal to 1. Additionally, in the second column, the Column Density before the move was equal to 2 and the Column Density after the move operation was executed is equal to 3. Furthermore, the largest Column Density outside the Move Window is equal to 2.

The chart included in FIG. 14 indicates a Column Density count value for each case. Before the move operation, 3 columns with column density equal to 2 are shown for the entire layout. After the move operation is executed, the count density of each column in the layout is again calculated. After the move, there is one column having a Column Density of 1, one column having a Column Density of 2, and one column having a Column Density of 3. Because the Channel Routing Density is determined to be the maximum of all Column Densities, the Channel Routing Density increases to 3 after the move operation is executed in Case 1. It should be emphasized that the Channel Routing Density is calculated by looking only at the changes in Column Density of the columns included in the Move Window. This results in a calculation of Channel Routing Density which is much more efficient than any implemented by prior art implementations.

Case 2 in FIG. 14 illustrates a case in which the Column Density of the first column is equal to 2 before a move operation and is equal to 1 after the move operation. Additionally, in Case 2, the Column Density of the column before the move operation is executed is equal to 2 and the Column Density of the second column is equal to 3 after the move operation. Furthermore, in Case 2, the highest column density outside the Move Window is equal to 4. In Case 2, therefore, the Channel Routing Density remains at the highest Column Density value both before and after the move operation. Thus, the move operation has no effect on the Channel Routing Density. Referring to the chart indicating a column density count value for Case 2, it should be noted that the layout includes two columns which have a Column Density of 2 and one column which has a Column Density of 4 before the move operation. After the move, the layout includes one column which has a Column Density of 1, one column which has a Column Density of 3, and one column which has a Column Density of 4.

Case 3 illustrates an example in which the first column has a Column Density of 2 before the move and a Column Density of 1 after the move operation is executed. Additionally, the second column has a Column Density of 2 before the move operation is executed and a Column Density of 1 after the move operation is executed. The highest Column Density outside the Move Window is 2 for the layout illustrated in Case 3. As with previous Case 2, the channel routing density of Case 3 is not affected by the move operation because the highest Column Density outside the window is the same as or higher than the highest Column Density within the Move Window.

Case 4 illustrates a situation in which the column density of the first column is equal to 2 before a move operation is executed and is equal to 1 after the move operation is executed. Case 4 also illustrates that a second column has a column density of 2 before the move operation is executed and a column density of 1 after the move operation is executed. Outside The Move Window, the highest Column Density is equal to 1. Therefore, after the move operation, the Channel Routing Density changes from 2 to 1.

Figure 11:
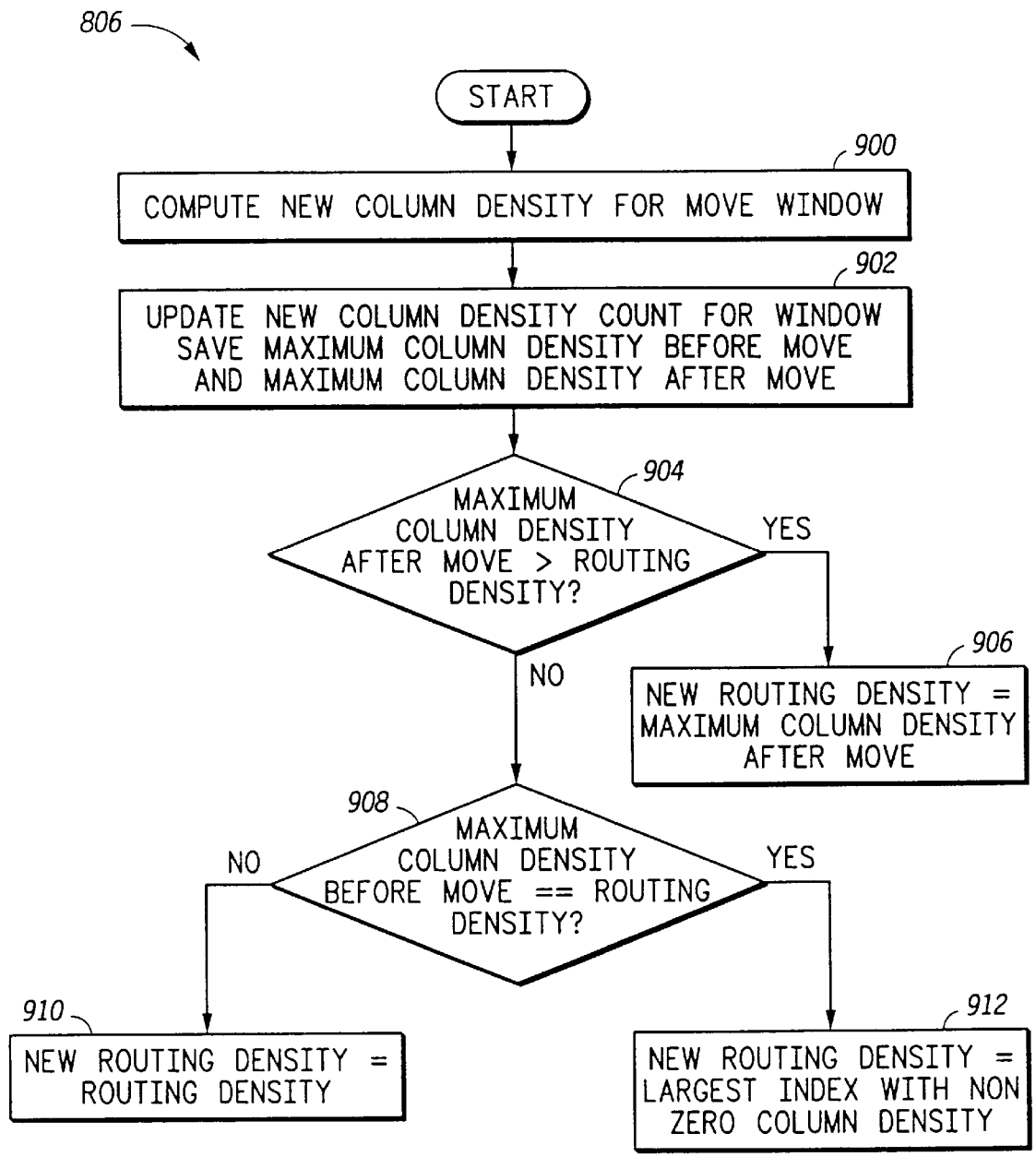

To understand how the example illustrated in FIG. 14 corresponds to the methodology implemented in FIG. 11, it should be noted that the new Column Density values computed in step 900 correspond to the Column Density values illustrated in Cases 1–4 after a move operation is executed. Furthermore, the maximum Column Density before the move operation value of step 902 corresponds to a maximum Column Density of all columns implemented within a Move Window before the move operation is executed. Additionally, it should be noted that the maximum Column Density after the move operation value of step 902 corresponds to a maximum Column Density value of all columns implemented within the Move Window after the move operation is executed. The Channel Routing Densities of steps 904 and 908 correspond to the Channel Routing Density before the move operation as illustrated in FIG. 14. The new Channel Routing Density value of steps 906, 910, and 912 of FIG. 11 correspond to the Channel Routing Density value after the move operation of FIG. 14.

When executing step 912, the new Channel Routing Density value may be calculated using the Column Density count value chart illustrated in FIG. 14. The new Channel Routing Density value is equal to a largest index having a non-zero Column Density. To determine the largest index with a non-zero Column Density Value, the entries in the Column Density count chart of FIG. 14 may be referred to. First, the entries in the Column Density count chart at an index corresponding to the channel routing density must be reviewed. Subsequently, the index is decremented until the first non-zero count is found. As an example, refer to Case 4 of FIG. 14. In this case, the Channel Routing Density value corresponded to two (2) before the move operation was executed. Referring to the Column Density Count chart at index 2, it should be observed that the count is later equal to zero. Therefore, the index is decremented to 1 and the chart is evaluated to determine that the index 1 is the largest index with a non-zero count value of three(3). Therefore, the new Channel Routing Density equals the index 1. Furthermore, in viewing FIG. 11 and FIG. 14 together, it should be noted that case 1 of FIG. 14 corresponds to step 906 of FIG. 11. Similarly, Case 2 of FIG. 14 corresponds to step 910 of FIG. 11. As well, Cases 3 and 4 of FIG. 14 correspond to step 912 of FIG. 11.

Figure 10:
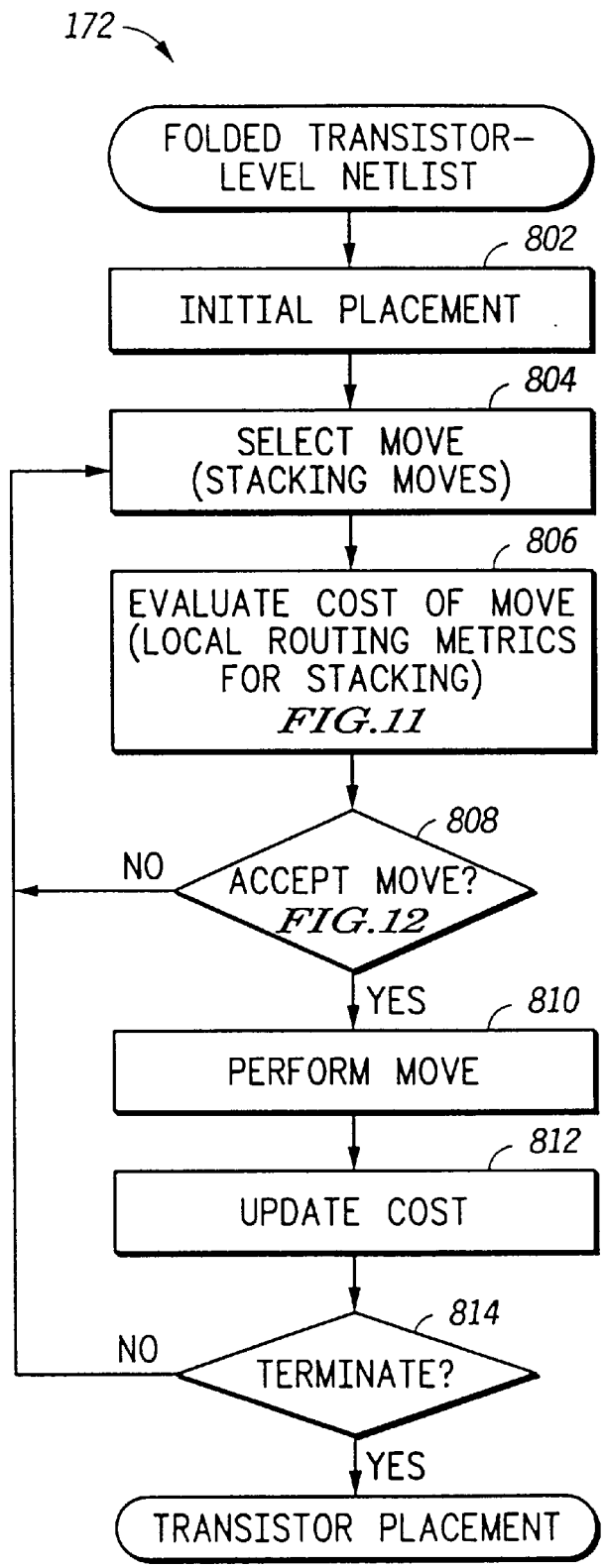
FIGS. 10 through 12 are flowcharts that illustrate Abstract Active Device Placement 172 in accordance with one embodiment of the invention illustrated in FIG. 7.

Referring again to FIG. 10, it should be noted that FIG. 11 only provides a methodology for evaluating a cost associated with increased channel routing density. It should also be noted that the cost associated with the move operation also reflect breaks in Diffusion regions, a horizontal wire length, a cell width, and a cell height. Calculation of each of these additional cost metrics is well known in the data processing art and will not be described in greater detail herein.

Figure 12:
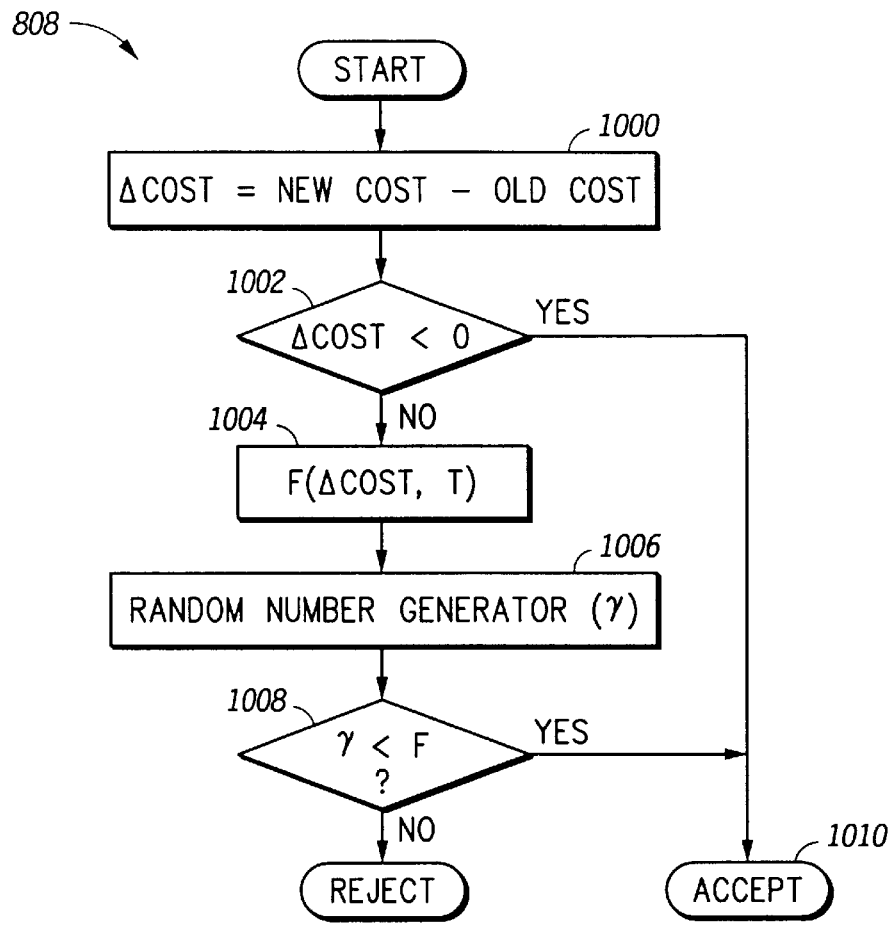

After step 806 is executed and the cost of a move operation is evaluated, the present invention must determine whether or not the move operation should be implemented in step 808. Step 808 is illustrated in greater detail in FIG. 12. In a step 1000, a change in cost, or delta cost, is calculated as the cost of the layout after the move operation less the cost of the layout before the move operation. In step 1002, it is determined whether or not the delta cost is less than zero. If the delta cost ($\Delta C$) is less than zero, the move operation is accepted or implemented. However, if the delta cost ($\Delta C$) value is not less than zero, a function of the delta cost ($\Delta C$) and the temperature (T) is calculated in step 1004. In the algorithm of the present invention, the temperature (T) is a parameter which is used to control the convergence of the algorithm to an optimal layout solution. The temperature (T) parameter is initially set to a value which allows a very high percentage of move operations to be accepted. The temperature (T) is subsequently lowered successively. The temperature (T) parameter is decreased, typically, by multiplying it by a number less than 1 until the algorithm of the present invention converges. Referring again to FIG. 12, the function F ($\Delta C$, T) of step 1004 may be represented by Equation 1:

$$f=F(\Delta C,T)=e^{-\Delta C/T} \quad (1)$$

The output (f) of F ($\Delta C$, T) is a number between zero (0) and one (1). Subsequently, in step 1006, a random number generator generates a random number (r) between zero (0) and one (1). In step 1008, the random number (r) generated in step 1006 is compared with the value of the function (f) of step 1004. If the random number (r) generated is less than the value of the function (f), the move operation is accepted in step 1010. However, if the random number (r) generated in step 1006 is greater than or equal to the value of the function (f) generated in step 1004, the move operation is rejected.

Note there that in the preferred embodiment, a "pseudo" random number generator is utilized. The advantage of this over a truly random number generator is reproducibility. One key element here is the apparent randomness of the random number generator. Therefore, a truly random number generator would generate acceptable results, at the cost of reproducibility. For these reasons, the above described Simulated Annealing techniques are considered to be non-deterministic algorithms, despite the use of a reproducible random number generator.

If the move operation is rejected, the program flow returns to a step 804 where a new move is selected. However, if the move operation is accepted, the move operation is performed in step 810 and costs associated with the move operation are updated in step 812.

Subsequently, it must be determined whether or not the algorithm implemented by the present invention has converged or "frozen" in step 814. A number of different methods of determining whether the system has reached a global minimum exist. For example, in the preferred embodiment, if a given minimum number of moves have been accepted or a maximum number of moves has been exceeded, the previously discussed temperature (T) parameter is multiplied by a value (A) (alpha), which is a number between zero and 1. If the maximum number of operations has been exceeded for preselected number of successive temperatures, T, the system is considered frozen and operation of the program terminates. If not, program control is returned to step 804 where a new move window is selected. Upon termination, the output is the transistor placement with a lowest cost of all placements generated.

In addition to calculating costs associated with channel routing density, the present invention also utilizes other parameters in determining the cost value. In addition to calculating channel routing density, a horizontal local routing metric is used to decrease the number of small Diffusion abutments. Such small Diffusion abutments connect exactly 2-terminals by placing the drain and source terminals of transistors in the cell horizontally adjacent to each other and by connecting the two terminals using a Diffusion wire. The result of using such abutments is that no metal or Diffusion contact is required. Therefore, a minimum distance between the two transistors is roughly reduced to half compared to a Diffusion abutment requiring a contact. Additionally, parasitic capacitance is reduced considerably. During cost determination, the number of small Diffusion abutments in each row is computed and used to more accurately determine cell width.

A vertical local routing metric included in the present invention involves vertical gate terminal alignment and vertical drain and source terminal alignment. The methodology of the present invention computes a number of such alignments and tries to maximize them. Such alignments result in denser layouts since straight wires without layer changes may be used to make these aligned connections.

The optimization methodology of the present invention enables transistors to be placed in significantly smaller layouts for circuits than any other prior art placement algorithm. Additionally, the present invention does so in a time efficient manner. It should also be noted that the implementation of the invention described herein is provided by way of example only.

B. Transistor Stacking

As previously described, the process of transistor-level layout synthesis includes a step of placing transistors. This step involves determining the horizontal and vertical location, as well as the orientation, of each transistor. The transistors are subsequently interconnected by the routing of conductive wires.

Traditionally, the transistors of a cell are placed in two horizontal rows, one for P-type transistors, and the other for N-type transistors. However, in standard cell design, where all cells have the same standard cell height, some cells can be made narrower by altering the cell architecture. Multiple horizontal adjacent rows may be used for both P-type and N-type transistors. This cell architecture allows transistors of a given type to be vertically aligned, or "stacked".

Prior art transistor placement methods have used various forms of such "stacked" cell architecture. For example, a program called Excellerator allows stacking of an arbitrary number of vertical transistors, but it restricts stacking to transistors that share a common transistor gate signal. The Excellerator program performs transistor stacking before transistors are connected by Diffusion wires to form chains. In a second prior art methodology, a system called in TOPOLOGIZER allows stacking of transistors with arbitrary connections. The methodology implemented TOPOLOGIZER does stacking during transistor placement, but uses an approach which does not include measurement of routing area in the cell height calculation. Therefore, the results of TOPOLOGIZER are usually far from optimal. Another transistor placement program, PAMS, provides for transistor stacking at the same time as transistor placement. The PAMS system, however, did not employ horizontal Diffusion abutment. Later, the CETUS program was provided that performs restrained stacking as a post-placement step in which P-N transistor pairs were stacked in the inner rows based on transistor sizes and local routing density.

The prior art implementations described above either fail to use the most accurate cost metrics, channel routing density, and Diffusion abutments, or allow only a restricted form of stacking; therefore, they fail to find a near optimal solution to the problem they are attempting to solve.

In contrast, the present invention provides a methodology which implements an unrestricted stacked placement of transistors that minimizes the best metrics of cell area, including channel routing density, horizontal Diffusion abutments, and local routing density.

The transistor placement algorithm of the present invention employs a relaxation version of the optimization method referred to as simulating annealing. The Simulated Annealing methodology is a general optimization technique that is able to find very near optimal solutions to combinatorial problems. The present invention utilizes the Simulated Annealing methodology to stack transistors by incorporating vertical transistor moves and local routing metrics between stacked transistors. Through the use of this methodology, the present invention produces high quality stacked transistor placements.

Figures 15, 16:
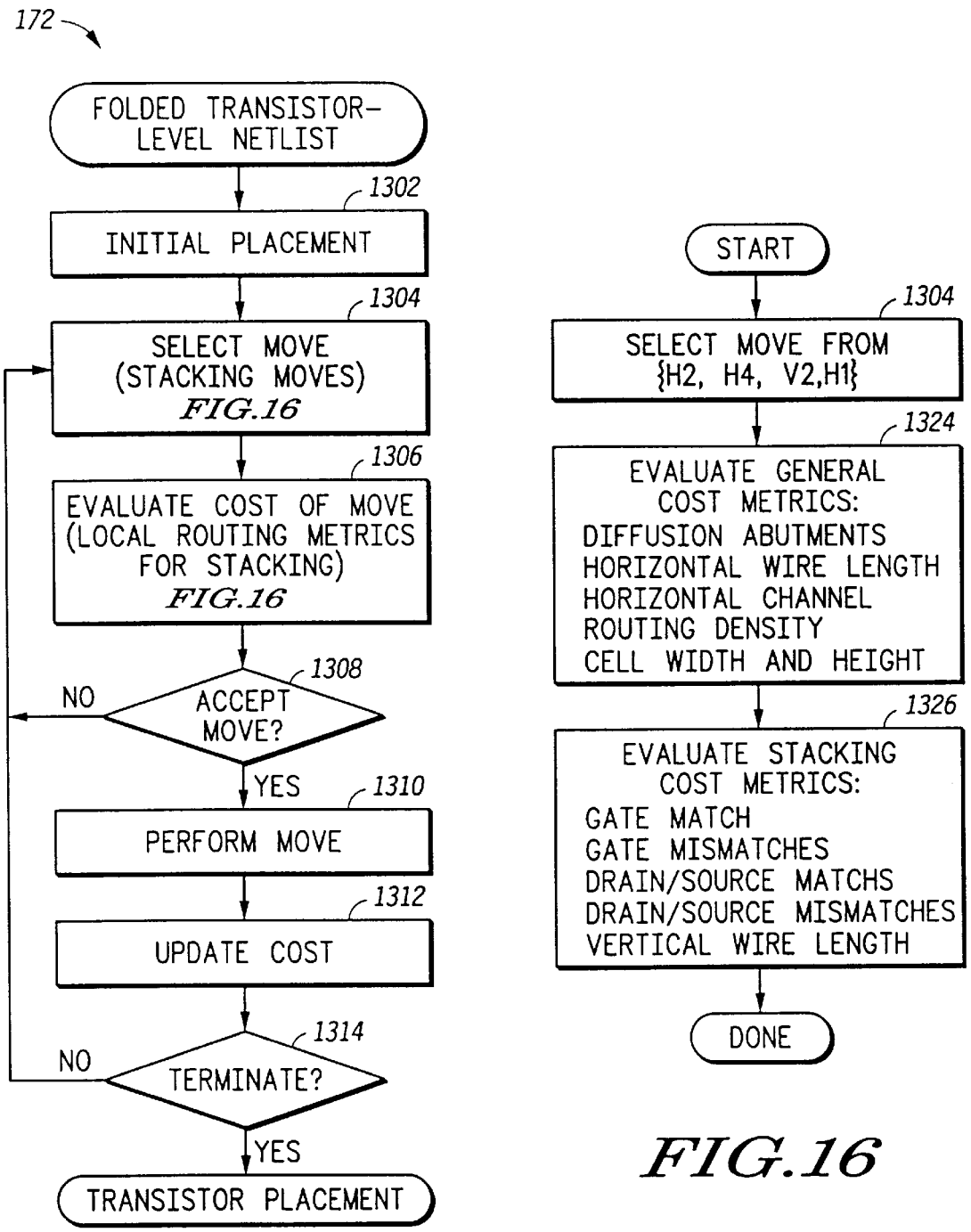
FIGS. 15 and 16 are flowcharts that illustrate Abstract Active Device Placement 172 in accordance with an alternative embodiment of the invention illustrated in FIG. 7.

FIG. 15 illustrates a second embodiment of abstract active device placement step 172. Prior to beginning step 172, a folded transistor-level net list is provided thereto. In step 1302, transistors to implement the cell are randomly placed in an initial step. Subsequently, in step 1304, a move operation is selected. Before implementing the move operation, however, the cost of the move operation is evaluated in step 1306. Each of steps 1304 and 1306 are illustrated in greater detail in FIG. 16.

In FIG. 16, a move operation is selected in step 1304. The move operations which may be selected include H2, H1, H4, and V2 move operation. Additionally, it should be noted that additional move operations may be implemented as desired by the system designer. In determining the operation executed by each of the move operations, it should be noted that the "H" in the move name indicates that a horizontal move occurs and the "V" indicates that a vertical move occurs. Furthermore, the number associated with the letters "H" and "V" indicate the number of rows of Diffusion regions, or transistors, involved in the move operation. As previously described, when executing a move operation, a reflection operation is executed such that a transistor in the left most position of the Move Window is transferred to the right most position of the move window. And the transistor in the right most position of the Move Window is transferred to the left most position of the Move Window. Similarly, depending on the window size, the transistor in the right most position minus one (1) is swapped with the transistor and the left most position minus one (1). Each of the move operations executed in step 1304 is implemented to allow the corresponding transistors to be configured for an optimal local connection. As previously mentioned, the "local connection" in stacked transistor placement refers to the connection between two rows of transistors of the same type.

After a move operation is selected in step 1304, the quality of the placement which will result from the move operation is evaluated in order to determine whether to accept or reject the proposed move. This evaluation step is executed in step 1306. In the first portion of step 1306, general cost metrics are evaluated, as shown in step 1324. It should be noted that the general cost metrics evaluated herein corresponds to the general cost metrics previously mentioned in Section A: High Density Transistor Placement. In the second portion of step 1306, cost metrics associated with evaluating stacking transistor placements are evaluated, as shown in step 1326. In evaluating stacking cost metrics, gate matches and mismatches, drain and source matches and mismatches, and vertical wire length parameters are evaluated.

To evaluate gate matches and mismatches and drain/source matches and mismatches, the numbers of matches and a number of mismatches are calculated. It should be noted that gate matches occur when transistor gate terminals electrically connected may be placed in a straight vertical line between two rows of transistors of the same type. Conversely, gate mismatches occur when electrically connected gates may not be placed in a straight vertical line between two same type transistor rows. Likewise, drain/source matches occur when the drains or sources of two transistors can be connected in such a straight line. Conversely, drain/source mismatches occur when drains or sources of two transistors in adjacent same type Diffusion regions may not be so connected.

In evaluating the aforementioned stacking cost metrics, each of the metrics is weighted by a predetermined factor to indicate its relative importance in the transistor placement algorithm. A cost associated with evaluating stacking metrics may be written as:

$$Cost = K_1 * Gate\_Matches + K_2 * Gate\_Mismatches + K_3 * Drain/Source\_Matches + K_4 * Drain/Source\_Mismatches + K_5 * Vertical\_Wire\_Length + \ldots + K_n * general\_cost\_metric \quad (2)$$

In one embodiment of the present invention, the weighting constants $K_1$ to $K_n$ respectively have the values of $K_1 = -1300$, $K_2 = 2100$, $K_3 = -1100$, $K_4 = 1200$, $K_5 = 10$. In the present embodiment of the invention, the stacking cost metrics associated with gate matches and mismatches and drain/source matches and mismatches are calculated by: 1. identifying all cases of local routing configurations: 2. identifying beneficial local routing configuration cases: 3. rating only the beneficial local routing configuration cases according to the relative benefit: and 4. assigning costs based on the relative position of these beneficial local routing configuration cases.

Figure 17:
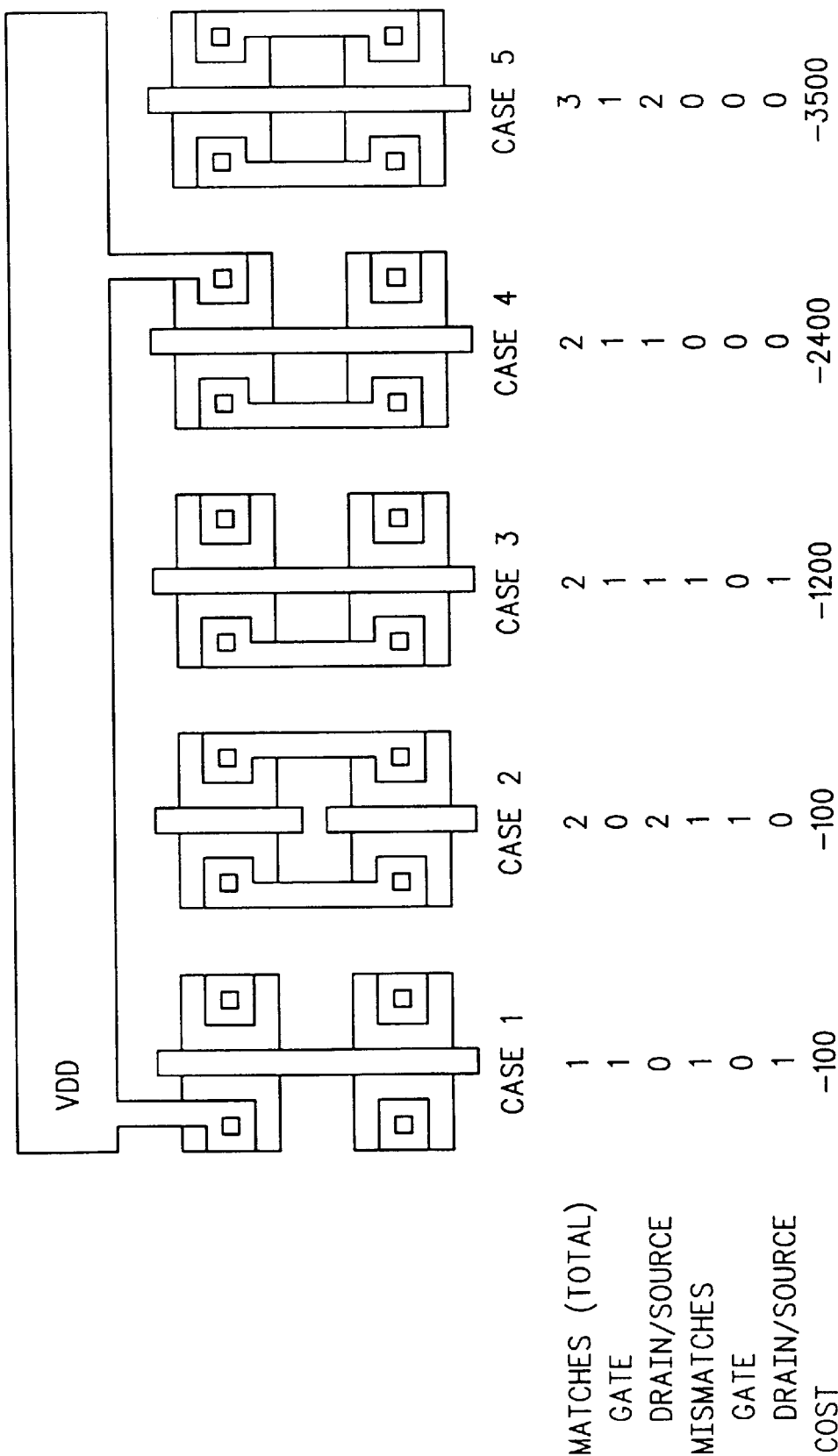
FIGS. 17 and 18 are circuit layouts illustrating a cost function in accordance with the method of FIGS. 10 et seq.

FIG. 17 illustrates an example wherein the beneficial local routing configuration cases have been identified, rated, and assigned costs. Referring to FIG. 17, Case 1 indicates a transistor configuration which has a total match count of 1, a total mismatch count of 1, and a cost of –100. The match count is a gate match and the mismatch count is a drain/source mismatch. Case 2 illustrates a system in which there are 2 matches, 1 mismatch, and a cost of –100. Of the matches, both are matches between the drain/source regions of the transistors. The mismatch is a result of gate mismatch. In Case 3, there are 2 matches, 1 mismatch, and an associate cost of –1200. Note that while the match and mismatch numbers of Case 2 are the same as Case 3, the type of match, specifically a gate match, in Case 3, makes Case 3 a much more attractive local routing solution. In Case 4, it should be noted that there are no mismatches even though the two transistors are not actually connected because one of the transistors is connected to a reference voltage supply rail. When one of the transistor is connected to a reference voltage supply rail, it is not included as a mismatch. Case 5 illustrates an optimal solution which has an associated cost of –3500 because it has no mismatches, 2 drain/source matches, and 1 gate match.

Referring again to FIG. 15, after the cost of the move operation is calculated in step 1306, step 1308 determines whether or not the proposed move operation should be accepted. Step 1308 is implemented in a similar manner to step 808 of FIG. 10. If the move operation should not be executed, program control is returned to Select Move step 1304. If the move operation is accepted, the move operation is performed in step 1310. Subsequently, the associated costs are updated to reflect the move operation in step 1312. After the costs are updated, it must be determined whether the stacked placement methodology should be terminated in step 1314. This step corresponds to step 814 of FIG. 10. If the move operation should not be terminated, program flow returns to Select Move step 1304. If the stacking placement algorithm of the present invention should be terminated, the transistors have been placed in an optimal manner.

Figure 18:
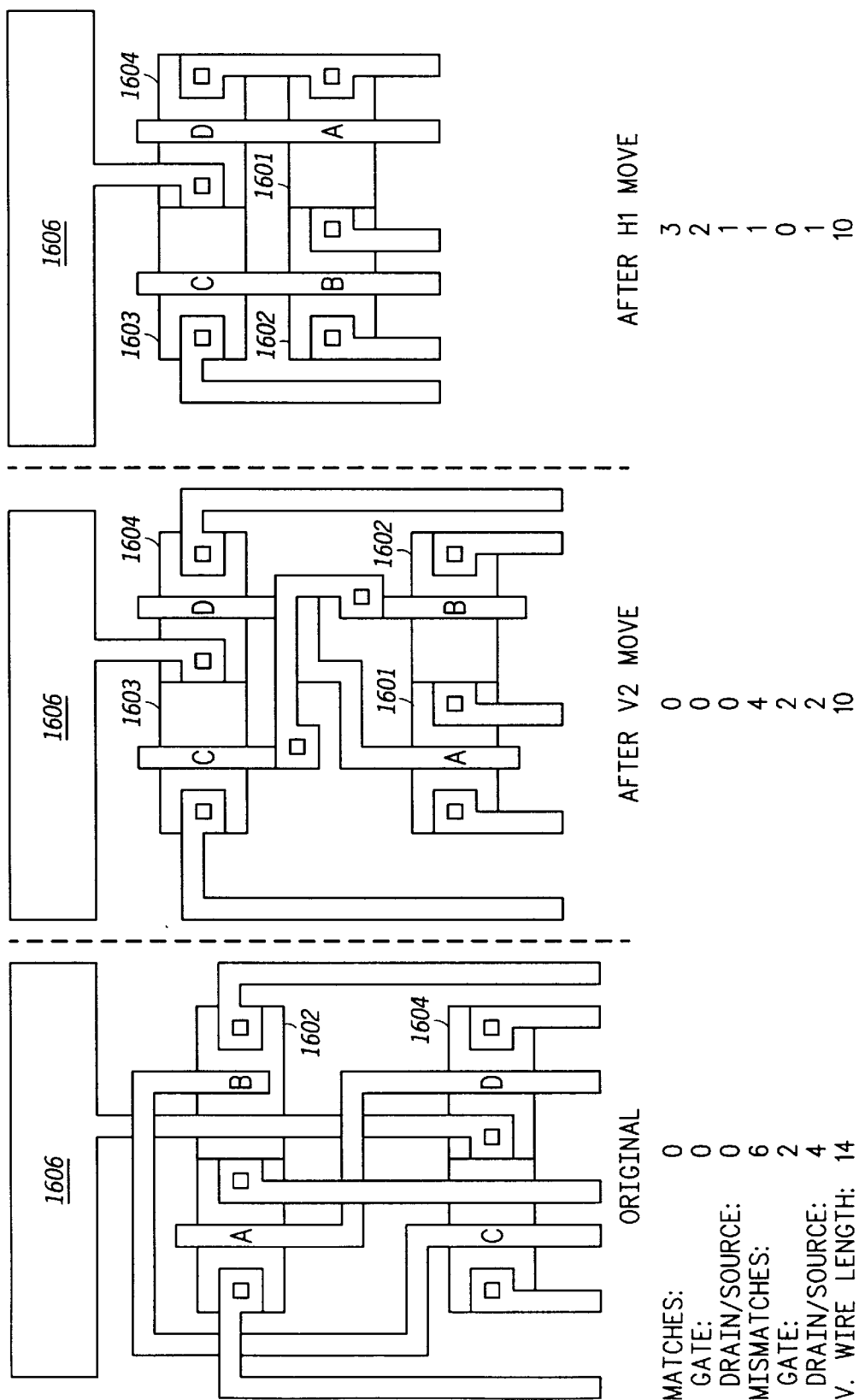

FIG. 18 illustrates an example of the stacking placement methodology implemented in the present invention. In the original placement which corresponds to initial placement step 1302, there are no matches, 6 mismatches, and a vertical wire length 14. A V2 move is subsequently selected in step 1304. After the V2 move, there are still no matches, but the number of mismatches has been reduced to 4 and the vertical wire length has been reduced to 10. Subsequently, the methodology of the present invention implements an H1 move. As a result of the H1 move, there are now 3 matches, only 1 mismatch, and a vertical wire length of 10. Thus, it may be seen that the invention provides an efficient methodology for optimizing a layout operation.

Through the use of the move operation and metric calculations described above, the stacking transistor placement algorithm of the present invention results in significantly smaller stacked transistor layouts for circuits which are provided in a time efficient manner. Since the general stacking operation, described above in Section A: High Density Transistor Placement Algorithm, is performed concurrently with the stacking transistor placement, both methodologies may be implemented to provide an optimal solution for any type of layout which is implemented.

C. Input/Output Port Placement

A description will now be given of the Abstract Port Placement shown in step 174 in FIG. 7. Traditionally Abstract Port Placement has been done either manually or by software. When done manually, Abstract Port Placement was done in a very time consuming, slow way. Manual placement of ports required that designers be able to comply with all required design rules and requires tremendous amounts of time for moderately large scale integrated circuits.

When Abstract Port Placement has been accomplished in the past by using software, it was typically done in the context of standard cells and typically involved only boundary port placement. A boundary port is a port which is placed always at a boundary of a cell in a cell layout. Since the only type of ports supported were boundary ports, software routines which were able to do boundary port placement were relatively straight forward and simple to implement. One disadvantage with the known commercially available layout tools has been that port assignment could be done only at a cell boundary, and thus port assignments for locations internal to cells was either not possible, or required significant amounts of manual intervention.

As technology has developed, and more than two metal layers have become common, it is now possible to route multiple metal layers over cells. The existence of three or more metal layers in semiconductor processes results in standard cells that can be placed adjoining each other and thereby reduces or eliminates dedicated routing channels which used to be required to exist between standard cells when two or fewer metal layers were used. As a result of using additional metal layers, access to abutting cells is preferably accomplished by internal port capability rather than boundary port capability. Previously sophisticated "place and route" tools have been able to locate in a very limited way internal port assignment. However, in order to have this capability, a programmer had to tell the "place and route" software in advance where acceptable port placement locations were in the layout, and in the internal portion of a cell for an internal port.

One commercially available "place and route" tool performing minimal port placement is "Gards" from Silver Lisco. Another commercially available "place and route" tool that has been able to do minimal internal port assignment is "ArcCell" from ArcSys. The ArcCell tool was able to find previously defined locations for internal ports as well as find any other available ports. One disadvantage with the ArcCell tool however has been that it required that a layout designer would have previously set enough room aside for any internal ports placed, and had to basically plan where the internal ports were going to be located in the cells. With all of that information, the ArcCell software could do some minimal internal port placement.

More recently in an article entitled, "*Efficient Standard Cell Generation When Diffusion Strapping Is Required*" by Guan and Sechen in the Fifth ACM/SIGDA Physical Design Workshop dated 1996, a description of a cell layout synthesis tool was provided. The Guan and Sechen tool was capable of doing internal port placement. However, their design was a modular design and had a restricted standard cell layout style. As a result there was little flexibility and inefficient utilization of space. The cell layout synthesis tool taught by Guan and Sechen scanned from one side of a layout cell to another. The methodology was to place transistors, route the cell, place the port to the left of gate signals until an output signal in the cell is met and put the internal ports to the right of the output signal on the right side of the gate signals. As a result of this uniform methodology, access to the internal ports was limited to no more than two directions.

Figure 19:
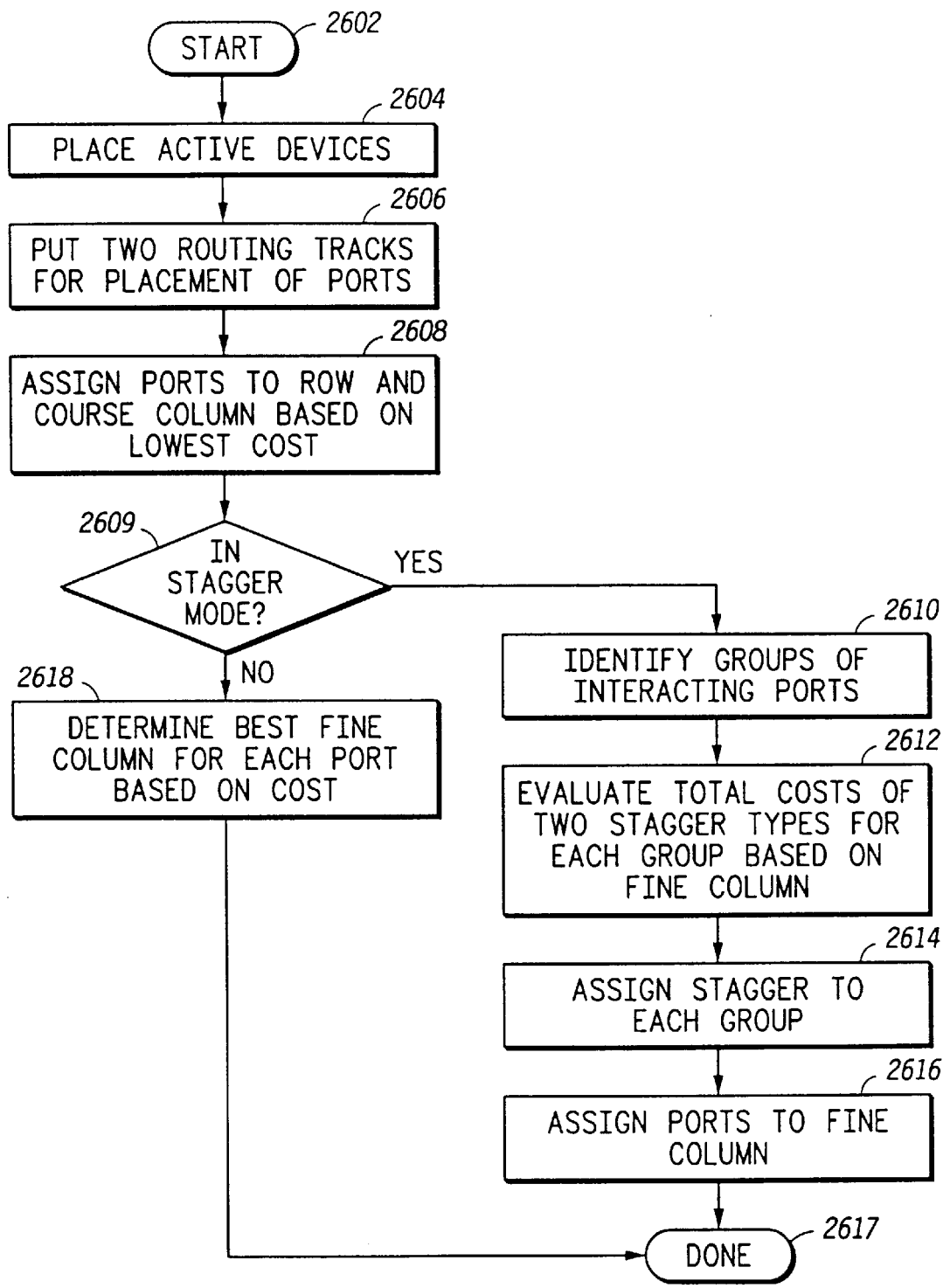
FIG. 19 is a flowchart that illustrates the operation of Abstract Port Placement shown in step 174 in FIG. 7.

Shown in FIG. 19 is a flow chart of the Abstract Port Placement methodology in step 174 in FIG. 7. FIG. 19 illustrates the internal port placement in accordance with the present invention. After starting with step 2602 the method shown in FIG. 19 is implementable in a layout software tool for transistor-level layout synthesis. First, active devices are placed, step 2604. In the preferred embodiment, the active devices occupy a multiple of three columns. The active devices are typically placed in the layout as columns and rows of active devices. In the preferred embodiment, two routing tracks are provided for placement of ports between two adjacent rows of active devices in step 2606.

In step 2608, an assignment of ports to a row and a "coarse" column is made based on a lowest cost factor. A cost factor determination is made in the assignment of a port to a "coarse" column based upon a number of cost factors. A first cost factor is the Column Routing Density. The density within each of the columns of active devices is determined and the least dense column is preferred in determining where internal ports are assigned. The second cost factor determination first involves an understanding of the concept of net spans. As mentioned above there is a plurality of rows and columns of active devices formed. Within each row there may be two or more active devices connected by a port net.

Figure 20:
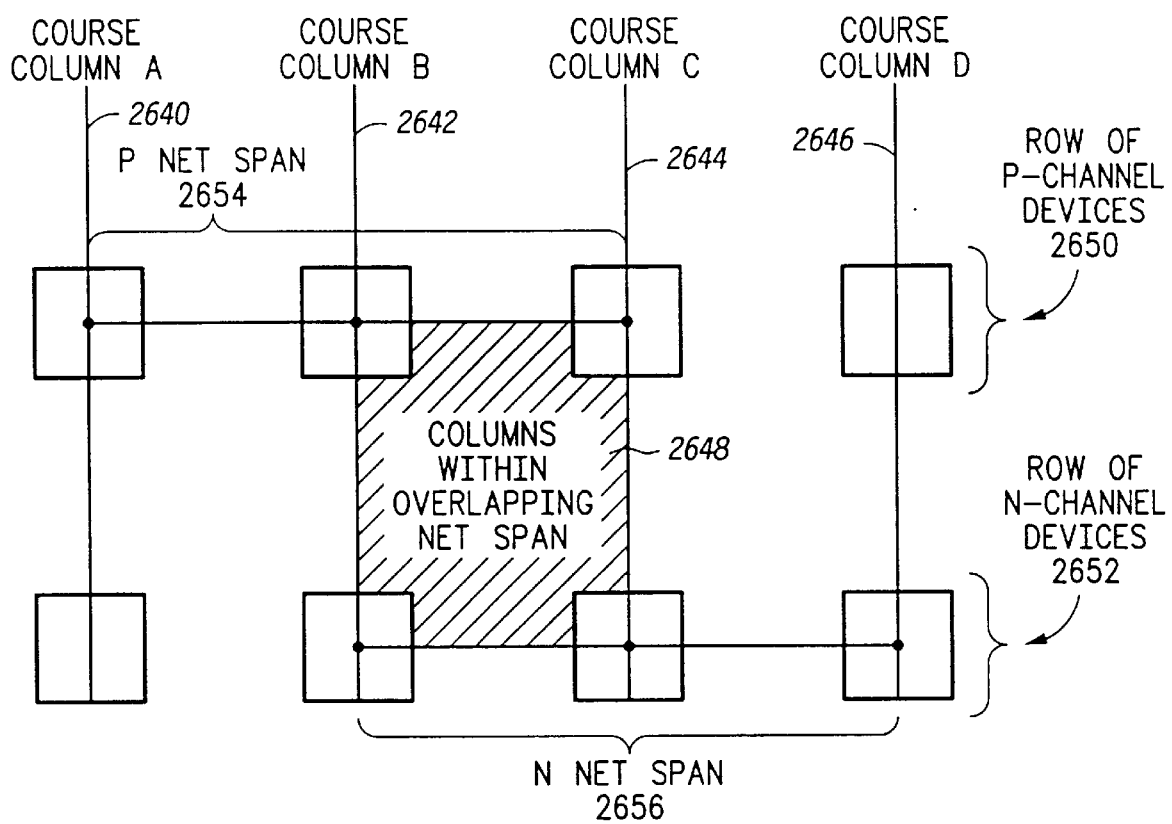
FIG. 20 is an example illustrating the cost factor of determining horizontal overlap of P and N-net spans in accordance with the method of FIG. 19.

Shown in FIG. 20 is an example illustrating the cost factor of determining horizontal overlap of P and N-net spans. FIG. 20 illustrates two rows 2650, 2652 of active devices which also form columns. In the first row 2650, the first three active devices are connected together to form a P-net span 2654. In the second row of active devices 2652 which are formed of N-channel devices in a preferred form, the second 2642, third 2644, and fourth 2646 columns of N-channel devices are connected together to form an N-net span 2656. Shown by two columns designated as columns shown in FIG. 20 are columns B 2642 and C 2644 designated by a hashing. These two columns are columns that fall within the overlapping net span 2648. As a result of the overlap, these two columns 2642, 2644 would be preferred among the four illustrated columns 2640, 2642, 2644, 2646 as the two columns in which an internal port should be assigned for the illustrated connected nets. It should be noted that in FIG. 20, there is a specific net between the first three P-channels of the top row 2650, and the same net spans the second, third and fourth N-channel devices. Therefore, the optimal placement for the internal port corresponds to only the port connected to this designated net. Optimal placement of other internal ports among the four columns 2640, 2642, 2644, 2646 will vary based upon other net assignments.

Another cost factor which is to be determined is the placement of an internal port relative to the active device to which it will be connected. It is desired to place an internal port directly adjacent to an active device to which a terminal of the active device will connect. An internal port which does not directly connect to an adjacent active device is less preferred in the cost factor analysis to one that does directly connect to an adjacent active device. A fourth and final cost factor in the placement of internal ports is the consideration of how many ports have been previously placed in a given column. The cost criteria here is to minimize the number of ports associated with a particular column. The theory is to spread the number of internal ports as equally as possible among the various columns. It should be noted in connection with the four recited cost factors that they are not given equal priority.

Returning to FIG. 19, after an assignment of ports to row and coarse column have been made in step 2608, a determination of whether or not to place the internal ports in a staggered mode is made in step 2609. Stagger Mode alternates the assignment of internal ports between alternating rows for successive columns. In order to optimize the number of directions in which a port is accessible by a "place and route" tool, staggering is very advantageous. When in Stagger Mode, "stagger" groups of interacting ports are first identified in step 2610. After a group of interacting ports has been identified, an evaluation in step 2612 is made of the total cost of two or more stagger types for each stagger group and is based on fine columns. The number of fine columns correspond to the number of terminals which an active device has and which can be defined to fall within a modular column in the rows and columns of the active devices.

In the layout process, Fine column alignment differs from a coarse column alignment because the latter is determined by the location of the active devices themselves. The fine columns are determined by the location of terminals such as sources, gates, and drains of active devices when those active devices are implemented as MOS transistors. Thus, a given column of transistors corresponds to a single "coarse" column, but the terminals of the transistors will correspond to three different "fine" columns.

In step 2612, the evaluation of the total cost is performed using the four cost criteria previously given in a connection with step 2608. Two "Stagger Types" or "Stagger Configurations" are mentioned in step 2612. This is based on the assumption that there are two corresponding port rows between rows of active devices. If there are more than two port rows there will be more than two Stagger Configurations possible. The preferred embodiment utilizes two Stagger Configurations, corresponding to two corresponding Stagger Rows. However, this method will work effectively with more Stagger Configurations and Stagger Rows.

Figure 21:
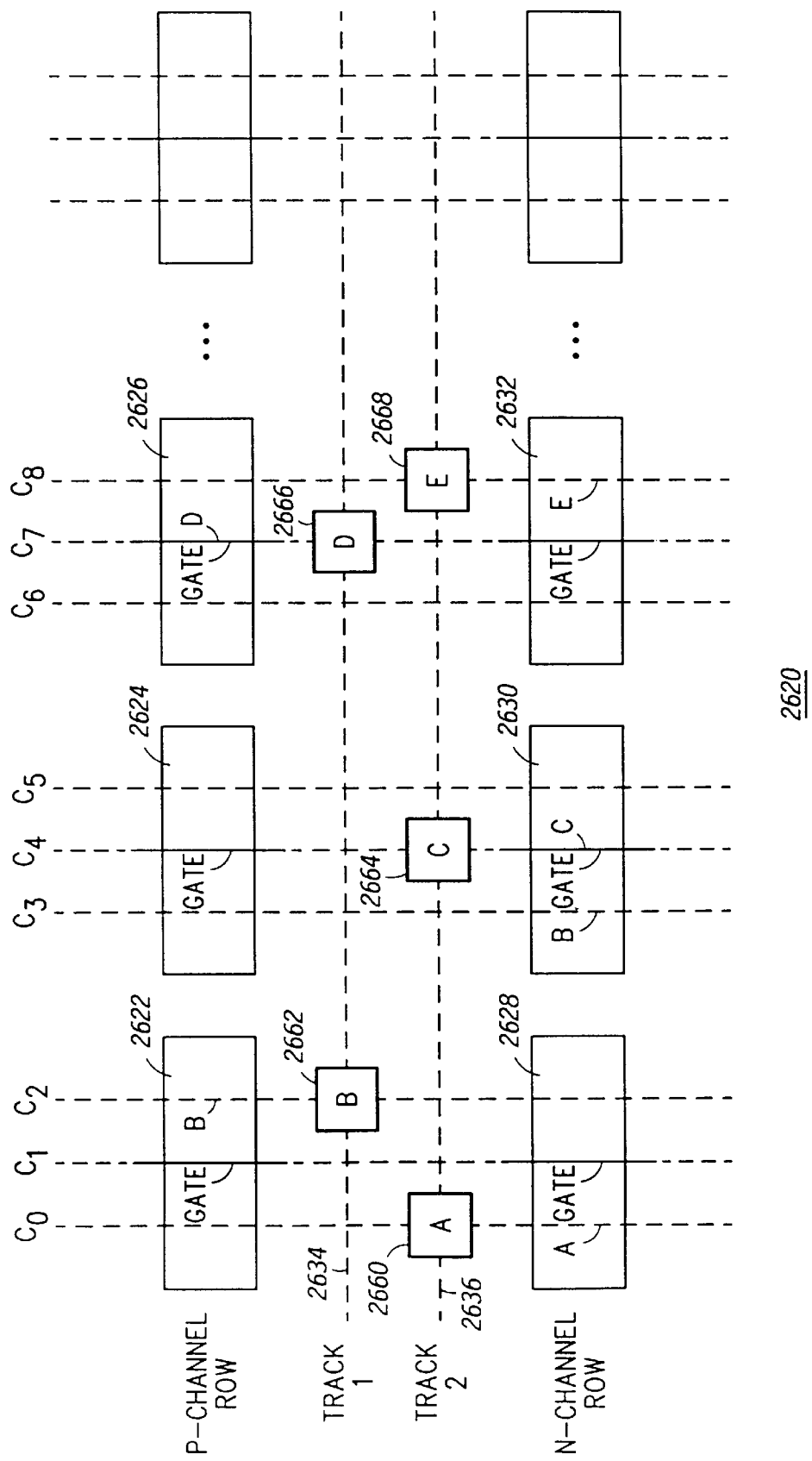
FIG. 21 is a cell layout 2620 showing the concept of "staggering" in connection with step 2612 and 2614 of FIG. 19.

Shown in FIG. 21 is a cell layout 2620 showing the concept of "staggering" in connection with step 2612 and 2614 of FIG. 19. Shown in FIG. 21 is a plurality of P-type transistors 2622, 2624, and 2626 which is extendible to an $n^{th}$ P-type transistor in a single row. In a second row are located a plurality of N-type transistors illustrated as transistors 2628, 2630, and 2632 extendible to an $n^{th}$ transistor at the end of the second row of the N-type transistors. Each transistor has three active electrodes designated in an imaginary dotted ("fine") column such as columns $C_0$, $C_1$, $C_2$ connection with P-type transistor 2622 and N-channel 2628, and columns $C_3$, $C_4$, and $C_5$ in connection with transistors 2624 and 2630 and columns $C_6$, $C_7$, and $C_8$ in connection with transistors 2626 and 2632. Between the two rows of active devices is illustrated Port Track 1 2634 and Port Track 2 2636. Port Track 1 2634 and Track 2 2636 may also be referred to as "Port Rows". These are two potential areas where internal ports may be located based upon the analysis performed by the present invention.

Illustrated in FIG. 21 are internal ports A 2660, B 2662, C 2664, D 2666, and E 2668 shown for purposes for illustration only. These five ports are in the same stagger group. Assume that ports A 2660, C 2664, and E 2668 are placed on Port Track 2 2636 whereas ports B 2662 and D 2666 are placed on Port Track 1 2634. FIG. 21 illustrates a "Stagger Mode" in which port A 2660 and port B 2662 are staggered or alternated between Port Track 2 2636 and Track 1 2634. Similarly, port C 2664 which follows port B 2662, eventually is placed back on Port Track 2 2636 and port D 2666 which follows port C 2664 is placed on Port Track 1 2634 in an alternating (staggered) fashion.

It should be noted from FIG. 21 that a variety of different placement configurations for the internal ports may exist. For example between transistor 2622 and transistor 2628, internal ports A 2660 and B 2662 are separated by a "fine" column which is an imaginary column created by the gates of transistor 2622 and transistor 2628. Similarly, port C 2664 is interplaced between transistor 2624 and transistor 2630 and is the sole internal port between these two transistors. In contrast are ports D 2666 and E 2668 which are located between transistor 2626 and transistor 2632. Ports D 2666 and E 2668 are not separated by a "fine" column and are alternated between Port Track 1 2634 and Port Track 2 2636 in "stagger" fashion.

The determination whether or not port A 2660 was placed on Port Track 1 2634 or Track 2 2636 was initially made based upon step 2612. A determination was made of the various cost factors when ports A 2660, B 2662, C 2664, D 2666, and E 2668 were staggered in the configuration shown in FIG. 21 versus the opposite stagger configuration in which port A 2660 would have been placed on Port Track 1 2634, port B 2662 on Port Track 2 2636 and similarly throughout C 2664, D 2666, and E 2668, while remaining in their same respective fine columns. Due to the cost determination resulting in the configuration shown in FIG. 21 having the lowest cost value, the configuration was chosen over an alternate stagger possibility. Step 2614 in FIG. 19 is the actual assignment of a Stagger Configuration to each group of interacting ports. In step 2616 is the assignment of the ports to fine columns as was done in FIG. 21.

Going back to step 2608 in FIG. 19, if a "place and route" routine was targeted in which no "staggering" was to be implemented, step 2618 is implemented before completion of the program in step 2617. In step 2618, a determination is made which is the best "fine" column for each port based on the cost factors. For example, taking the FIG. 21 model, an assumption can be made that internal port A 2660 would be assigned to Port Track 2 2636. Then, according to step 2618, a cost determination is made as to whether or not the lowest cost value results from assigning internal port A 2660 to fine column $C_0$, $C_1$, or $C_2$ existed.

By now it should be appreciated that a cell layout synthesis tool has been provided in which internal port assignment is done automatically in a most efficient manner. The tool automatically functions to provide placement of internal ports. The program illustrated in FIG. 19 is able to readily determine the four cost factors and the information associated with those factors from knowing the placement of active devices. Therefore, given a placement of the active devices, the present invention is able to determine the optimal way in which to place internal ports. This is done dynamically and automatically. It should also be noted that another input required for the method of FIG. 19 is a selection whether or not to perform the function of placing internal ports in a "Stagger" mode or a "Non-Stagger" mode. If there is doubt as to which mode may be optimal in a particular application, a user of the present invention may run in both modes, successively, and determine which results in the most compact resulting layout.

It should be noted that the present invention provides a user with much flexibility not previously available in cell layout synthesis tools. For example, the present invention may be used with a variety of different types of active devices. It may be used in modular or non-modular applications and may be used in standard cell and in non-standard cell library applications. The present invention is dynamic in that the tool actually does a placement determination for internal ports based upon "real-time" calculation of the various parameters involved, including a specification of where the active devices are to be placed. It should be noted that other devices besides MOS transistors may be utilized in place of the other contemplated transistors described in connection with FIG. 21.

D. Diode Placement

Antenna Diodes are diodes that are inserted in integrated circuit (IC) layouts to protect against electrostatic discharge (ESD). ESD may be caused by accumulation of charge on long metal lines connected to transistor gate terminals. In the case of standard cells, input ports connected to gate terminals are most at risk because they are often connected by long metal wires to other cells. During fabrication, RF on long metal wires often causes charge to build up at the gate terminal. The charge will ultimately discharge, and if this discharge is not controlled, the Integrated Circuit (IC) may be destroyed as the ESD causes a burn-through short in the transistor. Antenna Diodes are therefore electrically coupled to the long metal wires to prevent ESD burn-through. They get their name from the "Antenna" effect caused by the interaction of RF with long IC wires. As IC features shrink into sub-micron geometries, it takes less and less accumulated charge to burn-through and short. As the geometries shrink, the use of Antenna Diodes becomes more and more important in maintaining and improving IC yield.

Figure 22:
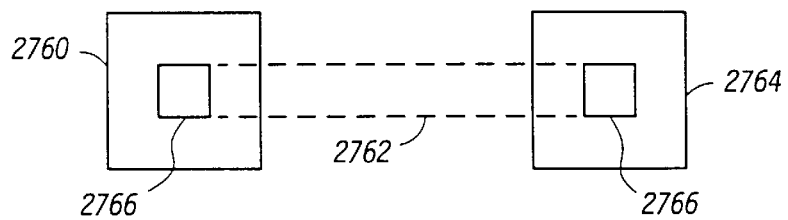
FIGS. 22 and 23 are different views of an illustrative port and Antenna Diode connected by a Metal-1 wire.
Figure 23:
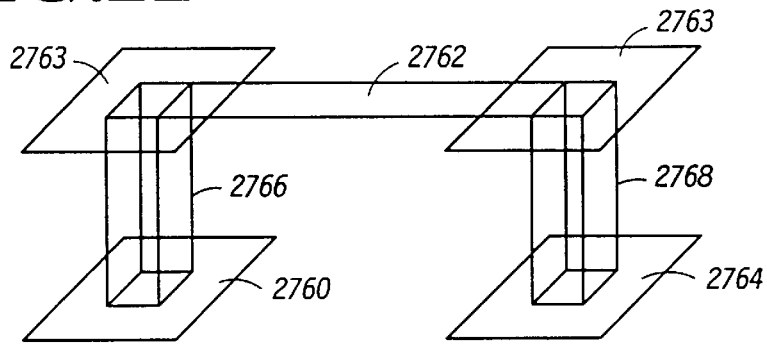

FIGS. 22 and 23 are different views of a port 2760 and an Antenna Diode 2764 connected by a Metal-1 wire 2762. FIG. 22 is an overhead view, and FIG. 23 is a perspective view of the port and diode. The port 2760 is located in the Poly layer. It is connected to the Metal-1 layer 2763 by contact 2766. The port contact 2766 is connected via a Metal-1 wire 2762 to contact 2768 and thence to Antenna Diode 2764 located in a Diffusion area. Antenna Diodes can be located in either the substrate or well region, leading to substrate diode or well diode respectively The method described herein is also applicable for placing any type of diodes.

Figure 24:
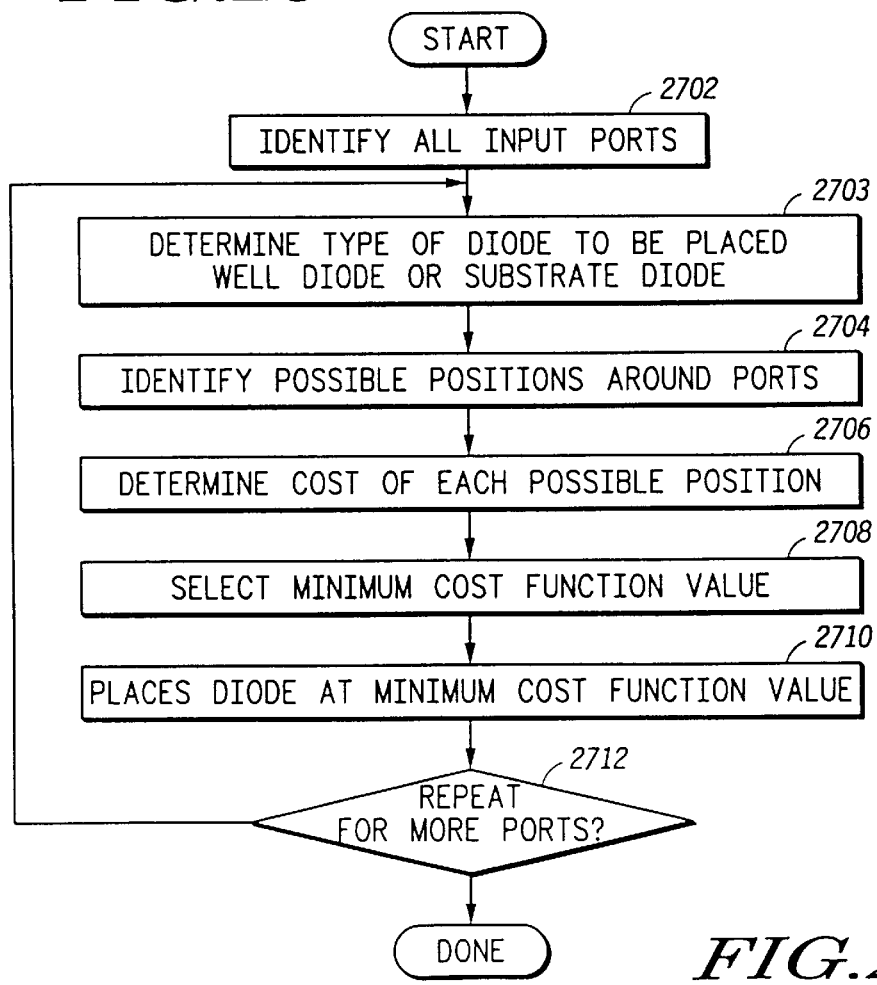
FIG. 24 is a flowchart that illustrates the operation of Abstract Diode Placement shown in step 176 in FIG. 7.

FIG. 24 is a flow chart illustrating the operation of placing antenna diodes. First, all of the input ports to the cell are identified, step 2702. Next, for a given input port, the type of diode to be used (well or substrate) is determined in step 2703 based on proximity of the diode to the well region, impact of the diode on the later stage of compaction, and interaction with other devices in the layout. Next, for a given input port, all possible positions around the port for an Antenna Diode are identified, step 2704. The cost of each possible position is then determined, step 2706. These costs are used to select the position with the minimum cost function value, step 2708. A diode is then placed at this minimum cost function value position, step 2710. A test is then made whether there are any more input ports, step 2712. If there are any more input ports to process, step 2712, steps 2704, 2706, 2708, 2710, and 2712 are repeated until no more ports require diodes.

Figure 25:
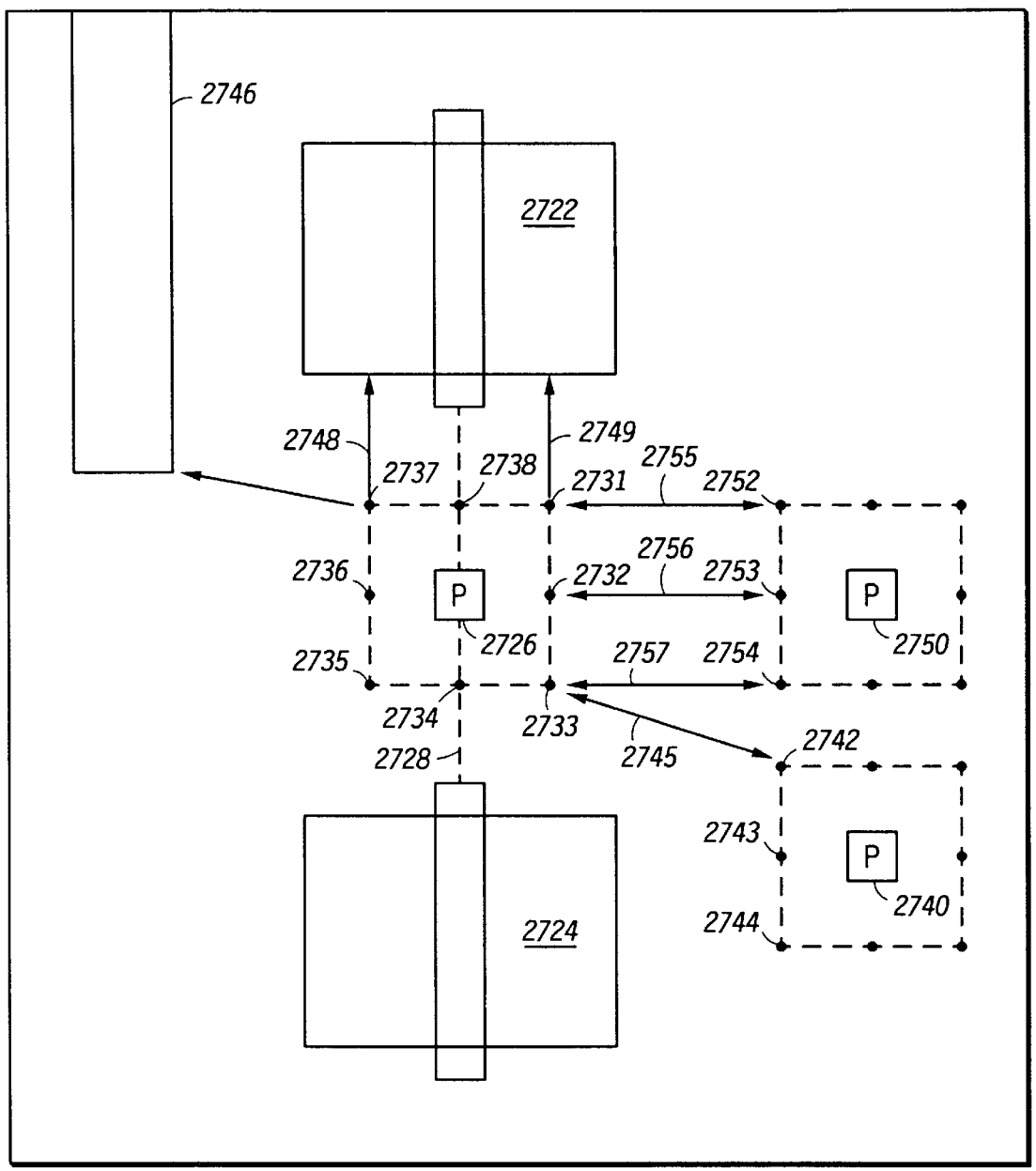
FIG. 25 is a block diagram showing a sample layout used to illustrate the operation of method of FIG. 24.

FIG. 25 is a block diagram showing a sample layout. There are two transistors 2722, 2724. They will ultimately be connected via wire 2728. A port 2726 has been placed between the two transistors. Three other elements are shown, a Side Tie 2746 two other Ports 2740, 2750. Around the original Port 2726, are located eight possible locations for the Antenna Diode 2731, 2732, 2733, 2734, 2735, 2736, 2737, and 2738. Similarly, port 2750 has located around it eight possible locations 2752, 2753, 2754, and port 2740 has located around it eight possible locations, three of which are 2742, 2743, 2744. In the preferred embodiment, the possible locations are located in a 3×3 square centered around a port. However, other configurations are possible. Note that in the previous topic titled "Port Placement", it was preferred to place one or the other of Ports 2740, and 2750 in the same column, but not both. Both are shown here to illustrate their interaction with Port 2726.

The cost function used takes into account the interaction between the possible locations 2731–2738, and different elements surrounding the possible locations and port 2726. For example, possible location 2737 has to take into account its distance 2747 from Side Tie 2746 and its distance 2748 from transistor 2722. The three top possible locations 2737, 2738, and 2731 need to take into account the distance from the well. Thus, if the diode is chosen to be a well diode, locations 2737 and 2731 are preferred, but not so if the diode is chosen to be a substrate diode. Possible location 2733 takes into account its distance 2745 with location 2742 and the distance 2757 with possible location 2754. Possible location 2732 takes into account the distance 2756 with possible location 2753. Possible location 2731 takes into account its distance 2755 to possible location 2752 around port 2750, and its distance 2749 to transistor 2722. Other interactions may also be taken into account, such as the distance from possible locations 2733, 2734, and 2735 to transistor 2724.

Since transistors 2722 and 2724 will ultimately be connected by wire 2728, the diode being placed cannot be located at either possible location 2734, or 2738. Thus, both those locations would receive very high penalty values. This restriction can be implemented in the cost function by assigning a very large weight to possible locations that are located on projected connection wires.

Finally, note that the quarters 2731, 2733, 2735 and 2737 are preferable to the other four locations from the perspective of compaction. Thus, the non-corner possible locations 2732, 2734, 2736, and 2738 are penalized for not being corners. This preference can be implemented in the cost function by adversely weighting the center (non-corner) locations 2732, 2734, 2736, and 2738.

Figure 26:
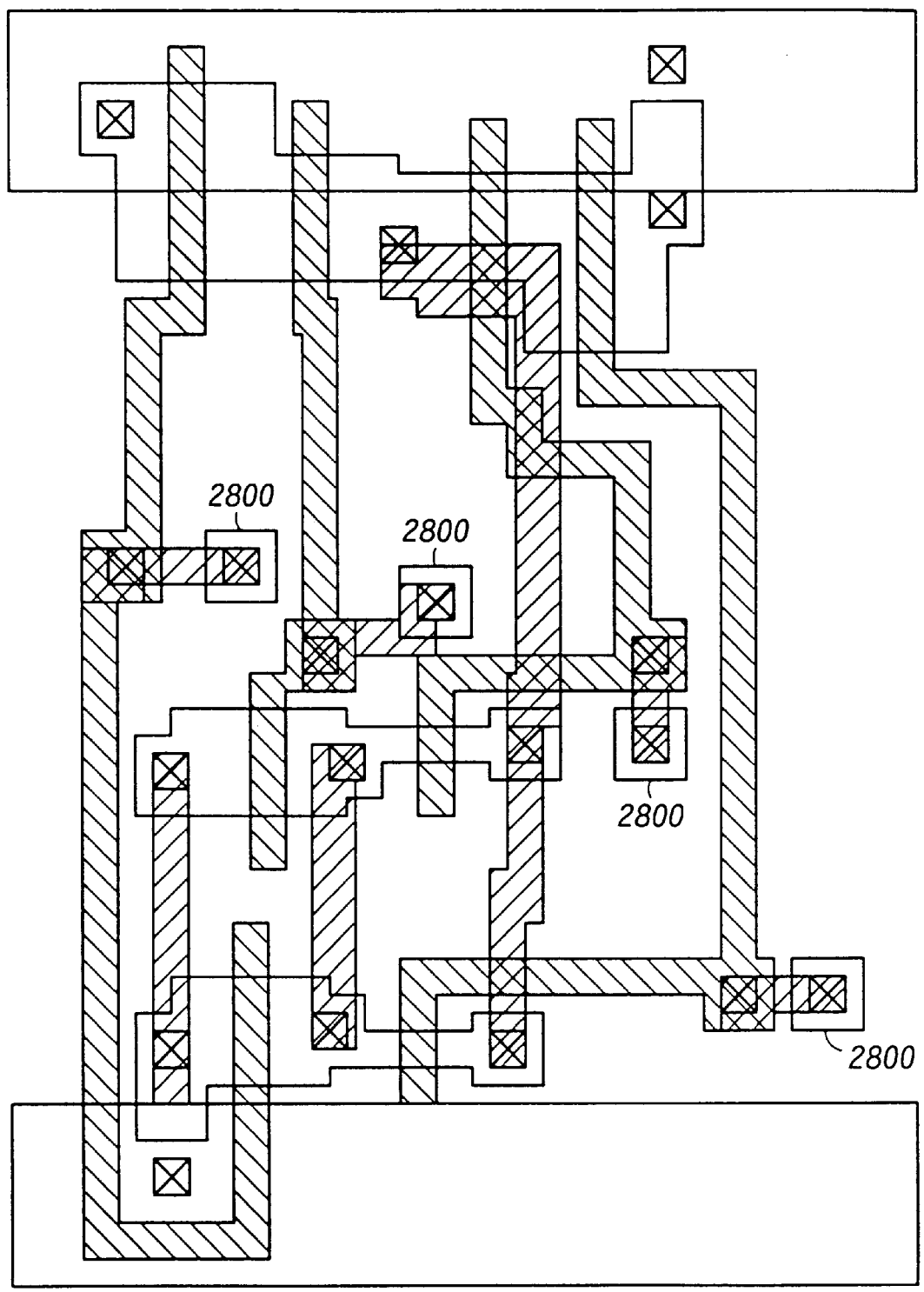
FIG. 26 is a transistor level circuit layout that illustrates what can happen when diode placement is performed after compaction.

This automated method of diode placement, taking into account various interactions, offers a number of advantages. One important advantage is that diodes are placed at locations that will be favorable to compaction. FIG. 26 is a compacted transistor level circuit layout that illustrates what can happen when a bad diode placement is performed without due consideration to interactions with other devices. In this case a diode 2800 had to be placed on the far right. The result is that the size of the cell is significantly larger than it would have been if that diode had been placed at some other preferred location. Another important advantage is that the diodes are placed prior to compaction. If diodes are placed after compaction, there may be no room left in the layout to place one or more of the required diodes. The usual solution to this problem is to just increase the cell width in order to accomodate all the required diodes. But note the substantial amount of unused space resulting from the necessity of including the diode after cell compaction.

Figure 27:
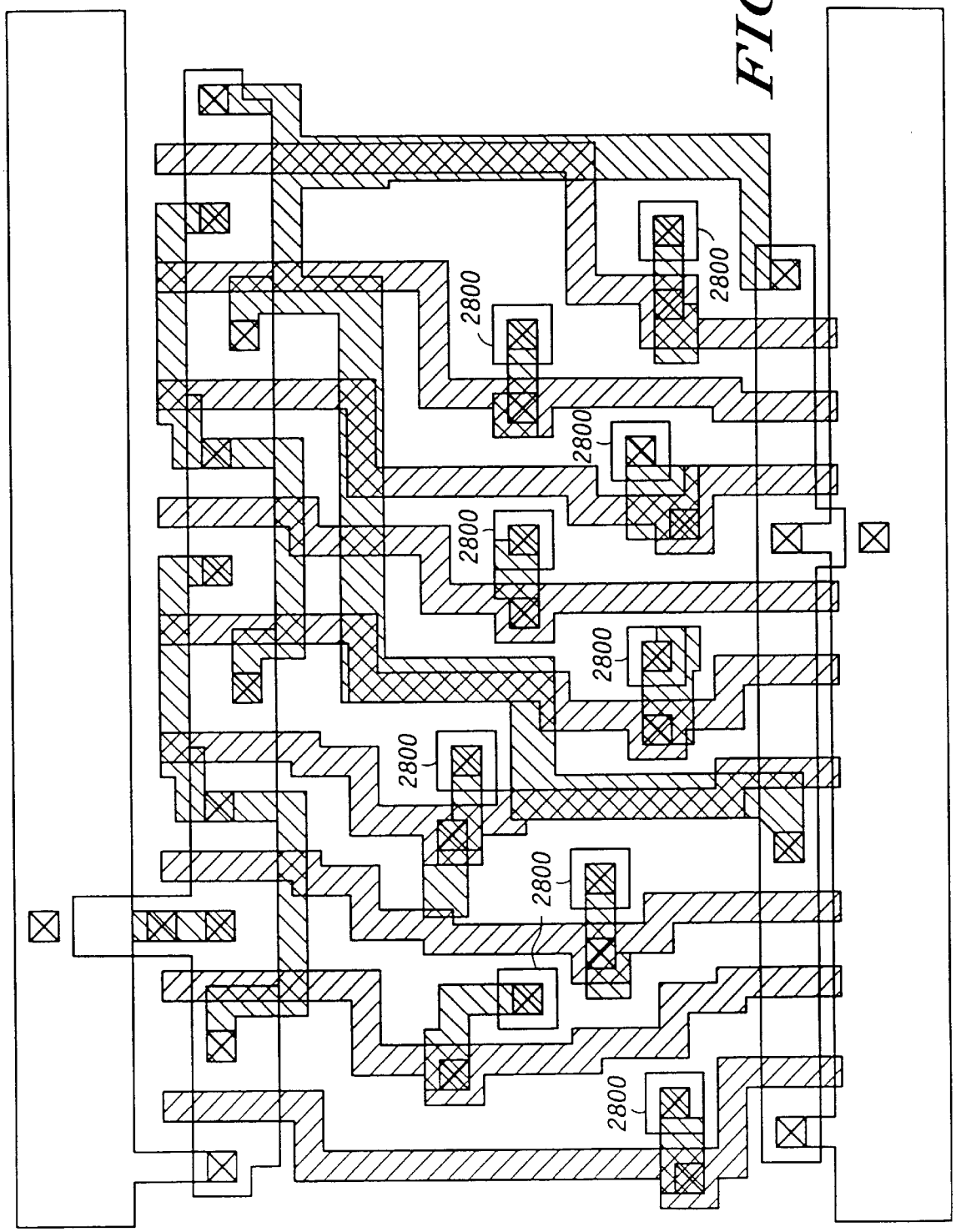
FIG. 27 is a transistor level circuit layout of a standard cell in which antenna diodes have been added by operation of the diode placement modules illustrated in FIG. 24.

Contrast FIG. 26 with FIG. 27. FIG. 27 is a transistor level circuit layout of a standard cell in which antenna diodes have been added by operation of the diode placement modules illustrated in FIG. 24. Nine (9) diodes have been inserted into the layout. The location of the nine diodes varies in relation to the ports to which they are connected. The reasons for this are twofold. First, the initial placement of the diodes will be at one of the eight locations surrounding the corresponding port. As noted above, it is preferable to initially locate them at corners. Secondly, diodes are placed before compaction. FIG. 27 shows the layout for the cell after compaction.

This is the first known implementation of automatically placing Antenna Diodes. Very importantly, the diodes are placed before compaction, and thus their placement does not adversely affect the size of resulting cells, especially in the case where every transistor gate needs to be protected. Also note that though the above implementation is illustrated within the framework of building standard cell libraries, there is nothing in the invention that limits it to such implementations.

E. Performance Driven Routing Flow

The method for routing which will be subsequently discussed corresponds to step 152 and 154 of FIG. 4. Before describing the methodology of the present invention in greater detail, the problems associated with routing and its prior art implementations that have attempted to solve these problems will be discussed.

During circuit layout synthesis, routing involves the connection of N-type and P-type transistors and signal input-output ports using electrical connections and applicable layers according to the electrical connectivity of the circuit being laid out. The applicable layers for interconnection usually include polysilicon, Diffusion, and metal. This invention also is applicable for higher layers of metal such as Metal-2 and Metal-3. Routing has a profound effect on the quality of a final compacted cell layout. A bad routing can lead to increased layout areas, poor electrical performance, and low yields. For example, if the routing results in an unnecessary cross-over of wires, the area associated with the layout will be increased. Additionally, if circuitry routing leads to long wires, it can adversely affect the electrical performance of the layout. Similarly, redundant vias adversely affect a yield of a layout.

Prior art cell layout synthesis operations have implemented different routing methodologies with the intent of solving the aforementioned problems. The prior art methodologies may be categorized as either commercially available cell synthesis packages, or non-commercial, published literature, or internal layout tools utilized by semiconductor companies. The commercially available prior art commonly utilizes a channel routing technique which does not make sufficient use of the available area for routing.

Additionally, prior art implementations which are commercially available do not consider user-specified performance constraints. Such performance constraints include important electrical performance requirements and yield requirements. While this lack of consideration may be sufficient for older processing technologies, for deep submicron technologies, these performance constraints become critical and necessary. Additionally, commercially available prior art implementations do not provide any provisions for handling interconnects with special requirements. Such special requirements include interconnects for critical circuits and interconnects for variable width elements. Again, it may be observed that these prior art implementations fail to provide a flexible method for performing efficient layout of a circuit which has these performance constraints and special requirements. Lastly, it should be noted that commercially available prior art implementations cannot route interconnects for stacked transistors. As stacked transistors may be essential for an optimal cell layout, the inability of the commercially available prior art implementations renders such implementations unable to optimize a cell layout.

In the second type of prior art implementations, literature has been published which improves upon the channel routing implemented by the prior art commercially available applications through the use of area routing algorithms. However, even in such published literature, performance constraints and special requirements are not taken into consideration. These prior art implementations also do not handle routing of layouts with stacked transistors, internal ports and ties. Therefore, even the improved routing methodology of the second prior art technique fails to address issues in current state of the art process technology.

In contrast to the prior art implementations described above, the present invention provides a routing methodology which optimizes an area of a cell layout while honoring the performance constraints of timing and enhancing yield. The routing methodology of the present invention involves connecting transistors and signal ports by electrical connections in an appropriate routing layer. An input to the router includes designation of transistors and signal ports which have geometric locations within a bounding box of the cell to be laid out. Additionally, the router is provided with information about the layers that are available for routing, the preferred direction of routing in each layer, and the cost of vias for each pair of routing layers. Furthermore, when the timing performance of a circuit to be laid out is critical, the timing constraints for that circuit can be translated in terms that indicate how critical each circuit interconnect is. The interconnects are then assigned numerical weights which determine the relative criticality of the different interconnects. For example, a net with a higher numerical weight is defined to be more critical than a net with a lower numerical weight, and, therefore, should get routed in a routing layer of lower resistivity and should have a shorter routing length.

Figure 28:
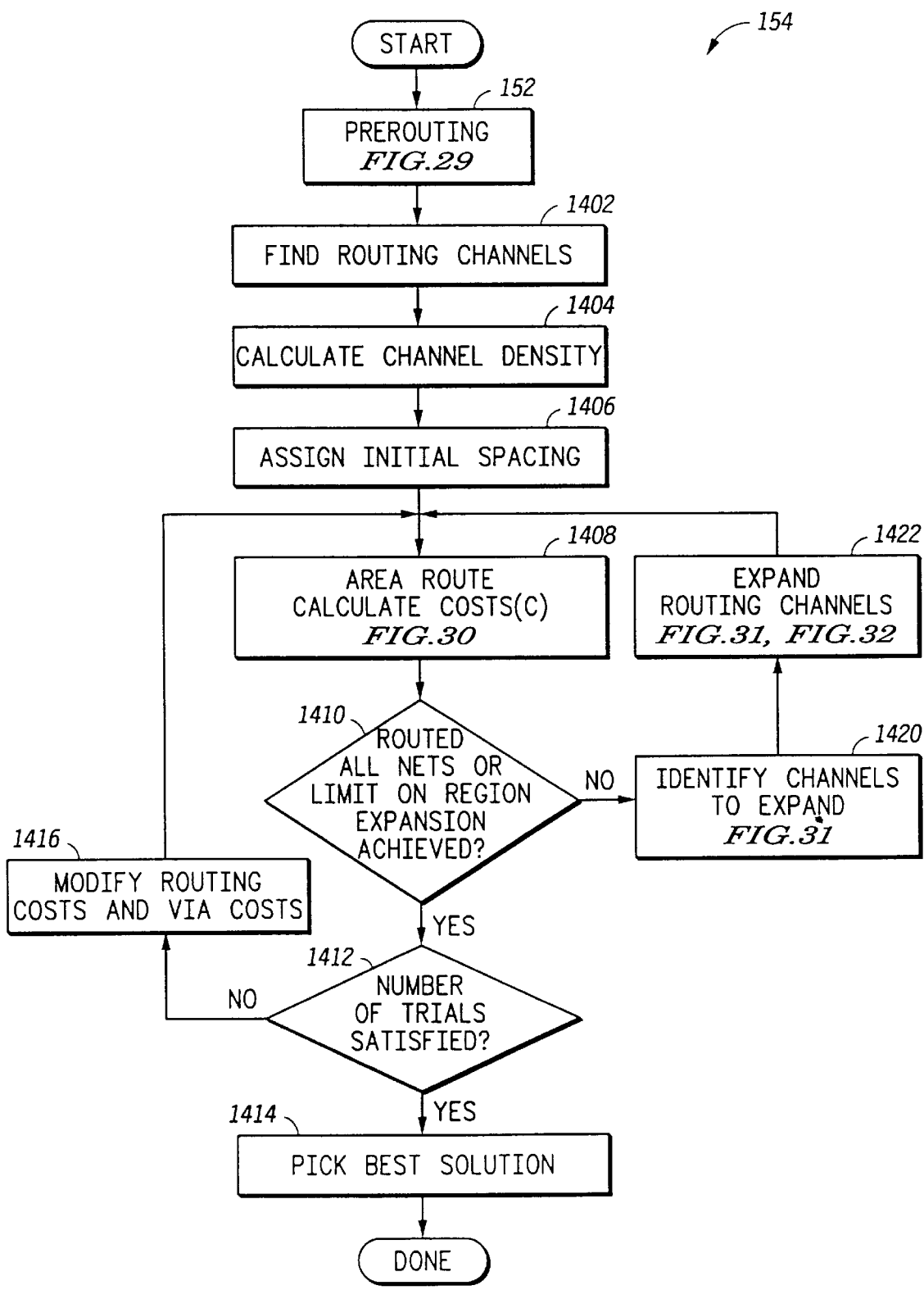
FIGS. 28, 29, 30, 31, and 33 are flowcharts that illustrate routing steps 152 and 154 of one embodiment of the invention illustrated in FIG. 4.

The routing methodology of the present invention is implemented in steps 152 and 154 of FIG. 4. FIG. 28 illustrates each of these steps in greater detail.

FIG. 28 is a flow chart that illustrates the operation of a multi-layered detailed Area Router. Such a Router is significantly different than the Channel Routers which are commonly used in prevailing cell-synthesis tools available in the industry. The Area Router described herein allows area-efficient routing to be performed over the transistors and wiring to be done in both horizontal and vertical directions in each routing layer. This flexibility is not provided in Channel Routers which invariably have a fixed direction for each layer of routing.

Figure 29:
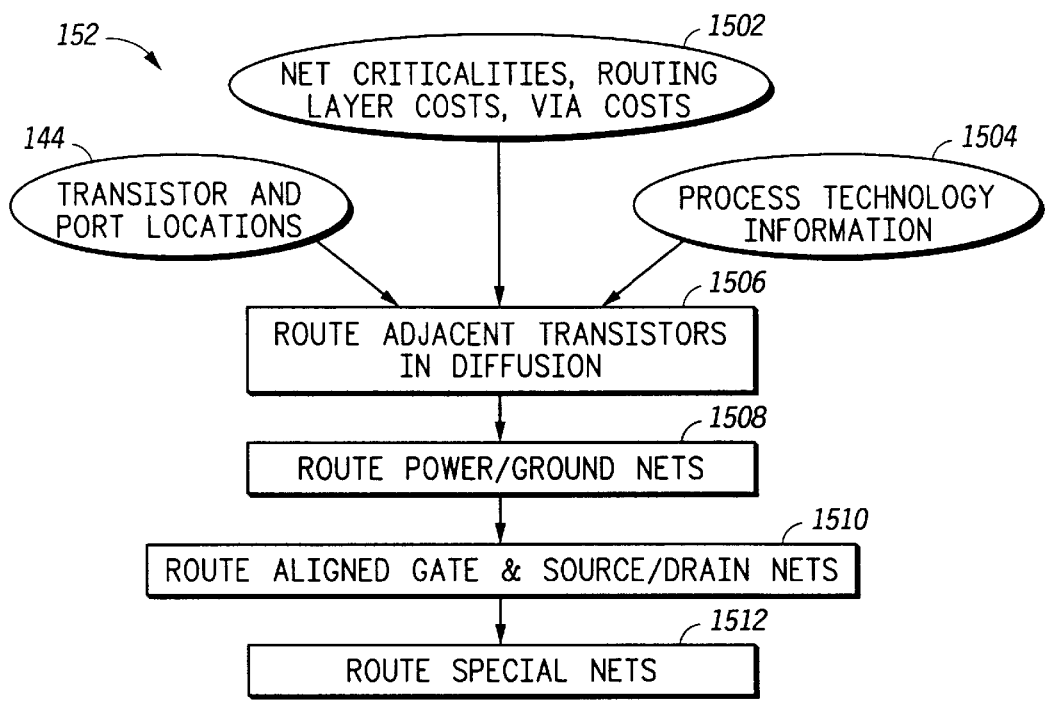

During a first portion of the routing methodology in the system, a pre-routing step 152 is executed. Step 152 is illustrated in greater detail in FIG. 29. Before execution of the routing step 152, transistors and ports are placed in a relative location using a methodology previously disclosed with respect to step 144 of FIG. 4. As well, in a step 1502, routing layer cost, and via costs are provided for evaluation. In step 1504, process technology information is also provided. The net criticalities of step 1502 include electrical connections which are considered critical for circuit performance. Such critical interconnects include supply nodes which should be connected directly to a power or ground supply rail using a connection which has a shortest possible routing length. Additionally, other critical interconnects include connections required for speed criteria which are specified in the information provided to step 152.

Stated another way, net criticality include all circuit interconnects whose timing requirements are essential to meeting the performance requirements of the circuit which is being laid out. Additionally, in step 1502, routing layer costs are provided to guide the routing process implemented by the present invention. Routing layer costs are provided for guiding the routing direction on a given layer. Furthermore, via costs are also provided. Such via costs indicate the cost of switching from one layer to another layer during the routing procedure. In addition to the parameters provided in step 1502, process technology information is provided in step 1504. The process technology information includes details for the various layers permitted by that manufacturing technology. Examples of process technology information include a minimum width of an interconnect in that layer and a minimum width of spacing between two interconnects in the layer. It should be noted that other process technology information may also be included.

Following step 1504, step 1506 represents a first step in pre-routing step 152. During step 1506, transistors which share a same source/drain signal and are adjacent to each other are routed using a Diffusion interconnect. Furthermore in step 1506, contacts are placed in the Diffusion for connecting to other transistors. After transistors are connected using a Diffusion interconnect, transistors which are connected to a power or ground supply rail are routed in step 1508. One method for routing transistors to one of the power and ground supply rails is using a Diffusion wire provided. The use of this Diffusion connection is particularly useful in salicided processes which have low resistivity for Diffusion. Additionally, it should be noted that this methodology is similarly provided for connecting transistors to power and ground supply rails in metal layers.

After the connection to power and ground supply rails are routed, aligned gate interconnects are routed in step 1510. When routing such aligned gate interconnects, either polysilicon or metal layers may be used depending on performance requirements. For example, if a high performance circuit is being implemented, gate interconnects can be implemented in metal, rather than polysilicon. Such high performance circuits include inverters and buffers, among others not specified herein. Furthermore, in step 1510, gates which are vertically and horizontally aligned may be routed. The ability disclosed herein to do both vertical and horizontal alignments of gate interconnects is especially useful in avoiding longer routing lengths in later steps. In addition to routing aligned gates, the aligned source/drain nets are also routed, typically in a metal layer, in this step.

After routing aligned gate nets in step 1510, any special interconnects are routed in step 1512. Special interconnects may require wiring resources which are larger than the process technology minimum. These may also include feedthrough interconnects that require reserved space within the cell region but do not actually connect to any transistors or signal ports within the cell.

Following step 1512, program flow returns to step 1402 of FIG. 28. Devices, ports, and interconnects which have been routed are provided for use during execution of this step. Step 1402 provides a methodology for identifying channels, or blocks of dedicated routing space where no Diffusion is present. Additionally, channels also include the space between transistors and a supply rail.

After the channels have been identified, a Channel Routing Density is calculated in step 1404. Calculation of Channel Routing Density has previously been described in detail and the calculation procedure will not be discussed in this section. For more information regarding the calculation of Channel Routing Density please refer to sections "A" titled "High Density Transistor Placement" and "B" titled "Transistor Stacking" above. Basically, step 1404 calculates a minimum required number of routing tracks in any channel and provides that information for use during execution of step 1406.

An initial spacing of the channels is determined in step 1406. This involves the translation of routing tracks to absolute geometric spaces based on the process technology information provided to pre-routing step 152, such as minimum width and minimum spacing for each layer. An initial spacing to be assigned is a function of several factors. To calculate the spacing between two dedicated routing tracks, the minimum track width and spacing rules for each layer under consideration are used.

Additionally, initial space between two tracks, one of which may be occupied by a tie, is set equal to the number of tie rows multiplied by vertical tie spacing. Furthermore, it should be noted that tie space is a function of tie construction where tie construction indicates whether or not the tie is a "P" (well-)type or an "N" (substrate-) type tie. It should further be noted that tie construction is established by the process technology information.

After initial spacing has been assigned for channels, the area routing methodology of the present invention is implemented in step 1408. Detailed routing of all the remaining nets which have not been pre-routed is performed. The Detailed Router of the present invention is a multi-layer Area Router which is designed to surmount obstacles such as rectangular shapes and pre-routed wires. Each routing layer has a user-specified preferred wiring direction and a cost of adding a via in the layer. The wiring direction and costs are provided in step 1502. Furthermore, the Router attempts to wire interconnects to minimize a cost metric that is a function of a length of wiring and a number of vias. Each interconnect is associated with a numerical weight which reflects its criticality for timing performance. Thus, a net that has been assigned a higher weight is more critical than a net with a relatively lower weight. The steps necessary to execute area route step 1408 are illustrated in greater detail in FIG. 30.

Figure 30:
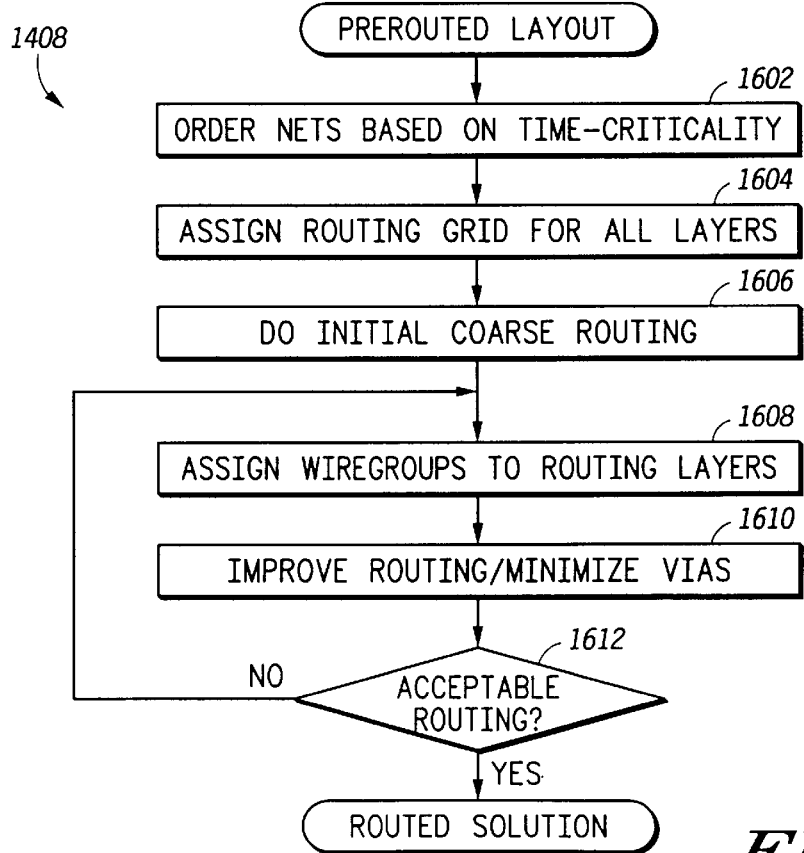

In FIG. 30, the proposed interconnects are ordered based on a time criticality factor in step 1602. This ordering is provided to address an issue of electrical performance of the circuit being laid out. The present invention orders interconnects by translating timing information into a numerical weight for the interconnects. This numerical weight is provided in a step 1502 and may be input by an external user who is using the cell layout synthesis program of the present invention. In one embodiment of the present invention, the higher the numerical weight of an interconnect, the higher is its criticality for timing performance. The interconnects are queued in monotonically non-increasing order of their interconnect weight. In step 1602, nets are routed sequentially, while interconnects with higher weights are processed first and interconnects with lower weights are processed last. By using this procedure, critical interconnects have a better chance of being routed with shorter wire spans and in layers of lower resistivity. It should be noted that critical interconnects include output connections, long interconnects, aligned gate, drain, and source interconnects, and interconnects which affect yield. In the case that the numerical weight is not provided by the external user, the criticality of the nets is determined automatically. For this, in step 1602, the interconnects are ordered based on their topology. For example, nets connecting output nodes of P-type and N-type transistors, source/drain nets connecting only P-type transistors or only N-type transistors (these have a horizontal extent but no vertical extent), and nets that are vertically aligned (these have a vertical extent but no horizontal extent) are given higher criticality.

After all interconnects are ordered based on time-criticality, the Router maps the layout problem onto a non-uniform virtual routing grid whose objective is to maximize the number of routing tracks that may be used in all the routing layers in step 1604. The routing grid is non-uniform in the sense that each layer to be routed may have a different spacing requirements as determined by the process technology information. The implementation of this routing technique is well known in the data processing art and is explained in greater detail in a PhD thesis written by applicant Mohan Guruswamy while at the University of Texas at Austin in 1992 entitled: "*A General Routing System for VLSI Custom Cell Layout*".

After the Router has mapped the layout problem onto a non-uniform virtual routing grid, an initial Coarse Routing is executed in step 1606. A Coarse Routing of all the interconnects is performed assuming a single-layer of routing, with interconnects routed in the order of their criticality. The criticality parameter used in this step corresponds to the previously described criticality. In executing initial Coarse Routing step 1606, a Maze Routing algorithm is utilized. The Maze Routing algorithm determines best routes for the interconnects based on a cost metric. The cost metric includes both a vertical and horizontal wire length for the proposed interconnect route and a number of bends, or corners which result from the proposed layout. The cost metric also includes the criticality information of the interconnect previously provided by a user in step 1602.

After initial Coarse Routing is performed in step 1606, wire groups are assigned to routing layers in step 1608. Each group of wires, or electrical connections, is assigned to a layer with an objective of minimizing a predetermined cost function in ensuring that the wires belonging to different nets do not overlap in the same layer. This assignment is based on the initial Coarse Routing operation. As in previous steps, interconnects with higher criticality are given preferential layer assignment. It should be noted that for critical interconnects, there should be as few layer transitions as possible. Each layer transition increases capacitance and decreases timing performance. Additionally, for critical interconnects, it is desirable to utilize layers which have low resistivity. To implement step 1608, an algorithm based on Simulated Annealing and Tabu Search are utilized. During the use of these algorithms, criticality, as previously described, is used as a cost factor. Both the Simulated Annealing and Tabu Search algorithms are well known in the data processing art and will not be described in subsequent detail herein.

After wire groups are assigned to routing layers in step 1608, an improved routing and via minimization step 1610 is executed. This is a final routing step that involves connecting wires in the assigned layers. Due to the sequential nature of the routing methodology implemented herein, it is possible that some interconnects can be routed in a better fashion in order to optimize the routing cost. To explore this possibility, interconnects are removed one at a time, in order of their criticality, and rerouted to obtain better routes. Additionally, during execution of this step, an attempt is made to minimize the number of transitions between layers, minimize redundant vias, and shorten interconnect lengths wherever possible. After the routing is improved and appropriate elements are minimized, step 1612 determines whether or not the resulting routing is acceptable. If the resulting routing is acceptable, a Routing Solution is provided. If not, program control returns to step 1608 which continues to reassign wire groups to routing layers in an attempt to generate an optimized routing configuration.

After a Routing Solution is calculated, it is provided to step 1410 which determines whether or not all interconnects were routed. If all interconnects were not correctly routed, steps 1420 and 1422 are executed in order to enable the present invention to route all interconnects. The Area Router performs a routing operation in a fixed space, which is determined based on an estimate obtained at component placement step 144. Due to non-predictability of the actual routing space requirement, it is possible that the Area Router is enabled to route a few interconnects. In this case, methodology of the present invention allows the expansion of regions in which routing occurs by predetermined amounts which are measured as a function of the number of routing tracks. A heuristic is used to accomplish systematic expansion of the routing regions. This expansion operation, including steps 1420 and 1422, will subsequently be described in greater detail in section "F" titled "Routing Space and Direction Determination" below.

If all interconnects are not routed, step 1412 is executed to determine whether or not a desired number of area routing trials have been attempted. If it is determined in step 1412 that the Routing Solution may be further improved by performing more trials, step 1416 is executed. In that step, routing costs and via costs are modified. After the cost modification, Area Routing step 1408 is performed with the new costs. Thus, Area Routing step 1408 provides a new Routing Solution. Steps 1408, 1410, 1412, and 1416 are repeated for a specified number of iterations to provide a set of routing solutions. Step 1414 subsequently picks a best Routing Solution from the set of solutions provided by Area Routing step 1408. For this purpose, each routed solution has a solution cost associated with it, which measures the quality of the routed solution. The trial that leads to a solution with minimum routing solution cost is picked to be the final routed solution. The routing solution cost includes parameters such as total length of interconnect wires in all the layers of routing, the total number of vias used in the routing, among others.

The operation of the system discussed in this section is very useful in ensuring high routing-area utilization. At every stage of this system, attention is given to interconnects whose timing is critical to the electrical performance of the circuit being synthesized. Additionally, the router allows better utilization of a variable area by routing, not just in a dedicated channel, but also over transistor devices. This feature is not available in current commercial applications. In addition, this system provides a flexible solution which allows interconnect of variable widths to be implemented. Another powerful feature is the control of timing at an individual interconnect level. Furthermore, the system permits routing to special structures such as antenna, diodes, and ties. As well, the system provides a flexible method for allowing routing to ports that are on a cell boundary, as well as to ports within the cell boundary.

F. Routing Space and Direction Determination

As previously described, the three key steps in MOS circuit layout synthesis are placement of transistors, routing of interconnects, and compaction of a result in layout. The routing step involves connecting the N-type and P-type transistors and the signal input-output ports using wires in applicable layers according to the electrical connectivity of the circuit. The applicable layers include polysilicon, Diffusion, and multiple layers of metal. Typically, routing on a layer is performed in one direction. However, it is difficult to determine an assignment of routing directions to various layers prior to routing owing to the complex nature of this problem. It is equally difficult to predict the space that will be required to complete the routing of the circuit. Although a lower bound of the number of tracks required for routing can be estimated from a placement of transistors and ports, often an actual number of tracks required to complete the routing is more than this lower bound. Therefore, the present invention implements system which dynamically increases the space available for routing when necessary.

The commercially available prior art implementations implement and enforce fixed routing directions for layers. These directions are fixed in that each layer of connections may be only horizontal or only vertical, and the two may not be intermixed in the same layer. For example, a metal layer may only contain vertical wires. This strict enforcement of routing direction fails to make efficient use of available routing space, as well. The rigidity of the prior art commercial applications is further illustrated by the fact that a routing direction for each layer is determined by the manufacturer of the circuit layout tool and may not be modified by an external user to provide greater optimization for use with that user's circuit. It should be noted that one cell layout may be better laid out with layers laid out in one set of directions, while another cell layout may be more optimally laid out with wires on corresponding layers laid out in orthogonal directions to those in the first cell layout. In addition, commercially available prior art implementations do not expand the routing channels automatically in case it is determined that the cell cannot be routed in the given space. They also do not have the ability to determine the location of routing failure and use that information to find regions of expansion.

Routing typically involves a preferred routing direction, horizontal or vertical, for each layer to accomplish a Manhattan style routing. The methodology implemented in the present invention implements a routing system that allows for an automatic selection of a preferred routing direction for each layer such that a best routing solution as measured by a predetermined routing cost metric will be generated.

Furthermore, one of the inputs to the automated routing algorithm is the fixed number of horizontal wiring tracks which the router of the present invention uses to complete the interconnections of the circuit. The number of tracks available determines a space available for routing. The number of wiring tracks is estimated prior to routing based the placement of the transistors and ports in step 144. However, very often, an actual number of tracks required is more than the estimated value since estimation of the exact number of tracks required is difficult to determine due to the complex nature of the routing problem. As previously suggested, the disclosed system implements a methodology in which space available for routing is automatically increased. This is performed by expanding a region available for routing in a systematic manner whenever the router of the present invention is unable to complete the interconnections in the given routing space.

During operation of this system, the routing stage involves connecting transistors and signal ports by wires in appropriate routing layers. These layers include polysilicon, Diffusion, and metal layers. Typically, each routing layer is assigned a preferred routing direction which is horizontal or vertical for a Manhattan style routing. The Router utilized in the system is an Area Router which determines a preferred routing direction for each layer automatically so that a total routing cost metric, measured as a function of a total wire length and a total number of vias, is minimized. The area routing step of the present invention is implemented in step 154 of FIG. 4.

FIG. 28 is a flowchart that outlines a system used to automate the selection of a preferred routing direction for each layer and ensure routing completion by providing more routing space. The Area Router routes a circuit on the basis of preferred routing directions with an objective of minimizing a value of routing cost metrics using a given number of tracks. If the system is unable to route the circuit completely, the Router enters a loop in which the space available for wiring is increased using a strategy which will be subsequently discussed. After the space is increased, the Router again attempts to route the circuit. The loop referred to above corresponds to steps 1420 and 1422 of FIG. 28.

Expansion of the routing region is iteratively carried out until the circuit to be laid out is routed successfully or a limit on an allowable expansion is reached as determined in step 1410. A value of the routing cost metric corresponding to the Routed Solution, C, is stored. Next, in step 1416, the routing directions for each layer are flipped. Stated another way, if the preferred routing direction of a layer is horizontal, it is set to be vertical and vice versa. A process of routing, step 1408, and routing region expansion, steps 1420 and 1422, with the new set of preferred layer directions is then repeated. A value of the routing of cost metric corresponding to the final routed solution is flipped layer directions, Cf, is determined. The best of the two routing costs, C and Cf, determines a preferred routing direction that is used for a final solution provided by the router of the present invention. This determination step corresponds to step 1414 of FIG. 28. It should be noted here that as shown, two different routing cost configurations or routing directions are tried. However, the method described herein is not limited to two routing cost configurations, but rather will work just as well with multiple cost configurations. In the case of multiple routing cost configuration settings, the step 1414 picks the best routing solution among all the different routing results.

Figure 33:
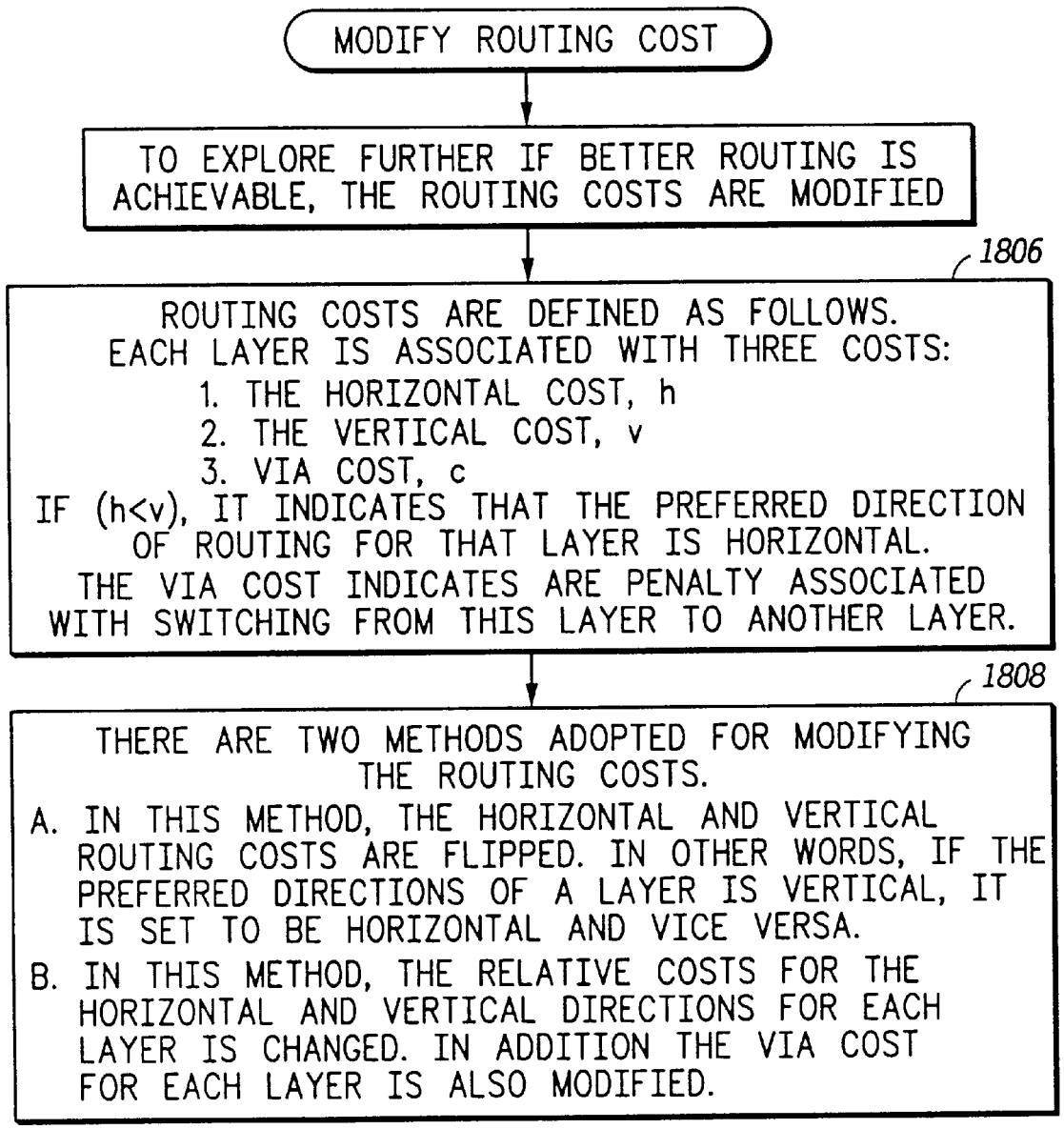

As may be seen in FIG. 28, when all interconnects are not routed for any routing cost configuration, steps 1420 and 1422 are executed. During step 1420, channels to be expanded are identified. Step 1420 is illustrated in greater detail in steps 1701, 1704, and 1706 of FIG. 31. In a first step 1702 of execution of identified channel to expand, the entire layout area for the circuit is divided into three routing channels for each row-pair of P-type and N-type transistors as shown in FIG. 33. These three channels are (A) a region between the P-type transistors and the power rail, (B) a region between the N-type transistors and a ground rail, and (C) a region between the N-type and P-type transistors. Subsequently, the vertical extent of each channel, A, B, and C, are determined. The vertical extent is a measure of the selected channels.

Figure 31:
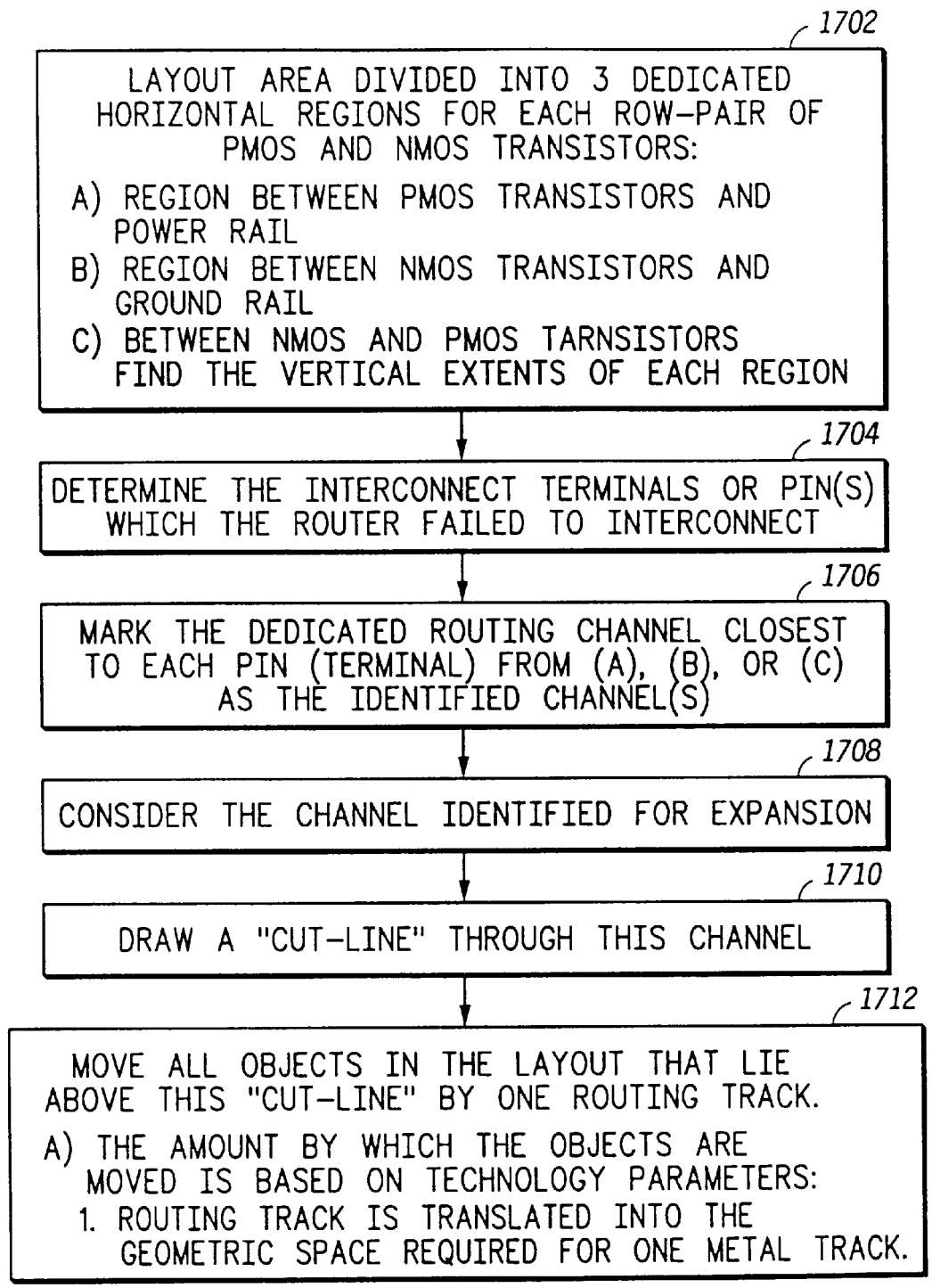

Next, to identify the channel to be expanded, step 1704 of FIG. 31 determines the interconnect terminals which the router of the present invention failed to interconnect. Next, in step 1706, the dedicated routing channels closest to the interconnect terminal from region A, B, or C are marked as identified channels. Subsequently, from step 1420, program flow is transferred to step 1422.

Figure 32:
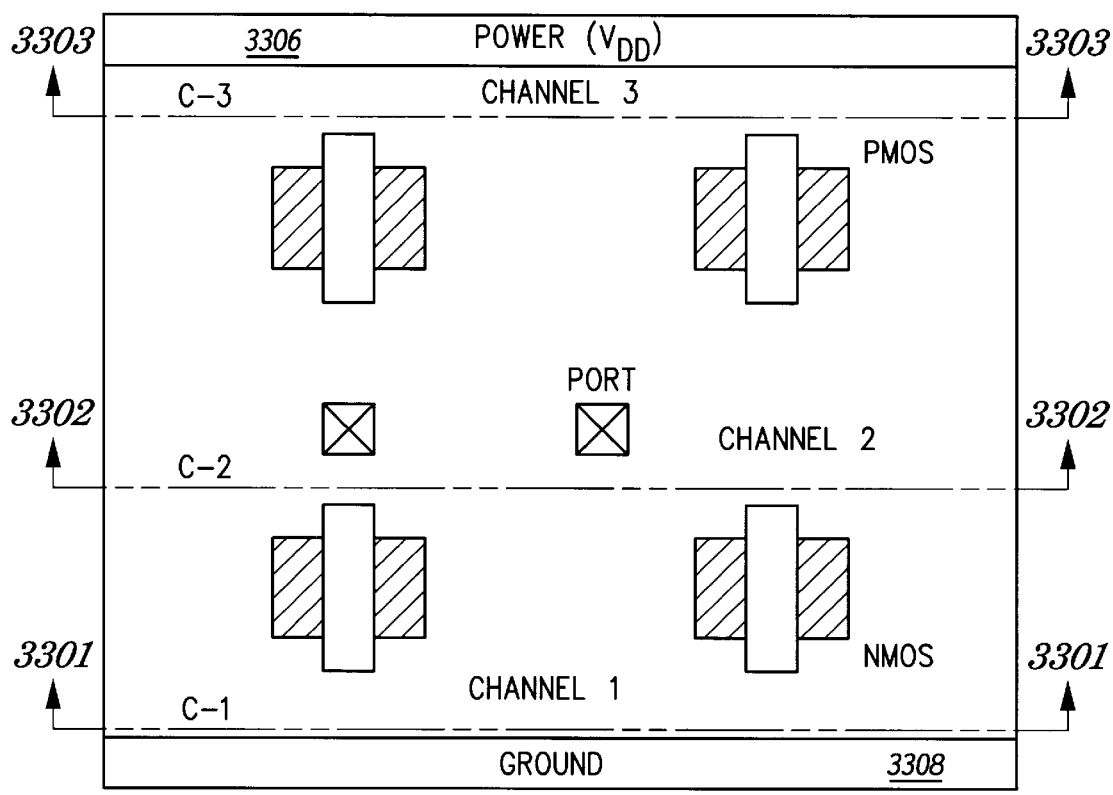
FIG. 32 is a circuit layout that illustrates operation of Expand Routing Channel functionality illustrated in FIG. 31.

Expand routing channel step 1422 is illustrated in greater detail in steps 1708, 1710, and 1712 of FIG. 31 and FIG. 32. In step 1708, the channel identified for expansion is considered. To execute this consideration procedure, a "cut-line" is drawn through this channel in step 1710. Such cut-lines are represented as 3301, 3302, and 3303 in FIG. 32. Next, in step 1712, all objects in the layout that lie above this "cut-line" are moved up by one ore more routing tracks. An amount by which the objects are moved is based on the process technology information provided in pre-routing step 152. For example, one routing track is translated to a geometric space required for one track of the layer upon which it is being implemented.

Each of the three steps, 1420, 1422, and 1408, described above is iteratively repeated. The procedure of step 1422 terminates if either all nets are completely routed, or a limit on the expansion region is achieved. This termination condition is checked in step 1410.

The Router described herein has the ability to add routing space for every necessary element in a systematic fashion to ensure routing completion of the circuit being laid out. Thus, the present invention allows as many tracks as are absolutely needed to complete circuit routing within a tightly integrated routing system. This flexibility results in a routing operation that is able to effectively complete routing operations to obtain optimal layouts in a fully automated way. Even though the embodiment described herein deals with routing region expansion in the vertical dimension, the present invention allows routing region expansion in the horizontal dimension as well. In such a case, the "cut-line" is vertical and objects are moved in the horizontal direction.

Additionally, the present invention allows the cell layout to be optimized by automatically modifying routing directions of various routing layers to pick a best set of directions based on a routing cost metric. The present invention implements this flexibility through the use of step 1416. FIG. 33 is a flowchart that illustrates the functionality executed by step 1416 in greater detail. In a first function executed by step 1416, the routing associated with a circuit layout are explored. Routing costs are defined in a manner illustrated in FIG. 33 in step 1806. Each layer of the circuit layout is associated with three costs: the horizontal cost, H; the vertical cost, V; and the via cost, C. If the horizontal cost, H, is less than the vertical cost, V, the relationship indicates that a preferred direction of routing for the layer being evaluated is horizontal. The via cost, C, indicates a penalty associated with switching from one layer to another layer. It should be noted that via costs vary for each pair of layers. Additionally, it should be noted that the horizontal cost and vertical cost values may be input by an external user or determined by the system.

After the routing costs are defined, there are two methods adopted for modifying those costs. This methodology is illustrated in greater detail in step 1808 of FIG. 33. In the first method, the horizontal and vertical routing costs are flipped. In other words, if a preferred direction for a layer is vertical, it is set to be horizontal and vice versa. In a second method for modifying routing costs, the relative cost for the horizontal and vertical directions for each layer are changed to other values which are not necessarily related to the previous values of the opposite direction. It should be noted that for purposes of this description, the vertical direction is an opposite of a horizontal direction, and the horizontal direction is an opposite of the vertical direction. Additionally, it should be noted that the via cost for each layer pair is also modified. Subsequently, the modified routing costs are provided to the area router of step 1408 which performs the routing based on the new set of costs. Subsequently step 1414 is executed to determine a best solution.

This portion of the present invention provides a methodology for increasing routing space only when necessary. Furthermore, the present invention provides a methodology for automatically choosing a layer of routing direction such that area is optimized. Thus, the router of the present invention allows for better utilization for available area. As well, the present invention permits routing over transistors and to ports or ties, and implements a methodology which results in significantly fewer contacts than the channel routers of prior art implementation.

G. Wire Minimization for Gridded Ports

Input and output (I/O) ports of signals in CMOS circuit layouts are required to be placed on specific grid locations, i.e., X and Y coordinates of ports must be integral multiples of a specified grid size. This is relevant in automatic layout synthesis, which uses layout compaction and wire minimization as a critical synthesis step.

This invention addresses automatic placement of input and output signal ports on a user specified grid during Wire Length Minimization. Wire Length Minimization is a major step in the layout compaction process of layout synthesis. The user-defined port grid during automatic cell generation (such as disclosed herein) is intended to facilitate block-level routability of standard cells by "Place and Route" tools. During Wire Length Minimization, port grid locations are selected such that the corresponding weighted wire lengths of the nets in a layout are minimized without violating user specified grid locations for input and output (I/O) ports. This procedure is essential to fully automate the cell layout synthesis process and to produce minimally sized standard-cell libraries to be used in designing digital Integrated Circuits (ICs).

A Compactor is a CAD tool used to generate design-rule-correct physical layouts which occupy minimum area either from symbolic layouts or from (loosely designed) physical layouts. In one-dimensional Constraint-Graph based Compaction, the compaction problem is separated into two independent compactions, one in the X-direction and one in the Y-direction. For each compaction, a Constraint-Graph which represents the physical connectivity and separation constraints, is generated. Then the graph is solved to minimize the layout area using the longest (or Critical) path method.

Figures 44, 45:
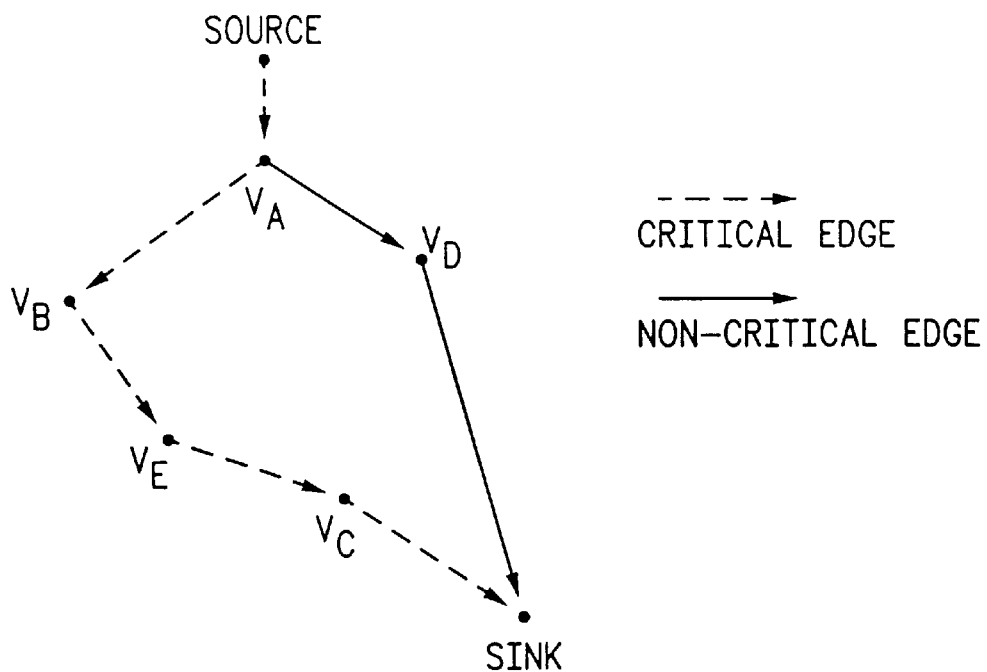
FIG. 44 is a Constraint-Graph representation of layout shown in FIG. 43, steps 2512, and 2514.
FIG. 45 is a table that illustrates the vertex weights and grid requirements corresponding to the vertices shown in FIG. 44.

In the Constraint-Graph, each layout element is represented by a vertex, and the physical connectivity, size, and separation constraints between any two elements are represented by edges between the corresponding graph vertices. An example of a Constraint-Graph is illustrated in FIG. 44. The compaction is performed in the Y-direction from bottom to top. The minimum achievable size of the layout, represented by the Constraint-Graph, in the direction of compaction is determined by the longest (or Critical) path(s) of the Constraint-Graph. The vertices on the Critical Path are known as Critical vertices and the rest of the vertices which do not limit the cell size are known as Non-Critical vertices. Non-Critical vertices have an inherent slack. The slack of a vertex is defined as the difference between its maximum and minimum distances from the Source Vertex. For Critical vertices, the minimum and maximum distances are equal, and thus the slack is by definition zero.

The longest (or Critical) path algorithm used in the one dimensional compactor disclosed herein moves all layout elements (including Non-Critical vertices) to the minimum possible distance from one of the layout boundaries. Input and output (I/O) ports are placed on the closest possible grid location from the boundary. Thus all layout components are pulled towards the top or left edge of the layout resulting in the extension of wires that run in the compaction direction. Extension of wires leads to a decrease in electrical performance due to an increase in parasitic capacitance and resistance. Also, these extended wires may increase the overall layout area by blocking the movement of the layout elements during subsequent compaction in the orthogonal direction.

One important goal of the Wire Length Minimization methodology disclosed herein is to choose positions along the axis depending on the compaction direction for Non-Critical graph vertices so as to minimize the corresponding overall Weighted Wire Length without violating any design rule constraints and On-Grid requirements without increasing the cell size. Wire Minimization is performed after solving the graph to determine the minimum and maximum locations for all vertices in the graph.

It is important to minimize the wire length of the interconnections that are connected to layout elements like ports which are placed on a grid location during compaction. Some of these ports may have more than one grid location that can satisfy the given constraints. By providing a mechanism for moving those ports to other grid locations during Wire Length Minimization, better results can be achieved. Unlike other layout elements, ports often need to be placed only on specific grid locations, i.e., in integral multiples of grid size in the slack region.

Figure 46:
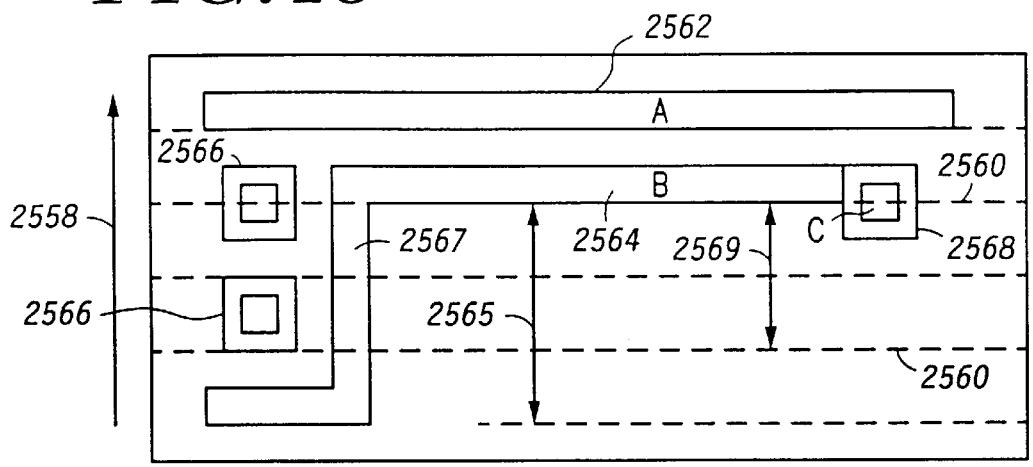
FIG. 46 through 48 are simple layouts that illustrate some of the advantages of moving On-Grid elements during step 2518.
Figure 47:
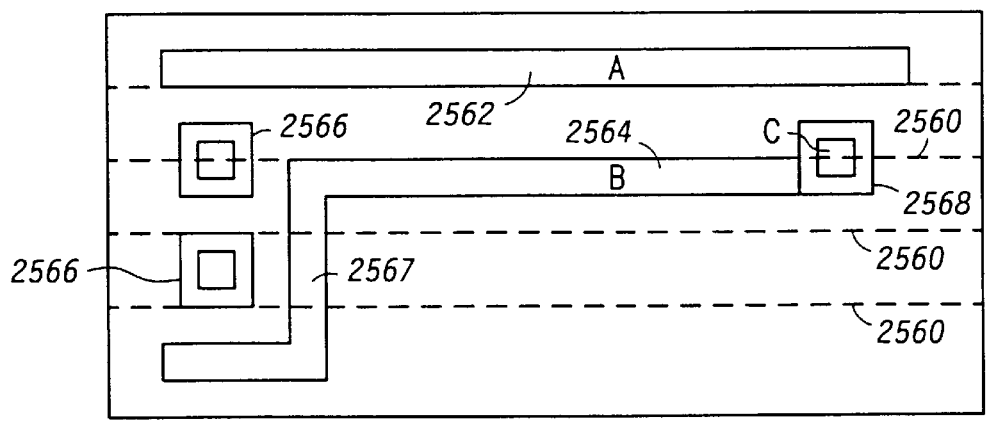
Figure 48:
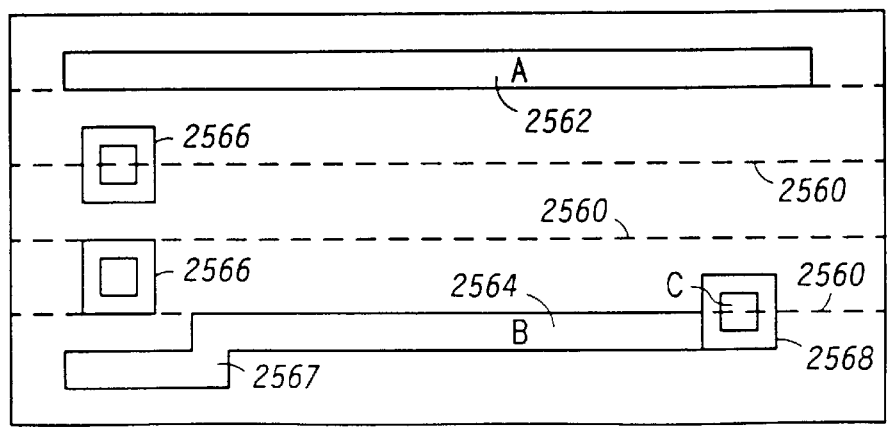

Elements that must be placed on a grid are marked as On-Grid during compaction. If one or more vertices in the vertex group are On-Grid elements, the vertex group should only be moved by integral multiples of the grid size. In FIGS. 46, 47 and 48, if port C 2568 is not placed on a grid, it can be moved so that wire B 2564 is absolutely straight, resulting in minimal length. However, if it is placed on a grid 2560 it can be moved (along with other elements) only two grid points down. Starting with a compacted layout in FIG. 46, the layout generated by Compactor and Wire Minimizer that does not allow movement of On-Grid elements is shown in FIG. 47, and when On-Grid elements are moved is shown in FIG. 48. In the layout shown in FIG. 47, initial On-Grid placement of ports during compaction is not altered during the Wire Minimization phase. Wire Minimization achieved is higher when the On-Grid ports are moved to new locations as shown in FIG. 48.

In the published literature, wire length minimization is restricted to layout geometries that need not lie on a specific grid. In commercial tools such as Cadence's Virtuoso Layout Synthesizer (LAS) and Silicon Compiler Systems' Explorer AutoLayout tools, there is no evidence that Wire Minimization is performed on the layout patterns that ultimately are placed on a grid.

Figure 34:
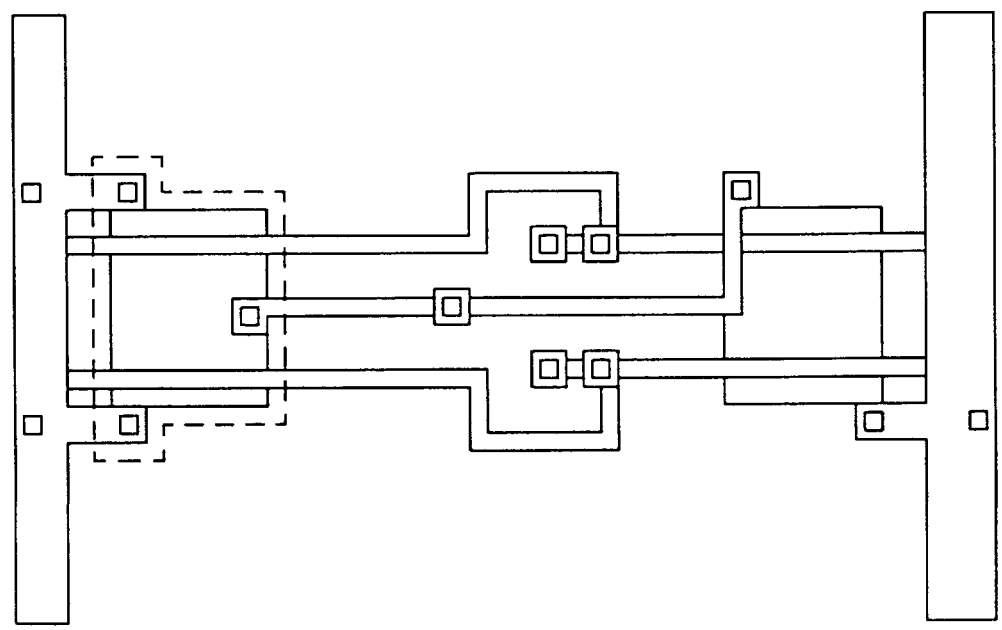

FIGS. 34, 35, 36 and 37 are for standard cell layouts showing four different levels of or stages in compaction. They are utilized to illustrate the compaction process. FIG. 34 illustrates an un-compacted layout.

Figure 35:
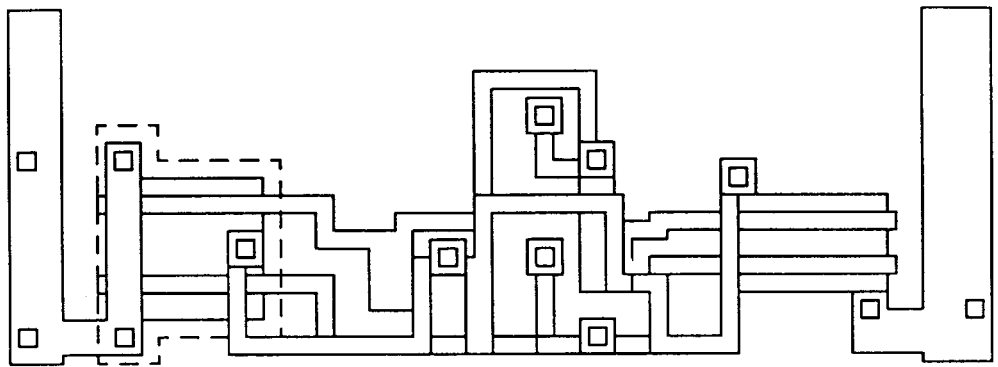
FIGS. 34 through 37 are Standard cell layouts that illustrate the layout compaction process.

FIG. 35 illustrates the layout shown in FIG. 34 compacted in one direction or dimension. In this case, the compaction has been done in the X direction, compacting all of the elements to the left. Wire Minimization has not yet been performed.

Figure 37:
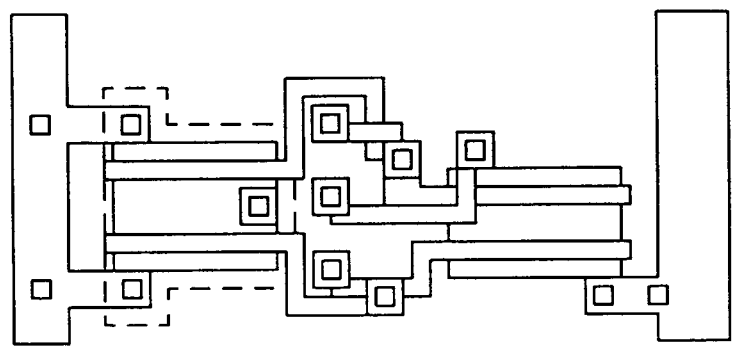
Figure 36:
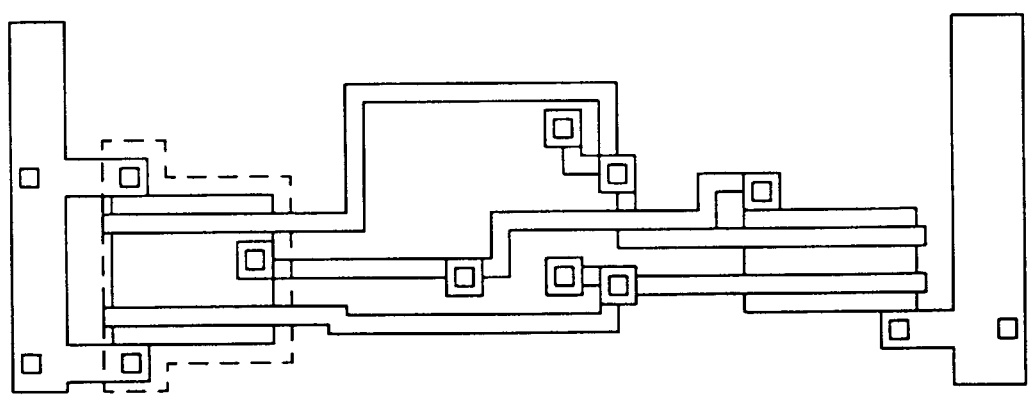

FIG. 36 illustrates the compacted layout shown in FIG. 35 after Wire Minimization has been performed. Compaction and Wire Minimization can be repeated several times, compacting first in one direction, and then in the other direction, then potentially back in the first direction. The result shown in FIG. 37 is the layout after compaction and Wire Minimization at least once in both the X and the Y direction.

Figure 38:
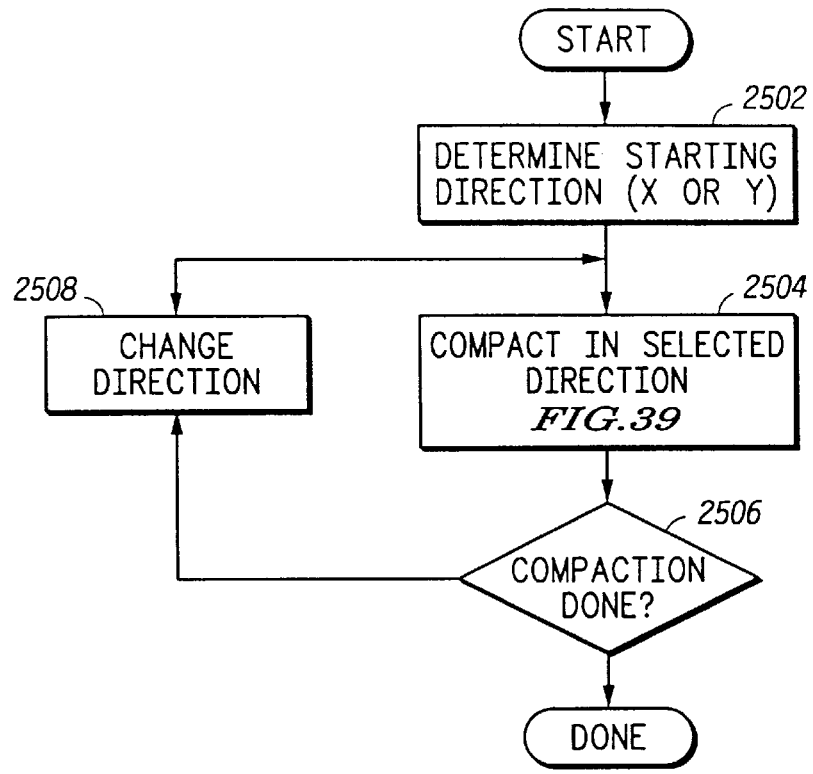
FIG. 38 is a flowchart that illustrates the operation of compaction, step 156.

FIG. 38 is a flow chart illustrating the operation of compaction illustrated in step 156 of FIG. 4. A starting compaction direction is determined in step 2502. The layout will first be compacted in either the X or Y direction, as determined by external parameters. This is determined in steps 191, 192 and 193 of FIG. 9. Note that in the preferred embodiment, the entire compaction process is usually performed at least twice, once starting in the X direction, and once starting in the Y direction.

After determining the starting direction, step 2502, the layout is compacted in the selected direction, step 2504. After compaction in the selected direction, step 2504, a test is made whether compaction is done, step 2506. If compaction is not complete yet, step 2506, the compaction direction is changed, step 2508. Compaction of the X direction is changed to the compaction of the Y direction, and vice versa. The result is that the routine toggles back and forth between compacting in the X direction and the Y direction.

Returning to step 2506, in the preferred embodiment, the loop is repeated up to four times. If the layout is first compacted in the X direction, the loop will be repeated three times, compacting in the X, Y, and X direction. However, if the layout is first compacted in the Y direction, it is compacted in the order of Y, X, Y, and X. The reason for always ending with an X compaction is that once the standard cell height has been met (which is the result of a Y compaction), a final X direction compaction is done to minimize the cell width. Another embodiment is to iterate between X and Y directions until a point of diminishing returns has been reached. For example, one could compact in the X and then the Y direction, and then compare the size of the resulting layout to the layout resulting from the previous compaction in the Y and X direction, stopping when any improvement is below minimum threshold. Alternatively, each X compaction can be tested against the previous X compaction, and if compaction has been performed above a minimum threshold, a Y and an X compaction are then executed.

Figure 39:
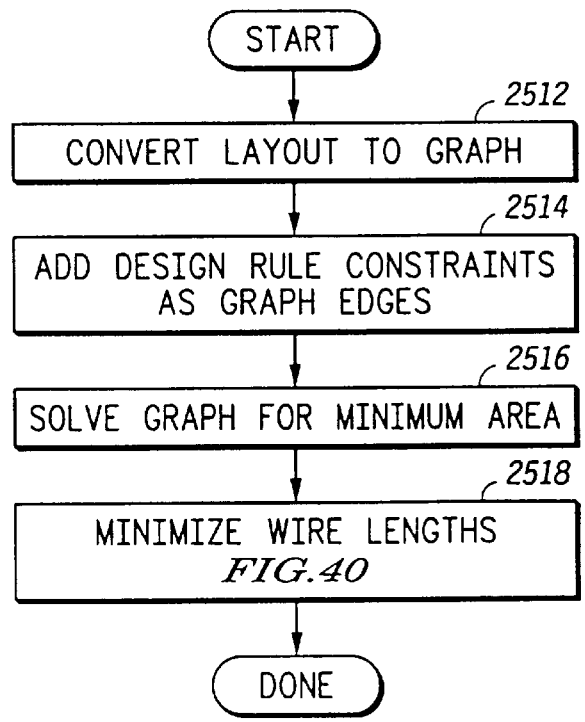
FIG. 39 is a flowchart that illustrates operation of compaction in a selected direction of step 2504.

FIG. 39 is a flow chart that illustrates operation of the compaction in a selected direction in step 2504. First, in step 2512 the layout is mapped into a Graph consisting of vertices and edges. Each graph vertex represents a layout element. Design rule constraints are added as graph edges in step 2514. The Constraint-Graph is solved for minimum area in the direction of compaction, step 2516. Referring back to FIG. 34, and 35, this step illustrates the transition from FIG. 34 to FIG. 35. In FIG. 35, all the elements have been compacted to the left as far as they can be without violating any design rules. This is Compaction in the X direction. The techniques for this type of one-dimensional compaction are well known. One embodiment operates by finding Critical Path or paths through the Constraint-Graph, then determining slack for vertices that are on the Non-Critical paths, then setting their locations to their minimum values. Note that the Critical Path is the longest path through the Constraint-Graph, and by definition contains no slack. Also note that area minimization is performed, as was illustrated by compacting to the left between FIGS. 34 and 35. A comparable area minimization technique may be performed instead, by compacting the layout to the right, and to the bottom, instead of to the left, and to the top of the layout.

After solving the graph for the minimum area, step 2516, wire lengths are minimized in step 2518. The results of Wire Length Minimization step 2518 can be seen in the transition between FIGS. 35 and 36. Wires in FIG. 36 have been minimized and straightened, in order to minimize total weighted wire length. Note that if the wire lengths are not minimized as shown in FIG. 36, any subsequent Y axis compaction will result in a much bigger final layout.

Figure 40:
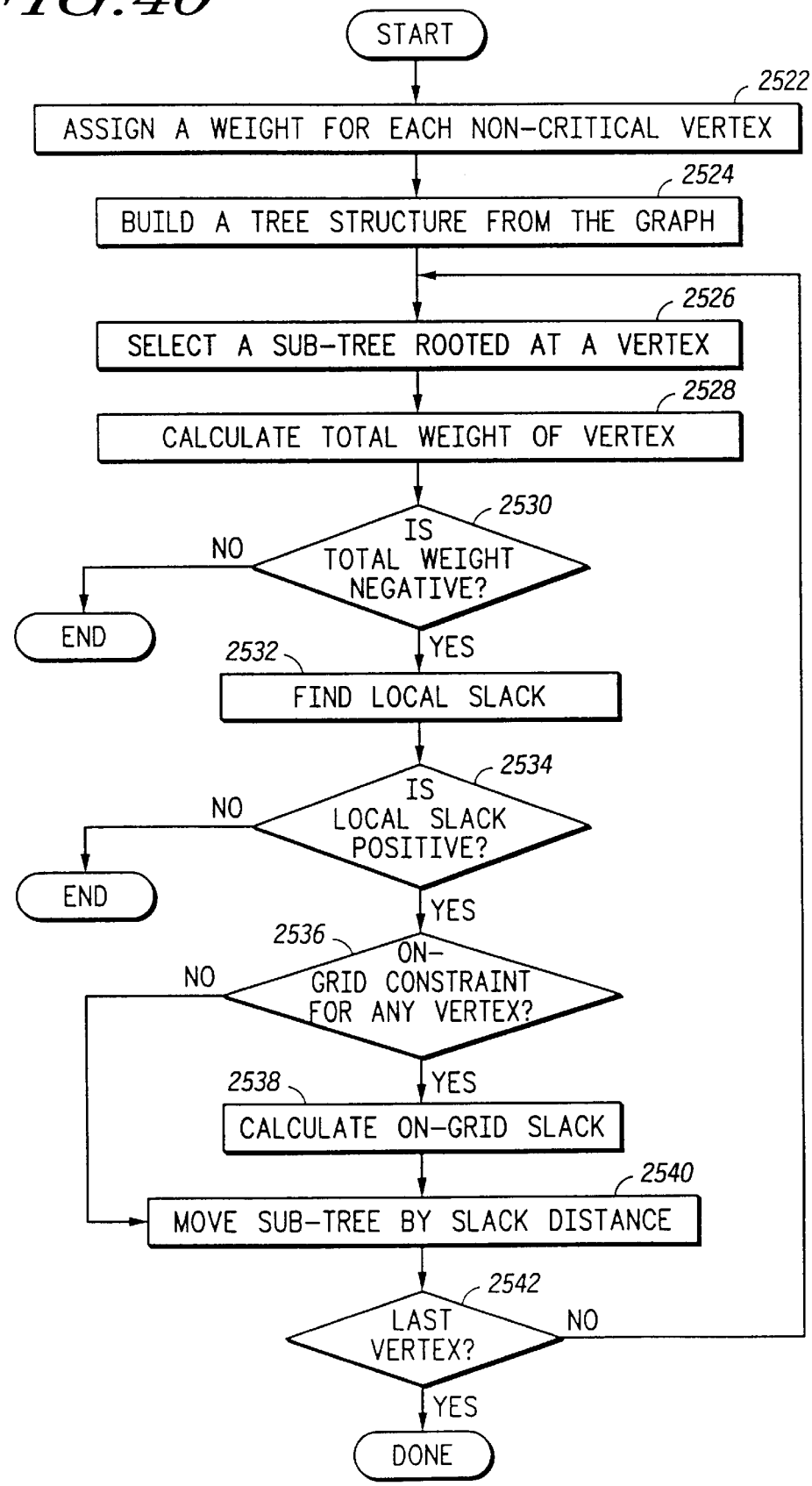
FIG. 40 is a flowchart that illustrates the operation of Minimize Wire Length function, step 2518.

FIG. 40 is a flow chart illustrating the operation of Minimize Wire Length function from step 2518. This function starts by assigning a weight to each Non-Critical vertex in the graph, step 2522. This signed magnitude of each weight represents whether the wire length will be increased or decreased when the corresponding vertex is moved. The weight represents and is a function of the parasitic load on the corresponding interconnects between the vertices.

Next, a tree structure is built from the graph, step 2524. The tree is built connecting layout elements as vertices with Non-Critical edges. One result is that there will be one or more sub-trees connected to vertices on the Critical Path(s).

After the tree structure has been built from the graph, step 2524, one of the sub-trees is selected, step 2526. It is rooted at a vertex located on the critical path. The total weight of the sub-tree rooted at the specified vertex is calculated, step 2528. A test is then made whether the total weight is negative, step 2530. If the total weight is not negative, step 2530, the previous two steps, 2526, 2528, are repeated. Otherwise, the local slack for the sub-tree is found, step 2532, and the sign of the local slack is tested, 2534. If the local slack is not positive, step 2534, the previous loop steps 2526, 2528, 2530, and 2532 are repeated. Otherwise, a test is made whether there are any grid constraints for any of the vertices in the sub-tree, step 2536. If yes, the On-Grid slack is calculated, step 2538. In any case the sub-tree is moved by the slack distance, step 2540. Finally, a test is made whether this is the last vertex, step 2542. If it is not the last vertex, step 2542, the previous eight steps 2526 to 2540 are repeated. Otherwise, the wire length function is complete, and a return is made to step 2518.

Figure 41:
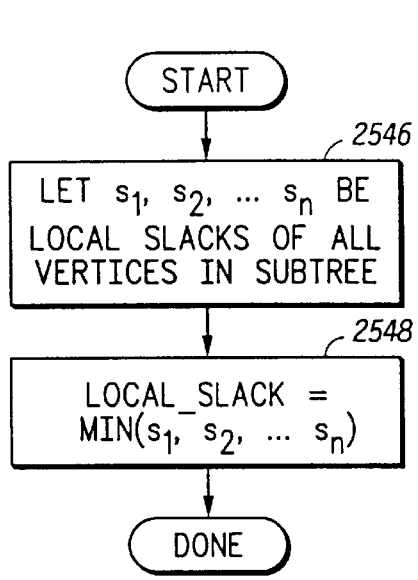
FIG. 41 is a flowchart that illustrates Find Local Slack routine in step 2532.

FIG. 41 is a flow chart that illustrates the Find Local Slack Function in step 2532. First, $S_1, S_2, \ldots S_n$ are defined to be the Local Slacks of all the vertices in the sub-tree, step 2546. Local Slack of a vertex in a sub-tree is defined as the maximum distance it can be moved without moving any vertex that is not part of the sub-tree. The Local Slack of the sub-tree is then set to the minimum of the Local Slacks (i.e. Local_Slack=MIN($S_1, S_2, \ldots S_n$)), step 2548.

Figure 42:
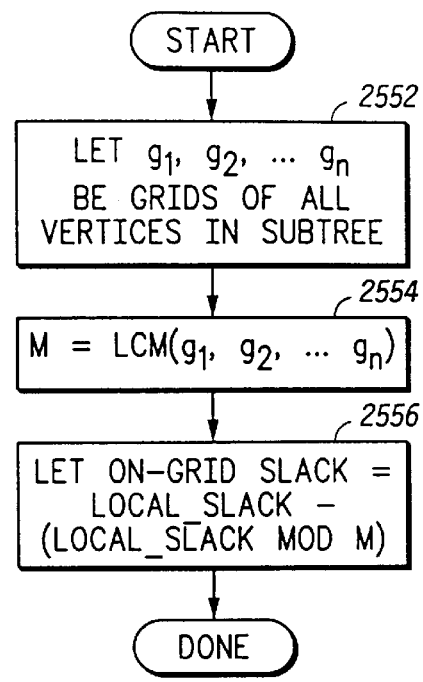
FIG. 42 is a flowchart that illustrates the operation of the Calculate On-Grid Slack routine in step 2538.

FIG. 42 is a flow chart illustrating the operation of the Calculate On-Grid Slack routine in step 2538. First $G_1, G_2, \ldots G_n$ are defined to be grids of all vertices in the sub-tree, step 2552. Next M is set to the least common multiple (LCM) factor of $G_1, G_2, \ldots G_n$ (i.e. M=LCM($G_1, G_2, \ldots G_n$)) step 2554. Finally, the On-Grid Slack is set to the Local_Slack minus the Local_Slack modulo M (i.e. On_Grid_Slack=Local_Slack—(Local_Slack MOD M)), step 2556. Note here that the continuous case where elements are not constrained to being On-Grid can be treated as a case where the grid size is equal to the minimum database granularity.

Figure 43:
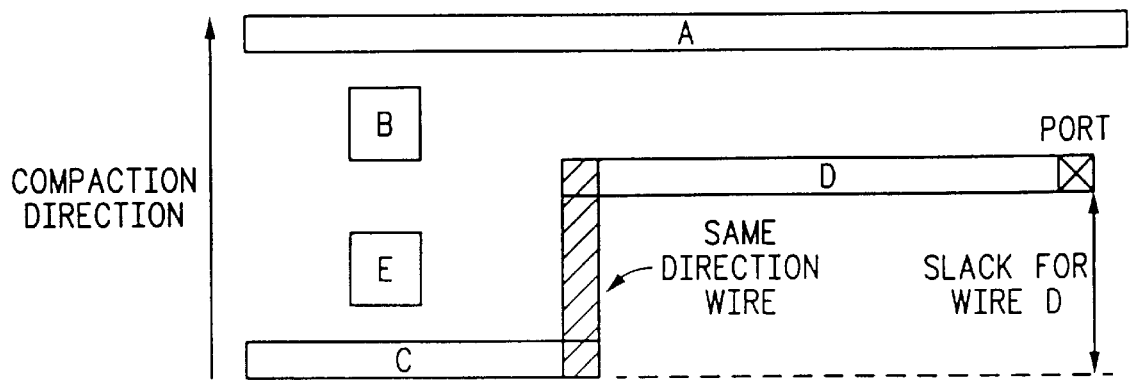
FIG. 43 is a layout example for illustrating graph representation of layout in step 2512.

FIG. 43 illustrates an example of a simple layout. FIG. 44 is a Constraint-Graph representation of the layout in FIG. 43. The dotted edges between the Source, $V_A, V_B, V_E, V_C$, and the Sink identifies the Critical Path. Each vertex in the graph represents a layout element in FIG. 43. FIG. 45 is a table that illustrates the vertex weights and grid requirements corresponding to the vertices in FIG. 44.

FIGS. 46, 47, and 48 are simple layouts illustrating Wire Minimization. The three layouts are utilized to show some of the advantages of providing a mechanism that allows On-Grid element to move during that phase, while maintaining On-Grid requirements for these elements.

FIG. 46 illustrates the layout after Compaction, step 2516, but before Wire Minimization, step 2518. The layout has two wires: Wire A 2562, and Wire B 2564. There are two elements 2566, such as ports, which are not moved in these figures. There is also an I/O port 2568, which is located on a grid line 2560. The direction of compaction is up 2558. The Slack for wire B 2565, and Port C 2569 are also shown.

FIG. 47 illustrates Wire Minimization when the I/O port 2568 is not allowed to be moved. At best, Wire B 2564 can be moved from the top edge of I/O Port C 2568 to the lower edge of I/O Port C 2568.

FIG. 48 illustrates the effect of providing a mechanism that allows I/O ports 2568 to be moved to other grid locations 2560 in order to minimize wire length. Note the vertical dimension 2567 of Wire B 2564. It is significantly shorter in FIG. 48 than it was in FIG. 47. This results from moving I/O Port C 2568 down two (2) grid lines 2560. Wire B 2564 is thus shorter by approximately the spacing between the grid line 2560 on which I/O Port C 2568 was located in FIG. 46 and the grid line 2560 on which it is located in FIG. 48.

Figure 50:
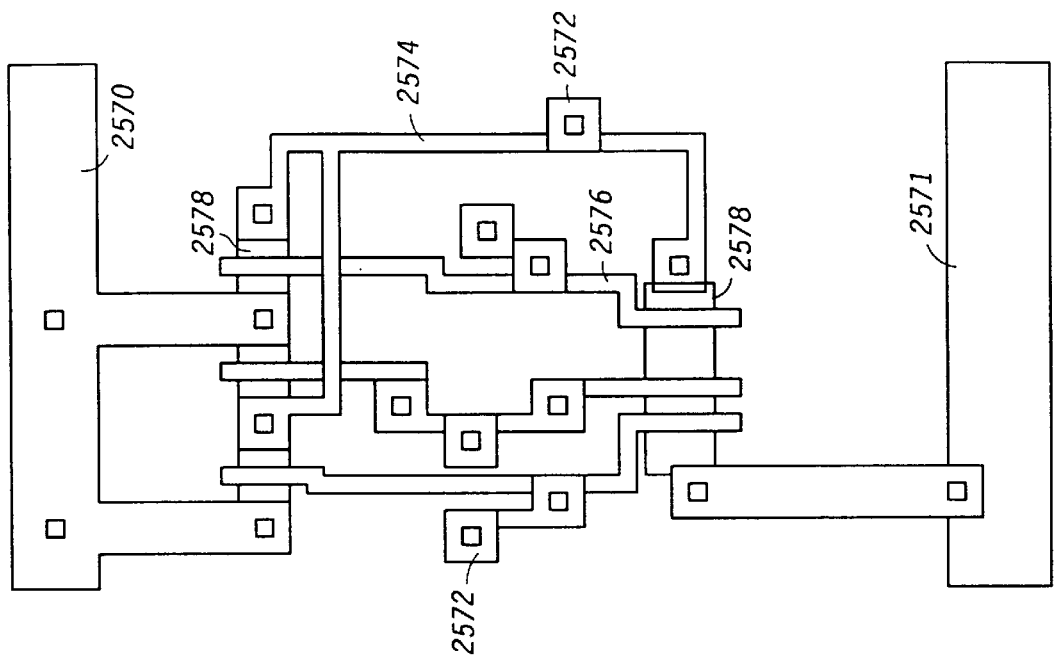
FIGS. 49 and 50 are Standard cell layouts that illustrate the benefits of wire minimization with On-Grid Ports.
Figure 49:
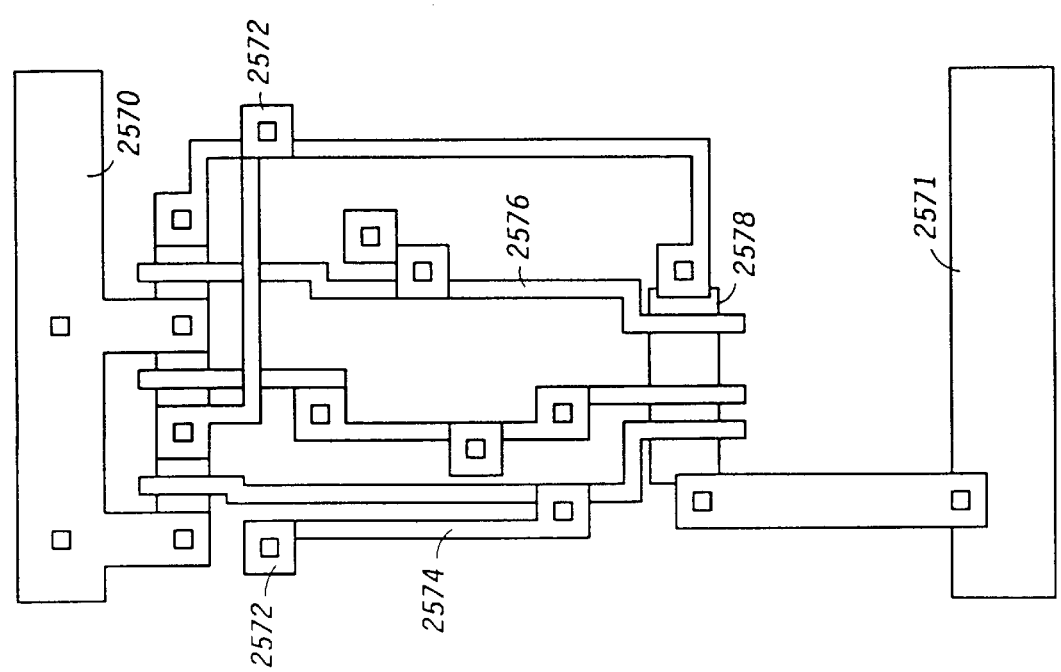

FIGS. 49, and 50 together illustrate the benefits of Wire Minimization on standard cells with On-Grid ports. In both figures, there is a top rail 2570 for VDD, and a bottom rail for Ground 2571 made of Metal-1. There are four I/O ports 2572. The ports are connected with Metal-1 wires 2574. The layout also contains Poly wires 2576 and a Diffusion area 2578.

FIG. 49 illustrates Wire Minimization without moving the I/O ports 2572. FIG. 50 illustrates Wire Minimization with ports moved during Wire Minimization. The result is that the Metal-1 wires 2574, and the three Poly wires 2576 are significantly shorter in FIG. 50 as compared to FIG. 49. This can be attributed to allowing ports to be moved to other grid locations. Because of the shorter wires, the performance of the circuit is substantially improved. Note also that this shortening of wires has been at the expense of lengthening the two wires between the VDD rail 2570 and the transistor formed by the upper Diffusion areas 2578.

The approach herein of Wire Length Minimization is much more comprehensive and performs wire length minimization without violating on-grid requirements of input and output (I/O) ports than is available in the prior art. In this layout synthesis approach, circuit layouts with better electrical characteristics are generated due to reduced parasitic loads on signals. This comprehensive Wire Minimization can lead to denser layouts when compared to the layouts generated by any commercially available tools.

H. Notch, Tie, and Contact Filling Flow

The use of design rules to verify semiconductor design integrity is known in the semiconductor arts. Generally, a design rule will specify a minimum spacing between two structures of a semiconductor layout. These structures can be on the same or different "mask" layers. Historically, design rules have been used in one of two ways. First, design rules have been used by automatic layout tools to assure a structure is not placed or routed closer than the design rule allows to another structure. For example, if a first net has been previously routed on a given layer, and a second net is in the process of being routed on the same layer, the design rules would be adhered to by the router such that the second net would not be placed closer than a specified design rule distance to the first net.

Running a design rule check (DRC) following a placement and routing of design components is a second method of using design rules. Some DRC checks occur layer by layer to determine whether two structures on a common layer violate a design rule, such as a spacing design rule. Other DRC checks occur between layers to determine if two or more structures on multiple layer violate a design rule, such as an overlap or spacing design rule. The DRC checker evaluates each structure individually to determine whether any other structure relative to the first net violates a design rule. The DRC checker outputs a list of errors for a layout designer to correct.

While effective, the prior art methods have several limitations, the first being that the DRC checkers have mechanisms to verify if a layout is valid but do not include a method to fix errors that may exist. The second limitation is that DRC checkers generally apply a common set of design rules to similar structures. Not taken into account is the fact that various structures, such as interconnections, on a layer may relate to other structures in such a manner that they need not abide by the same design rules as the other structures. This results in space inefficient designs. DRC checkers do not attempt to produce space efficient designs, nor do they attempt to correct identified errors. This task generally requires manual modification by a layout designer, resulting in increased turn around time and less space efficient layouts.

Therefore, it is desirable to have a methodology that automatically produces space efficient layouts and guarantees DRC correctness.

Figure 51:
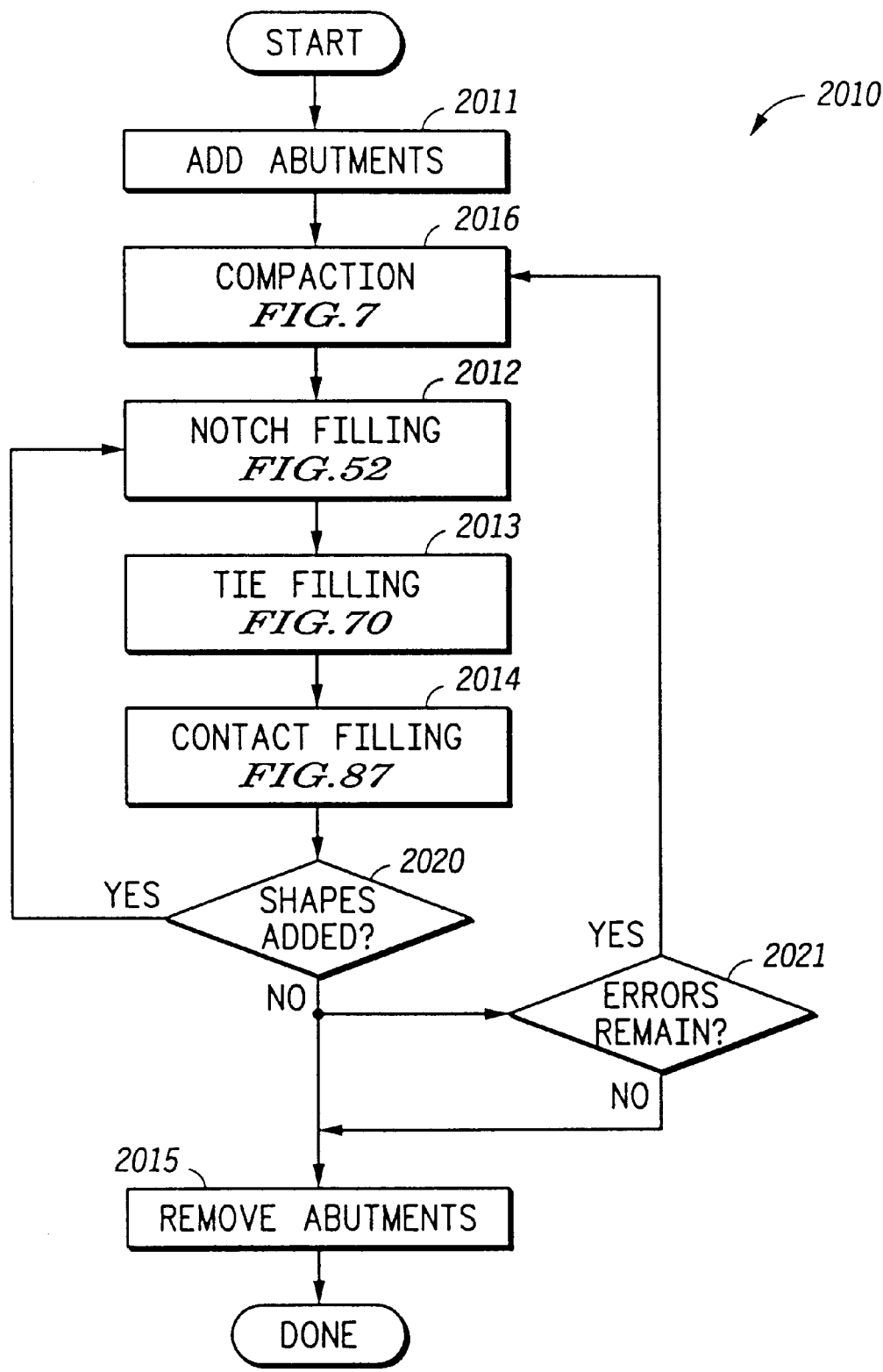
FIG. 51 is a flowchart that illustrates notch, tie, and contact filling in accordance with the present invention.

FIG. 51 is a flowchart that illustrates a method 2010 for shape filling. Shape filling 2010 begins at step 2011 where abutments are added. These abutments emulate other structures that may have design rule interactions with the layout being processed. For example, in standard cell layouts design rules exist between specific layers, such as a nitride and a well layer. A violation between these two layers can occur when two cells, each design rule correct by itself, are placed side by side in a larger design. In order to prevent this type of design rule violation from occurring, artificial shapes are added on the sides of the layout preventing design rule violations. These artificial shapes incorporate "placeholders" within each cell so that the subsequent steps 2016, 2012, 2013, 2014, and 2015 operate correctly. In a preferred embodiment of this invention, abutments are added on a mask layer outside an existing boundary of the layout being processed. Abutments may also be added on a well layer both inside and outside an existing boundary of the layout being processed. Abutment sizes may be directly specified, or they may be determined by considering each abutting layout of a plurality of layouts that may abut the layout being processed and further considering where layout elements in the abutting layout may encroach on the space required by the layout being processed.

Next, at step 2016, an automatic compaction of the layout is performed. During this compaction step, spacing rule violations for objects residing on the same net are allowed. This allows design rule violations to occur between objects of the same net. However, objects on different nets will strictly maintain rule requirements specified by the technology. Unlike prior art, which would enforce a same-net design rule for given structure types, this use of varying design rules based on structure attributes, such as nets, permits improved compaction of a design. Since same-net design rules are ignored, processing of violations may be required later in the flow 2010.

Next, at step 2012, a notch filling method is used to automatically fill any notches introduced by the compaction step 2016. The notch filling techniques of step 2012 will be discussed in further detail below. Next, at step 2013, a tie filling technique is performed. In this step, substrate and well ties are placed into available space. This allows some cells that would otherwise have insufficient or minimal tie coverage to function properly, and in accordance with the design rules. It is important that this step occur after the notch filling step, otherwise ties may be placed into existing notches, thereby making it impossible to fill the notches without causing other design rule violations. The specific implementation of step 2013 will be discussed in more detail below.

Next, in step 2014, contact filling occurs. In this step, redundant contacts and vias are automatically added, and landings and coverings of contacts and vias are expanded. This increases the yield or good die per wafer yield of the layout by reducing single points of failure introduced by individual via shorts and opens. It is important that this step occur after the step 2013 of tie filling, because the ties added in step 2013 may introduce additional contacts to be processed in step 2014. Furthermore, in a preferred embodiment, the steps 2014 and 2013 occur before step 2012, because filled notches may now create large enough space for ties and/or contacts. The step 2014 of contact filling is discussed in more detail below.

Next, in step 2015, long tie removal occurs. A long tie occurs when a portion of a tie Diffusion layer is not within a specified distance, or design rule of any contact to its respective power layer. Step 2015 removes this portion of the tie Diffusion layer as discussed in greater detail below. Step 2015 also may remove the artificial abutments added in step 2011.

Next, at step 2020, a determination is made whether or not the filling steps 2012, 2013 and 2014 have added additional shapes. This is generally accomplished by comparing the shapes of the initial layout to the shapes of the completed layout. If a difference exists, it is known that shapes have been added. In the event that shapes have been added, it is necessary to return to step 2012 notch filling and repeat the steps of 2012 notch filling, 2013 tie filling and 2014 contact filling to assure any introduced violations are taken into account. This loop is repeated until no shapes have been added, at which time it is assured that all design rule violations have been corrected.

Once no shapes have been added, the flow of method 2010 continues at step 2021. At step 2021 a determination is made whether or not there are any errors remaining in the now modified layout. In the event that errors do remain, it would indicate that there were irreconcilable design rule errors introduced somewhere in the previous flow. In this case, it would be necessary to return to the compaction step 2016 and perform another compaction in order to generate a starting layout having different structure shapes upon which to perform the flow 2010 upon. When other errors do not exist, the flow continues at step 2015 where the abutments added in step 2011 are removed, as discussed further below.

The flow 2010 provides an improvement over the prior art, in that for a given standard cell, or other design, design rules can be selectively ignored allowing for improved compaction. Following this compaction the present invention automatically corrects design rule violations introduced as a result of their being initially ignored. For example, the fact that objects on a common net need not meet the same strict design rules as nets which have no relationship to one another greater compaction can be utilized. This greater compaction can introduce design rule violations which are corrected by performing the notch filling, tie filling and contact filling steps, and then repeating them in this order for a preferred embodiment. In this way it is assured that errors introduced by one step are detected and corrected by a subsequent step. The overall effect of the method 2010 results in high density, high yield designs, which can be produced in an improved period of time with fewer iterations and reduced manufacturing costs.

Figure 52:
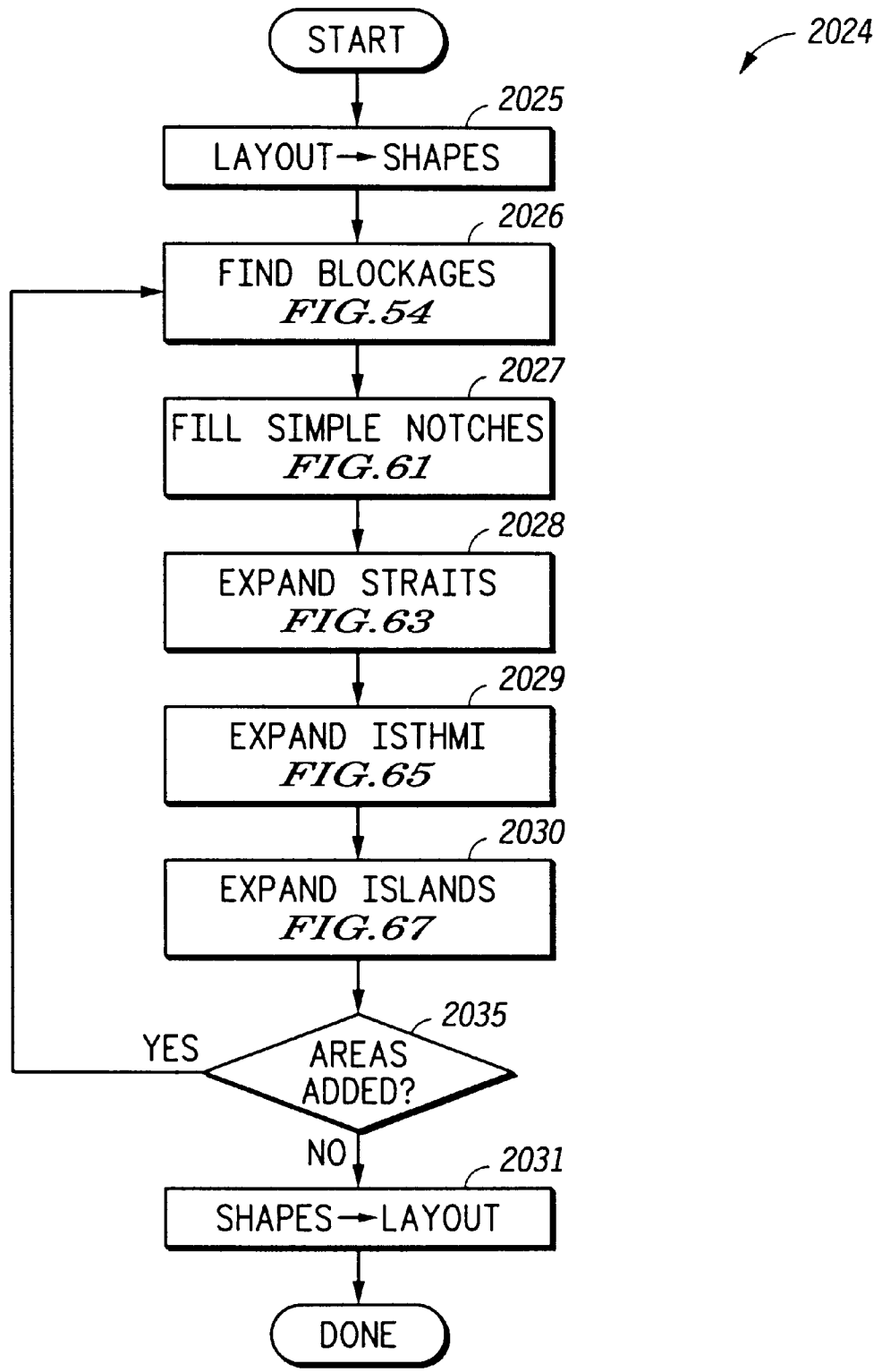
FIG. 52 is a flowchart that illustrates notch filling in accordance with the present invention.

FIG. 52 is a flowchart that illustrates a method 2024 for performing the notch filling step 2012 in FIG. 51. Notch filling 2024 begins with step 2025 where a design layout is converted into a series of shapes. Next, at step 2026, a blockage shape is determined for each layer of a layout. Then, at step 2027, all simple notches are filled for a given layer. This is followed by step 2028 where all straits for a given layer are expanded. Next, at step 2029, all isthmi are expanded for each given shape. Then, at step 2030, all islands for each given shape are expanded. Next, at step 2035, a determination is made whether or not any areas were added to each given shape. In the event that step 2035 is found to be true and areas were added, step 2035 is followed by step 2026 and continues as previously discussed; however, in the event step 2035 is found to be not true and no shapes were added, individual shapes are converted into a layout at step 2031. Steps 2025 through 2031 are discussed in greater detail below.

Figure 53:
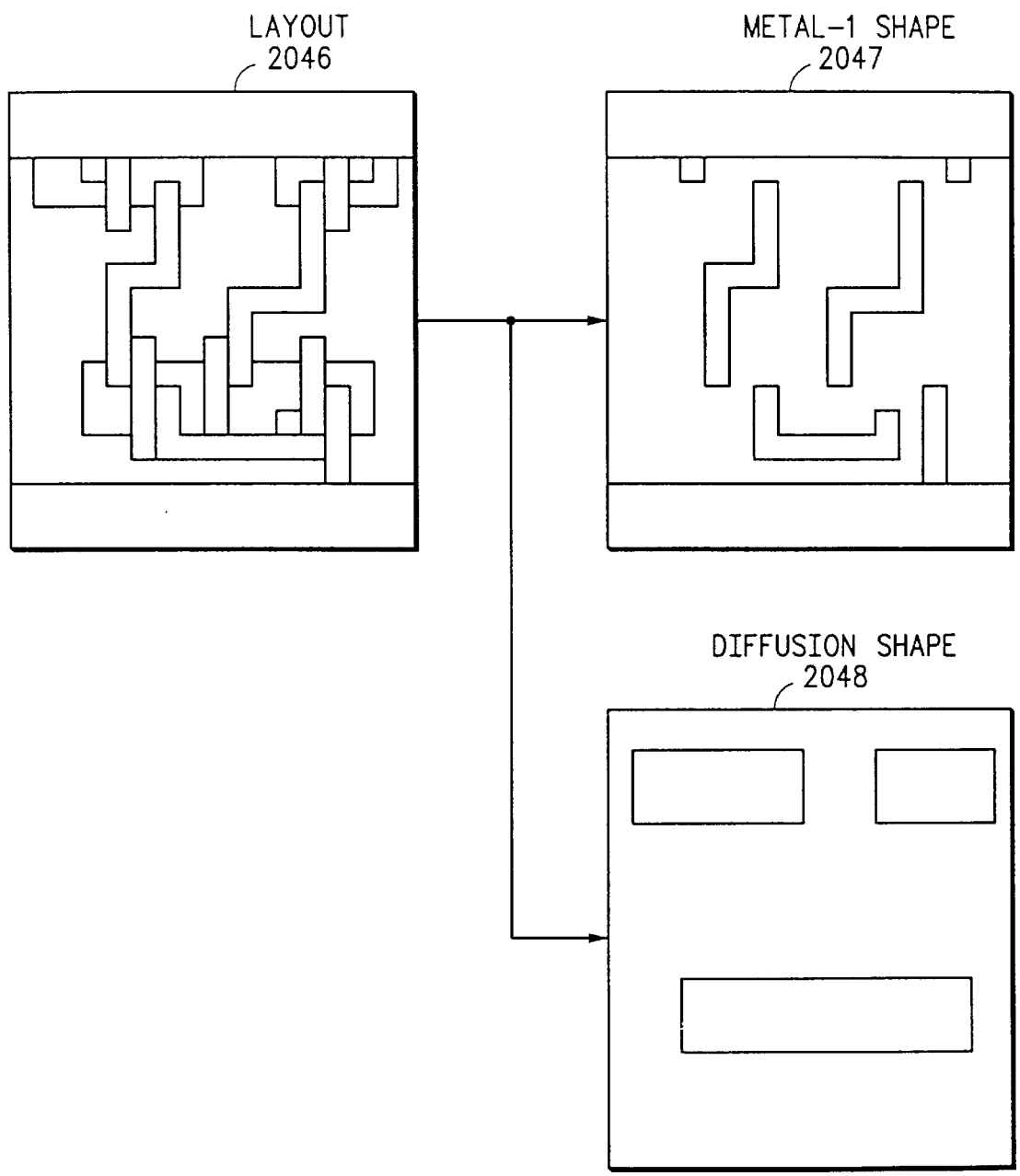
FIG. 53 is a diagram that illustrates layout to shape conversion in accordance with the present invention.

Notch Filling 2024 of FIG. 52 represents a detailed representation of the notch filling step 2012 of FIG. 51. At step 2025, a design layout is converted to a series of shapes. This is illustrated in greater detail with reference to layout diagram FIG. 53. FIG. 53 contains a representative layout 2046 of a semiconductor cell. Note that the layout contains several layers as would be understood by one skilled in the art. By converting the layout 2046 into a series of shapes, each layer is represented by its own shape. Sample layout 2046 is converted into a Metal-1 shape 2047 and a Diffusion shape 2048. Note that only two layers and their corresponding shapes are shown for illustrative purposes only. Layouts 2046 with additional layers would have corresponding additional shapes generated. Once each shape represented in FIG. 53 is generated, the original layout can be reproduced by converting each shape back into individual layer as represented in the original layout database. It is these individual shapes that are acted upon in accordance with the present invention. It is understood by one in the art, that the individual shapes are generally represented by a data base that is specifically associated with a given design tool. The database structure used is not specific to any preferred embodiment of the invention.

Figure 54:
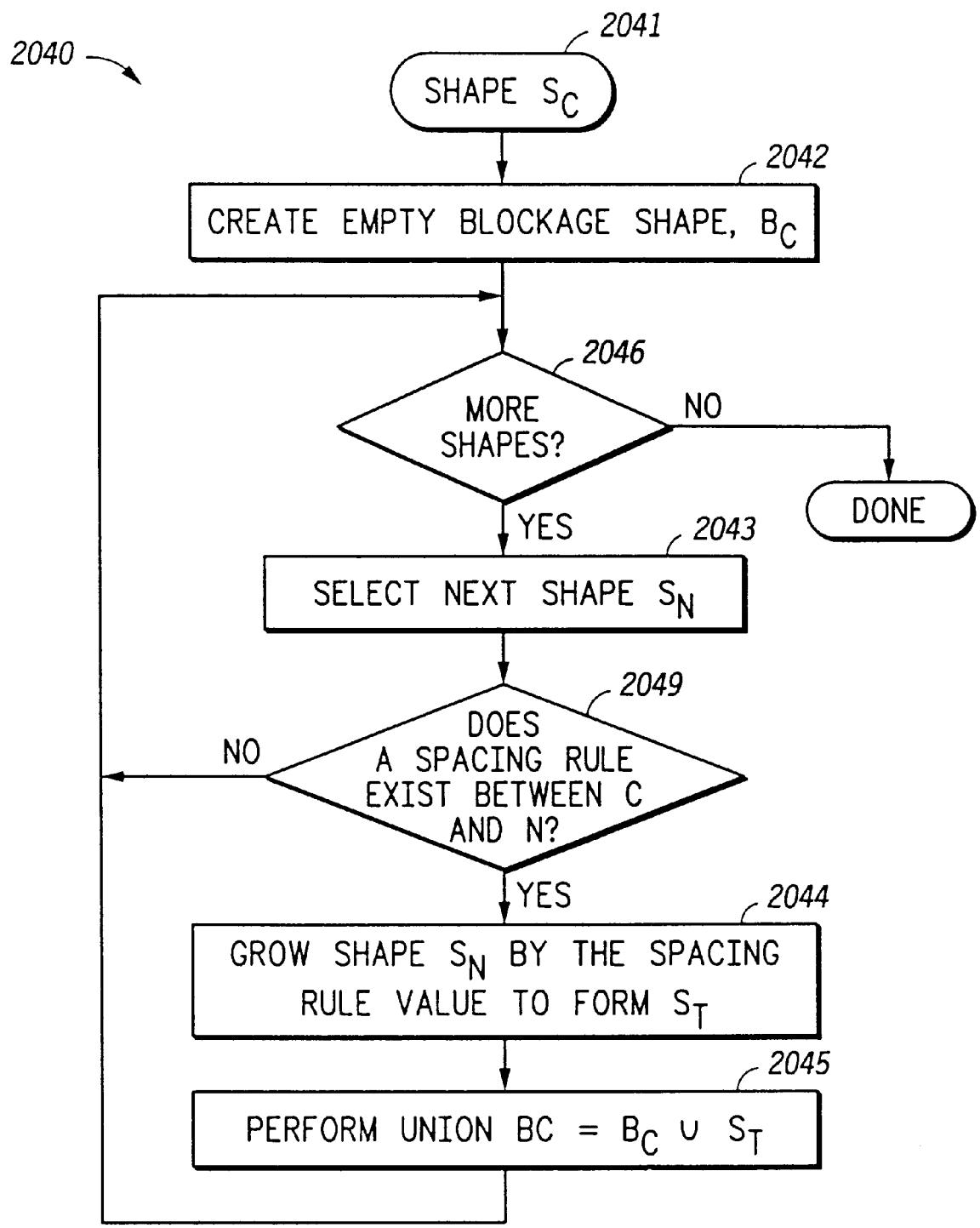
FIG. 54 is a flowchart that illustrates finding blockages step 2026 in FIG. 52.

FIG. 54 is a flowchart that illustrates a method 2040 which details step 2026 in FIG. 52 in greater detail. Starting with shape Sc in first step 2041, an empty blockage shape Bc, which is associated with Sc, is created at step 2042. Next, a test is made for more shapes in step 2046. If no more shapes exist to be processed here, method 2040 is done. Otherwise, a second shape Sn is selected at step 2043. Note that the shape Sn is associated with the same layout as shape Sc but represents a different layer of the layout. Next, at step 2049, a determination is made whether or not a spacing rule exists between layers C and N. For example, if between the layer C of the layout and the layer N of the layout, there is a spacing rule requiring one micron spacing between an structure edge of layer C and a structure edge of layer N, a spacing rule would be deemed to exist. In the event no spacing rule exists, a test is made for more shapes to test in step 2046, and if another exists, a different shape Sn is selected at step 2043, iterating until all shapes have been tested.

When a spacing rule is determined to exist between layers C and N of a layout in step 2049, shape Sn is grown in step 2044 by the spacing rule value T to produce a shape St, where T is the spacing value of the design rule. The term grown will be discussed below. Next, at step 2045, a union is performed between Bc and the grown shape St. The result of this union replaces the previous value Bc. For example, initially, when Bc still represents an empty blockage shape, the union of Bc and St will be equal to the value of St and will be stored in Bc. Steps 2046, 2043, 2049, 2044, and 2045 are repeated until all design rules associated with the layer C are processed. In the preferred embodiment of the invention, the method 2040 is performed multiple times, once for each layer C in the layout. The operation of method 2040 is illustrated with reference to FIG. 55.

Figure 55:
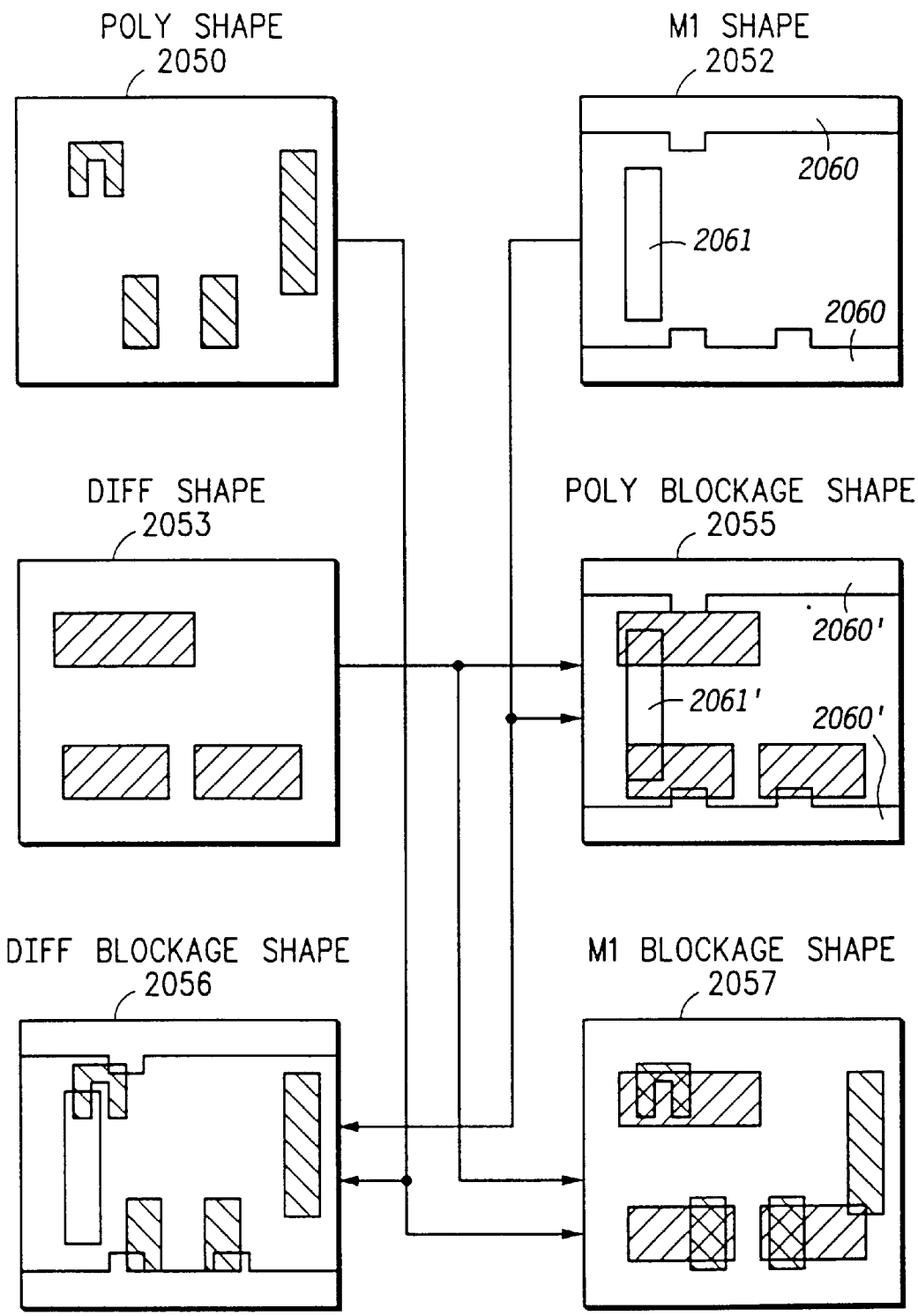
FIG. 55 is a diagram that illustrates finding blockages step 2026 in FIG. 52.

FIG. 55 is a block diagram containing six shapes. The three input shapes are a polysilicon shape 2050 (poly), a Metal-1 shape 2052 (M1 shape), and a Diffusion shape 2053. Assume that the poly shape 2050 corresponds to Sc, and the Metal-1 shape corresponds to Sn. Further assume that there is a design rule specified between the poly included in shape 2050 and the Metal-1 included in shape 2052. The Metal-1 shape 2052 is grown by the design rule amount T and stored in poly blockage shape 2055. Where the Metal-1 shape 2052 contains positive regions 2060 and 2061, it can be seen that the positive regions 2060 and 2061 have been grown or enlarged and saved into the poly blockage shape 2055 and are represented by positive region 2060' and 2061'. Likewise, positive regions of Diffusion shape 2053 are also incorporated into the poly blockage shape 2055 indicating that a design rule exists between poly shape 2050 and Diffusion shape 2053.

In a like manner, a Diffusion blockage shape 2056, and a Metal-1 blockage shape 2057 are formed assuming that common design rules exist between each of the three shapes. Poly blockage shape 2055 indicates those regions in which a polysilicon layout element cannot be added or expanded into. In other words, poly blockage shape 2055 indicates those areas where poly is not allowed to reside for a given semiconductor design. Similarly, Diffusion blockage shape 2056 and Metal-1 blockage shape 2057 indicate where Diffusion and Metal-1 are not allowed to reside.

I. Notch Filling

Figure 56:
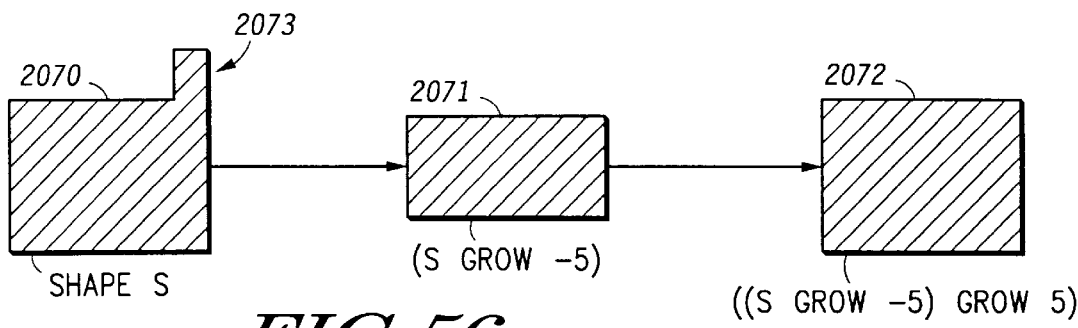
FIG. 56 through 59 are diagrams that illustrate a series of resultant shapes generated from a series of individual shapes in accordance with the present invention.

FIGS. 56 through 59 are layout diagrams that illustrate the effects of various functions, such as arithmetic functions, upon various shapes. A grow function, as used in step 2044 of FIG. 54, is illustrated in FIG. 56. Shape S 2070 illustrates an initial shape. When grown by −5, the resulting shape is shown by (S grow −5) 2071. Note that a "grow" of −5 effectively shrinks shape S 2070. During a grow function, each edge is moved according to the grow value. When a grow value is negative, each edge would be moved inward, where inward references the body of the shape. Conversely, a positive grow value would cause each edge to move outward the amount specified. Therefore, it can be seen that shape 2071 is noticeably smaller that the shape 2070 after a grow of −5.

It is important to note that the small appendage originally visible in shape 2070 has disappeared in shape 2071. This occurs when the edges forming an appendage, such as appendage 2073, are within two times the grow distance. For example, if the distance between the two facing sides of appendage 2073 were ten units apart and each side grows inward by 5 units, a total reduction of the width of 10 has occurred and the appendage has been eliminated. It would be recognized by one skilled in the art that such a grow function would act upon a data base representing the shape S.

The shape (S grow −5) 2071 is next grown by +5 to form shape ((S grow −5)grow 5) 2072. In this situation, each edge has moved in an outward direction by 5 and it can been seen that the overall effect is that the appendage 2073 of shape 2070 has been removed.

Figure 57:
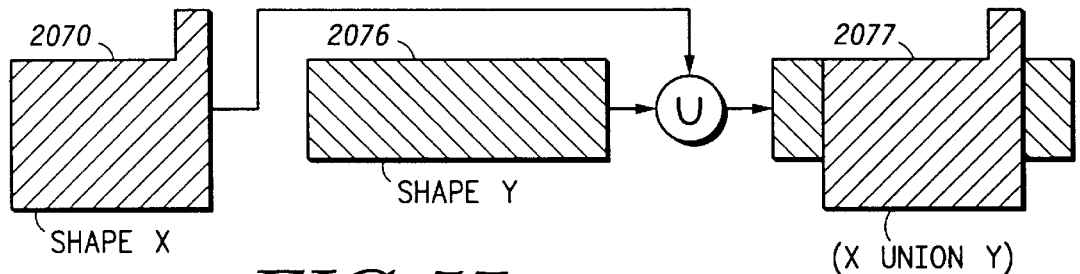

A union function is illustrated in FIG. 57. A union occurs between two or more shapes. In the example, the union is performed between the shape X 2075 and the shape Y 2076 resulting in shape 2077. While for illustration purposes the union of X and Y shown in shape 2077 contains unique cross-hatching, it is done only for the clarity of the figure in that, in the preferred embodiment of the present invention, the new shape does not distinguish between the initial specific shapes. In another embodiment of the invention, the new shape may distinguish between the initial specific shapes.

Figure 58:
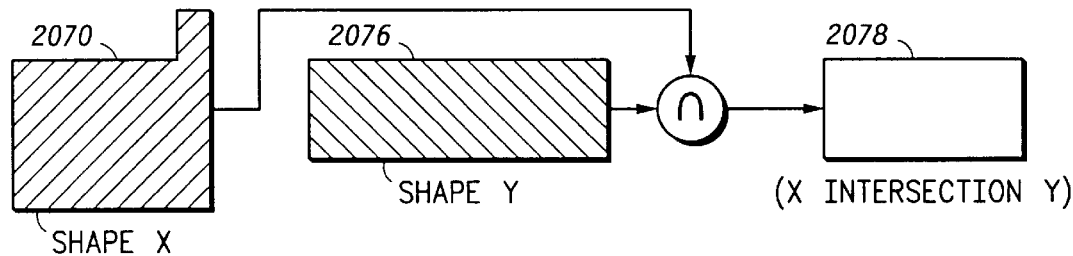

FIG. 58, illustrates an intersection function. An intersection occurs between two or more shapes such as the intersection between the shape X 2075 and the shape Y 2076. An intersection produces the areas common to both shape X and shape Y as illustrated in shape 2078.

Figure 59:
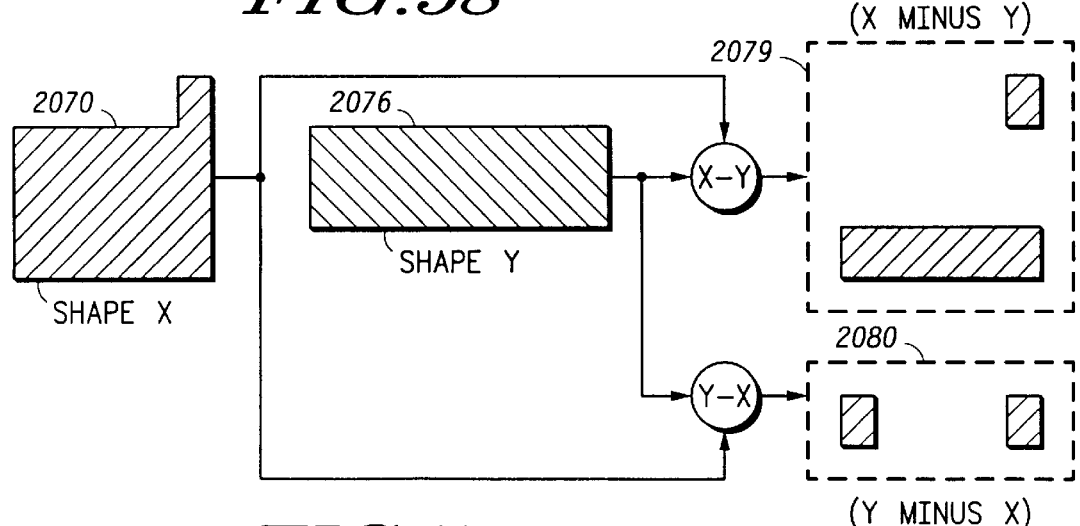

FIG. 59 illustrates the subtraction of one shape from another. Specifically, FIG. 59 illustrates results of X−Y and Y−X. X is analogous to shape X 2075 of FIG. 59, while Y is analogous to shape Y 2076 of FIG. 59.. Where shape Y 2076 has been subtracted from shape X 2075, those portions in common between shape X 2075 and shape Y 2076 are removed from the shape X 2075 resulting in shape (X minus Y) 2079. In a likewise manner, when X 2075 is subtracted from Y 2076, shape Y minus X) 2080 is produced.

Figure 60:
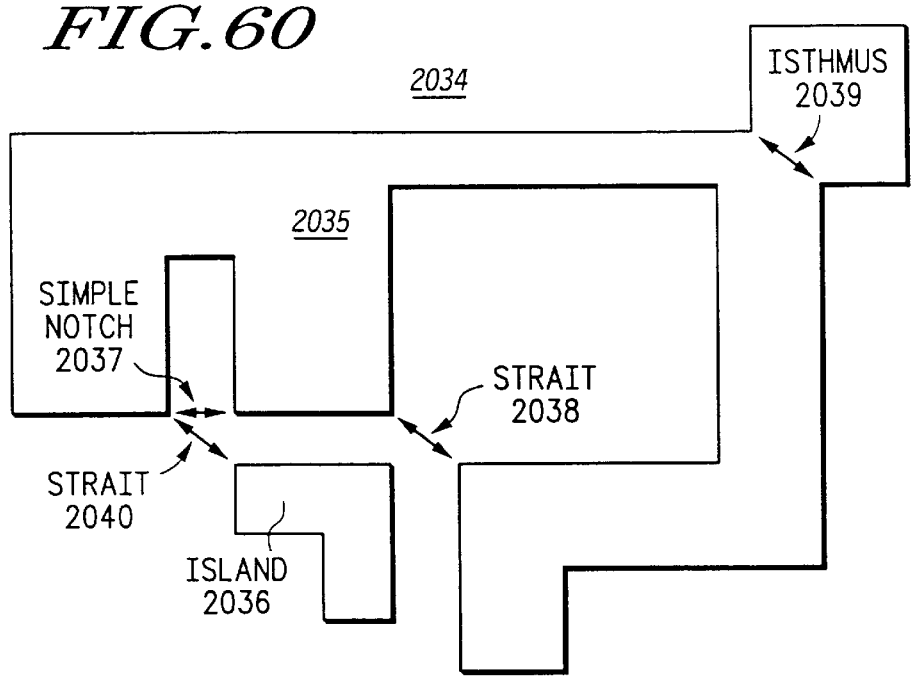
FIG. 60 is a layout diagram used to define further terminology consistent with method 2024 illustrated in FIG. 52.

FIG. 60 is a layout diagram used to define further terminology consistent with method 2024 illustrated in FIG. 52. FIG. 60 contains shape 2034 which has two positive regions 2035 and 2036. Note that a positive region is a portion of a shape that is maximally contiguous, and that a shape may consist of a single positive region or multiple positive regions as illustrated in shape 2034.

Shape 2034 contains island 2036 which is in itself a positive region. An island is defined as a positive region having an area below a specified required minimum area. Shape 2034 contains isthmus 2039. An isthmus is a portion of a positive region below a minimum width value. In other words, isthmus 2039 is below a required design rule width. Shape 2034 is also forms strait 2038 and strait 2040. A strait is formed between two corners of one or more positive regions. Strait 2038 is a strait formed by two corners of a common positive region, while strait 2040 is formed by corner portions of separate positive regions. Finally, shape 2034 contains simple notch 2037. A simple notch is a recessed area within a given positive region that is below a minimum design rule specification. Note that the terms simple notch, strait, island, and isthmus are generically referred to in step 2012 in FIG. 51 as a "notch" and are encompassed by the term "notch filling". The term notch filling in step 2012 refers to the correction of the four design rule violations shown in shape 2034.

Figure 61:
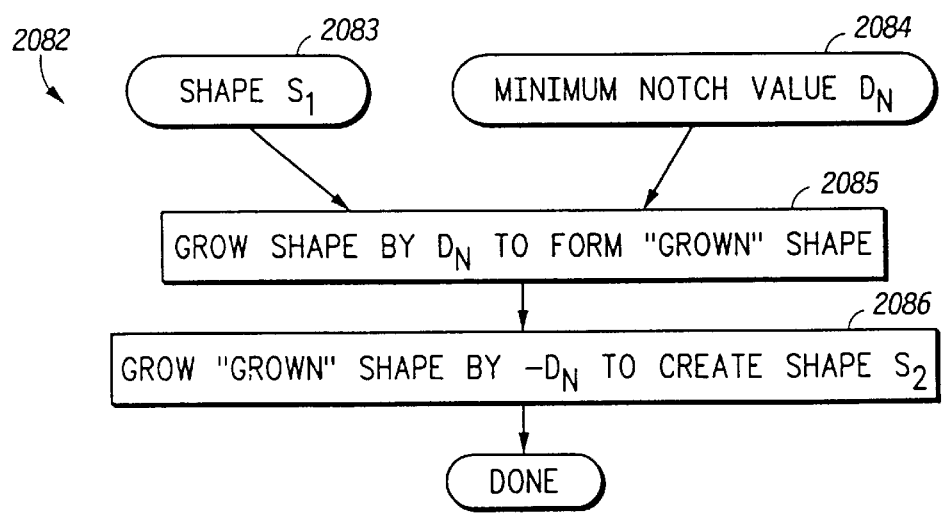
FIG. 61 is a flowchart that illustrates filling simple notches in accordance with the present invention.

FIG. 61 is a flowchart that illustrates "Notch Filling" method 2082 which illustrates notch filling step 2027 in FIG. 52 in more detail. Starting with shape S1 in step 2083 and a minimum simple notch value Dn in step 2084, shape S1 is grown by the value Dn/2 to form a grown shape in step 2085. Next, the grown shape is further grown by the value −Dn/2 to create shape S2 in step 2086,.

Figure 62:
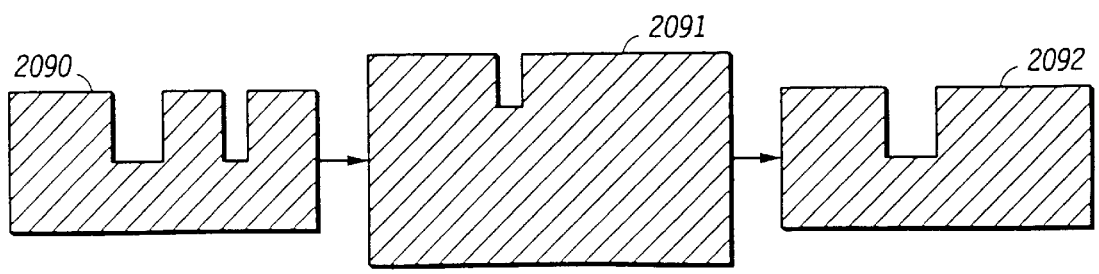
FIG. 62 is a layout diagram that illustrates the effects of the simple notch filling method 2082 in FIG. 61.

FIG. 62 is a series of layout diagrams that illustrate effects of notch filling 2082 in FIG. 61. Shape 2090 in FIG. 61 illustrates initial shape S1 from step 2083. Shape 2091 represents the "grown" shape of step 2085. Note that in grown shape 2091, an invalid notch in shape 2090 has disappeared. Shape 2092 illustrates "grown" shape 2091 grown by the value −Dn (i.e. shrunk by Dn). Note that shape 2092 has been in effect grown and subsequently reduced by a common value. The overall effect is to eliminate invalid notches of size Dn or less while otherwise maintaining the integrity of initial shape 2090. Therefore, notch filling method 2082 can be used to remove notches which occur when "same net" design rules are temporarily ignored. In the preferred embodiment of the invention, shape S2 produced in step 2086 is generally assigned to shape S1, replacing the previous contents of shape S1.

Figure 63:
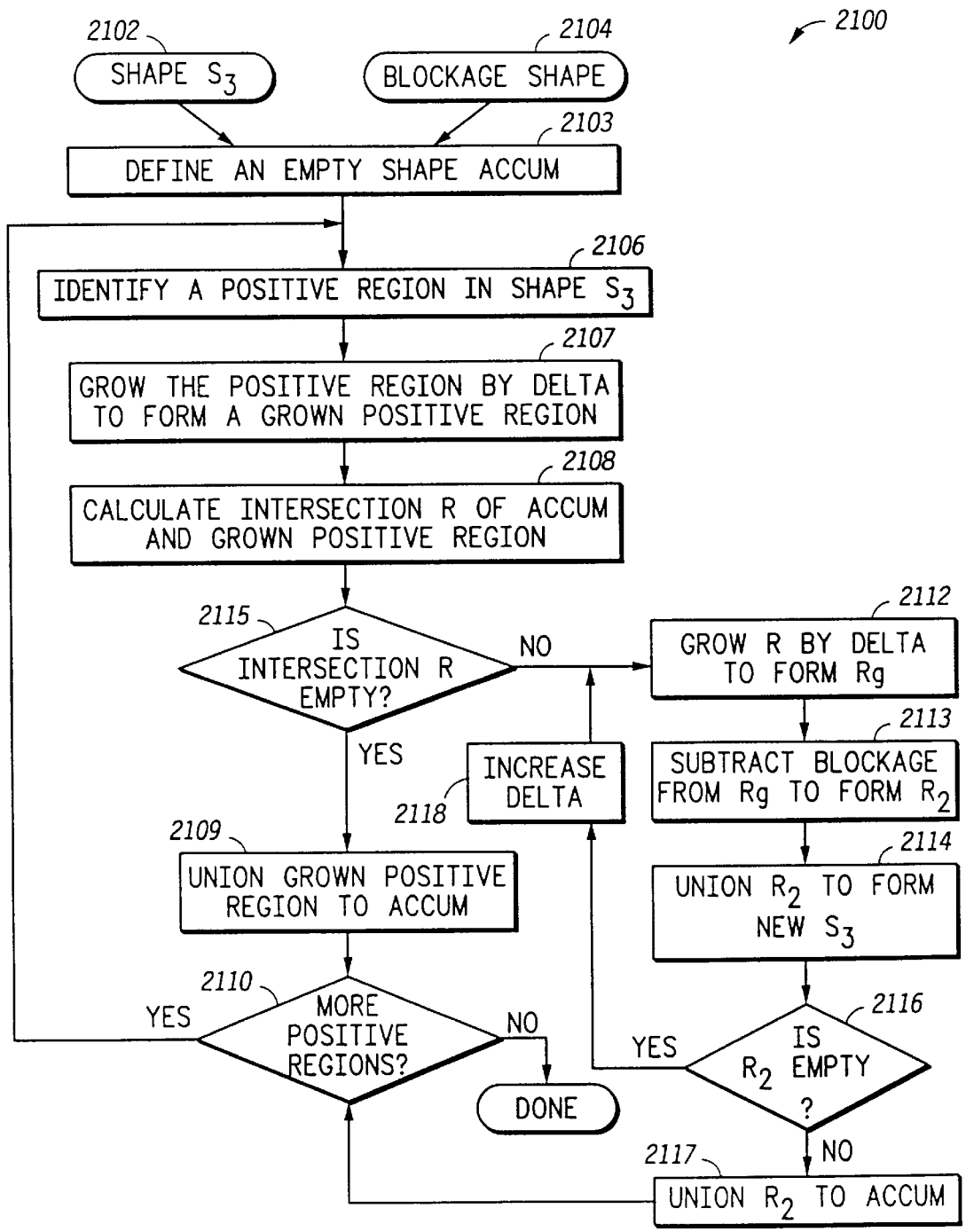
FIG. 63 is a flowchart that illustrates filling straits in accordance with the present invention.

FIG. 63 is a flow chart that illustrates in more detail step 2028 of FIG. 52. Method 2100 starts with shape S3 in step 2102 and a blockage shape in step 2104. The blockage shape would be one of the blockage shapes, such as Bc, generated at step 2026 of FIG. 52. Next, an empty shape ("accum") is defined in step 2103. The shape "accum" is used to accumulate various information generated in method 2100 as will be illustrated below. Then, a positive region from the shape S3 is identified in step 2106. This is followed by the positive region being grown to form a grown positive region in step 2107,. For example, referring to FIG. 64, shape 2020 represents S3 containing positive region 2022 and positive region 2023, where shape 2022 is the positive region identified in step 2106. The grown positive region is represented by shape 2021 in FIG. 64.

Next, the intersection of the shape "accum" and the positive region 30 grown by a value "Delta" is performed, forming result R in step 2108. In a preferred embodiment of the invention, the value "Delta" is based on one half of the minimum spacing distance on the layer associated with shape S3. Then, a determination is made whether or not the intersection result R is empty in step 2115. When the positive region being used is the first positive region of a given shape, the intersection will always be empty and step 2109 will be executed next. At step 2109, the grown positive region is unioned to the shape "accum". This is followed by a determination of whether more positive regions remain to be processed in step 2110. As long as more positive regions need to be processed in step 2110, the next positive region is identified in step 2106, and steps 2106, 2107, 2108, 2115, 2109, and 2110 are repeated for each of the positive regions in the shape S3.

Figure 64:
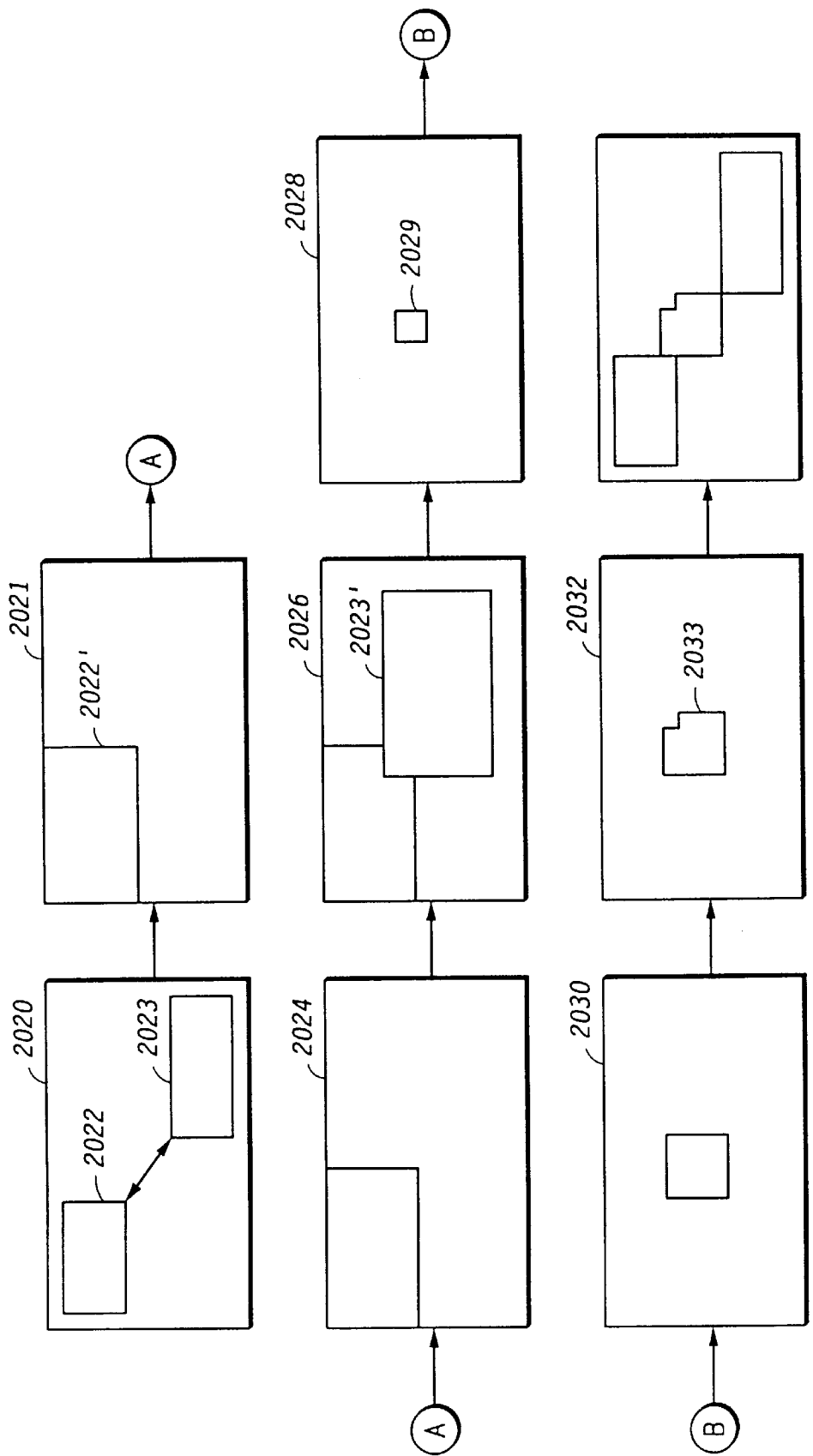
FIG. 64 is a diagram that illustrates the operation of strait filling illustrated in FIG. 63.

Assuming the next positive region is B 2023 of FIG. 64, it would be grown by "Delta" to form a grown positive region. Next, at step 2108, an intersection R of shape accum and the grown positive region would be calculated. The result of this intersection is shape 2028 having positive region 2029. Positive region 2029 corresponds to intersection R where grown shape 2023' has been intersected with the value of "accum" shape 2024. Proceeding to step 2115, a determination is made that the intersection R (shape 2028) is not empty, and flow will proceed to step 2112. In step 2112 the intersection R is grown by "Delta" to form grown region Rg as illustrated in shape 2030. The blockage shape for shape S3 (not shown) is subtracted from the grown strait to produce a difference R2 in step 2113, illustrated by positive region 2033 of shape 2032. Subtracting the blockage from the grown intersection in step 2113 assures that a strait is not grown into a prohibited area as defined by the blockage of the layer S3.

Continuing after step 2113, a union is performed between the shape R2 and the shape S3 to form a new S3 in step 2114. This, in effect, adds the intersection to the original shape, thereby filling the strait. It should be noted that the justification for filling the strait is that the strait was created as a result of relaxing "same net" spacing rules during the compaction stage. Therefore, straits exist only between two locations on a common net.

Following step 2114, a determination is made whether R2 is empty in step 2116. If R2 is empty, it indicates that the previous grow in step 2112 had no effect on generation of shape S3 and that further iterations are needed to fill the strait. Therefore, when the shape R2 is not empty, flow continues at step 2117 where shape R2 is unioned into the "accum" shape in step 2117. This step allows a new portion, which now fills in the strait, to be used in further calculations in looking for straits.

When R2 is empty, the union performed in step 2114 did not affect the filling of the strait. Therefore, "Delta" is increased, and steps 2112, 2113, 2114, 2116, and 2118 are repeated until shape R2 is determined to be non empty in step 2116. The effect of the loop between steps 2112 and 2116 is to grow a sufficiently large portion R2 to fill in the strait without violating some other design rule. The R2 portion is added to the original layer containing the strait, thereby eliminating the invalid strait. It should be noted that this is but one embodiment of the present invention and that other criteria may be used to determine when to terminate the flow to 2118. For example, if the strait fillage portion R2 meets a certain size or certain boundary size it may be determined that it is large enough and the flow could continue to step 2117.

One alternative to the steps just discussed is to add a step that error terminates if the grown size gets too big. In this case the strait is not filled and an error notice is generated.

Following the union of shape R2 into shape "accum" in step 2117, the test for more positive regions in step 2110 is made, repeating both inner and outer loops until all positive regions have been processed. At that point, method 2100 is done.

Figure 65:
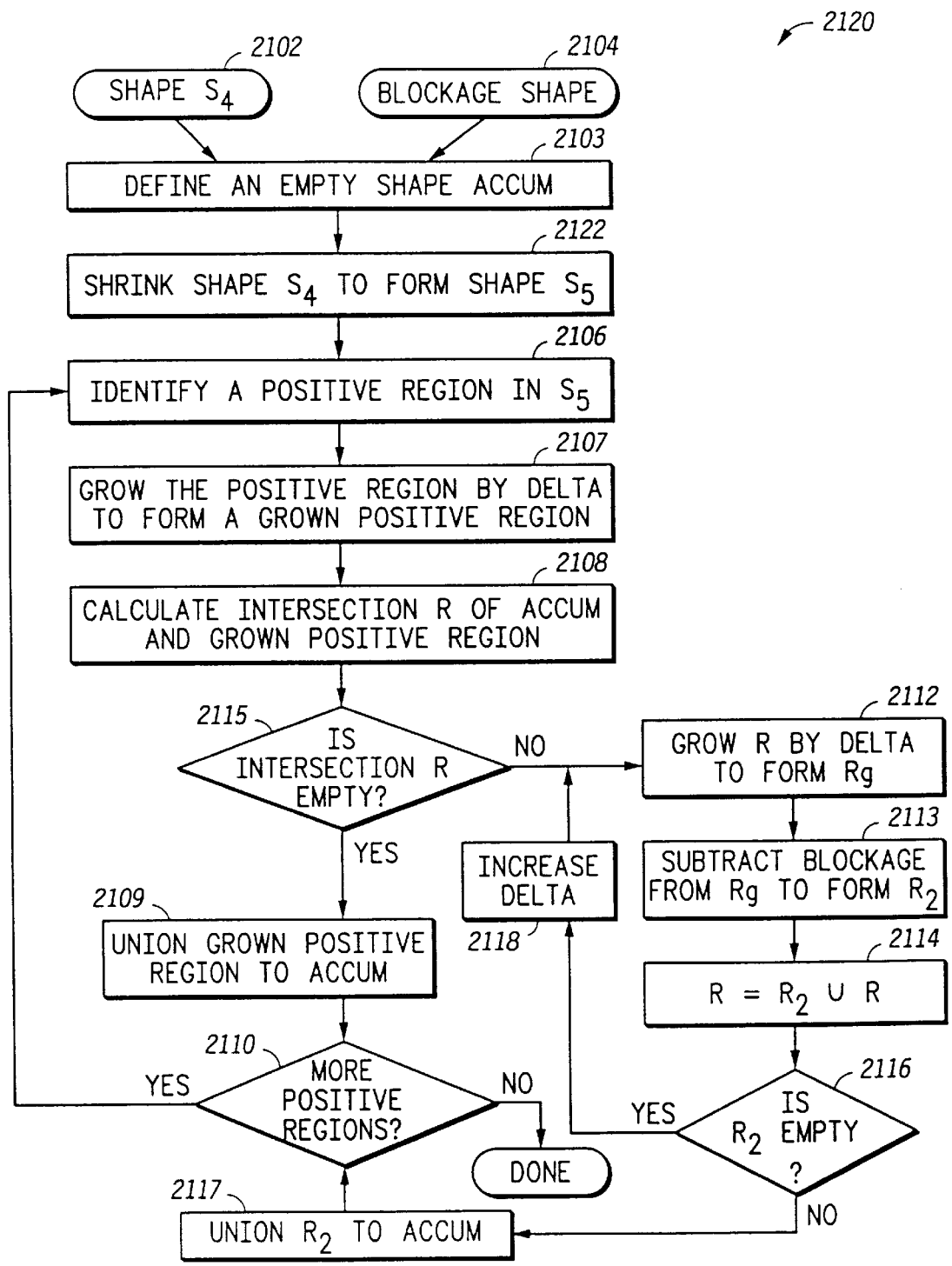
FIG. 65 is a flowchart that illustrates isthmus filling in accordance with the present invention.

FIG. 65 illustrates a method 2120 which is a detailed flow of the step 2030 of FIG. 52. The flow 2120 maintains similar numbering of steps in method 2100 of FIG. 63 that are the same. Steps 2102–2106 of methods 2120 and 2100 are the same. Preceding step 2106 in method 2120 is step 2122, in which a shrink is performed on the shape S4 to form a new shape S5. It should be noted once again, that the shrink is the same as growing by a negative value. The amount by which the shape is shrunk is such that any isthmi which exist will be broken. Therefore, if a design rule specifies that an isthmus of 2 is invalid, the positive region would be shrunk by 1 in order to ensure that the isthmi break off. Next, the method continues with step 2107 an subsequent steps in a similar manner as described above for a strait fill flow. An isthmus is corrected using a flow similar to that above wherein the broken isthmus, now a strait, is corrected using the flow for correcting straits.

Figure 66:
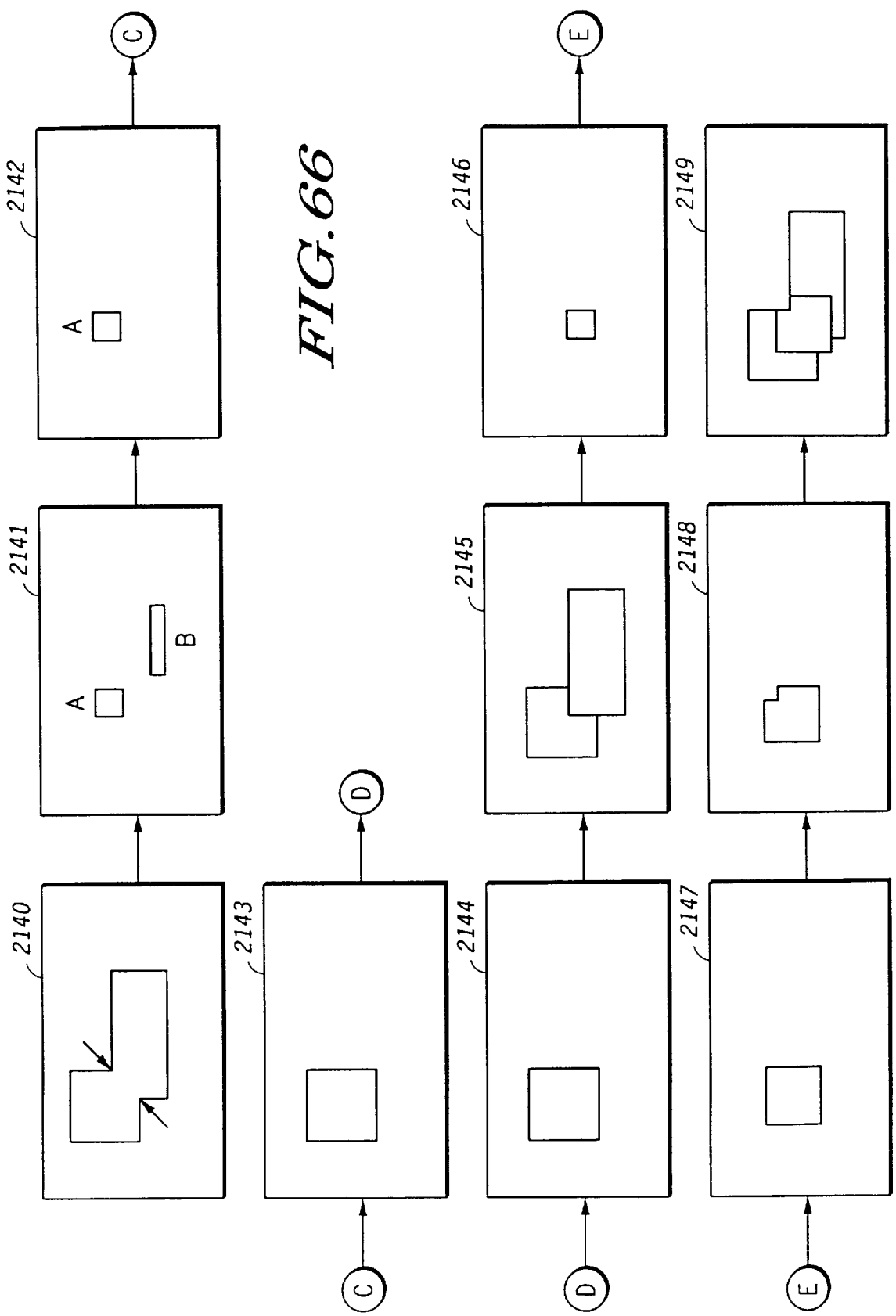
FIG. 66 is a diagram that illustrates the operation of isthmus filling illustrated in FIG. 65.

This is best illustrated by FIG. 66 wherein shape 2140 contains an isthmus as indicated. Shape 2141 illustrates the effects of growing shape 2140 by a negative value. Note the negative value would be based on D/2 where D is the design rule distance. Since two shapes are moving the D is divided by two. In addition, a small epsilon may be added to the D/2 to assure there is no common point which could otherwise occur. This assures proper filling in subsequent steps. Shape 2142 would illustrate the original isthmus area. Next, shapes 2143, 2144, 2145, 2146, 2147, 2148, and 2149 show the effects the remaining flow would have on filling an isthmus using steps similar to a strait flow. Note that the overall effect is to identify a positive region which can be grown in order to grow the strait such that it meets design rule specifications.

Figure 67:
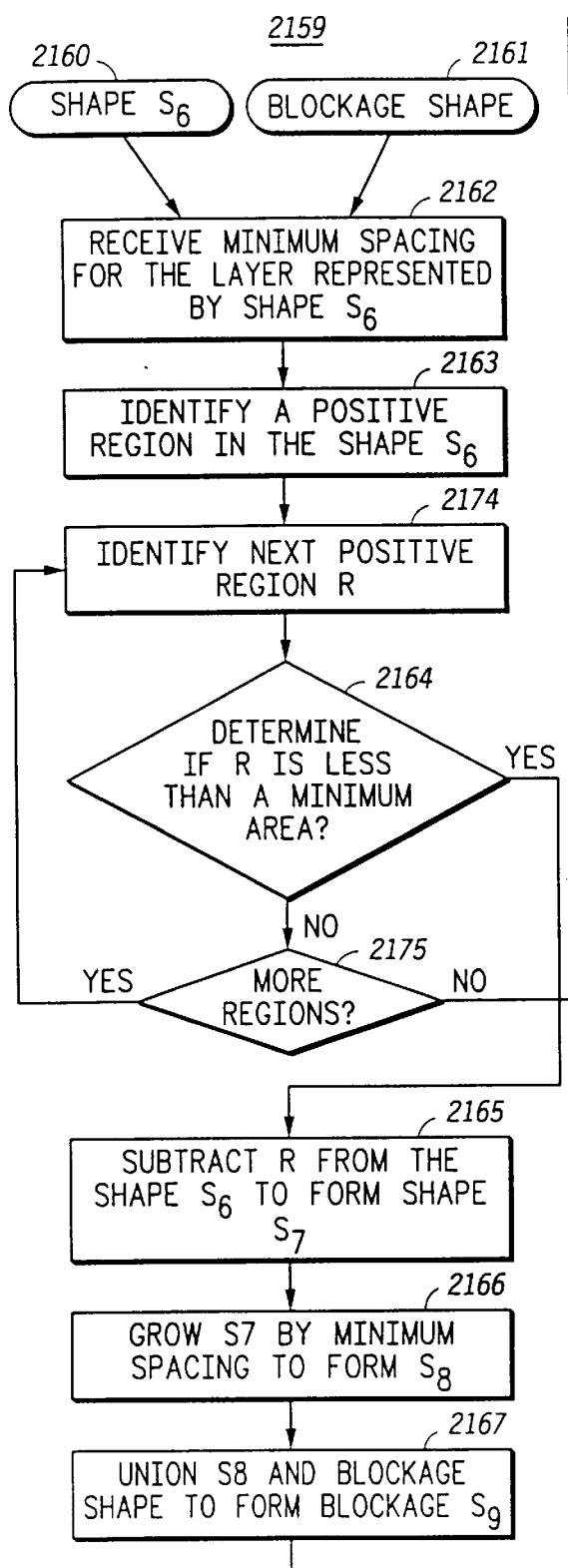
FIG. 67 is a flowchart that illustrates island filling in accordance with the present invention.
Figure 67:
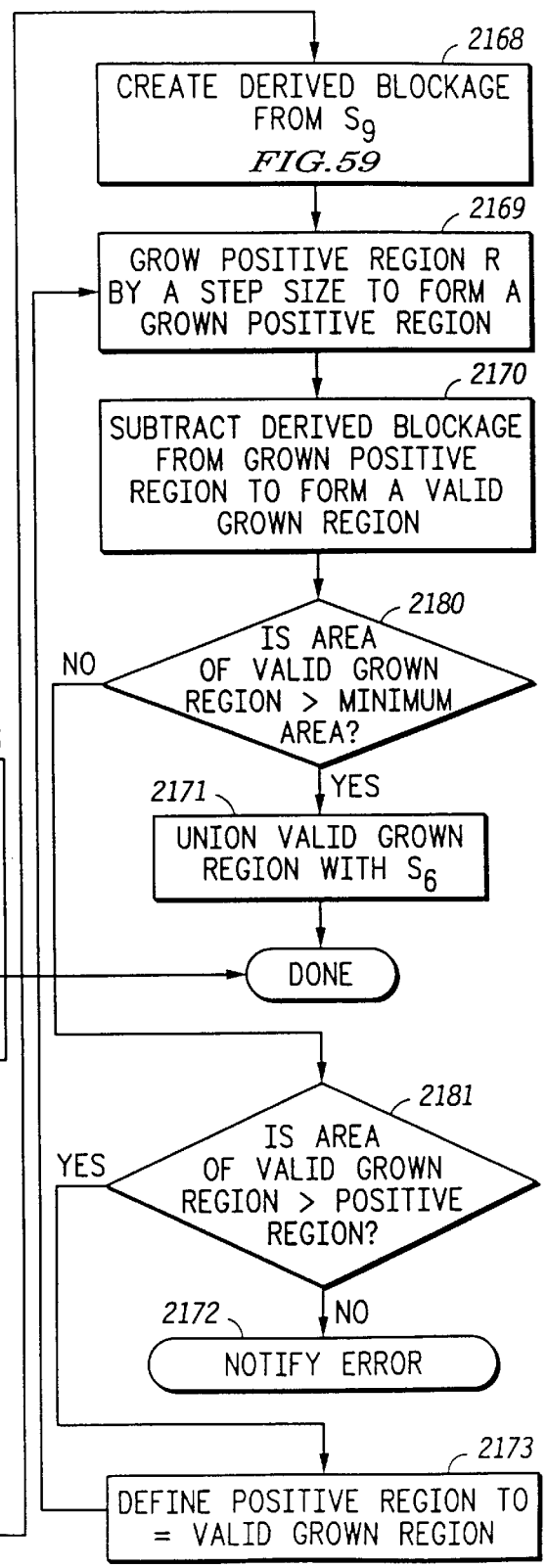

FIG. 67 illustrates a method 2159 which is a detailed view of the step 2030 of FIG. 52. The method 2159 is used to expand islands for a given shape.

Beginning at step 2160 a shape S6 is received. Next, at step 2161, a blockage shape is received. The blockage shape received would be the blockage shape representative of the same layout layer as the shape S6. For example, if shape S6 represents a poly layer, the blockage shape would represent the poly blockage shape. Next, at step 2162, a minimum spacing for the layer represented by shape S6 is received. This minimum spacing would indicate how near an island may come to another structure on the same layer. Next, at step 2163, a positive region in the shape S6 is identified.

Next, at step 2164, a determination is made whether the positive region identified has an area less than a minimum area. The minimum area would also be a provided parameter which would be technology dependent. In the event the positive region is not less than a minimum area i.e., meets a design rule specified, then the flow continues with step 2175. In step 2175, a further determination is made whether there is a next positive region; if there is a next positive region, the flow continues with step 2174 where a next positive region is identified. This loop would be repeated until all positive regions have been analyzed for a minimum area. In the event at step 2164 the determination is that the positive region is less than a minimum area, then the flow proceeds to step 2165. At step 2165 the positive region is subtracted from the shape S6 to form a new shape S7. Note that the new shape S7 would be the original received shape S6 without the now identified positive region. Next, at step 2166, the shape S7 would be grown by a minimum spacing amount to form S8 in order to identify where the positive region, which has been deleted from S7, can grow in order to meet a minimum area requirement.. Note that this effectively grows all shapes on the received shape S6, excluding the positive region, by the minimum spacing. Next, at step 2167, a union is performed between S8 and the blockage shape to form a blockage S9. Note the blockage S9 shows the composite areas where the positive region identified cannot grow. Next, at step 2168, a derived blockage is created from shape S9 and is discussed in more detail with reference to FIG. 68 below. Next, at step 2169, the positive region is grown by a step size to form a grown positive region. Next, at step 2170, the derived blockage is subtracted from the grown positive region to form a valid grown region. The valid grown region is different from the grown positive region in that if the grown positive region were to encroach on an illegal area, that illegal area would be removed from the valid grown region. Next, at step 2180, a determination is made whether or not the area of the valid grown region is larger than a minimum area. When it is true that the valid grown region now exceeds a minimum area, the flow proceeds to step 2171 where a union is made between the valid grown region and the original received shape S6. The effect of this union is to grow the island into valid space such that it meets a minimum area. From 2171 the flow could continue at step 2174 to identify a next positive region and perform the flow for each positive region.

In the event the area of the valid grown region does not exceed a minimum area, the flow proceeds to step 2181, where a determination is made whether the valid grown region is larger than the positive region. When the valid grown region is not larger than the positive region it indicates that the step 2169 of drawing the positive region had no overall effect of improving the area of the positive region. This would indicate that the island is "land locked," in that it has nowhere to grow given the current blockage shape. When this occurs and the area is not larger than the positive region the flow will proceed to step 2172 where a notification of an error would be generated. Where the area of the valid grown region is larger than the positive region, it is then known that the step of growing at 2169 did have a positive effect and further growth is needed. Therefore, flow proceeds to step 2173 where the positive region is defined to be equal to the valid grown region and the flow continues at step 2169.

Figure 68:
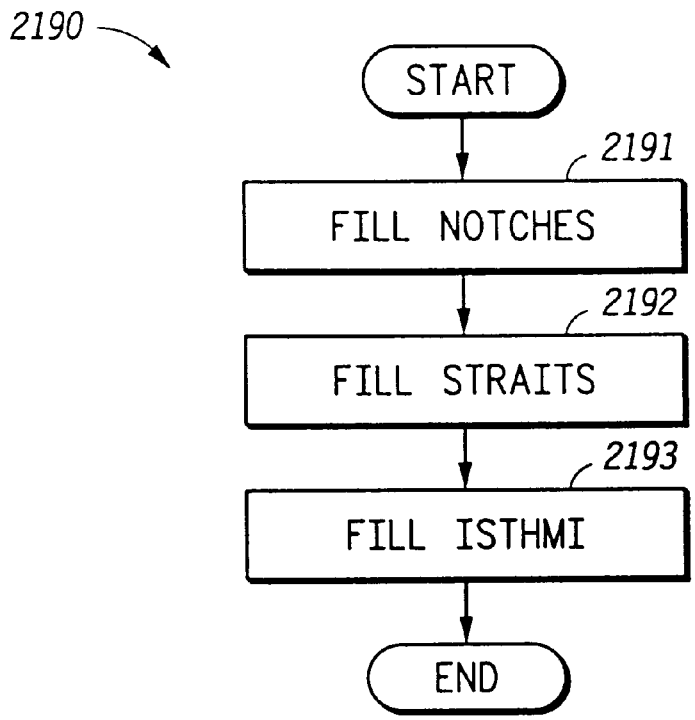
FIG. 68 is a flowchart that illustrates a method of calculating a derived blockage.
Figure 69:
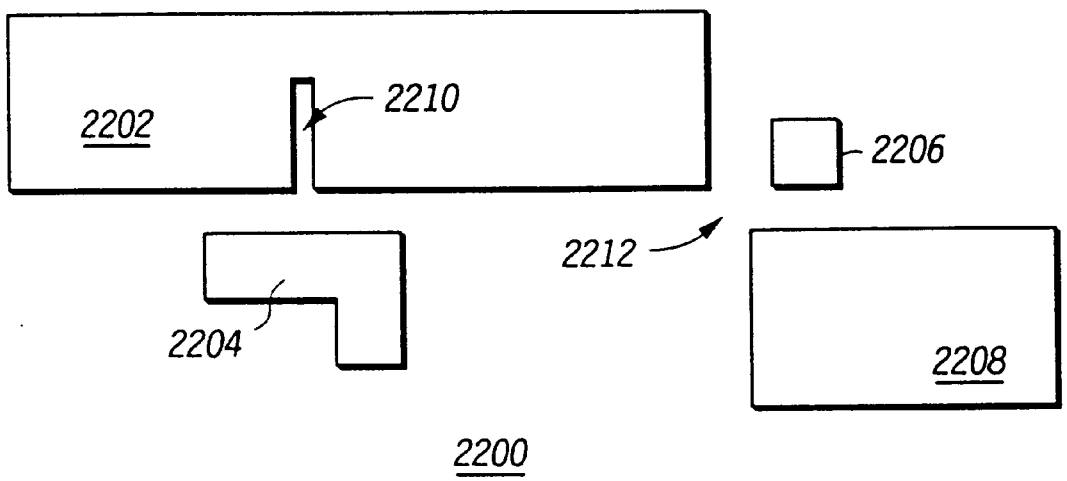
FIG. 69 is a diagram that illustrates a case in which derived blockages are beneficial.

FIG. 68 illustrates a method 2190 for creating a derived blockage. A derived blockage was created in step 2168 of the island fill flow in FIG. 67. The need for calculating or determining a derived blockage is illustrated in FIG. 69. FIG. 69 would be representative of the blockage S9 of step 2167 in FIG. 67. Blockage S9 is created by a combination of the original shape S6 containing the island without the island present, unioned with the blockage for the layer S6. Therefore, FIG. 69 would be representative of the blockage layer unioned with the shape layer after the shape layer is grown. As a result, there may be newly introduced or created islands, straits or simple notches. For example, in FIG. 69, positive region 2204 has been identified as an island which needs to be expanded, and hence would not actually be part of the blockage S9 as represented by shape 2200 in FIG. 69. The remaining positive regions 2202, 2206 and 2208, taken together as a shape, would represent a union between the blockage for the layer of S6 and the grown shape S6 itself. As can be seen, a simple notch 2210 is present in layout element 2202, as well as a strait 2212. When positive region 2204 is grown it can be seen that it would be possible for it to grow into the simple notch 2210. This in turn would create a design violation on 2204 as it would have an appendage below a minimum required size. Likewise if 2206 were the island identified, it could grow into the strait 2212 and create an isthmus. Conversely, if two islands existed on either side of an isthmus, they could grow in such a manner to create a strait between them which would then need to be fixed at a later time. Therefore, it is necessary to create a derived blockage to assure the growing of an island does not create any additional design rule violations.

Referring to FIG. 68, a derived blockage is determined by receiving a shape B representing a blockage to a layer L and performing on the shape B the method 2190 of filling notches in a manner previously discussed. Method 2190 begins at a step 2191 where notches are filled. Next, in step 2192, the derived blockage is further determined by filling straits in B in a manner previously discussed. And, finally, in step 2193, the derived blockage is further determined by filling isthmi in B in a manner previously discussed. Since B represents a blockage to a layer L, the minimum spacing distances used in steps 2190, 2192, and 2193 are based on the minimum width distances for layer L, and the minimum width distances used in steps 2190, 2192, and 2193 are based on the minimum spacing distances for layer L. By calculating a derived blockage, the simple notch 2210 of FIG. 69 will not be identified as a valid area into which the island 2204 may be filled. Likewise, the strait 2212 will not be identified as a valid area into which the island 2206 may be filled. The derived blockage thereby allows for valid growth of islands 2204 and 2206.

J. Tie Filling

The use of well ties and substrate ties in semiconductor designs is well known in the semiconductor arts. Generally, a design rule specifies the number and location of well or substrate ties needed for a given semiconductor well or substrate. The purpose of a well or substrate tie is to create a potential bias in the well or substrate that allows the transistors to operate in a predefined manner. More than one well tie or substrate tie may be used in well or substrate areas which are large. This assures a common voltage potential across the well or substrate.

Often, well and substrate ties are placed early in the development of a semiconductor layout. Automatic layout synthesis systems, in particular, place well and substrate ties early in the development process. This provides for easy placement of a predefined number of ties. However, placing the ties early can be bad for creating densely compacted designs because, early in the development process, the final locations of elements are not known, so a tie may be added in a critical location that will later prove to increase the size of the design. Furthermore, because the final locations of elements are not known, the exact number and location of ties are similarly unknown and must be estimated. An estimate may be incorrect. If the estimate is too high, unnecessary ties may be added, increasing the size of the design. If the estimate is too low, the design will not be design rule correct and may suffer performance degradation. Finally, while a bare minimum of substrate ties may meet the overall design rules of a design, additional well ties and substrate ties will increase the reliability of a part by assuring the common voltage potential across the well and substrate areas.

Well and substrate tie placement can take time. Typically, the later tie placement occurs in the development of a semiconductor layer, the more time is required to place ties, since more layout elements must be moved to achieve the necessary number of ties. Due to the time and manual effort required, additional ties, which could enhance reliability, are rarely added even when space is available.

Figure 71:
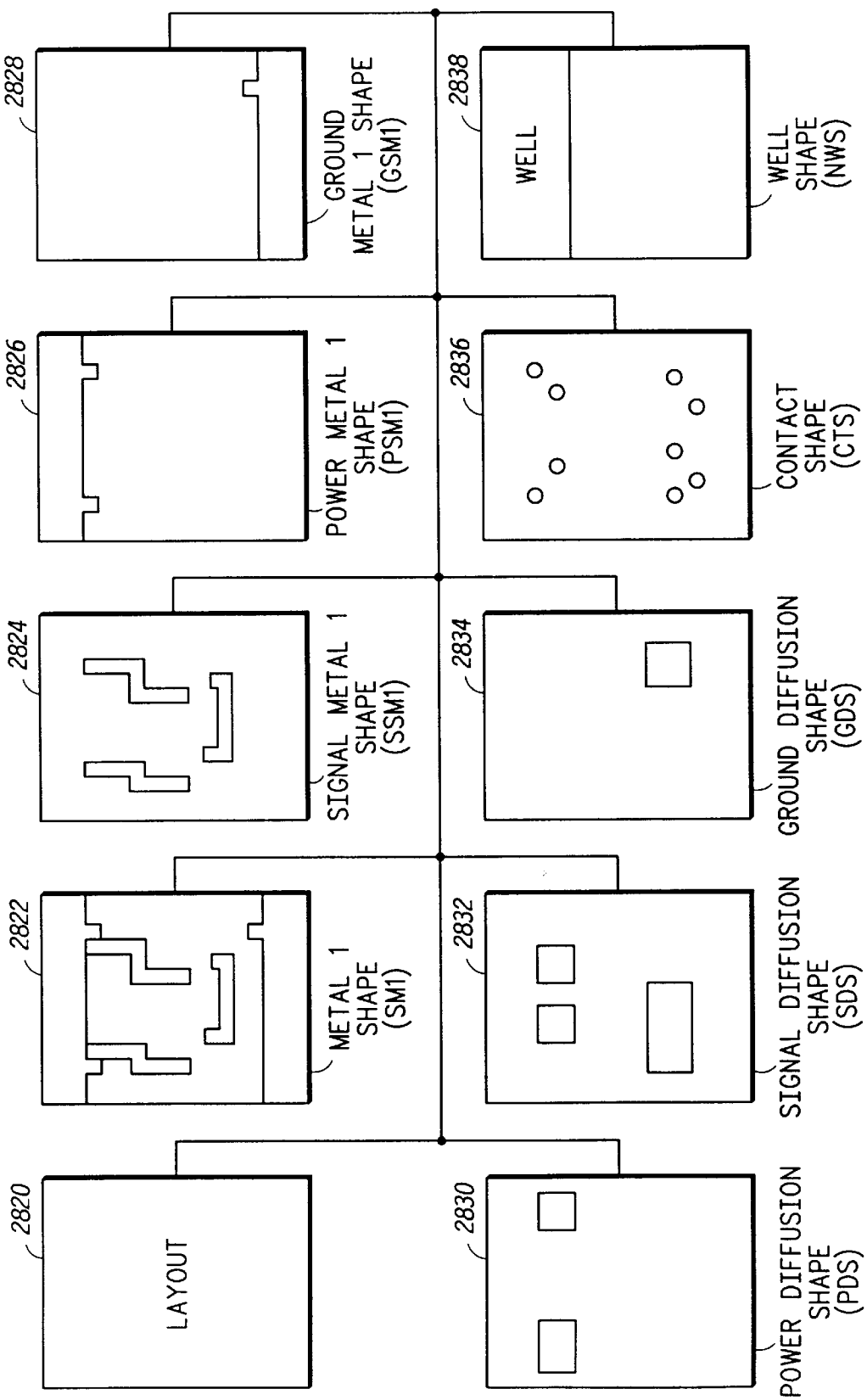
FIG. 71 is a diagram that illustrates a series of shapes derived from a specific semiconductor layout.

In operation, the present invention converts a layout into a group of shapes corresponding to the layout. For each shape, a blockage shape associated with that shape is generated. Based on the shapes and blockages the well ties associated with the layout are filled. At a next step the substrate ties are filled based on the shapes and blockages associated with the shapes. Next a step for removing long ties is executed. Finally a layout is generated based on the composite shapes. These steps are performed automatically. During step 2802, a received layout for a standard cell or other portion of a semiconductor layout is converted into various shapes. This layout to shape conversion is identical initially to the layout to shape conversion associated with the specification of FIG. 52, step 2025 but it differs in that this conversion stores the power, ground, and signal portions of each layer in separate shapes. Examples of the derived shapes from a layout 2820 are shown with reference to FIG. 71. In FIG. 71 the layout 2820 was transformed by step 2802 into the Metal-1 shape 2822, signal Metal-1 shape 2824, power Metal-1 shape 2826, ground Metal-1 shape 2828, power Diffusion shape 2830, signal Diffusion shape 2832, ground Diffusion shape 2834, contact shape 2836, and well shape 2838. If the shapes 2822 through 2838 were combined, each on its own layer, the original layout would be produced.

The Metal-1 shape 2822 corresponds to all Metal-1 associated with the layout 2820. The signal Metal-1 shape 2824 represents the Metal-1 layout elements associated specifically with signals on the Metal-1 layer of layout 2820. The power Metal-1 shape 2826 represents the Metal-1 layout elements corresponding to the power supply of the layout 2820. For example, any portion of Metal-1 known to be connected directly to power will be represented in the power Metal-1 shape. Likewise, ground Metal-1 shape 2828 represents the Metal-1 portions known to contact the ground associated with the layout 2820. The power Diffusion shape 2830 contains those portions of layout 2820 of Diffusion coupled to power. Signal Diffusion shape 2832 represents Diffusion associated specifically with signal portions of the layout 2820. Ground Diffusion shape 2834 contains Diffusion layout elements known to be coupled directly to ground in 2820. Contact shape 2836 contains just the contact portions associated with layout 2820. Well shape 2838 represents a well portion associated with layout 2820. Note that the shapes of FIG. 71 are not meant to be exhaustive, and that in fact other shapes can exist.

Figure 72:
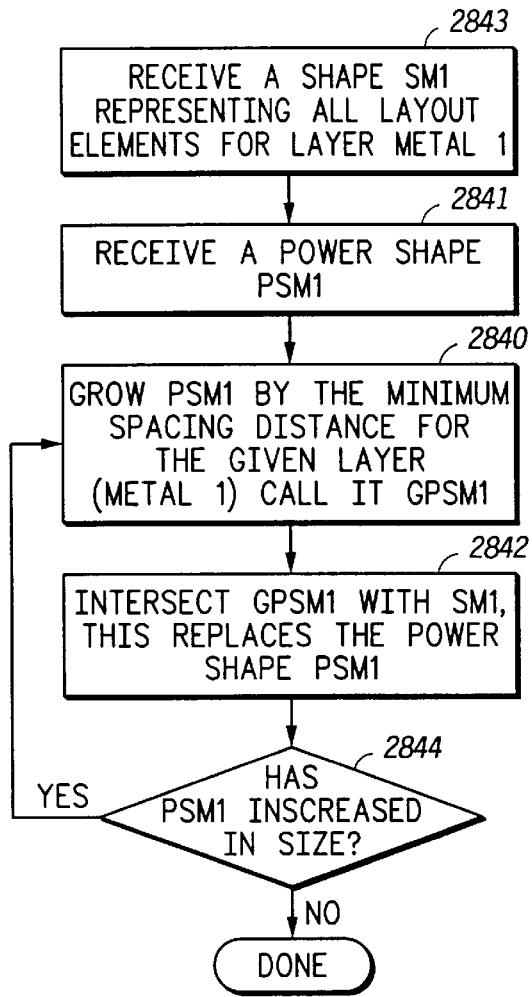
FIG. 72 is a flowchart that illustrates converting layouts into power shapes.

The method of FIG. 72 is an "identify contiguous" flow which generates specific shapes not previously covered in the specification. At a step 2840, the power Metal-1 shape is grown by a minimum spacing distance for the Metal-1 layer. This value is referred to as grown power Metal-1 shape (GPSM1). GPSM1 is intersected with the Metal-1 shape (SM1) which in turn replaces the power Metal-1 shape PSM1. The effects of steps 2840 and 2842 can be seen with reference to FIG. 73.

Figure 73:
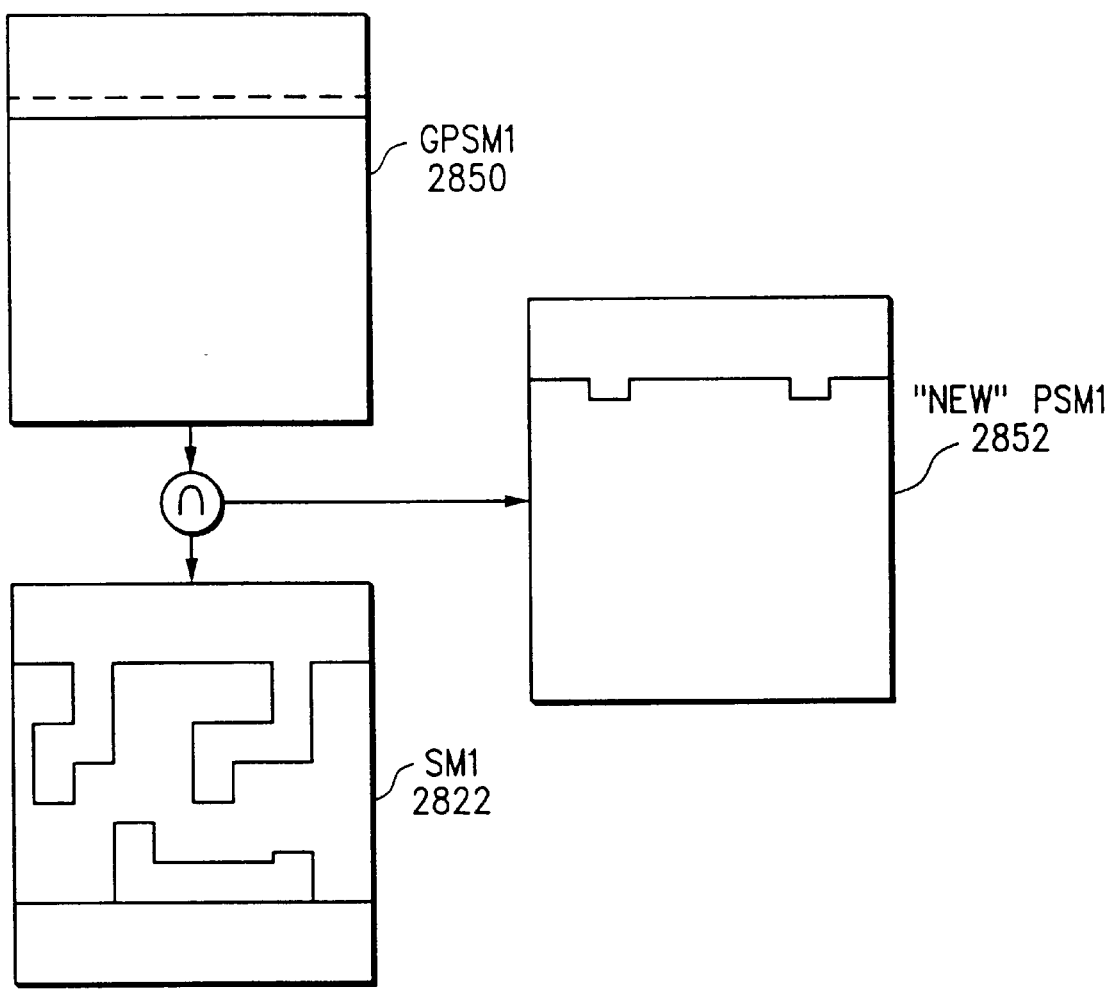
FIG. 73 is a diagram that illustrates the intersection of two layers.

In FIG. 73 it can be seen where the grown power Metal-1 shape 2850 has been grown from the original power Metal-1 shape, which is represented by a dashed line, to the solid line of 2850. This in turn is intersected with the Metal-1 shape, which represents all Metal-1 layout elements. The result of this intersection is represented as a new PSM1 shape 2852. Note that the difference between the GPSM1 shape 2850 and the new PSM1 shape 2852 is that the portions of SM1 2022 which are directly in contact with the power portions of the Metal-1 layer have been included in PSM1. Referring back to the flow of FIG. 72, in step 2844, a determination is made whether or not the new PSM1 shape is larger than the original PSM1 shape. When true, the flow of FIG. 72 successfully identified Metal-1 connected to the power rails represented in PSM1. Therefore, the flow will continue at step 2840 until all such connected metal is identified. When false, the flow from step 2844 is finished.

The overall effect of the method of FIG. 72 is to identify those Metal-1 areas which are contiguous with and thus connected to a circuit power supply. An analogous method is also applied to the ground shapes in order to identify those metal-1 areas which are contiguous with and connected to a circuit ground.

Figure 74:
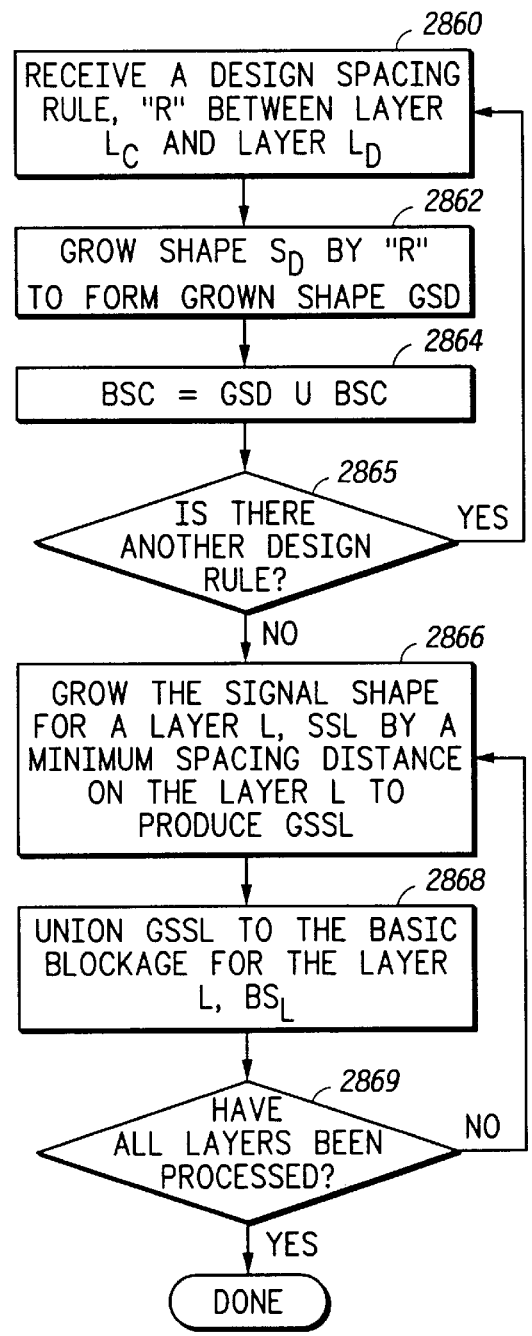
FIG. 74 is a flowchart that illustrates finding basic blockages in accordance with the present invention.

FIG. 74 illustrates a method of finding the basic blockages for each of the shapes associated with the layout. At a step 2860, a design spacing rule between layer Lc and layer Ld is identified. Next, at step 2862, the shape Sd associated with layer Ld is grown by a value R associated with the design spacing rule to produce a grown shape GSd. For example, if the layer Lc and the layer Ld had a design rule which prohibited them from being closer than 1 micron to each other, the shape Sd would be grown by 1 micron. It should be noted that GSd represents areas in which the shape Sc can not be grown into and thus areas in which layout elements on layer Lc are not allowed. Next, at a step 2864, the blockage BSc for layer Lc is unioned to the grown shape GSd. This value replaces the original value for the blockage BSc. Again, this blockage shape represents area that Sc cannot be grown into. Next, at step 2865, a determination is made whether or not all design rules have been processed. When all design rules have not been processed flow continues to step 2860, where it is implied that the next design spacing rule will be identified. Flow continues in this loop, until all design spacing rules have been processed.

Once it is determined at step 2865 that all design spacing rules have been identified, the flow continues at step 2866. At step 2866 the signal shape SSL associated with a layer L is grown by the minimum spacing for that layer resulting in GSSL. Next, at step 2868 the grown signal shape GSSL from step 2866 is unioned to the blockage shape BSL associated with layer L. Next, at step 2869 a determination is made whether or not all layers have been processed. When all layers have not been processed flow continues to step 2866, where it is implied that the next layer will be identified. Flow continues in this loop until all layers have been processed. Once all layers have been processed, the flow is essentially complete.

Figure 75:
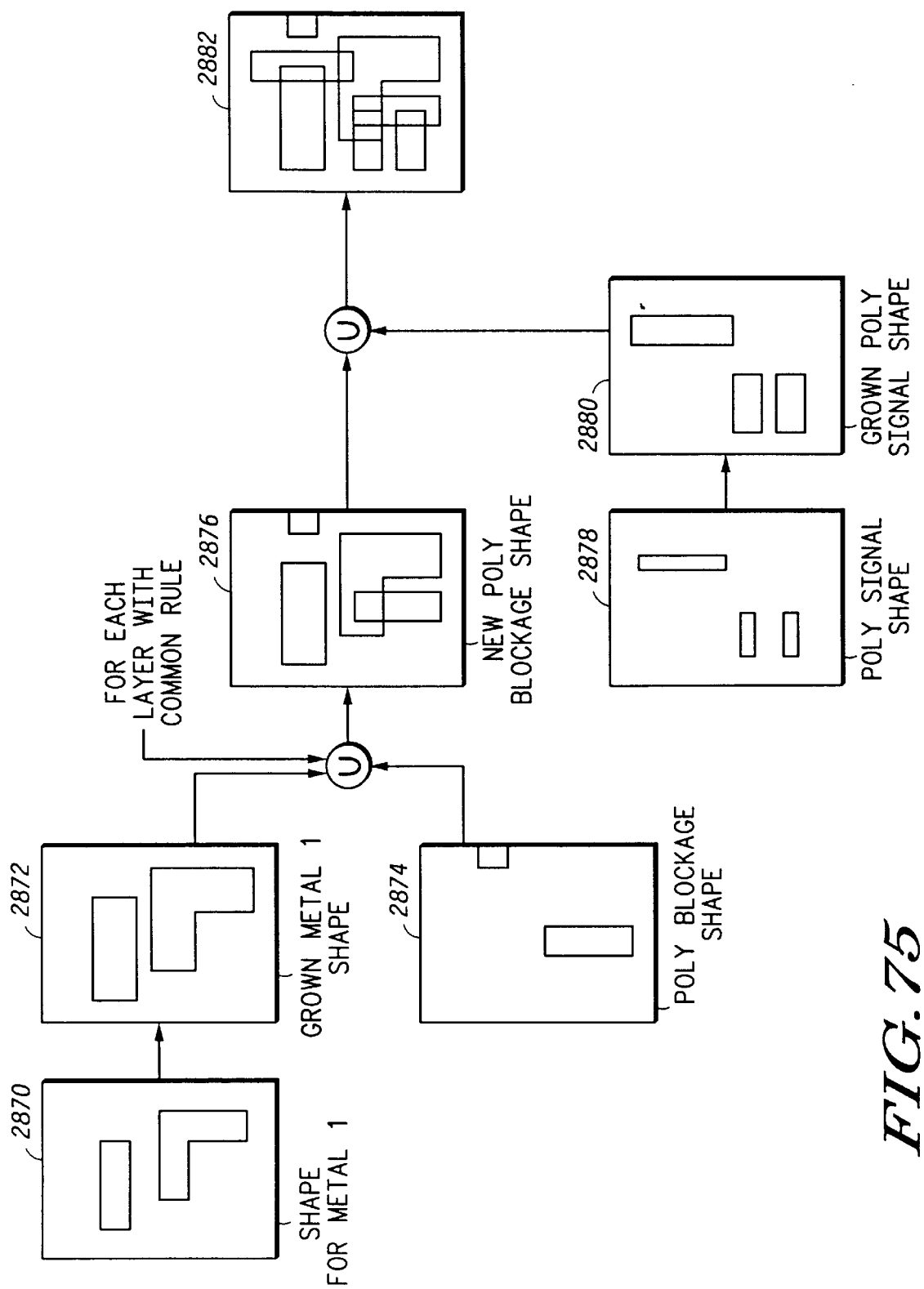
FIG. 75 is a diagram that illustrates the implementation of the method of FIG. 74 as relating to various shapes.

FIG. 75 illustrates in example form the effects of the flow of FIG. 74. The poly blockage 2874 of FIG. 75 represents the shape BSc of step 2864 associated with the poly layer. In the example of FIG. 75 the poly blockage shape 2874 is being processed with a second shape Sd which in the example is associated with the Metal-1 layer. In effect, the Metal-1 layer and the poly layer have a minimum design spacing rule associated with them. The shape for Metal-1 2870 is grown by the common design spacing rule of step 2862 in order to produce a grown Metal-1 shape 2872. The grown Metal-1 shape 2872 is unioned with the poly blockage shape of 2874 in order to produce a new poly blockage shape 2876. The effect of the loop between step 2860 and step 2865 is that for each layer with a common design spacing rule such a union occurs as indicated by the signal labeled for each layer with a common rule of FIG. 75. Next, the poly signal shape 2878 is grown by the minimum poly space in a step 2866 to produce the grown poly signal shape 2880 as shown in FIG. 75. This in turn is unioned with the new poly blockage of shape 2876 to form a new poly blockage 2882. Again it is important to note that the new poly blockage 2882 represents those areas in which poly associated with a well tie may not reside.

Figure 70:
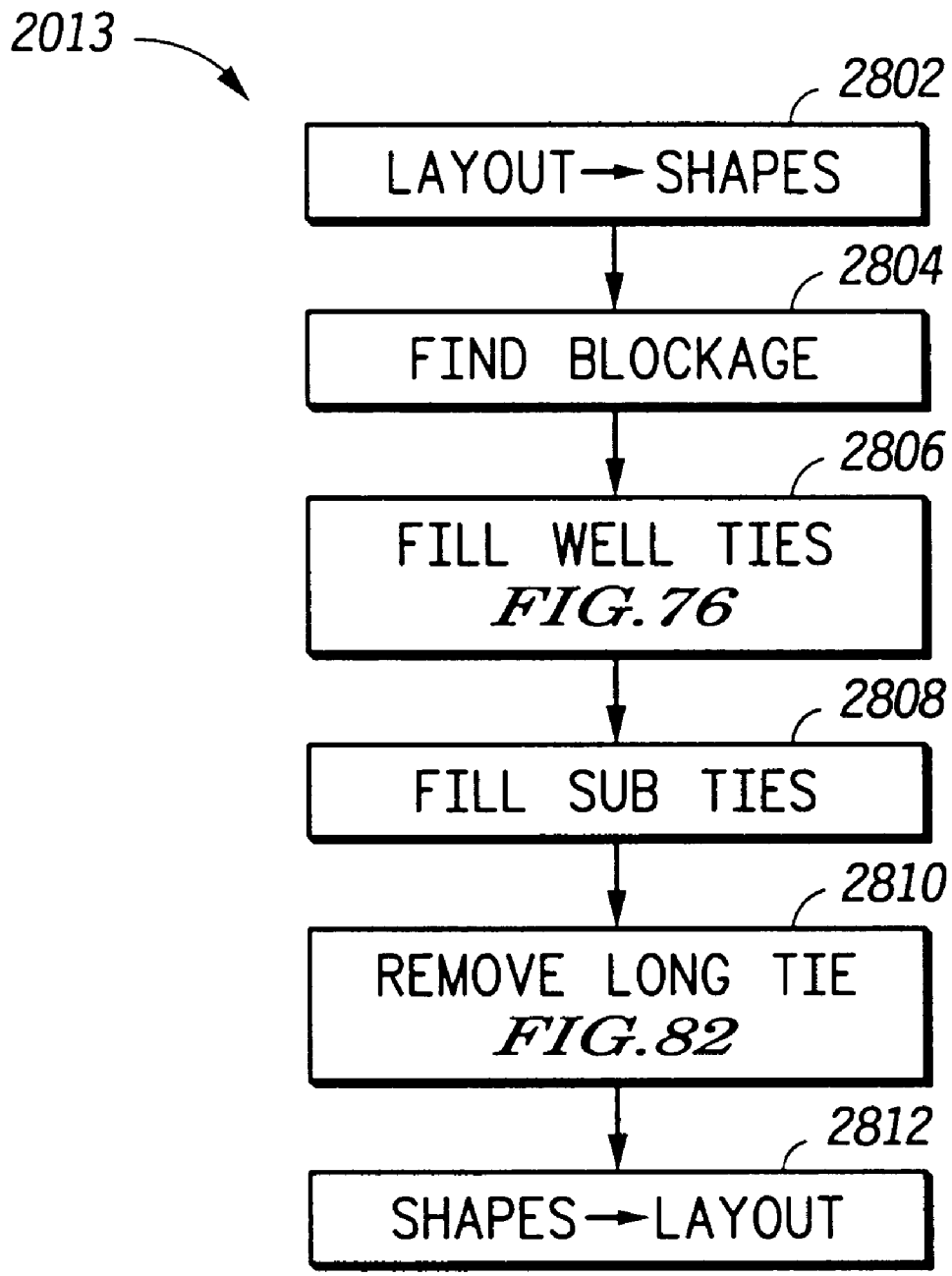
FIG. 70 is a flowchart that illustrates method 2013 in accordance with the present invention.

With the blockages of steps 2804 of FIG. 70 identified, the flow proceeds to step 2806 of FIG. 70. The step 2806 further comprises the steps illustrated in the method of FIG. 76. At step 2890, the complex blockage to the power Metal-1 shape is calculated. This is further illustrated with reference to FIGS. 77 and 78. Next, at a step 2891, all contactable Diffusion area is identified, as further illustrated with reference to FIG. 79. Next, at step 2892, contacts are added from Metal-1 to tie Diffusion, as further discussed with reference to FIG. 79. Next, at step 2893, a flood fill is performed on all tie Diffusion.

Figure 76:
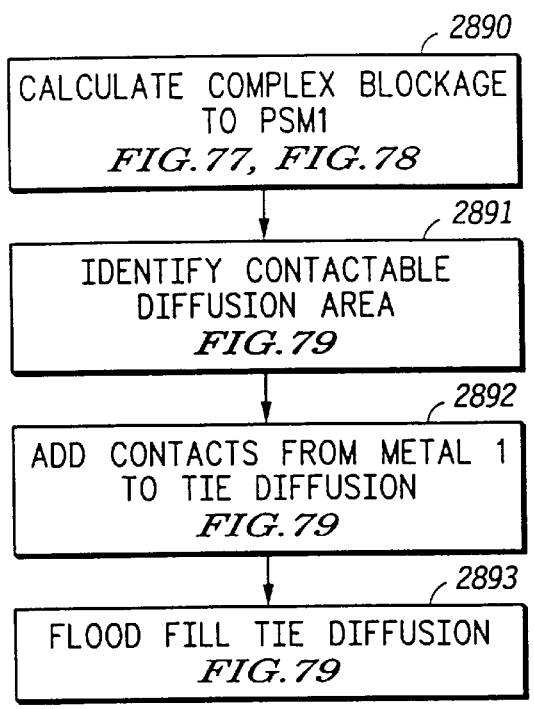
FIG. 76 is a flowchart that illustrates in greater detail a portion of FIG. 70.
Figure 77:
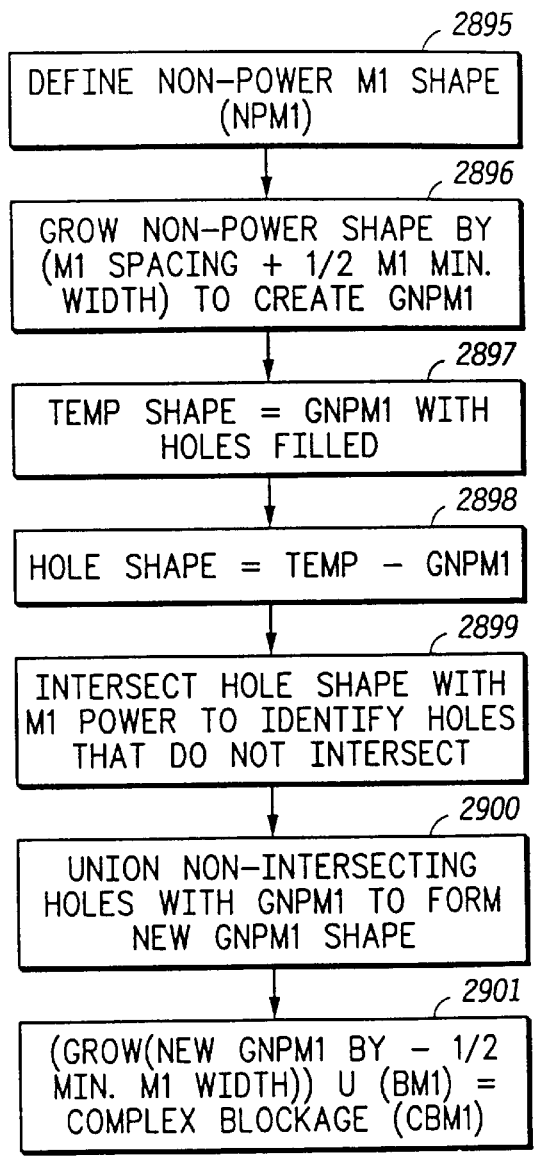
FIG. 77 is a flowchart that illustrates in greater detail a portion of FIG. 70.
Figure 78:
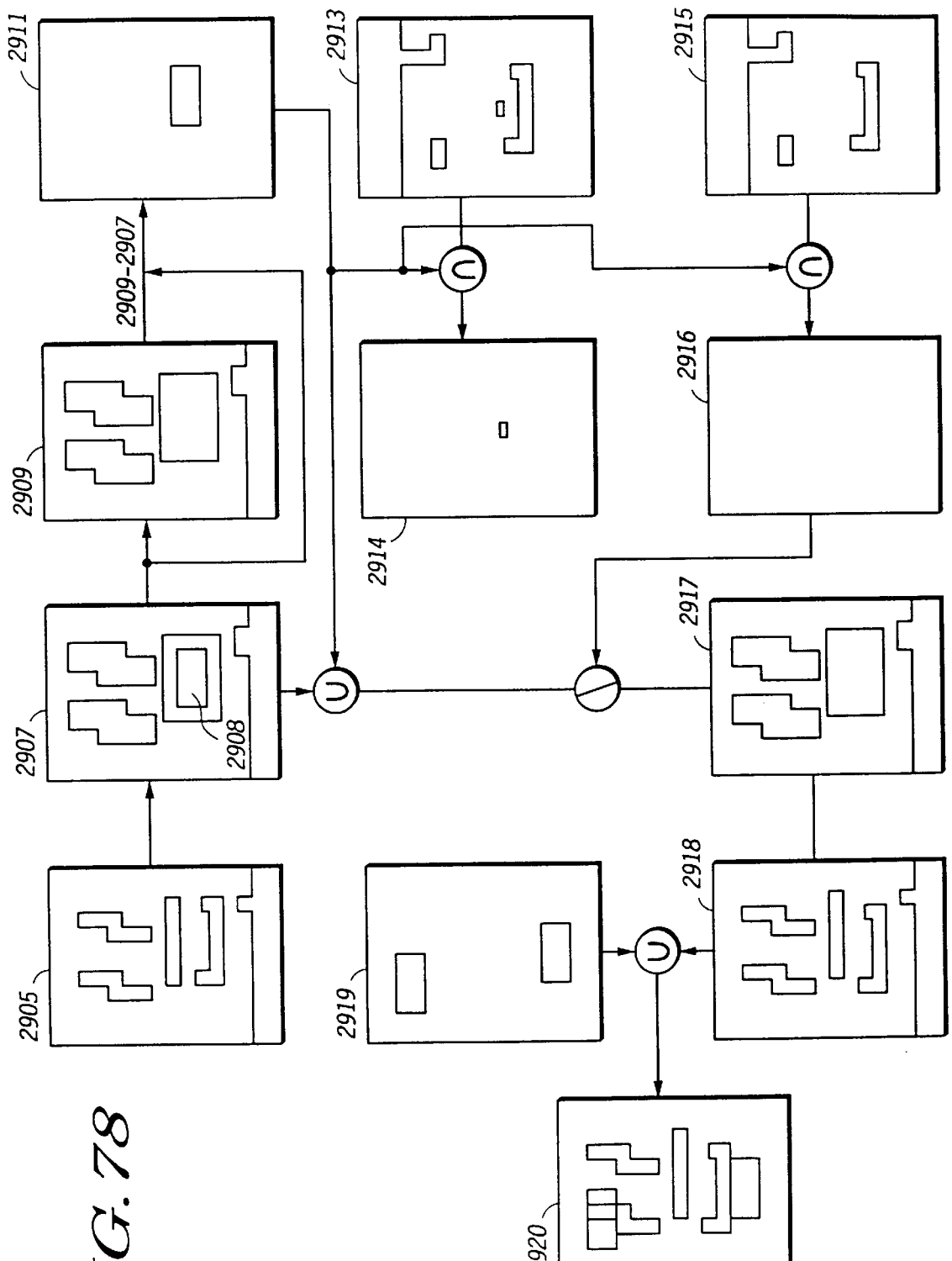
FIG. 78 is a diagram that illustrates a sequence of shapes used in implementation of the method of FIG. 77 as relating to various shapes.

FIG. 77 illustrates a method further implementing the steps of step 2890 of the method of FIG. 76. Specifically, at step 2895 a non power Metal-1 shape is defined. This is represented in FIG. 78 by shape 2905. Shape 2905 contains all the Metal-1 area except for that area incorporated in the power Metal-1 shape. Next, at step 2896, the non power Metal-1 shape is grown by the sum of the Metal-1 space and ½ of the Metal-1 minimum width. This grown shape is referred to as the grown non power Metal-1 shape (GNPM1), and indicates where metal1 associated with a well tie cannot reside. The shape GNPM1 is illustrated by shape 2907 of FIG. 78. Next, at step 2897, a temporary shape is created which is the GNPM1 layer with any holes filled. It should be noted with reference to FIG. 78, that shape 2907 has a hole 2908 associated with it, and that this hole 2908 has been filled in shape 2909 of FIG. 78.

Next, at step 2898, a shape representing the original hole 2908 is generated. This is accomplished by subtracting the GNPM1 shape from the temporary shape. Shape 2911 of FIG. 78 illustrates the hole. Next, at step 2899, an intersection is performed between the hole shape and the Metal-1 power shape to identify holes that do not intersect a power layer. Where shape 2913 represents a power shape the intersection between it and 2911 produces a shape 2914 which does identify an intersection of the two shapes. As a result, it is known that the power signal is available within the hole of shape 2907. Therefore, there is a potential for ties to be dropped to well locations within this hole.

However, if shape 2915 represents the power layer and it is intersected with the shape 2911, the shape 2916 is produced, which is a null shape enclosing no area. As such, no ties can exist within this hole, and at the next step 2900 those holes which are determined to be non intersecting with the power Metal-1 shape are unioned with the grown non power Metal-1 shape in order to form a new grown non power Metal-1 shape with the holes filled. Referring to FIG. 78, where shape 2911 does not intersect with the Metal-1 power shape of 2915, a union would be performed between 2911 and 2907 to produce the shape of 2917. The new grown non power Metal-1 shape 2917 has the hole filled in, because power is not available within the hole 2908 and therefore it would not be possible to fill a well tie into hole 2908.

Next, in step 2901, the new grown non power Metal-1 shape is grown by a negative ½ of the minimum Metal-1 width. The result is illustrated in shape 2918 in FIG. 78. This value in turn is unioned with the blockage shape for Metal-1 2919 in order to form a complex blockage shape for Metal-1 (CBM1). This shape represented by shape 2920 of FIG. 78 represents the area in which metal1 associated with a well tie may not be placed.

Figure 79:
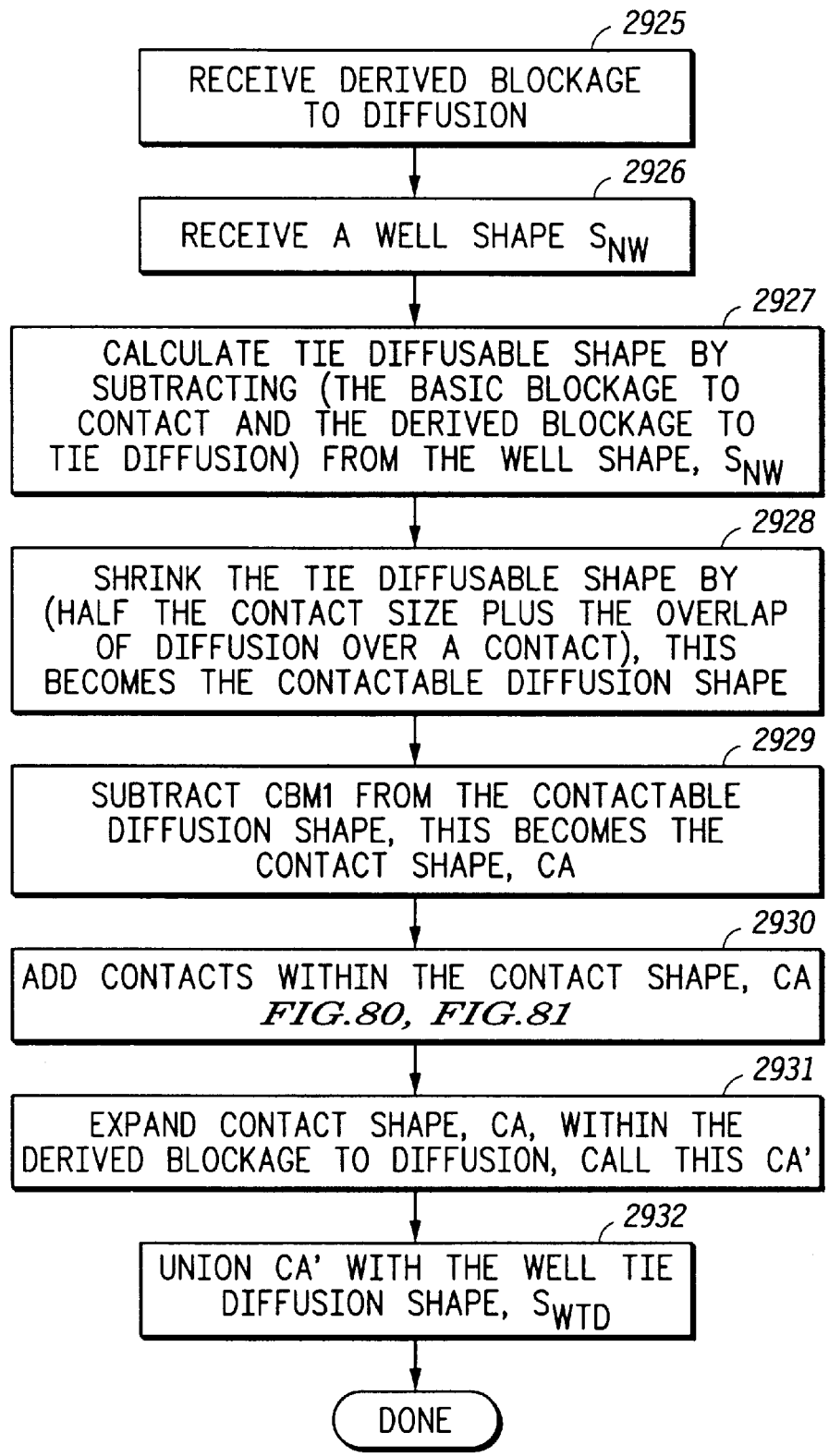
FIG. 79 is a flowchart that illustrates in greater detail a portion of FIG. 76.

FIG. 79 illustrates a method which expands upon the flow of FIG. 76. At step 2925, which is a first sub step of step 2891 of FIG. 76, a derived blockage is calculated from the complex blockage shape for Metal-1 (CBM1). The derived blockage flow is discussed with reference to FIG. 68 previously. Next, at step 2926, a well shape Snw is received. Note this shape could have been previously generated during a layout to shape step. Next, at step 2927, a tie diffusable shape is calculated by subtracting from the well shape the basic blockage to contact and the derived blockage to tie Diffusion. Next, at step 2928, the tie diffusable shape is grown by the negative of one-half the contact size plus the overlap of Diffusion over a contact. The result of this grow operation is the contactable diffustion shape. Next, at step 2929, the complex blockage to Metal-1 is subtracted from the contactable Diffusion shape. The result of this subtraction is the contact shape CA. Within the contact shape CA, contacts can be successfully added by locating the center of a contact within the contact shape CA.

Next, at step 2930, which corresponds to step 2892 of FIG. 76, contacts are added within the contact shape CA. This step is further desribed with reference to FIGS. 80 and 81. Next, at step 2931, which corresponds to step 2893 of FIG. 76, a new Diffusion shape CA' is defined to be equal to the original contact shape CA expanded, or flood filled, within the derived blockage to Diffusion. CA' then represents a maximum well tie Diffusion area. Flood filling a first shape within a second shape entails expanding the first shape within the second shape to utilize all available space. This is accomplished by growing the first shape by a small amount to form a grown first shape. Next, the first grown shape is modified by subtracting off the second shape. This modified grown first shape grows within the area of the second shape. By repeatedly growing the now modified first shape and subtracting the second shape, the modified first shape will be expanded to occupty all available space not occupied by, but surrounded by, the second shape. The step of repeating is ended when the modified shape did not change in area between iterations.

Next, at step 2932, the new Diffusion shape CA' is unioned with the well tie Diffusion shape Swtd to create a new well tie Diffusion shape which is further assigned to Swtd. This new well tie Diffusion shape now comprises the original well tie Diffusion and the added Diffusion due to added and expanded contacts.

Figure 80:
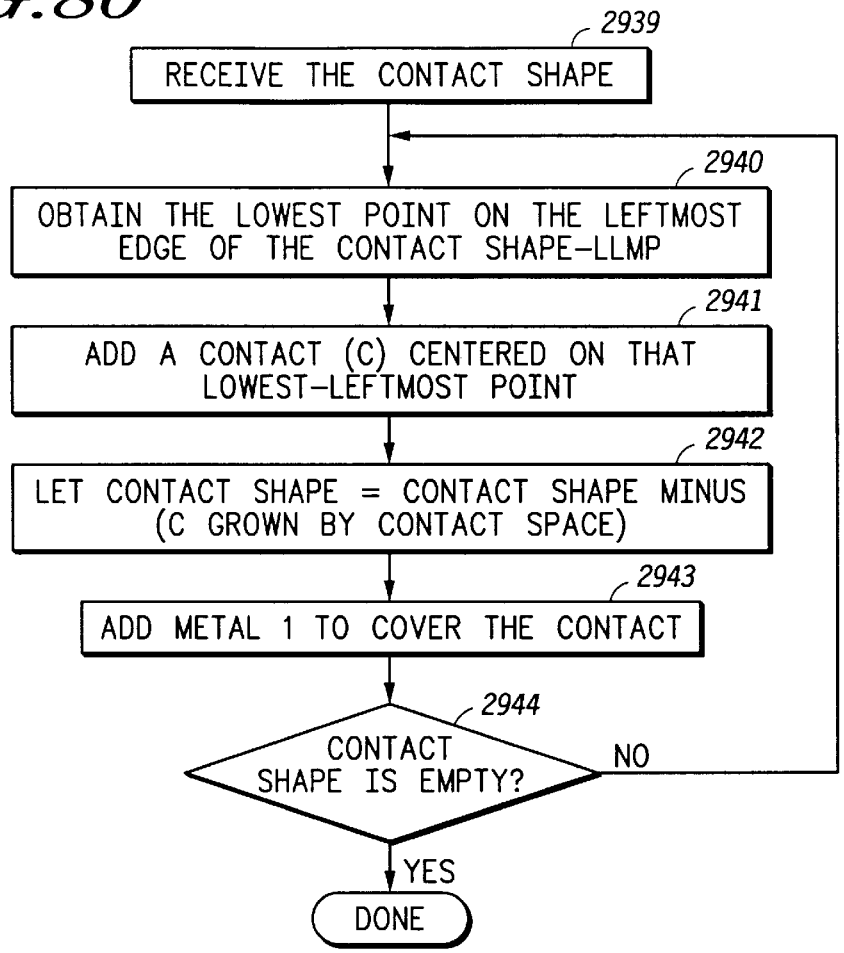
FIG. 80 is a flowchart that illustrates in greater detail a portion of step 2013 of FIG. 79.
Figure 81:
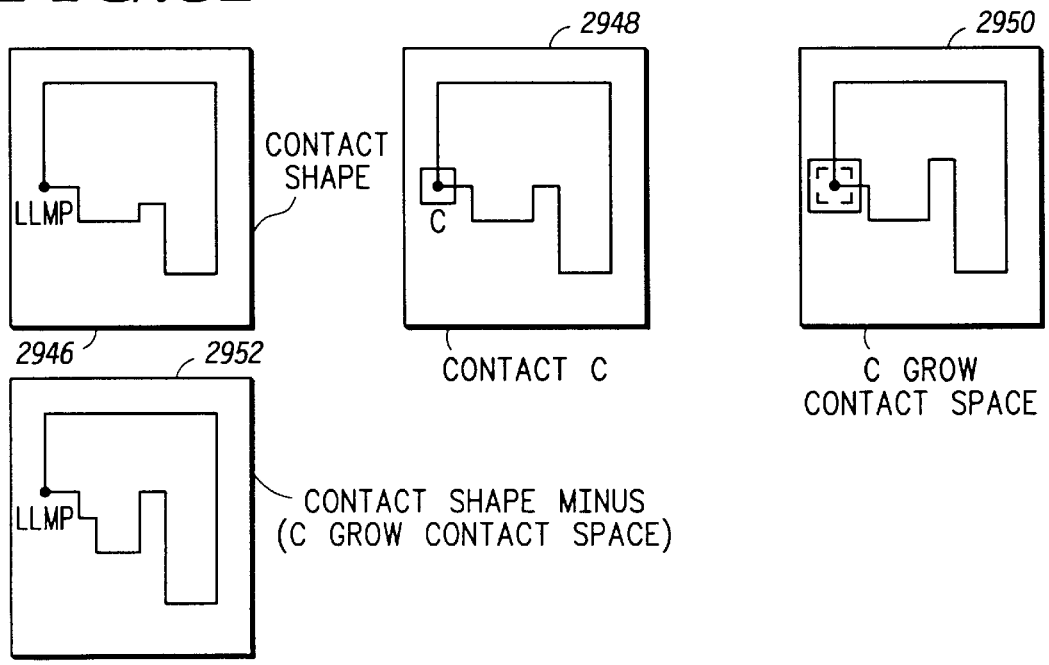
FIG. 81 is a diagram that illustrates a representative implementation of FIG. 80.

FIG. 80 illustrates a detailed method of step 2930 of FIG. 79. At step 2939 the augmented contact shape CA is received. Note, this step is for clarity only, as the augmented contact shape CA was previously calculated in the method of FIG. 79. Next, at step 2940, the lowest point on the left most edge (LLMP) of CA is identified as illustrated in shape 2946 of FIG. 81. Next, at step 2941, a contact is added. The added contact is centered on the LLMP point as illustrated in shape 2948 of FIG. 81. Next, at step 2942, the augmented contact shape CA is modified by subtracting off added contact shape after it is grown. The contact shape is grown because there may be a design rule requiring that contacts meet a certain spacing requirement. This is illustrated by shapes 2950 and 2952 of FIG. 81. Next, at step 2943, Metal-1 is added to cover the contact that was placed in step 2942. Next, at step 2944, a determination is made whether the contact shape is empty. If not, the flow returns to step 2840 until all contact space has been filled by contacts. If so, the flow is done.

Figure 82:
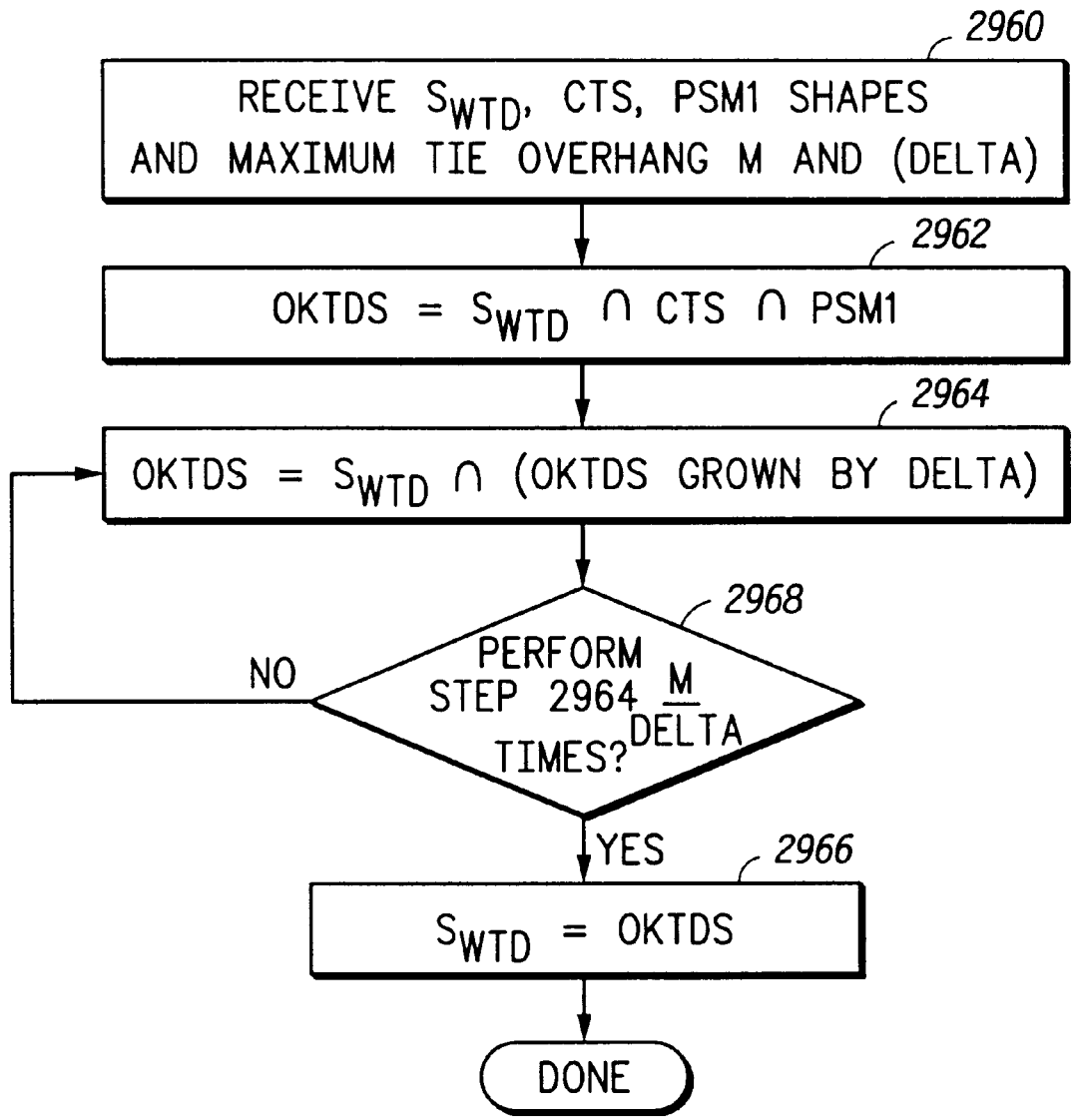
FIG. 82 is a flowchart that illustrates in greater detail a portion of FIG. 70 for finding and removing long ties.
Figure 83:
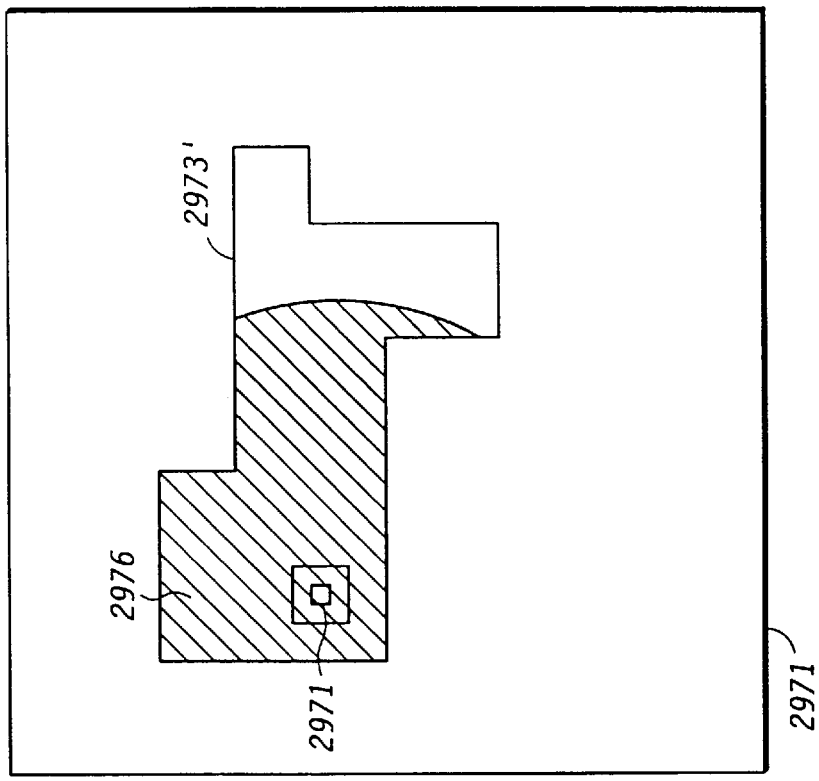
FIG. 83 is a diagram that illustrates the effects of implementing a portion of the method of FIG. 82.
Figure 83:
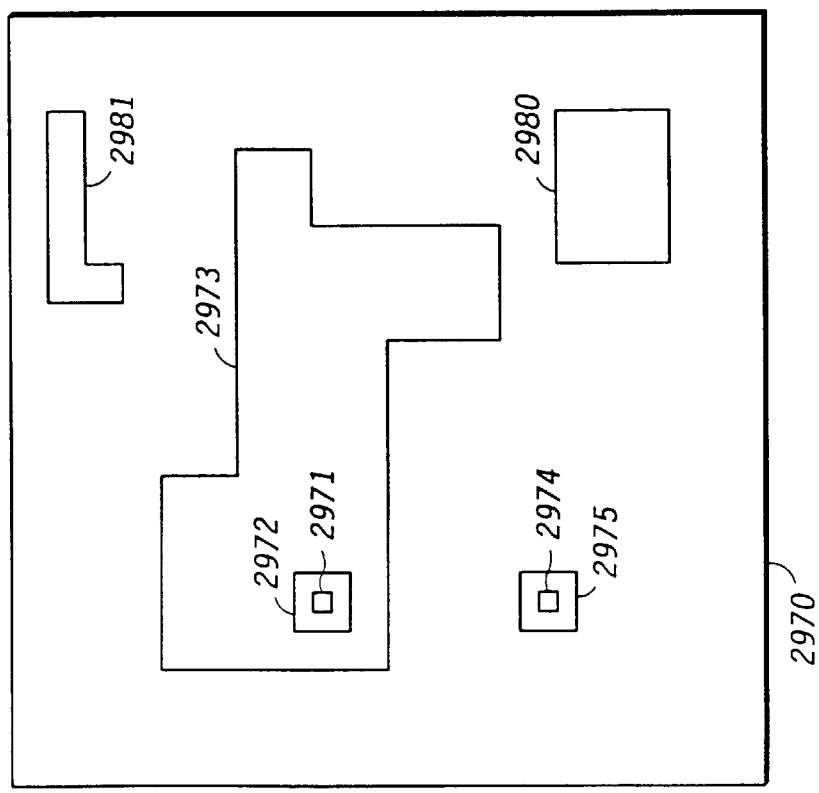

FIG. 82 is an expanded flow for step 2810 of FIG. 70 for removing long ties. At step 2960, a well tie diffustion shape Swtd, contact shape CTS, and Metal-1 power shape are received. As noted previously, this step is performed for clarity, as these shapes already exist in the method of FIG. 70. Next, at step 2962, a valid tie diffustion shape OKTDS is defined to be equal to the intersection of the tie Diffusion shape Swtd, the contact shape CTS, and the Metal-1 power shape PSM1. This is indicated by shape 2970 of FIG. 83. The OKTDS shape comprises areas where ties 2972 and 2974 are directly connected to power Metal-1 layout elements through contacts 2971. Next, at step 2964, the OKTDS shape is modifed by growing the original OKTDS shape by an amount delta and intersecting the result with the tie diffustion shape Swtd. At step 2968, a determination is made whether to repeat the step a maximum number of times. The maximum number of times is defined by the maximum tie overhang M divided by delta. This assures that no tie is longer than the maximum well tie length M. Next, at a step 2966, the OKTDS shape replaces the tie diffustion shape Swtd. Shape 2971 of FIG. 83 illustrates the valid tie Diffusion shape OKTDS 2976 which was grown within the tie Diffusion positive region 2973'. The shape 2976 meets all design rules.

It should be noted, that the above methods apply to substrate ties as well as well ties. In particular, the method previously desribed for filling well ties in step 2806 of FIG. 70 can be used in an analogous fashion to perform the step 2808 of FIG. 70.

The method 2013 of FIG. 70 concludes with step 2812, in which the shapes are converted into a semiconductor layout.

In addition, while the methods may use specific examples, for instance Metal-1 containing a power layer, other layers and shapes can and should be used to assure design integrity.

K. Contact and Via Filling

Figure 84:
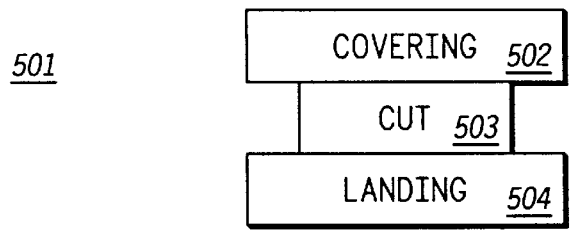
FIG. 84 is a cross sectional view of a covered via.

The use of vias is well known in the semiconductor arts to connect two conductive layers such as two metal layers. FIG. 84 illustrates a covered via having a cut 503, a covering 502 which overlaps the cut 503, and a landing 504 which overlaps the cut 503. Note that the term covering can be used generically to refer to both a landing 504 and a covering 502. The covering 502 represents one layer of a semiconductor device, while the landing 504 represents a second layer of a semiconductor device. The cut 503 represents a third layer of a semiconductor device. The cut 503 electrically connects the covering 502 to the landing 504. In turn, the coverings are, generally, connected to nodes on their respective layers which in turn conduct signals to portions of a semiconductor device.

Figure 85:
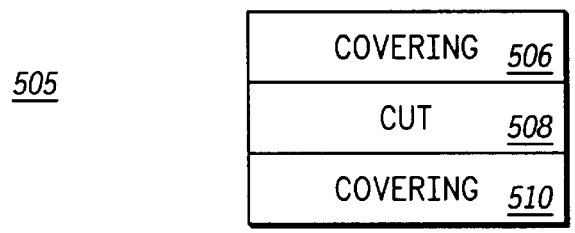
FIG. 85 is a cross sectional view of an uncovered via.

FIG. 85 illustrates a via which is uncovered and unlanded; this is referred to as an "uncovered via". The uncovered via has a covering and landing containing no overlap beyond the cut dimensions. Because there is no overlap on the coverings, an uncovered via take less space to implement than a covered via.

Figure 86:
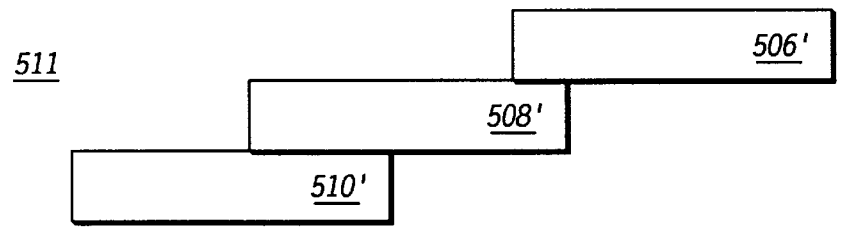
FIG. 86 is a cross sectional view of an uncovered via that is misaligned.

A disadvantage of the uncovered via is greater susceptibility to misalignment and other processing variations as compared to the covered via. FIG. 86 illustrates the effects of a misalignment between semiconductor device layers which occur during the processing of semiconductor devices. As illustrated, the covering 506', the cut 508', and the landing 510' are misaligned relative to each other. The problem with such a misalignment is that the conductivity of the electrical connection between the layers, the cut area, is reduced as compared to an aligned via such as represented in FIG. 85. In severe cases, misalignment or processing variation can fail to establish any electrical connection. Reduced or missing connectivity can cause a semiconductor device to be nonfunctional. Where a single via connects objects on separate layers, the problem is particularly acute, as there is no alternative connectivity path. Furthermore, the problem associated with misaligned vias is particularly serious when uncovered and unlanded vias are used as opposed to when covered and landed vias are used. This is because the oversized covering and landing areas of the covered and landed via can accommodate some misalignment between the layers.

Uncovered vias are more space efficient than covered vias. The cost of a semiconductor device is directly related to its size. Coverings, however, are more reliable in terms of electrical contact between layers than uncovered vias. Therefore, it would be advantageous to implement a method of adding and using vias with larger coverings without increasing the overall size of a semiconductor device. It would further be advantageous to implement a method of adding redundant vias without increasing the overall size of a semiconductor device.

Figure 87:
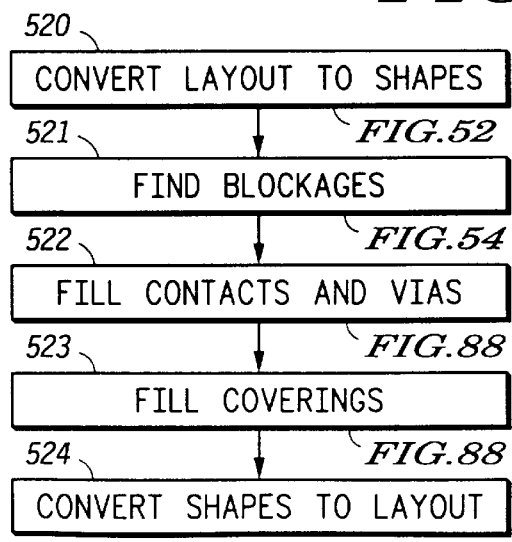
FIG. 87 is a flowchart that illustrates a method of filling contacts and vias in accordance with the present invention.

FIG. 87 illustrates a method in accordance with the present invention for adding vias. At step 520, a layout is converted into a number of shapes needed in order to process the vias. The step 520 is analogous to step 2025 of the notch fill method of FIG. 52. Next, at step 521, the blockages are determined for each of the shapes generated in step 520 above. The finding blockages step is analogous to the step 2026 of FIG. 52, and the method 2040 of FIG. 54 above, and will not be discussed further herein. Next, at step 522, contacts and vias are filled into available areas based upon the blockage information of step 521. Next, at step 523, coverings are added to all contacts and vias represented by the shapes, including those contacts and vias added in step 522. The specific steps comprised by steps 522 and 523 are discussed in more detail below. During final step 524, the shapes generated in the process of filling contacts and vias are converted into layout format.

Figure 88:
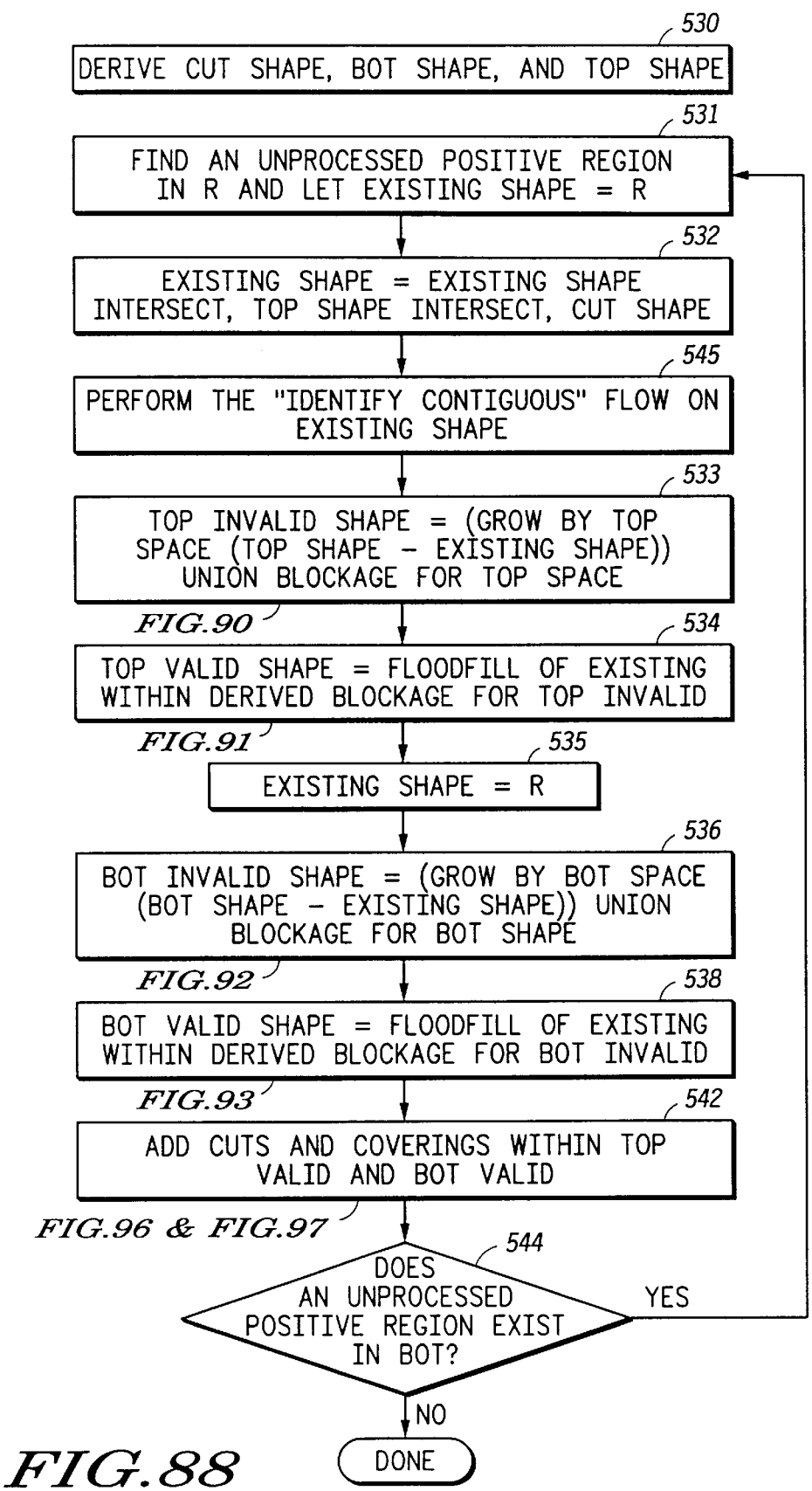
FIG. 88 is a flowchart that illustrates an expanded portion of the flow of FIG. 87.

FIG. 88 illustrates, in flow diagram form, an expanded version of a portion of the method of FIG. 87, which determines where contacts and vias may be placed in accordance with the present invention. Note that the terms contact and via will be used interchangeably. Specifically, however, a "via" refers to a semiconductor portion connecting a metal layer to another metal layer, while a "contact" refers to a semiconductor portion connecting a metal layer to a non-metal layer, such as a poly layer. The method of FIG. 88 is used interchangeably whether contacts or vias are being added.

Figure 89:
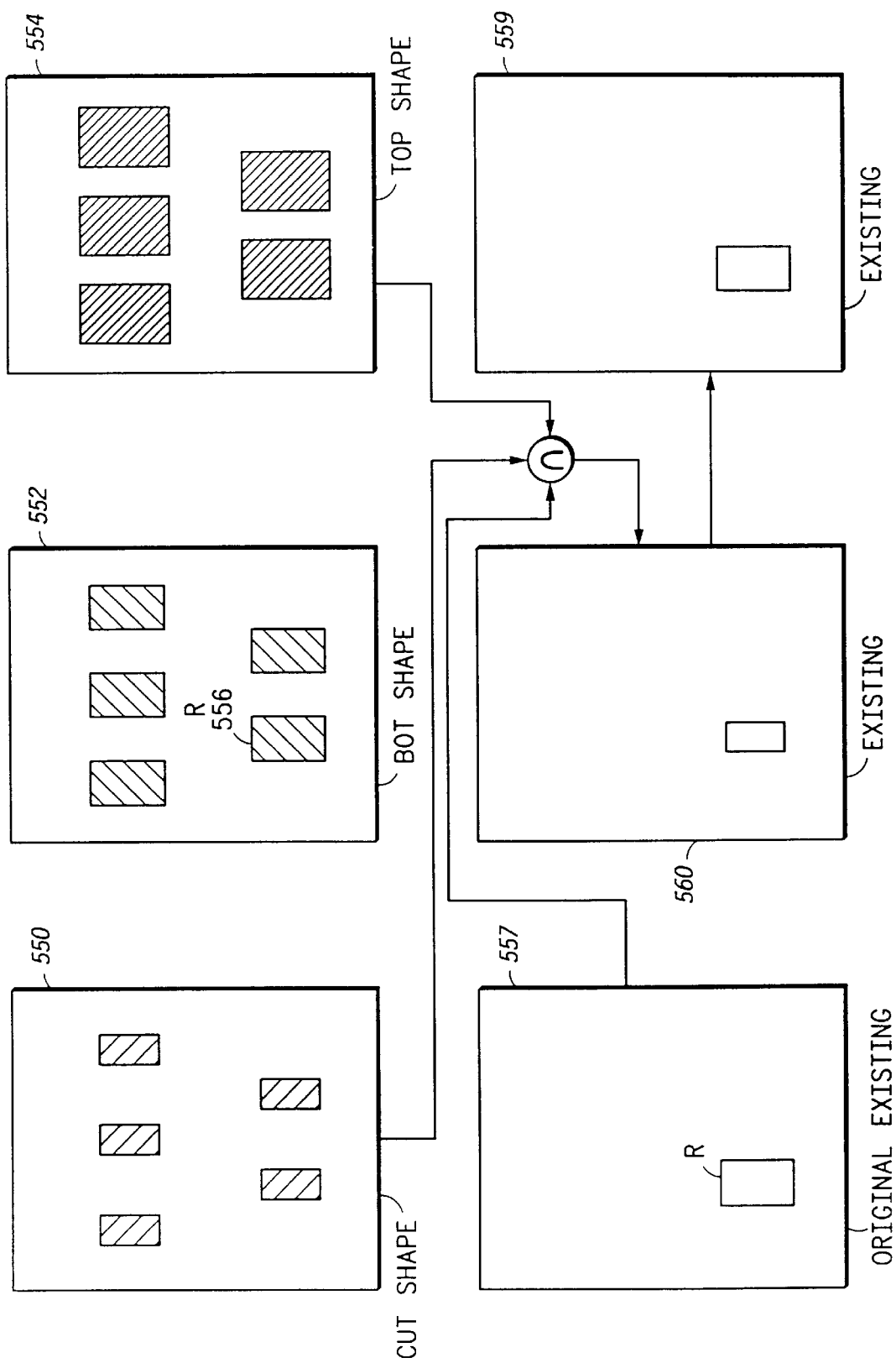
FIG. 89 is a flowchart that illustrates the generation of an Existing Shape in accordance with the method of FIG. 88.

Step 530 of FIG. 88 relates to a sub-step within step 520 of FIG. 87 which defines shapes. At step 530, Cut shape, Top shape and Bot shape are defined. With reference to FIG. 89, Cut shape 550 is the shape representing the cut layer for a via. Bot shape 552 comprises the landing portion of a plurality of vias and may further comprise other interconnections. Top shape 554 comprises the covering portion of a plurality of vias and may further comprise other interconnections. Note that combined the Top shape 554, Cut shape 550, and Bot shape 552 represent the areas enclosed by layers top, cut, and bottom in a given semiconductor device.

These shapes therefore implicitly represent the existing vias or contacts connecting the top layer and the bottom layer. For example, the bottom layer may be a poly layer, the cut layer may be a poly contact layer, and the top layer may be a Metal-1 layer.

Next, at step 531, which is a sub-step of step 522 of FIG. 87, a positive region R in the Bot shape 552 is identified, and assigned to a new shape named Existing 557 of FIG. 89. Next, at step 532, the Existing shape is defined to be the result of itself (the Existing shape) intersected with the Top shape intersected with the Cut shape. As illustrated in FIG. 89, it can be seen that Cut shape 550 and Top shape 554 have been intersected with Existing shape 557 to generate a new Existing shape 560. Note that in this instance, the original Existing shape 557 is larger than the new Existing shape 560. This indicates that some portion of the chosen positive region R did not intersect the Cut shape 550 and the Top shape 554.

Figure 90:
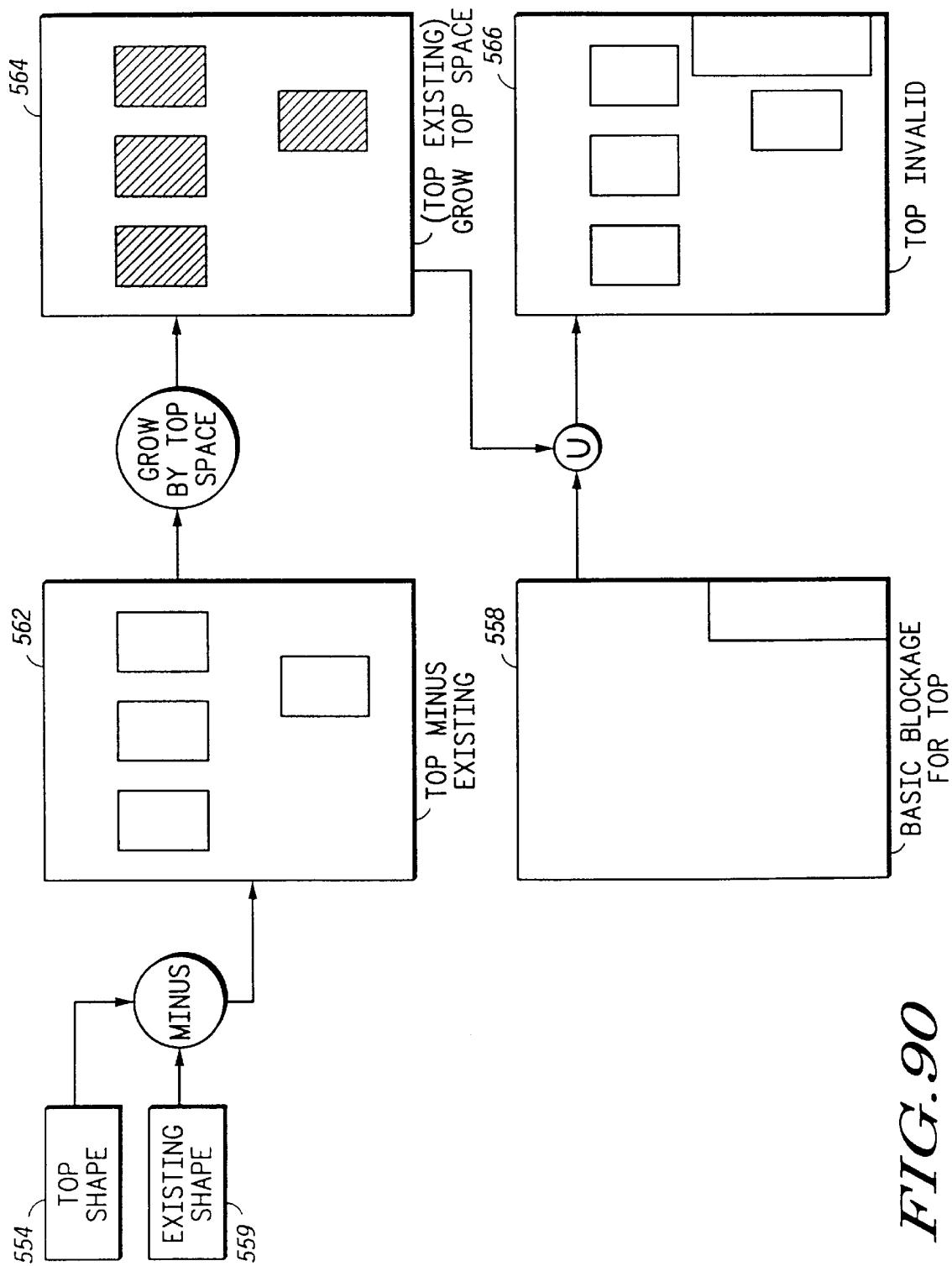
FIG. 90 is a diagram that illustrates the generation of a Top Invalid Shape in accordance with the method of FIG. 88.

Next, at a step 545, all portions of the Top shape 554 contiguous with the Existing shape 560 are identified, the result assigned to a new shape also named Existing 559. This is accomplished using the identify contiguous flow of FIG. 72 which is further illustrated in FIG. 73. Next, at step 533, a top invalid shape is defined. As illustrated in FIG. 90, the top invalid shape is determined by first taking the top shape 554 minus the Existing shape 559 to obtain shape 562. Shape 562, in turn, is grown by a value TopSpace to obtain a grown shape 564. The value TopSpace is technology dependent and indicates the spacing required between elements on the top layer. Next, the grown shape 564 is unioned to the basic blockage shape for the top layer to obtain shape 566. The basic blockage shape for the top layer is illustrated in FIG. 90 as shape 558, and was derived at step 521 of FIG. 87.

Figure 91:
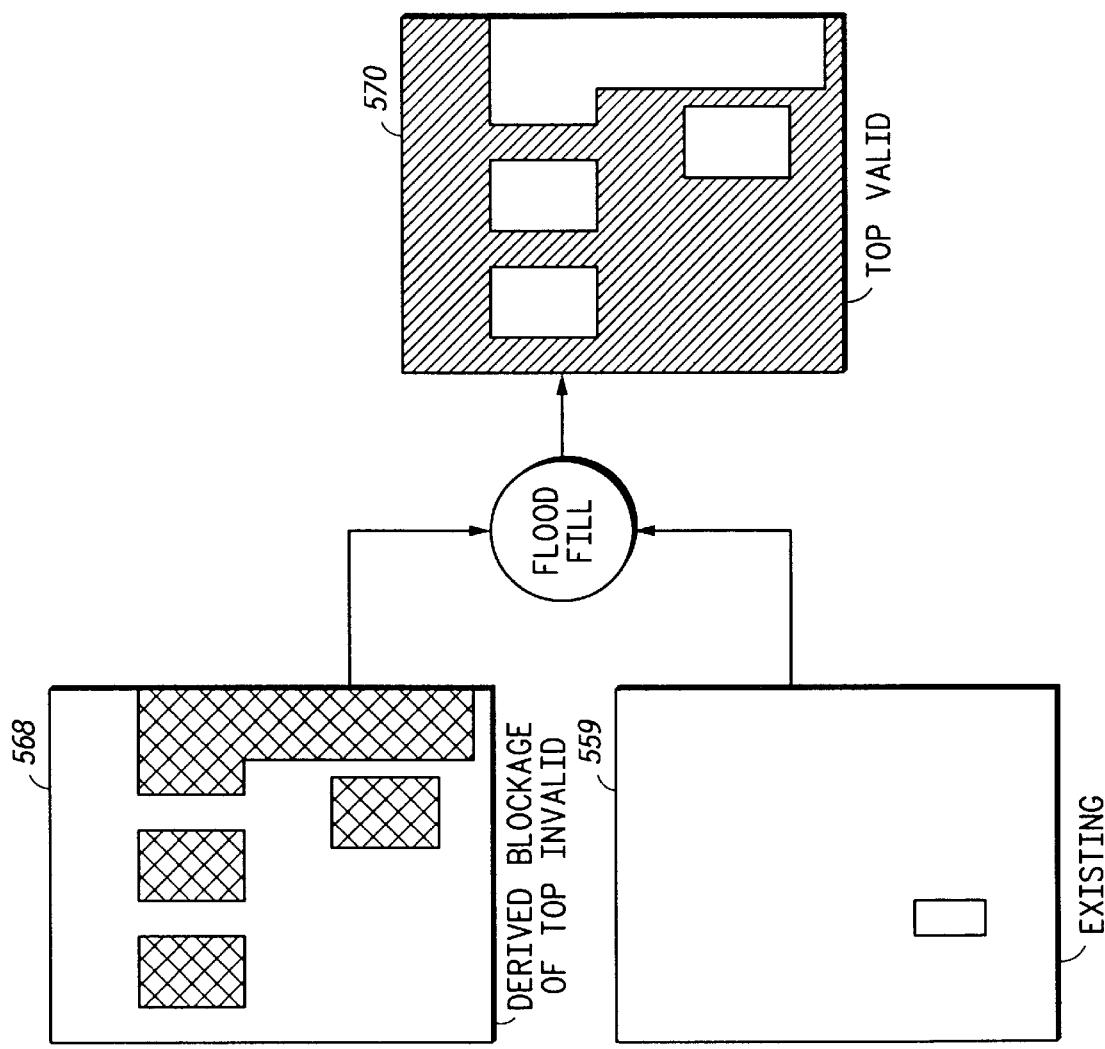
FIG. 91 is a diagram that illustrates the generation of an Top Valid shape in accordance with the method of FIG. 88.

Next, at step 534, a TopValid shape is defined. A TopValid shape is produced by performing a flood fill within the derived blockage of the top invalid shape. The derived blockage of the TopInvalid shape is determined using the derived blockage flow above with reference to FIG. 68 previously. In addition, refer to the previous flood fill discussion. This derived blockage of the top invalid shape is illustrated in FIG. 91 with reference to shape 568. The flood fill of Existing shape 559 within the derived blockage of the top invalid shape 568 is illustrated as TopValid Shape 570 of FIG. 91. This TopValid shape generally indicates where coverings or landings can be placed relative to the Top shape. In other words, if the top shape represents a metal layer, TopValid would indicate the areas on that metal layer where coverings or landings could be placed and grown.

Figure 92:
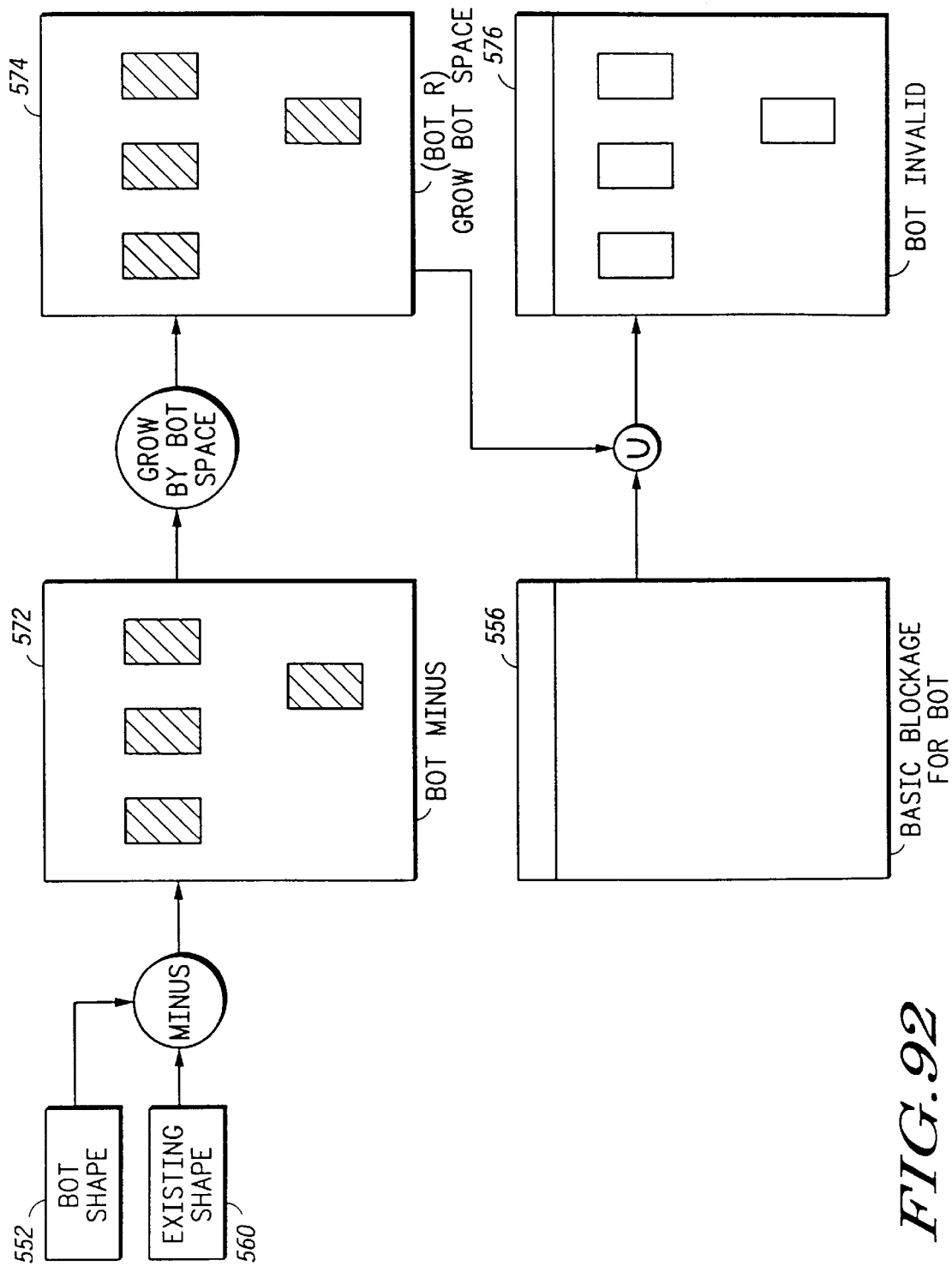
FIG. 92 is a diagram that illustrates the generation of a Bot Invalid Shape in accordance with the method of FIG. 88.
Figure 93:
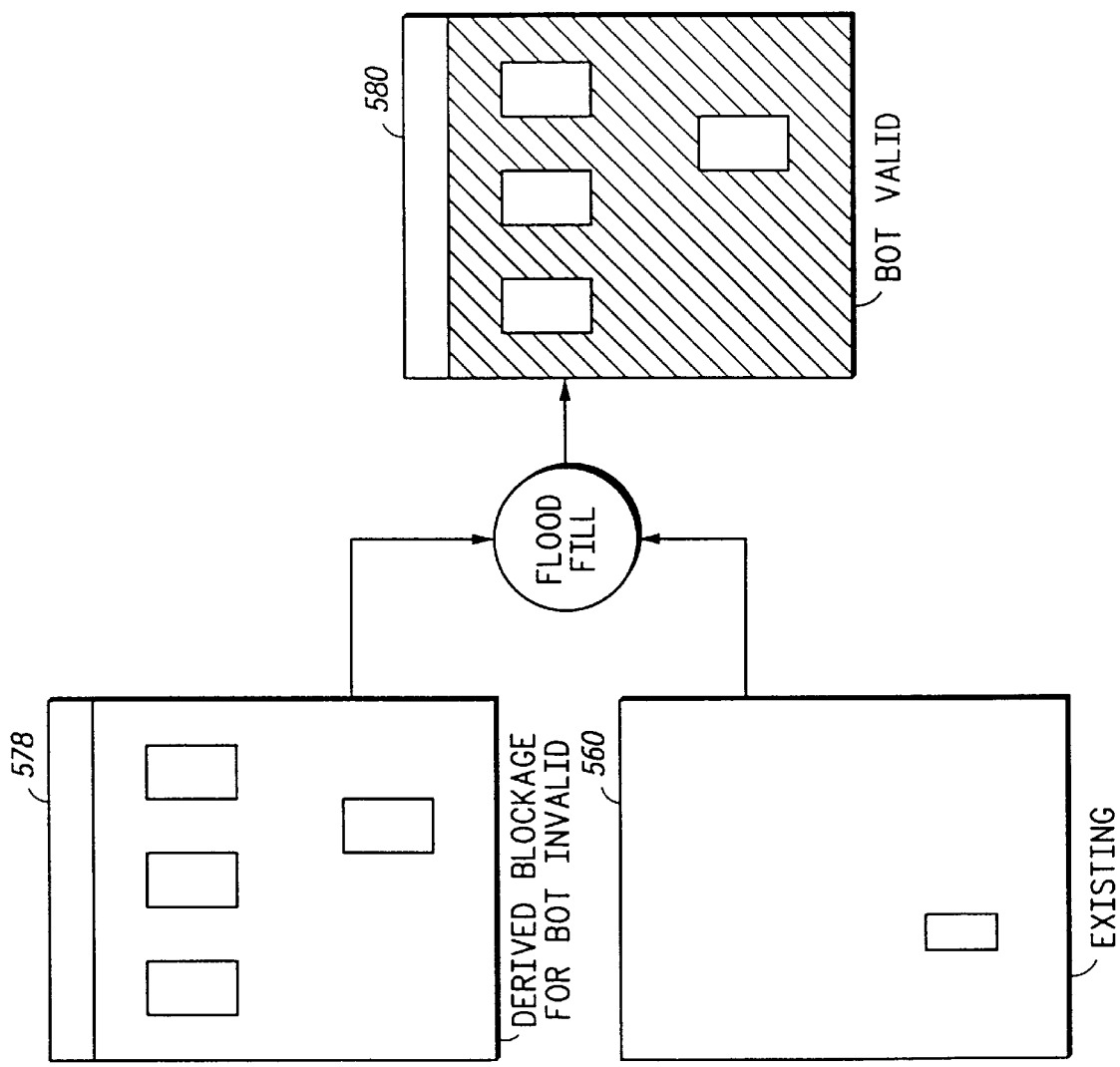
FIG. 93 is a flowchart that illustrates a portion of the flow of FIG. 87 in expanded form.

Next, at steps 535, 536 and 538, a BotValid shape is identified. In step 535, the positive region R is assigned to a new shape named "Existing." Then the BotValid shape is generated in a manner analogous with that of TopValid as identified in steps 533 and steps 534. The resulting BotInvalid and BotValid shapes are illustrated with reference to FIG. 92 and 93. Next, at step 542, as discussed below, cuts and coverings are added within the TopValid and BotValid shapes. Next, at step 544 a determination is made whether unprocessed positive regions exist in Bot shape 552. If so, flow proceeds to step 531 creating a loop. Otherwise the flow of FIG. 88 is finished, and returns to step 523 of the method of FIG. 87.

Figure 96:
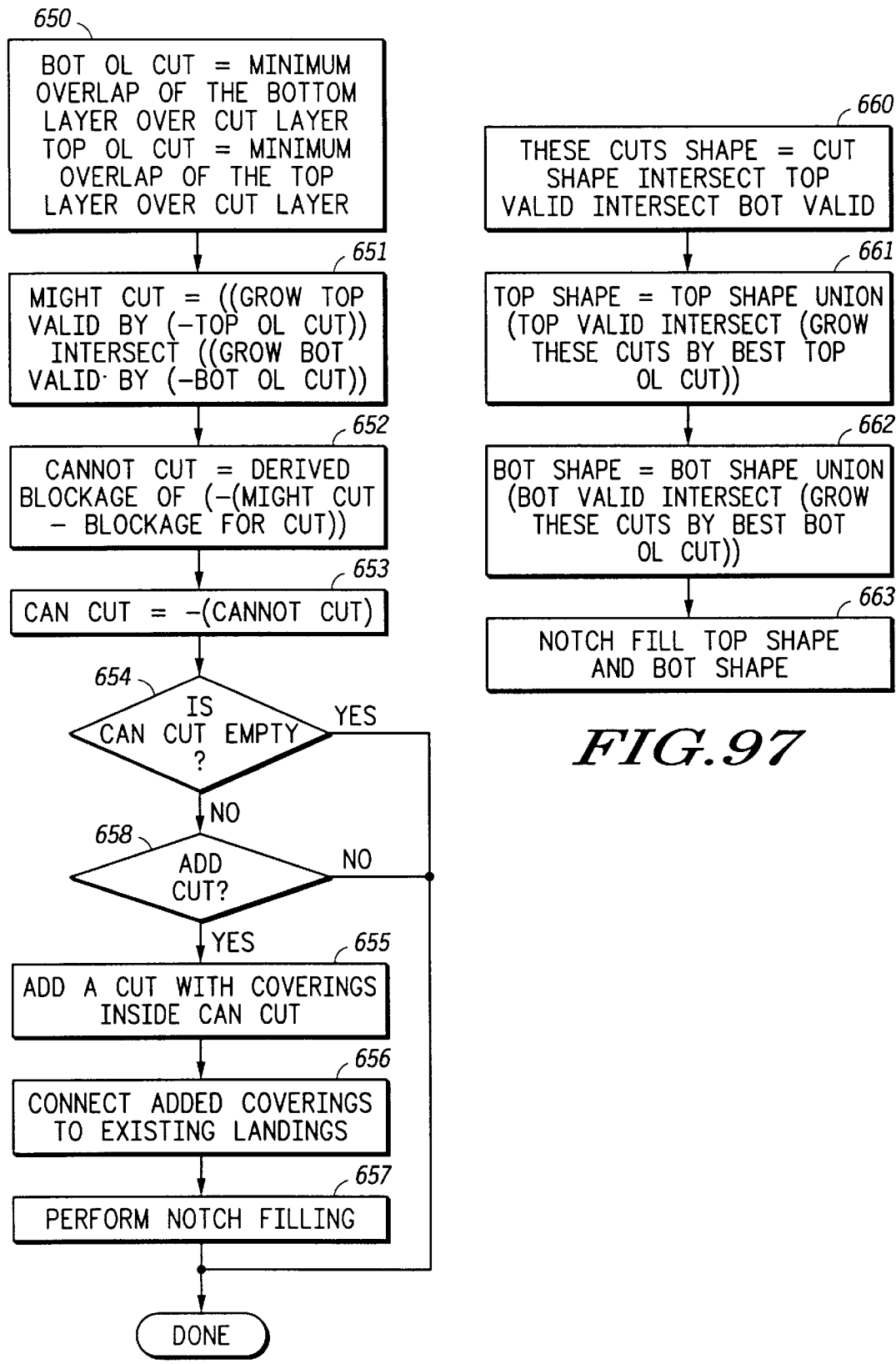
FIG. 96 is a diagram that illustrates the generation of a Bot Valid shape in accordance with the method of FIG. 88.
Figure 97:
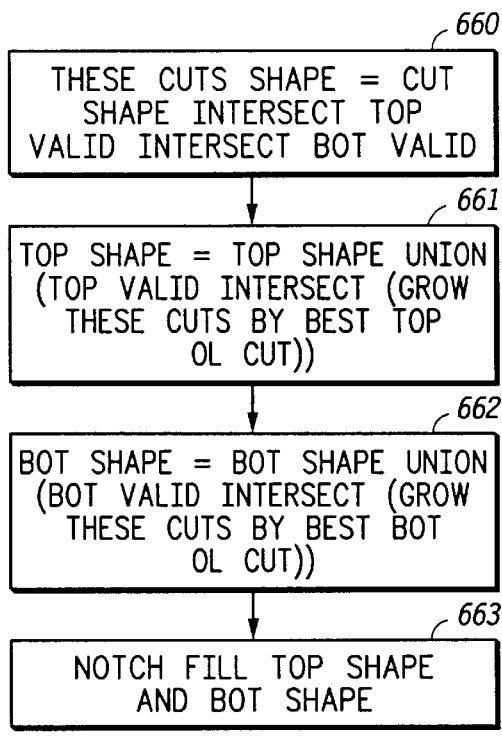
FIG. 97 is a flowchart that illustrates a portion of the flow of FIG. 87 in expanded form.

FIG. 96 and FIG. 97 expand upon step 542 of FIG. 88 which adds cuts and landings. Specifically, the method of FIG. 96 is used in step 542 of FIG. 88 in order to implement step 521 of FIG. 87, while the method of FIG. 97 is used in step 542 of FIG. 88 in order to implement step 523 of FIG. 87.

Figure 94:
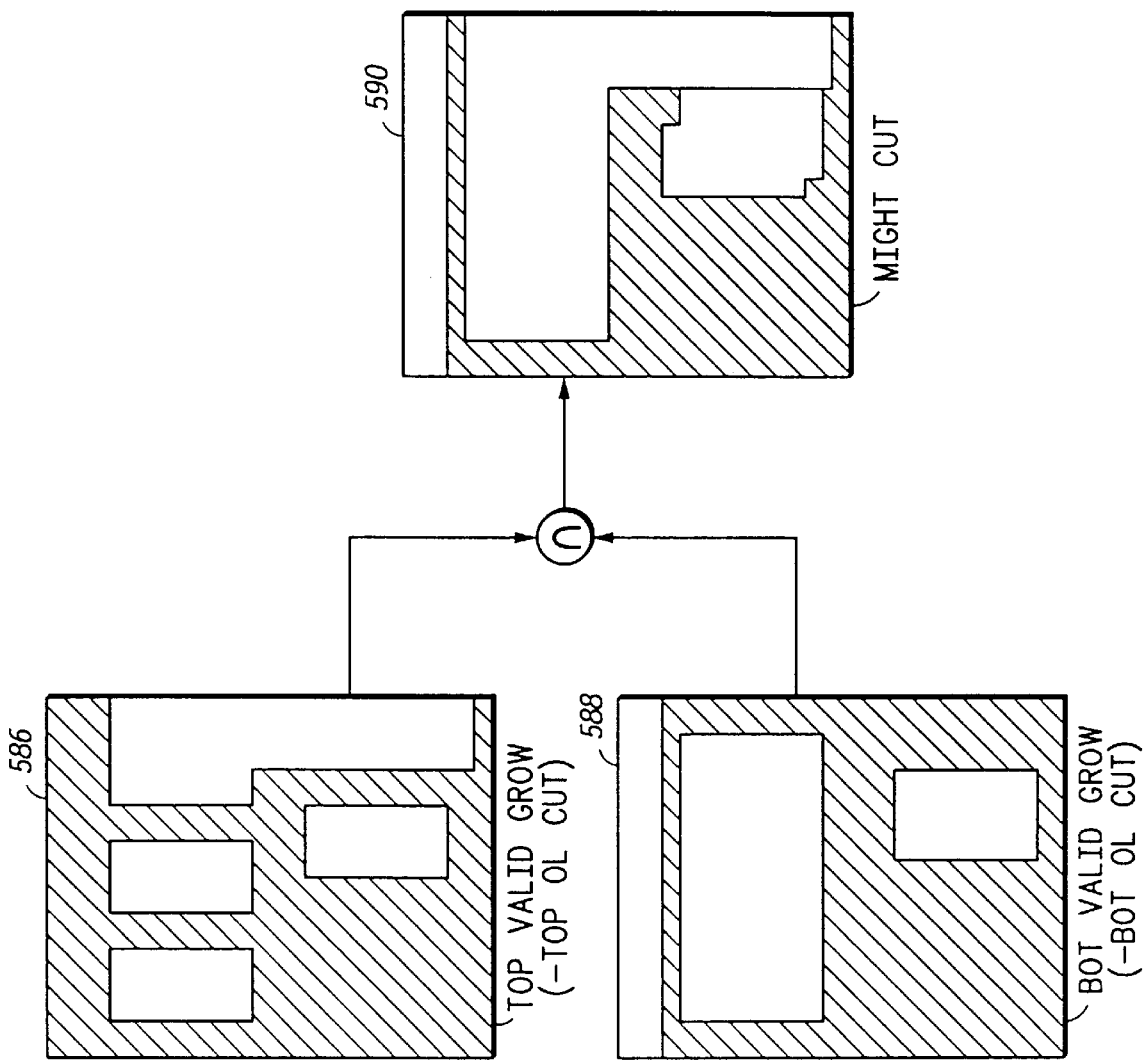
FIG. 94 is a diagram that illustrates the generation of a Might Cut shape in accordance with the method of FIG. 88.

At step 650 of FIG. 96 the minimum specified overlap of the bottom layer over the cut layer is defined to be BotOLCut. Likewise, the minimum specified overlap of the top layer over the cut layer is defined to be TopOLCut. Next, at step 651, a shape MightCut is defined to be an intersection of TopValid grown by the inverse of TopOLCut intersected with the BotValid shape grown by the inverse of TopOLCut. In other words, the top valid shape 570 of FIG. 91 is grown by an amount equal to negative the value of TopOLCut as illustrated by shape 586 of FIG. 94. Likewise, BotValid is grown by an amount equal to negative the value of BotOLCut. This is illustrated by shape 588 of FIG. 94. Next, these two grown shapes are intersected in order to produce the MightCut shape 590.

Figure 95:
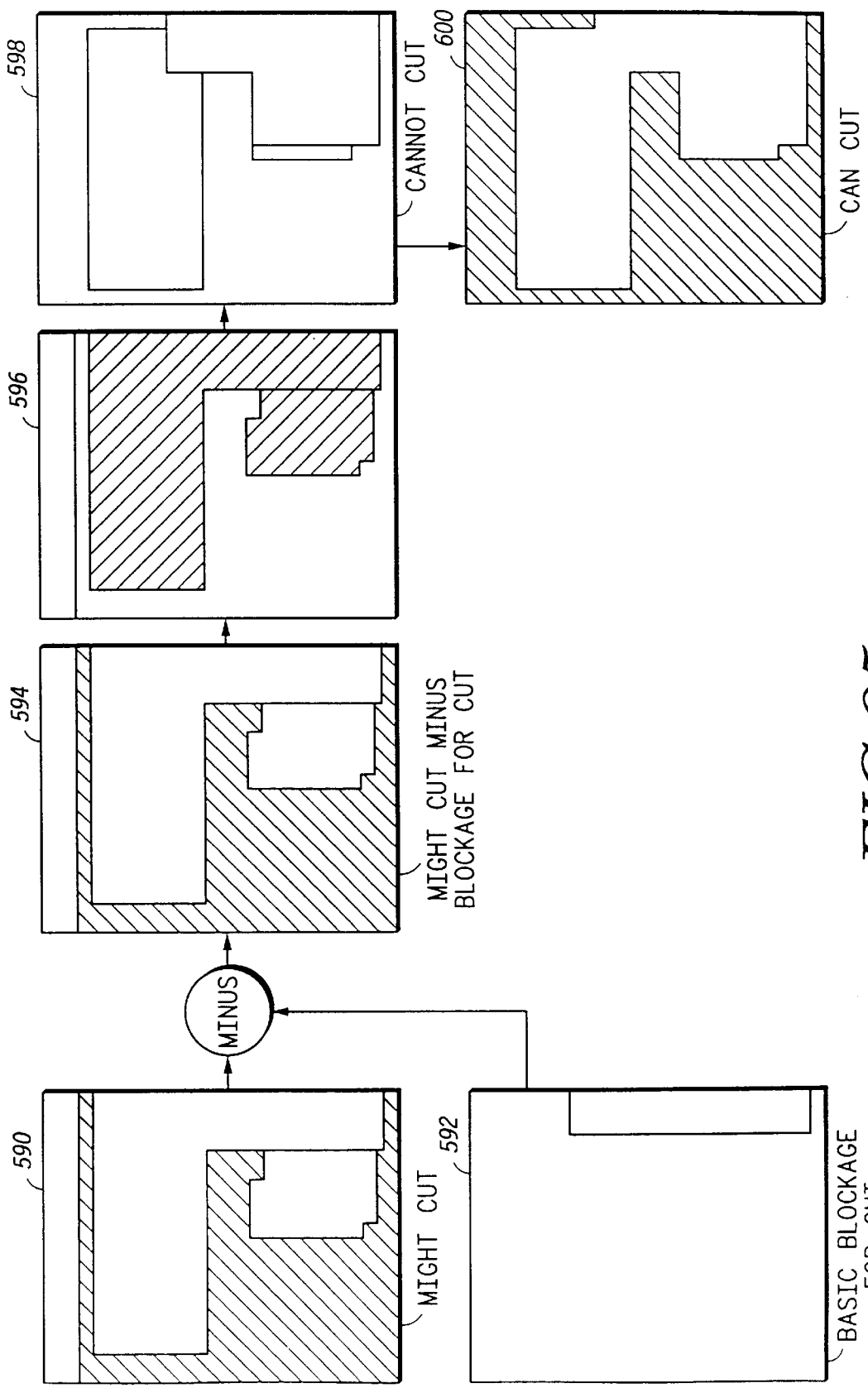
FIG. 95 is a diagram that illustrates the generation of a Can Cut shape in accordance with the method of FIG. 88.

Next, at step 652, the shape CannotCut is defined to be equal to the derived blockage of the inverted MightCut shape minus the basic blockage shape associated with the cut layer. In other words, as illustrated in FIG. 95, a shape 594 is generated by subtracting the blockage shape for Cut 592 from MightCut 590. The shape 594 is inverted to produce a shape 596. The derived blockage is determined for this now inverted shape 596 to provide the shape CannotCut 598. Shape CannotCut 598 represents areas where cuts cannot be placed. Conversely, the inverse shape of CannotCut 598 is CanCut 600, and represents areas where cuts can be placed.

At step 654, a determination is made whether the shape CanCut 600 is empty. If empty, no cuts, and hence no vias, can be added for the positive region being processed. As such, the flow for this positive region is finished. If not empty, then it is possible to add a via and flow proceeds to step 658. At step 658, a further determination is made whether to add a cut even though it is feasible. Numerous criteria can be used for determining whether a new cut should be added. Examples of such criteria include whether multiple cuts already exist in the Existing shape, or whether the added capacitance of an additional cut would add too much capacitance to a node. If it is determined that no cut should be added, then the flow for this positive region is finished. If a cut is to be added, flow proceeds to step 655 where a cut and coverings are added to Cut shape, Top shape, and Bot shape.

Next, at step 656 of FIG. 96, the added covering is connected to the existing covering, and the added landing is connected to the existing landing. This is performed by modifying the Top shape and the Bot shape. As a final step 657 of FIG. 96, notch filling as discussed above with reference to step 2012 of FIG. 51 is performed on the modified shapes.

The method of FIG. 97 is used in order to implement step 542 of FIG. 88 in order to perform step 523 of FIG. 87 without adding additional cuts. At step 660, vias are identified by intersecting Cut shape, TopValid shape, and BotValid shape together. The resulting shape (TheseCuts) are all cuts in the standard cell, or design portion being analyzed. At step 661, the top coverings are grown by first growing the shape TheseCuts by BestTopOLCut, and intersecting the result with TopValid to create an intersected shape. The intersected shape is then unioned with the top shape and the result assigned as a new top shape. BestTopOLCut is a technology-dependent value that specifies the largest top overlap that will be added in this method. The new top shape will contain covered vias where allowed. Note, that while not necessary, there is an assumption that at least one via was less than fully covered to begin with. Otherwise, the step 661 has no effect. Step 662 adds landings in the same manner as step 661 added coverings. In step 663, any notch violations introduced are rectified.

By now it should be apparent the present invention allows for increased reliability of semiconductor devices without additional space being required. This is accomplished by automatically identifying and using available space in a standard cell layout, or other design portion, to provide duplicate and covered vias.

L. Automatic Tie Placement

In the construction of an integrated circuit, the designer must compensate for operational difficulties that may arise for the particular construction of the integrated circuit. Typical operational difficulties include excessive current drain, substrate power up, localized heat generation beyond a limit, and other problems that are not apparent in the design of the integrated circuit but that are critical to the operation of the integrated circuit. These operational difficulties, of course, are affected by the physical design of the integrated circuit made from a logical design, the size of the integrated circuit, the process used to construct the integrated circuit, and the manner in which the integrated circuit is operated.

Figure 98:
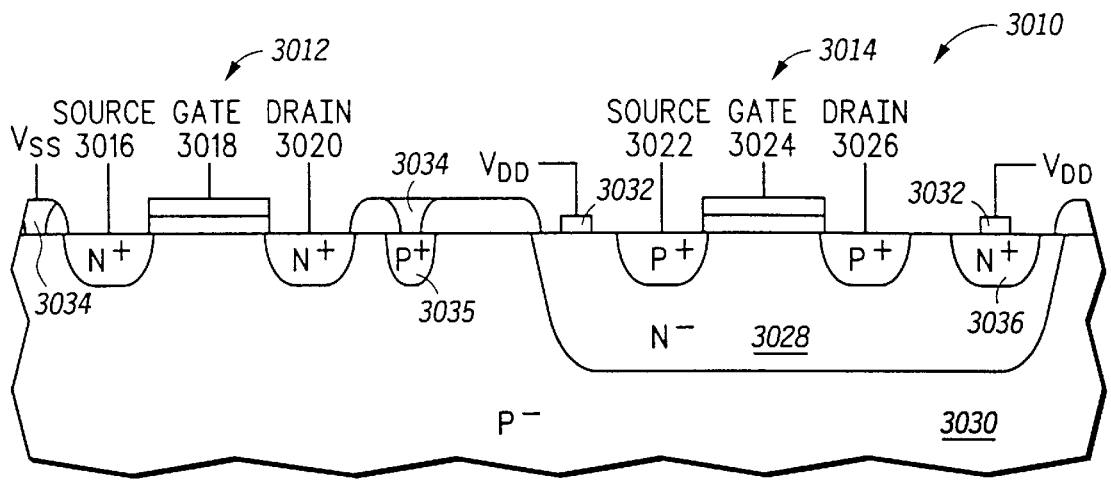
FIG. 98 is a cross sectional view of a CMOS transistor.

With particular reference to FIG. 98, a typical CMOS transistor 3010 may include N-channel transistors 3012 and P-channel transistors 3014. The transistors 3012 and 3014 are connected such that they implement particular logic functions or portions of logic functions within an integrated circuit. Each N-channel transistor 3012 includes a source 3016, a gate 3018, and a drain 3020 while each P-channel transistor also includes a source 3022, a gate 3024, and a drain 3026.

The N-channel transistor 3012 is turned on by applying a voltage exceeding a threshold voltage to the gate 3018. Once turned on, the N-channel transistor 3012 conducts from its source 3016 to its drain 3020. Alternatively, the P-channel transistor 3014 is turned on by applying a voltage lower than a threshold to its gate 3024. Once the transistor is turned on, the P-channel transistor also conducts from its source 3022 to its drain 3026.

As is shown, when a P-type substrate 3030 is used as the base for the integrated circuit, each P-channel transistor 3014 is constructed within an N-type well 3028 formed in the P-type substrate 3030. The use of an N-type well 3028 is required to prevent a direct short between the source 3022 and substrate. Silicon controlled rectifier ("SCR") latch-up occurs when a forward bias exists at the substrate/well junction. Upon SCR latch-up, the integrated circuit ceases to function properly and consumes large quantities of power. To prevent SCR latch-up between the P-type material of drain 3026, the N-type material of the well 3028, and the P-type material of the substrate 3030, the N-well 3028 is tied to a first voltage reference level or VDD. In this fashion, SCR latch-up is prevented by fixing the potential of the N-type well 3028 at the first reference voltage $V_{DD}$.

Fixing the well 3028 at the first reference voltage $V_{DD}$ also guarantees that the threshold gate voltage that must be applied to the gate 3024 to turn the P-channel transistor 3014 on will remain constant during operation of the integrated circuit. Because the relative voltage differential between the gate 3024 and the N-well 3028 determines whether, and how rapidly, the inversion layer between the source 3022 and the drain 3026 will invert, the voltage differential must be controllable. The application of a voltage to the source 3022 or the drain 3026 affects the potential of the N-well 3028. Thus well ties 3032 along the N-type well 3028 also serve to fix the voltage of the N-well 3028 and ensure that the gate voltage threshold will remain constant. As shown, well ties 3032 may be made directly between the source $V_{DD}$ and the N-well 3028 or may be made between the source $V_{DD}$ and a more highly doped region 3036 within the N-well structure.

With the N-channel transistor 3012 as well, a voltage applied to the source 3016 or drain 3020 may alter the voltage of the substrate 3030. In such a situation, if the voltage of the substrate 3030 is not fixed, the gate threshold voltage required to turn on the N-channel transistor 3012 through its application to the gate 3018 will vary. Thus, substrate ties 3034 are commonly used to fix the voltage potential of the substrate 3030 at a reference potential $V_{SS}$. As shown, the substrate ties may be made directly to the substrate 3030 or may be made to a more highly doped portion of the substrate 3035.

The placement of ties within integrated circuits has typically been left up to the circuit designer who generates the physical design of the integrated circuit. Thus, the application of ties has been inconsistent and iterative alterations in their placement between the production of mask sets are sometimes required to enable a correct operation of the integrated circuit. Even when the placement of ties does not cause operational difficulties which must be fixed at a later time, the application or placement of ties within an integrated circuit has been a tedious and difficult process because of the various design rules that influence tie placement. The integrated circuit will have smaller dimensions when the ties are properly placed because properly placed ties allow for more efficient compaction.

Thus, there exists a need in the art for a method and apparatus for the automatic placement of ties and connection elements within integrated circuits based upon design rules.

This section relates to automatically placing ties within an integrated circuit. The method commences with the receipt of integrated circuit dimensions, element dimensions, and element locations within the integrated circuit. In this fashion, a partial physical description of the integrated circuit is received. Next, the method receives placement rules for the placement of ties within the integrated circuit. The method then processes the integrated circuit dimensions, the element locations, the element dimensions, and the placement rules to place a tie or connection element within the integrated circuit. Based upon the processing, the ties and connection elements are placed at optimum locations within particular regions of the integrated circuit. The placement of the ties and connection elements then complies with placement rules across the integrated circuit, while minimizing their impact on integrated circuit dimensions. In this fashion, the method described in this section relieves an integrated circuit designer from the tedious and monotonous task of hand placing ties within an integrated circuit, while ensuring a highly efficient tie arrangement.

Figure 99:
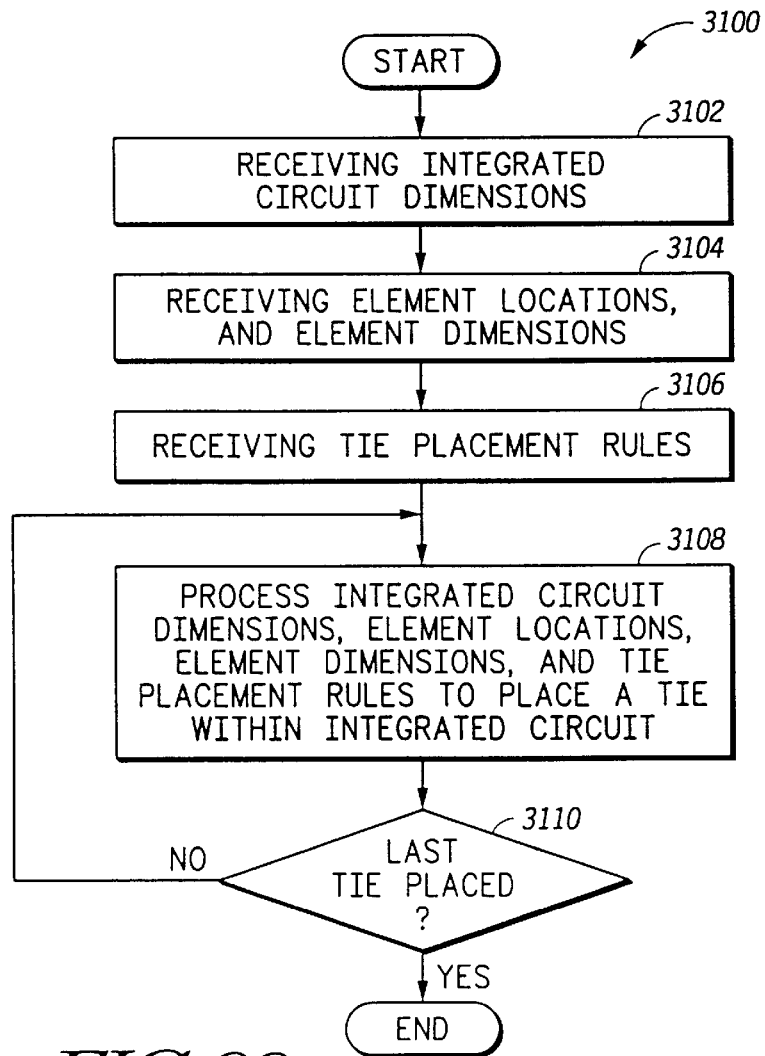
FIG. 99 is a flowchart that illustrates tie placement within an integrated circuit in accordance with one embodiment of the invention.

FIG. 99 illustrates a method 3100 for placing ties within an integrated circuit. The method commences at a first step 3102 of receiving integrated circuit dimensions. The integrated circuit dimensions preferably relate the outer dimensions of the integrated circuit as well as particular placement of wells, supply rails, and other major elements within the integrated circuit. These particular integrated circuit dimensions preferably are derived during a design step in an integrated circuit design process. Thus, these dimensions do not relate final dimensions of the integrated circuit but are intermediate computer aided design (CAD) dimensions established for the purpose of constructing a physical design of the integrated circuit.

Next, the method 3100 includes the step of receiving element dimensions and element locations within the integrated circuit 3104. Preferably, the elements include transistors, resistors, capacitors, diodes, connections between elements, and elements that are required to cause the integrated circuit to properly function. Preferably, element dimensions establish outer boundaries of respective elements as well as the various intra-element boundaries associated with the element, such as drain boundaries, gate boundaries, and source boundaries. Preferably, the element dimensions include at least two dimensions, height and width, but may also include preferred depth of element portions. Preferably, the particular element dimensions are derived during a design step and do not relate final dimensions of the elements within a manufactured integrated circuit. Based upon the element locations and dimensions, relative locations between the elements may also be determined. With the receipt of the integrated circuit dimensions in step 3102 and the element locations and element dimensions in step 3104, a basic physical layout of the integrated circuit is established.

Next, at step 3106, the method 3100 includes receiving tie placement rules. Tie placement rules typically relate maximum distances between particular elements, or portions of elements, and ties within the integrated circuit based upon design rules. The ties may include either substrate ties or well ties depending upon the portion of the integrated circuit under consideration. As illustrated FIG. 98, a well tie comprises a connection between a first reference voltage $V_{DD}$ and a well within the integrated circuit while a substrate tie comprises a connection between a second reference voltage $V_{SS}$ and the substrate of the integrated circuit. Tie placement rules, when adhered to, guarantee that gate threshold voltage limits will not be violated and that the integrated circuit will not suffer from SCR latch-up.

In a preferred form of the present invention, three separate tie placement rules are adhered to. The first tie placement rule is called "tie spacing," that is a maximum distance between adjacent ties within the integrated circuit. In the case of an integrated circuit including both P-channel and N-channel transistors, two differing tie spacings must be considered. A first tie spacing is a maximum distance between well ties while a second tie spacing is a maximum distance between substrate ties. Tie spacing typically relates to a horizontal distance across the integrated circuit. In a typical integrated circuit, cells are arranged in rows across the substrate surface, each of the cells performing a particular logical function and interconnected with other cells. Power and ground rails define upper and lower boundaries of the rows of cells and provide power and ground to the cells. In a preferred form of the invention, tie spacing is a maximum distance in a direction parallel to the rows of cells.

The second preferred tie placement rule is called "well edge spacing" which relates a maximum spacing distance between an edge of a well and a well tie. Preferably, well edge spacing is measured in a direction perpendicular to the rows of cells within an integrated circuit. Thus, in a preferred form of the present invention, tie spacing and well edge spacing are rules that apply perpendicularly to one another.

The third preferred tie placement rule is called "Diffusion spacing." Diffusion spacing is a maximum distance between active Diffusion and a tie taken in any direction across the integrated circuit surface. Thus, the Diffusion spacing rule must be satisfied in two dimensions across the integrated circuit.

Tie spacing, well edge spacing, and Diffusion spacing are typically fixed for the integrated circuit. However, spacing between ties will vary depending upon which of these rules is most stringent for a particular location on the integrated circuit. Determining which rule is most stringent for a particular location within the integrated circuit depends upon elements proximate to the specific location. For example, transistor sizes near a tie will determine a maximum distance between a tie and a subsequent tie, according to the Diffusion spacing rule. Thus, spacing between ties must be determined for the placement of each particular tie within the integrated circuit to optimize tie placement and minimize the number of ties required to satisfy tie placement rules. In addition to these three tie placement rules, every tie must be placed at or beyond a minimum distance from adjacent elements so that the integrated circuit may be manufactured. In other words, the normal CAD design rules for the integrated circuit must also be satisfied.

From step 3106 the method proceeds to step 3108 which processes the integrated circuit dimensions, the element locations, the element dimensions, and the tie placement rules to place a tie within the integrated circuit. Preferably, this step includes considering a present location of interest within the integrated circuit where a last tie has been placed and selecting a new tie placement location. Thus, with the tie placement rules received in step 3106, step 3108 includes processing the tie placement rules to determine maximum distances to the new tie placement location.

From step 3108 the method proceeds to decision step 3110 which determines whether a last tie has been placed within the integrated circuit. If at step 3110 a last tie has not been placed, the method proceeds again to step 3108 wherein another tie within the integrated circuit is placed. However, if at step 3110 it is determined that the last tie has been placed, the method ends. Preferably, many ties are placed within an integrated circuit to guarantee the proper operation of the integrated circuit. Thus, step 3108 will be executed numerous times in order to place all of the ties within the integrated circuit.

The method 3100 described in this section may be used to place ties within any integrated circuit or in any portion of an integrated circuit. In one application, the method 3100 may be used to place ties within the cells of a standard cell library, wherein the cells of the standard cell library are used over and over to create an overall integrated circuit design. In other applications, the method 3100 may be used to establish ties across a complete integrated circuit or a module of the integrated circuit that does not use the standard cell design approach.

Therefore, the method 3100 described in this section automatically places ties within an integrated circuit with such placement conforming to the complicated tie placement rules. In this fashion, compliance with tie placement rules is certain and errors and inefficiencies that were previously introduced by the designer are eliminated. Thus, the method 3100 not only reduces time and cost in the placement of ties within the integrated circuit design, it reduces costs associated with fixing problems in designs that only became evident after the integrated circuit was fabricated and tested.

Figure 100:
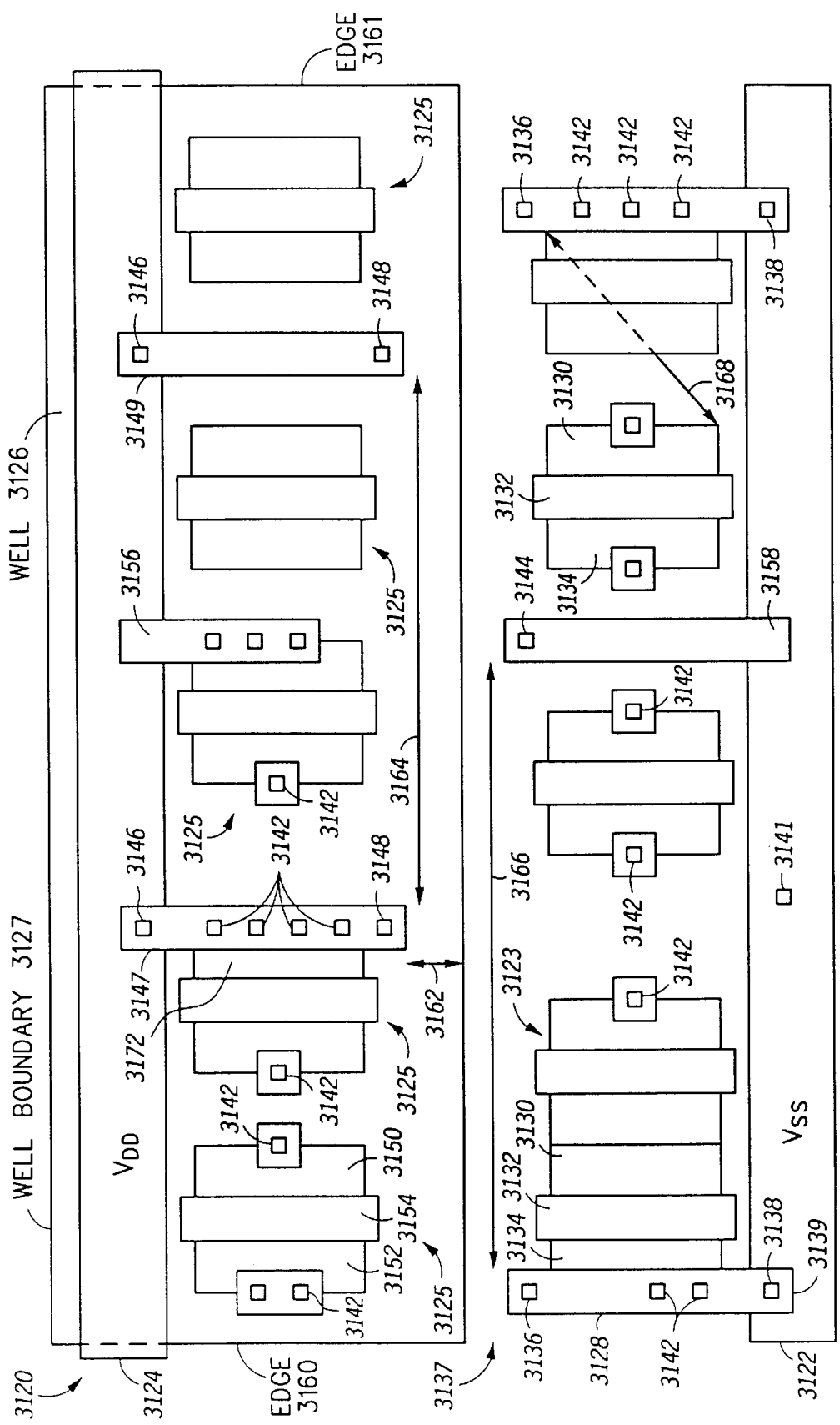
FIG. 100 illustrates a portion of an integrated circuit that has had its ties placed in accordance with the method of FIG. 99.

FIG. 100 illustrates a portion of an integrated circuit 3120 that has had its ties placed in accordance with the method 3100 of FIG. 99. The integrated circuit 3120 includes a ground rail 3122 fixed at a first reference voltage $V_{SS}$ and a power rail 3124 fixed at a second reference voltage $V_{DD}$. The power rail 3124 resides in proximity to a plurality of P-channel transistors 3125 disposed in a row across the integrated circuit 3120. Each P-channel transistor 3125 includes a source 3150, a drain 3152, and a gate 3154. The P-channel transistors 3125 are formed within a well 3126 defined by a well boundary 3127. As previously illustrated in accordance with FIG. 98, the well 3126 is doped N-type while the substrate comprising the integrated circuit 3120 is a P-type substrate. Therefore, each of the P-channel transistors 3125 is formed in a portion of the well 3126.

The integrated circuit 3120 also includes a plurality of N-channel transistors 3123, each including a drain 3130, a source 3134, and a gate 3132. The N-channel transistors 3123 are disposed in a row across integrated circuit 3120 and formed within the P-type substrate of the integrated circuit. Of course, the N-channel transistors 3123 could be formed in a differently doped surface portion of the substrate.

The integrated circuit 3120 illustrated in FIG. 100 is a portion of two rows of transistors within a larger integrated circuit. Preferably, the integrated circuit 3120 includes hundreds of rows, each having a width hundreds of times as wide as the portion shown in FIG. 100. The portion shown in FIG. 100 may represent a cell within the integrated circuit 3120 that is interconnected with various other cells to accomplish the goals of the integrated circuit 3120. Tie placement rules apply to all portions of the integrated circuit and therefore apply to each cell within the integrated circuit. In accordance with one application of the present invention, ties are placed within each cell of a standard cell library such that when the cells of the standard cell library are used together, the tie placement rules are satisfied across the integrated circuit as a whole. Thus, the integrated circuit 3120 portion illustrated in FIG. 100 is used simply to demonstrate the teachings of the present invention, with the teachings applicable to various other integrated circuits as well.

The integrated circuit portion 3120 is defined by a first vertical edge 3160 and a second vertical edge 3161 as well as the power rail 3124 and the ground rail 3122. In accordance with the present invention, the method 3100 of placing ties in accordance with FIG. 99 commences at a left edge 3160 of the integrated circuit and proceeds toward a right edge 3161 of the integrated circuit. The left edge 3160 of the row containing the P-channel transistors 3125 is a first reference location from which is determined where a subsequent well tie must be placed. If the edge 3160 represents an outer edge of the complete integrated circuit 3120, a particular well tie spacing will be required. However, if the edge 3160 represents an edge of a cell that abuts an edge of another cell, it is assumed that a well tie resides within a certain distance of the edge 3160. Thus, the tie placement rules, when applied, may produce differing well tie spacing requirements from the edge 3160 for the different cases.

Based upon the tie placement rules, a distance from the edge 3160 to a next well tie must be less than a maximum spacing distance. This distance is based upon the elements proximate to the edge 3160, the particular design rules for the integrated circuit, standard circuit design rules, substrate characteristics, well characteristics, as well as various other characteristics and rules. A well tie 3146 or 3148 is then placed within the determined distance from the edge 3160.

As illustrated, ties 3146 and 3148 differ from contacts to transistors 3142 in that they physically connect the second reference voltage 3124 to the well 3126. A conductive structure 3147 ties the second reference voltage $V_{DD}$ to both a well tie 3146 underneath the power rail 3124 and a well tie 3148 near an edge of the well 3126. When a well tie 3148 near the well 3126 edge is not required to satisfy tie placement rules, a well tie 3146 may simply be made below the power rail 3124 to the well 3126 without extending the conductive structure 3147. The conductive structure 3147 illustrated also couples the power rail 3124, biased at $V_{DD}$, to a source 3172 of the associated P-channel transistor 3125. Thus, the conductive structure 3147 serves to both power the source 3172 of the P-channel transistor 3125 and to provide a well tie 3148 connection.

A well edge spacing rule is illustrated by distance 3162. Well edge spacing represents a maximum spacing distance between an edge of the well 3126 and a tie 3148 or between an edge of the well 3126 and a tie 3146. Because the substrate is tied to the ground rail 3122 at $V_{SS}$, well ties 3148 must be placed no greater than the well edge spacing 3162 from a well edge to prevent the voltage of the well from drifting toward the voltage of the substrate. In a preferred method of the present invention, the well edge spacing is measured in a distance perpendicular to the row of transistors within the integrated circuit 3120. Thus, the well tie 3148 satisfies the well edge spacing 3162. Well ties 3146 may simply be placed under the power rail 3122 as required without requiring a separate conductive structure such as conductive structure 3147. The well tie 3146 is simply a conductive contact between the power rail 3124 and the well 3126 of the integrated circuit 3120.

Tie spacing between well ties in a direction parallel to the row of transistors in the integrated circuit 3120 portion is represented by distance 3164. The tie spacing rule is satisfied by the two well ties 3148 illustrated that reside near the channel region 3137. It is important to note that the channel region 3137 should not be confused with the channel region of a gated transistor. The channel region 3137, as used herein, is the separation region between the P-channel transistor region and the N-channel transistor region and is not a gated region of a transistor. The rule is also satisfied by the particular spacing between well ties 3146 under the rail 3124. As illustrated, the conductive structure 3149 that provides the second well tie 3148 near the well 3126 edge is deposed within a Diffusion break and does not provide a voltage $V_{DD}$ to a P-channel transistor 3125 source 3150 as did the prior conductive structure 3147. No transistors reside within the Diffusion break. In some cases, such as the conductive structure 3147 illustrated, the placement of a well tie near a P-channel transistor 3125 does not affect the location of the transistor 3125. However, in other cases, the placement of a well tie 3148 near a transistor affects the placement of connections between P-channel transistors 3125. The placement of well ties within a Diffusion gap further provides the benefit of allowing for a greater compaction density during a compaction step that is preferably performed after the method described in this section.

Substrate ties 3138 and 3144 are placed within the row of N-channel transistors 3123 to satisfy the tie placement rules. Substrate tie 3136 near the channel region 3137 is located substantially midway between the power rail 3124 and the ground rail 3122 while substrate tie 3138 is located under the ground rail 3122. Both of the substrate ties 3136 and 3138 connect to conductive structure 3128 which is connected to the ground rail 3122 at voltage $V_{SS}$ and to the source 3134 of N-channel transistor 3123 at connections 3142. In this fashion, the conductive structure 3128 performs the dual purpose of connecting to the substrate ties 3136 and 3138 as well as connecting to the transistor source 3134.

Substrate ties may simply be placed under the power rail 3122 as required without requiring a separate conductive structure such as substrate tie 3141. When placed under the power rail 3122, the substrate tie does not hinder subsequent compaction of the integrated circuit as it could if it were in the channel region 3137. Substrate tie 3141 is simply a conductive contact between the ground rail 3122 and the substrate of the integrated circuit 3120. The contact 3141 may be contacted to an underlying heavily doped P-region and may be filled with a tungsten plug, polysilicon, aluminum, titanium nitride, silicide, or another known via conductive material or conductive composite. A particular substrate tie spacing distance 3166 shows a maximum distance between substrate ties 3136 and 3144 parallel to the row of N-channel transistors 3123.

A Diffusion spacing 3168 is illustrated as a maximum distance in any direction between active Diffusion within the transistor and a substrate tie 3136. As illustrated, an extreme edge of a Diffusion region of an N-channel transistor 3123 must be within the Diffusion spacing distance 3168 from the nearest substrate tie 3136. As illustrated, a Diffusion region may be either a drain 3130 or a source 3134 of an N-channel transistor 3123. Alternatively, a Diffusion is also either a drain 3152 or a source 3150 of a P-channel transistor 3125 formed within the well 3126. Thus, the Diffusion spacing rule applies to the P-channel transistors 3125 as well as the N-channel 3123 transistors. Because the Diffusion spacing distance 3168 considers the distance between any Diffusion point on the integrated circuit 3120 and a respective well or substrate tie, the Diffusion spacing rule applies in two dimensions unlike the tie spacing rule and the well edge spacing rule that apply only in single dimensions.

Thus, ties have been placed within the integrated circuit 3120 of FIG. 100 in accordance with the method 3100 of the present invention. The ties 3136, 3138, 3146, and 3148 were placed in accordance with the tie placement rules to prevent SCR latch up and gate threshold voltage variances.

Figure 101:
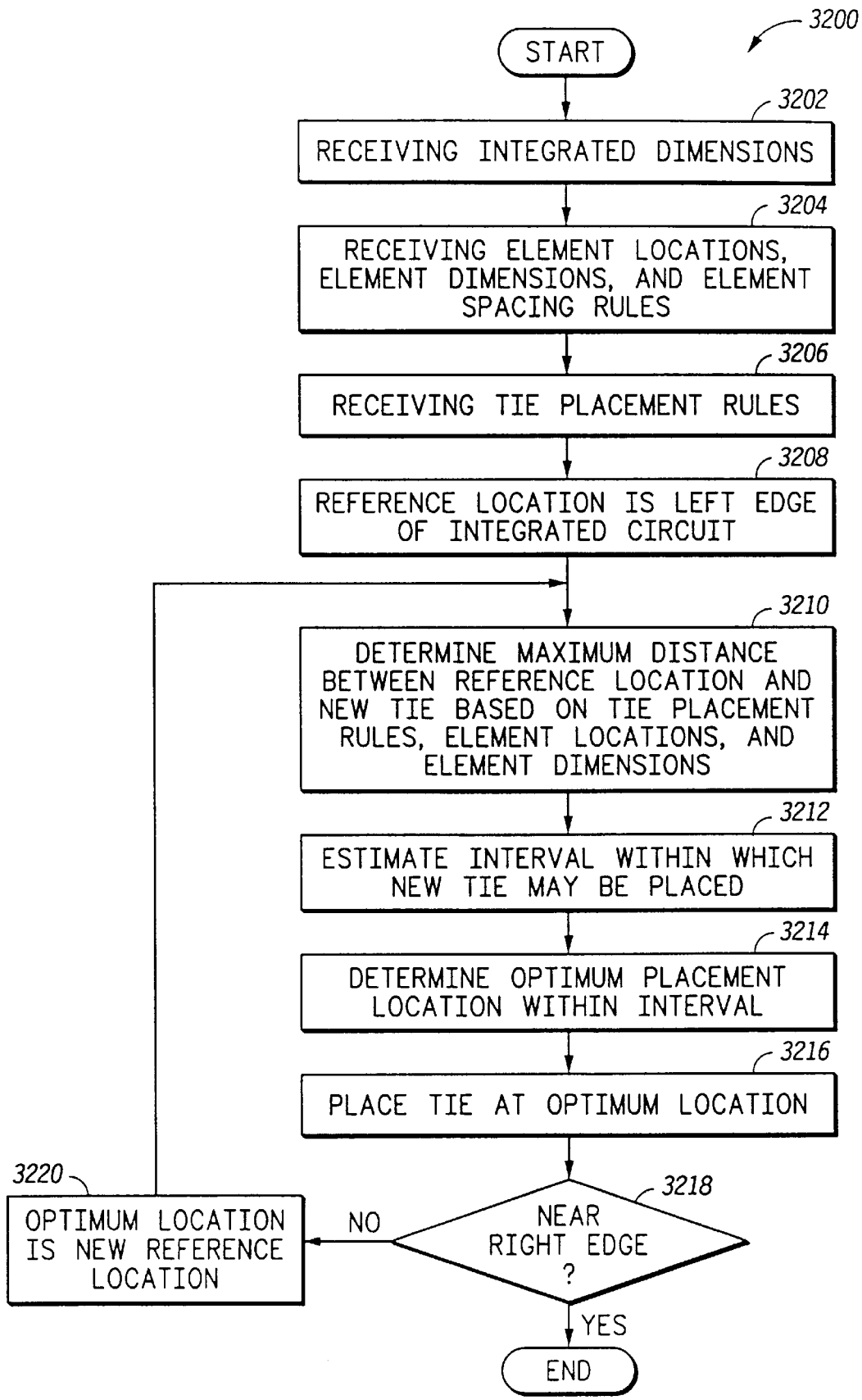
FIG. 101 is a flowchart that illustrates an alternative method for automatically placing ties within an integrated circuit.

FIG. 101 illustrates an alternative method 3200 for automatically placing ties within an integrated circuit. The method 3200 commences at step 3202 of receiving the dimensions of an integrated circuit. As with the method 3100 of FIG. 99, method step 3202 preferably includes receiving integrated circuit dimensions that represent fully the outer boundaries of the integrated circuit as well as the important dimensions within the integrated circuit. Next, at step 3204, the method includes receiving element locations, element dimensions, and element spacing rules. In this fashion, the combination of steps 3202 and 3204 provides a partial physical description of the integrated circuit. Prior to the execution of the method 3200 described in this section, elements have been placed within the integrated circuit. Preferably, the method 3200 is performed prior to routing of connections within the integrated circuit. However, the method 3200 could also be performed after some signal routing has been completed. After the method 3200 has been completed, a compaction step is performed to establish the final locations of the elements within the integrated circuit. Such compaction is performed to minimize the integrated circuit dimensions in accordance with integrated circuit design rules.

Next, at step 3206, the method 3200 includes receiving tie placement rules. As was previously described, tie placement rules preferably include tie spacing, well edge spacing, and Diffusion spacing. These spacings represent boundary conditions for the placement of ties within the integrated circuit. Further, as was previously described, the tie placement rules may be static or they may be dynamic based upon the particular elements in consideration within the integrated circuit and the particular locations under consideration with the integrated circuit. Therefore, the tie placement rules will vary from integrated circuit and from location to location within the integrated circuit based upon the integrated circuit design, the process used for manufacture, the operational voltage of the integrated circuit, and other factors affecting the operation of the integrated circuit.

Next, at step 3208, the method includes establishing as a reference location the left edge of the integrated circuit. As was described in reference to the integrated circuit 3120 of FIG. 100, a left edge 3160 of the integrated circuit may be an edge of the overall integrated circuit or may simply be an edge of a cell within an integrated circuit library.

Next, at step 3210, the method includes determining a maximum distance between the reference location and a new tie to be placed based upon tie placement rules, element locations, and element dimensions. As was previously discussed, the maximum distance will be based upon a tie spacing, a well edge spacing, and a Diffusion spacing that are calculated for the particular reference location. For example, with the reference location located at an edge of a cell that will be placed adjacent to other cells, it is presumed that a tie has been placed in an adjacent cell. In this fashion, the maximum distance from the cell edge within which to place a tie will be approximately one-half of the overall maximum spacing distance. Thus, with a one-half spacing distance in each of two adjacent cells, the distance between nearest ties in adjacent cells satisfies the maximum distance.

Next, at step 3212, the method 3200 includes estimating an interval within which a new tie may be placed. This interval is based upon the maximum distance, the element locations, the element dimensions, element spacing rules, and preferably an estimated compaction density that will be obtained during a subsequent compaction step.

Figure 102:
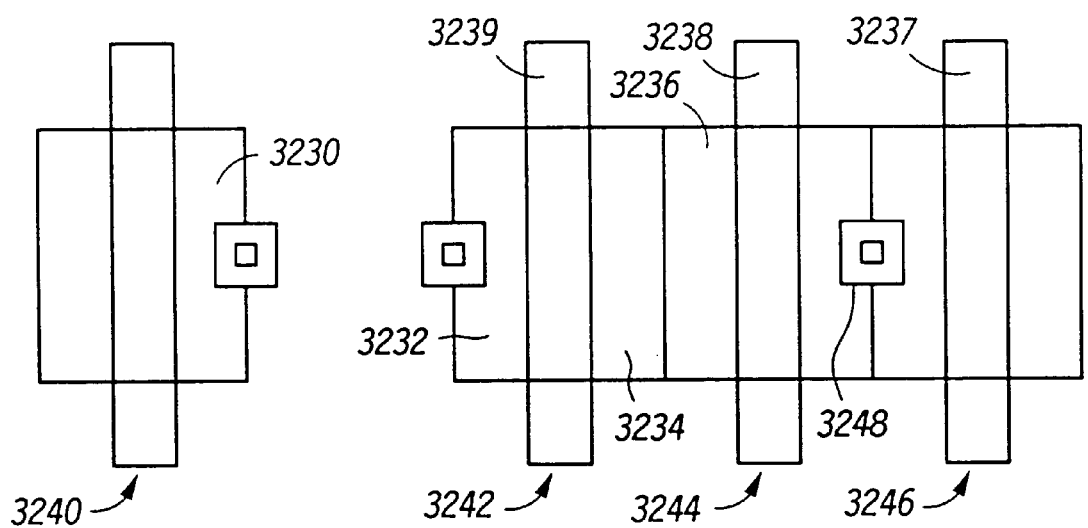
FIG. 102 illustrates examples of several possible spacing rules in accordance with the method of FIG. 99.

Element spacing rules relate to the minimum required spacing between adjacent elements. FIG. 102 illustrates examples of several possible spacing rules. In the case of adjacent transistors that are not connected to each other, such as transistors 3240 and 3242, there must be sufficient space between the source 3230 of the first transistor 3240 and the drain 3232 of the adjacent transistor 3242 so that conduction will not occur between source 3230 and drain 3232. Such spacing must account not only for the properties of the material separating the elements but also the expected variations of the manufacturing process employed. The space between adjacent but unconnected transistors 3240 and 3242 is known as a Diffusion break because the material separating the transistors has not been altered by Diffusion.

In the case of adjacent transistors having Diffusion portions that are connected to one other but to no other point in the circuit, a different spacing rule applies. In this situation, connected transistors 3242 and 3244 having no external connections must have sufficient spacing between their respective gates 3239 and 3238 so that conduction will not occur from gate 3238 to gate 3239. In operation, gates 3238 and 3239 may be driven to differing voltages wherein one of the transistors is turned on and one is turned off. When in this state, there must be sufficient isolation between the gates 3238 and 3239 to prevent unwanted conduction or crosstalk. Thus, considering variations in manufacturing processes, sufficient spacing between gates 3238 and 3239 through Diffusion portions 3234 and 3236 must exist to prevent conduction between gates 3238 and 3239. A location at which adjacent transistors are connected to each other but to no other point in the circuit is known as a Diffusion with no contact location.

Finally, in the case of adjacent transistors 3244 and 3246 that have Diffusion portions connected to each other and to some other point in the circuit through an intervening Diffusion contact 3248, another element spacing rule applies. In this case, because the Diffusion portions contact a metal layer in the integrated circuit, sufficient spacing must be had between each of the respective gates 3238 and 3237 and the Diffusion contact 3248 to allow the transistors 3244 and 3246 to properly operate considering manufacturing process variations. Locations at which adjacent transistors connect to one another as well as to some other point in the circuit through an intervening Diffusion contact are known as contacted Diffusion points.

In a preferred embodiment of the method 3200, compaction will occur after the placement of the ties such that the elements within the integrated circuit are moved more closely together in at least the horizontal distance. Compaction must also consider the placement of connections and ties within the integrated circuit so that the integrated circuit may be manufactured. All compaction of elements must be implemented without violating element spacing rules and the spacing between connections, elements, and ties. Since the maximum tie spacing must only be complied with after compaction, the tie spacing intervals are adjusted based upon projected compaction densities. Within step 3212, an interval is determined by processing the element locations, the element dimensions, and the element spacing rules. First, the maximum tie spacing distance is scaled by a factor, preferably 120%, to account for less than optimum compaction. Element widths and minimum spacing distances between adjacent elements are successively summed for adjacent elements along the integrated circuit until the scaled maximum tie spacing distance is reached. This determines an outer boundary of the interval. An inner boundary of the interval is preferably set as the reference location. Thus, the interval within which the tie is to be placed is defined to accomplish step 3212.

Next, at step 3214, the method 3200 includes determining an optimum placement location within the interval. The optimum placement location is based upon element locations within the interval, the type of elements within the interval, any Diffusion break within the interval, and the number of routing connections required at various locations along the interval. Thus, the step of determining an optimum placement location with the interval is based at least partially upon the reference location. An optimum location within the interval is determined such that a maximum compaction may occur and so that the operation of elements and routing is minimally disturbed. Preferably, ties are placed in rail regions instead of channel regions so as to minimize disturbance of elements and eliminate routing obstacles. Of course, in some situations, depending upon the well edge spacing and Diffusion spacing rules, ties must be placed in channel regions as well.

Step 3214 considers a most distant Diffusion break within the interval from the reference location. As previously described, a Diffusion break is a location within the integrated circuit between elements that has retained substrate doping levels or that is a portion of the well that has not been doped subsequent to the formation of the well. Step 3214 also considers a most distant Diffusion to reference voltage connection within the interval from the reference location. Diffusion to reference voltage connections typically comprise either $V_{DD}$ to P-channel transistor source connections or $V_{SS}$ to N-channel source connections. Further, step 3214 considers a most distant Diffusion with no contact within the interval from the reference location. A Diffusion with no contact location typically is a drain to source connection between adjacent transistors connected in series without any other connection at the series connection point.

From step 3214 the method proceeds to step 3216 of placing a tie at the optimum location. This may include the placement of a well tie near a channel region, a well tie under a power rail, a substrate tie near the channel region, or a substrate tie under a ground rail. In any case, the placement of a tie in step 3214 satisfies the tie placement rules for all elements within the estimated interval assuming that the efficiency of compaction assumption, as reflected in the maximum distance scale factor, was correct.

From step 3216 the method proceeds to decision step 3218 where it is determined whether the tie placement location was near the right edge. If the tie placement location was within tie placement rules for a last tie to be placed in the integrated circuit cell, or integrated circuit, the method is complete. However, if at step 3218 the tie has not been placed near the right edge, the method proceeds to step 3220 of assigning the tie placement location as the new reference location. From step 3220 the method proceeds again to step 3210 such that another tie may be placed at an optimum location. Steps 3210 through 3220 are repeated until all ties within the integrated circuit have been placed.

Thus, the method 3200 illustrated in FIG. 101 places all ties within an integrated circuit such that they comply with tie spacing rules and are optimally placed. Such placement is done in a manner to minimally disrupt the operation and locations of elements within the integrated circuit and to most efficiently place the ties within the integrated circuit. The benefits of the method 3200 of FIG. 101 extend not only to a reduction in design time and cost for the integrated circuit designer input but also guarantee compliance with tie spacing rules.

M. Substrate and Well Tie Style Selection

Substrate and well ties are required in CMOS circuit layouts to prevent latch-up of devices (latch-up and ties are discussed in more detail in the section "L" titled: "Automatic Tie Placement"). Tie Types describe classes of locations at which well and substrate ties may be placed horizontally in a layout; for example, "under the rail" or "in the channel". Tie Styles are sets that contain zero or more Tie Types. The Tie Types selected must satisfy all tie-related design rules based on the desired technology. Selection of Tie Styles is very important in automatic layout synthesis, where compaction, placement, and routing are critical synthesis steps.

This section addresses the automatic selection of substrate and well tie styles for latch-up protection in the context of automatic synthesis of CMOS semi-custom, full-custom, and/or standard-cell layouts. An initial minimal Tie Style is selected to begin synthesis. If a design rule correct cell cannot be produced with this Tie Style, a different Tie Style is selected and synthesis is performed again. Efficient estimates are made for the placement of ties within each Tie Style, such that routing can be completed without adversely impacting the area of the layout and no human intervention is required. This procedure is essential to fully automate the cell layout synthesis process and to produce design rule correct layouts, without adversely impacting cell layout densities.

Figure 103:
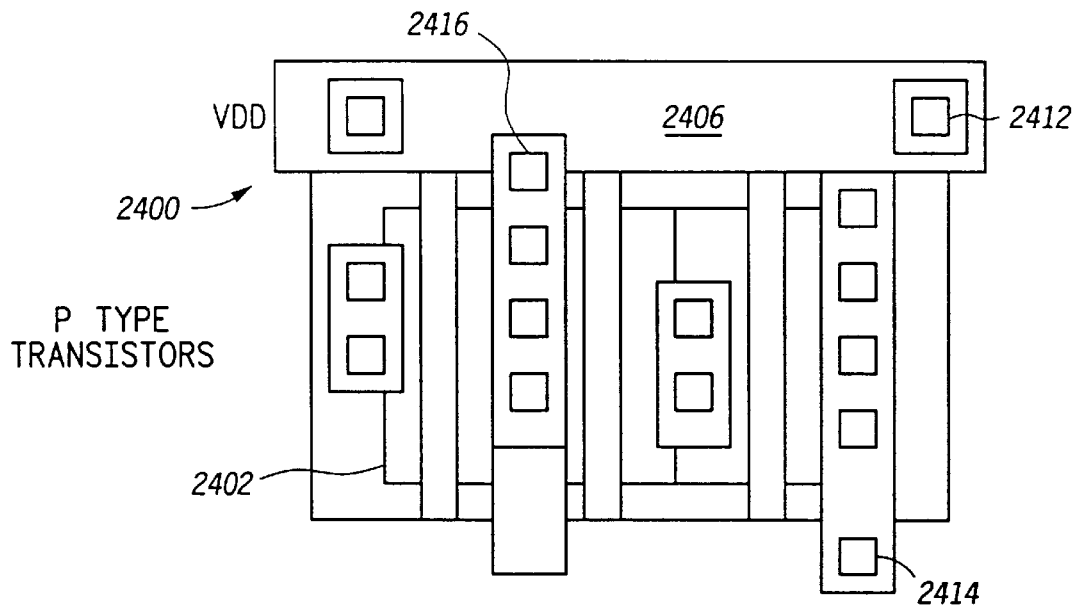
FIG. 103 is a diagram showing a sample standard cell layout with different Substrate and Well Tie Styles.
Figure 103:
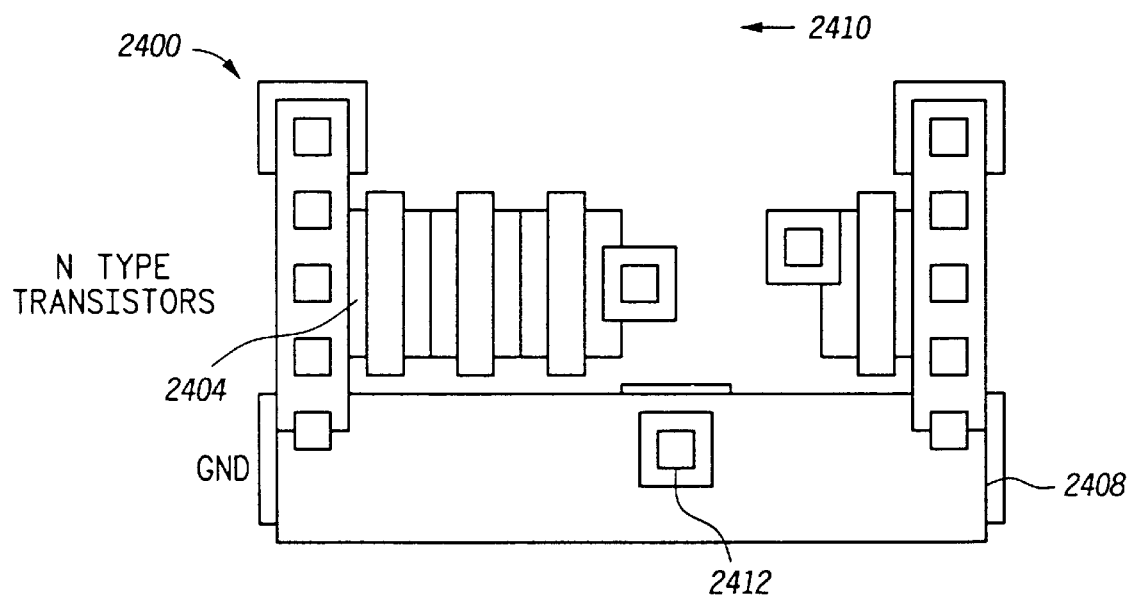

FIG. 103 is a diagram illustrating the standard cell layout shown at the mask level. The layout shows a standard cell 2400 which has only placed components - routing has not been completed yet. The circuit consists of P-channel transistors 2402, and N-channel transistors 2404. There are two supply rails: Power ($V_{DD}$) 2406, and Ground (GND) 2408. Between the P-channel transistors 2402 and N-channel transistors 2404 is a channel 2410. Also shown are three Tie Types. The Tie Types are shown located on the two supply rails ("Rail Ties") 2412, located in the channel between the P-channel and N-channel areas ("Channel Ties") 2414, and located between the transistors and rails ("Away Channel Ties") 2416. Typically well and substrate ties have been placed on the supply rails 2412. More recently, design rules for ties have required that they be placed in the channel between the P-channel and N-channel transistors 2414, and between transistors and their corresponding rails 2416. However, most automatic tools today allow placement only of the Rail Ties 2412. Those tools which also allow the other two types of ties 2414, 2416 require that one Tie Style be decided beforehand and used throughout the synthesis process. Once the Tie Style has been determined or specified, the tie placement methodology disclosed in section "L" titled: "Automatic Tie Placement" above can be utilized to place the ties in the horizontal dimension.

Explicitly specifying a single Tie Style may unnecessarily increase the area of the layout. Additionally, the guess as to the optimal Tie Style may be insufficient and the result is a design that does not conform to design rules. Indeed, experiments prove that some tie styles generated smaller layouts at the expense of producing more design rule incorrect layouts (see Table T-1 below). It should also be noted that using the "Channel Ties" Tie Type produced layouts whose total area was substantially larger than the cell layout area produced by using the "Automatic" Tie Style.

It is critical to determine an optimal Tie Style for each cell in a standard cell library; where the optimal Tie Style produces a layout with the smallest area and is design rule correct. Typically one Tie Style will not be the optimal Tie Style for every cell in a standard cell library. The method of selecting Tie Styles must also guarantee that all cells generated in a library are design rule correct. Finally, it is important to begin the search for optimal Tie Style of a given cell with a most non-intrusive Tie Style selection. The most non-intrusive Tie Style selection is the Tie Style which has the least impact upon the routing and compaction stages of layout synthesis.

FIG. 104 is a flowchart illustrating the operational flow for the method of automatically choosing the Tie Style for a given cell. It begins by receiving tie parameters and transistor placement details, step 2420. In the system shown in FIG. 4, these are provided by the preceding flow elements or steps. Next, the order of Tie Styles to be selected is defined and the first Tie Style is selected, step 2422.

FIG. 105 depicts the Tie Style selection matrix used in the preferred embodiment. Eight different combinations are shown in the table. These define the eight combinations of the three supported locations where ties may be placed in the horizontal dimension. The three supported locations for ties 2412, 2414, 2416 are shown in FIG. 103. The eight combinations are ordered such that Tie Styles which are least intrusive upon routing and have better density are given priority. However, Tie Styles with higher priority are often less likely to be design rule correct. It follows that Tie Styles which are more intrusive upon routing and have worse density, have a better chance at satisfying the design rules. In step 2422, Tie Style selection is initialized with no ties being placed at this point. This is the least intrusive selection that usually results in the best density and therefore smallest layout area, but is also the least likely selection to result in a design rule correct layout.

Returning to FIG. 104, ties are placed according to the Tie Style selection, step 2424. This step is discussed in more detail in the previous Tie Placement section above. This is followed by Routing and Compaction, step 2426. These steps are also described elsewhere in this invention.

After Routing and Compaction, step 2426 a test is performed to determine whether the tie coverage rules have been satisfied step 2428. If the tie coverage rules have been satisfied, and the cell meets the target height for the library, step 2428, then the tie style selection process is done. Otherwise, contacts and ties are added where possible, step 2430 without causing design rule violations to other layout elements. This step is designed to enhance Tie Coverage. The operation of this step is detailed in section "J" titled: "Tie Filling" herein. A test is then made to determine whether the Tie Coverage Rules are now satisfied, step 2432. If the cell layout is now design rule correct as to Tie Placement, the Tie Style selection process is now complete.

Otherwise, the next Tie Style is selected, step 2434 and the operation continues at step 2404. The next Tie Style is selected based upon the linear order defined in the table shown in FIG. 105.

Should all tie styles 2440 be exhausted before tie coverage rules have been satisfied, steps 2428, and 2432, the Tie Parameters or Transistors Placement Parameters from step 2420 must be modified. This invariably is a result of over-aggressive transistor and port placement.

One advantage of this methodology is that the amount of area allocated to ties can be minimized while guaranteeing maximal tie coverage. This is done in part by giving priority to the Tie Style which results in the best density. In the preferred embodiment, this best density is achieved when no space is allocated for Rail Ties 2412, Channel Ties 2414, nor ties between transistors and rail ("Away Channel Ties") 2416. Even though this Tie Style selection may result in a layout that violates the tie coverage rules, a design rule correct layout may still be generated in step 2430 by adding contacts and ties after Layout Compaction step 2426, where possible, without increasing the cell layout area nor introducing design rule violations. If the operation of step 2430 satisfies the tie coverage rules in step 2432, a more intrusive Tie Style need not be selected.

Table T-1 below contains sample results using various tie styles on a standard cell library consisting of twenty-five cells.

TABLE T-1

| Tie Style | Cell Area | DRC Check | |
| --- | --- | --- | --- |
| | | Fail | Pass |
| No Ties | 398850 | 22 | 3 |
| Rail Ties | 456622 | 19 | 6 |
| Channel Ties | 486197 | 3 | 22 |
| Auto Ties | 476579 | 0 | 25 |

First, note that the first three Tie Styles generated cells which were not design rule correct. This has significant negative yield implications. There is a tradeoff between area and design rule correctness. Secondly, it was possible to generate a design rule correct layout in the case of three cells without allocating initial space for ties due to step 2430. Any space allocated to these three cells during the Tie Placement step 2440 would have produced a layout which was larger than necessary. This corresponds to the first Tie Style selection "No Ties" in table 2440 in FIG. 105. The "Automatic" Tie Style was the only tie style selection capable of generating all cells in the library without any design rule violations.

The above described preferred embodiment is used to automatically generate cell layouts in minimal area, while adhering to design rules set forth by the technology.

IV. Conclusion

The automatic synthesis of standard cell layouts disclosed herein can generate standard cell libraries comparable to, and in many cases superior to hand-crafted standard cell libraries in size, in a fraction of the time. The cells in libraries generated by this methodology are often half or less of the size of cells generated using prior art automated methods. Though shown in the context of standard cell layout generation, many of the techniques and methods disclosed herein are applicable to other forms of layout.

Those skilled in the art will recognize that modifications and variations can be made without departing from the spirit of the invention. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

We claim:

1. A method of synthesizing a layout of a circuit from a logical netlist and a set of constraints, said method comprising the steps of:
a) deriving a plurality of physical netlists from the logical netlist;
b) following step (a) enumerating an ordered sequence of physical netlists from the plurality of physical netlists, wherein the ordered sequence of physical netlists is determined by an estimated physical dimension of the cell layout;
c) following step (b), selecting a first netlist from the ordered sequence of physical netlists as a selected physical netlist;
d) placing a plurality of layout elements according to the selected physical netlist and the set of constraints,
e) routing the plurality of layout elements to implement a plurality of interconnections specified by the logical netlist,
f) testing for a termination condition, and
g) if the termination condition in step f) was not met, selecting a next netlist from the ordered sequence of physical netlists as the selected physical netlist and repeating steps d) through g).

2. The method of claim 1 which further comprises:
h) compacting the plurality of layout elements according to the set of constraints.

3. The method of claim 2 wherein step h) comprises the following substeps:
1) compacting the plurality of layout elements preferentially in a vertical dimension,
2) if a height of a cell produced in substep (1) is greater than a standard cell height, selecting a next netlist from the ordered sequence of physical netlists as the selected physical netlist and repeating steps d) through h),
3) compacting the plurality of layout elements preferentially in a horizontal dimension,
4) if a height of the cell produced in substep (3) is less than or equal to the standard cell height and a width of the cell produced in substep (3) is less than a width of the cell produced in substep (1), selecting a cell produced in substep (3) as a compacted cell, and
5) otherwise selecting a cell produced in substep (1) as the compacted cell.

4. The method of claim 3 further comprising the following substep:
6) adding location constraints to individual layout elements to create a standard cell.

5. The method of claim 4, wherein substep (6) comprises constraining a cell height to the standard cell height.

6. The method of claim 5, wherein substep (6) further comprises constraining all layout elements on a well layer to lie within the well height from a defined location relative to an edge of a cell.

7. The method of claim 3 wherein substep (1) comprises the steps of:
compacting the plurality of layout elements in a vertical dimension and subsequently compacting the plurality of layout elements in a horizontal dimension.

8. The method of claim 3 wherein substep (3) comprises the steps of:
compacting the plurality of layout elements in a horizontal dimension, and subsequently compacting the plurality of layout elements in a vertical dimension.

9. The method of claim 3, further comprising:
i) receiving an effort level, wherein:
substeps (2) through (4) are not performed when the effort level is low.

10. The method of claim 2 which further comprises:
i) Placing one of the plurality of layout elements to implement a subset of interconnections specified by the logical netlist.

11. The method of claim 10 wherein step (h) comprises the steps of:
1) adding one or more of the plurality of layout elements to interconnect adjacent layout elements on a same net,
2) adding one or more of the plurality of layout elements that allow a router to interconnect layout elements that are on a layer not used by the router, and
3) adding one or more of the plurality of layout elements to interconnect high priority layout elements with a minimum wire length and a minimum number of layer changes.

12. The method of claim 2 wherein steps d, e, f, and h are performed on a persistent layout database.

13. The method of claim 1 which further comprises:
h) Placing one of the plurality of layout elements to implement a subset of interconnections specified by the logical netlist.

14. The method of claim 1 which further comprises:
h) Creating in a persistent database a plurality of layout objects specified in the selected physical netlist.

15. The method of claim 1 wherein step (d) comprises the steps of
1) automatically placing an abstract representation of a primary layout object in order to optimize a placement of the primary layout object subject to an estimated location of a secondary layout object and an estimated location of a tertiary layout object,
2) automatically placing an abstract representation of the secondary layout object in order to optimize a placement of the secondary layout object subject to an actual location of the primary layout object and the estimated location of the tertiary layout object, and
3) automatically placing an abstract representation of the tertiary layout object in order to optimize a placement of the tertiary layout object subject to the actual location of the primary layout object and an actual location of the secondary layout object.

16. The method of claim 15 wherein:
primary layout objects comprise active devices,
secondary layout objects comprise ports and contacts, and
tertiary layout objects comprise antenna diodes and well and/or substrate ties.

17. The method of claim 1, wherein step (d) comprises:
placing a layout element so that a cell height is equal to the standard cell height.

18. The method of claim 17, wherein step (d) further comprises placing all layout elements on a well layer within the well height from a defined location relative to an edge of a cell.

19. The method of claim 18, wherein substrate and well ties are added to enhance yield of the layout.

20. The method of claim 18, wherein redundant layout elements are added to enhance yield of the layout.

21. The method of claim 18, wherein rows of polysilicon lines are added to enhance yield of the layout.

22. The method of claim 18, wherein layout elements are added to eliminate notches in the layout.

23. The method of claim 1, wherein step (e) is performed by an area router.

24. The method of claim 1 wherein steps (d) and (e) are performed on a persistent layout database.

25. The method of claim 24 wherein:
the persistent layout database contains:
a geometric boundary of each layout element,
a type of each layout element, and
a plurality of sets of layout elements, wherein each set comprises layout elements that will be interconnected to each other in a subsequent step.

26. The method of claim 1, comprising the additional step of:
h) Adding layout elements to increase yield and performance of a final layout.

27. The method of claim 1, wherein step (b) comprises enumerating a plurality of foldings of a logical netlist.

28. The method of claim 1, wherein the termination condition of step (g) is that no untried physical netlist could be narrower than a cell already produced.

29. The method of claim 1, wherein the termination condition of step (g) is that a cell no taller than a standard cell height has been produced.

30. The method of claim 1 further comprising the steps of:
h) generating a transistor placement file from the layout;
i) creating a set of one or more masks from the transistor placement file; and
j) fabricating a plurality of integrated circuits from the set of one or more masks.

31. A method of synthesizing a layout for a circuit from:
a physical netlist and
a plurality of high level constraints, said method comprising the steps of:
a) Enumerating an ordered sequence of sets of constraints from the plurality of high level constraints;
b) Following step (a) selecting a first set of constraints from the ordered sequence of sets of physical constraints as a selected set of constraints;
c) Placing a plurality of layout elements according to a logical netlist and the selected set of constraints,
d) Routing the plurality of layout elements to implement a plurality of interconnections specified by the physical netlist,
e) Testing for a termination condition, and
f) If the termination condition in step (e) was not met, Selecting a next set of constraints from the ordered sequence of sets of constraints as the selected set of constraints and repeating steps (c) through (f).

32. The method of claim 31, wherein a constraint enumerated in step (a) is a constraint on a height or a width of a layout.

33. The method of claim 31, wherein at least two of the sets of constraints enumerated in step (a) differ in a number of rows in which layout elements may reside.

34. A data processing system for synthesizing a layout of a circuit from:
a logical netlist and
a set of constraints, said data processing system comprising:
a) deriving a plurality of physical netlists from the logical netlist;
b) following step (a), enumerating an ordered sequence of physical netlists from the plurality of physical netlists, wherein the ordered sequence of physical netlists is determined by an estimated physical dimension of the cell layout;
c) means for selecting a first netlist from the ordered sequence of physical netlists as a selected physical netlist following step (b);
d) means for placing a plurality of layout elements according to the selected physical netlist and the set of constraints,
e) means for routing the plurality of layout elements to implement a plurality of interconnections specified by the logical netlist,
f) means for testing for a termination condition, and
g) if the termination condition in means (f) was not met, means for selecting a next netlist from the ordered sequence of physical netlists as the selected physical netlist and repeating means (d) through (g).

35. Computer software for synthesizing a layout of a circuit from:
a logical netlist and
a set of constraints, said computer software comprising:
a) deriving a plurality of physical netlists from the logical netlist;
b) following step (a), enumerating an ordered sequence of physical netlists from the plurality of physical netlists, wherein the ordered sequence of physical netlists is determined by an estimated physical dimension of the cell layout;
c) a set of computer instructions for following step b, selecting a first netlist from the ordered sequence of physical netlists as a selected physical netlist;
d) a set of computer instructions for placing a plurality of layout elements according to the selected physical netlist and the set of constraints,
e) a set of computer instructions for routing the plurality of layout elements to implement a plurality of interconnections specified by the logical netlist,
f) a set of computer instructions for testing for a termination condition, and
g) a set of computer instructions for if the termination condition in set (f) was not met, selecting a next netlist from the ordered sequence of physical netlists as the selected physical netlist and repeating sets (d) through (g).

36. A computer readable medium containing the computer software in claim 35 encoded in a machine readable format.

37. A method of manufacturing the computer readable medium in claim 36 which comprises:
encoding the computer software in machine readable format on the computer readable medium.

38. A method of selecting a physical netlist for synthesizing a layout of a circuit from a logical netlist said method comprising the steps of:
a) deriving a plurality of physical netlists from the logical netlist;
b) following step (a), enumerating an ordered sequence of physical netlists from the plurality of physical netlists, wherein the ordered sequence of physical netlists is determined by an estimated physical dimension of the cell layout
c) following step (b), selecting a first netlist from the ordered sequence of physical netlists as a selected physical netlist.

* * * * *